US008773852B2

(12) United States Patent  
Singleton

(10) Patent No.: US 8,773,852 B2  
(45) Date of Patent: Jul. 8, 2014

(54) AIR FLOW MANAGEMENT DEVICE FOR USE IN AN ELECTRONICS SYSTEM

(75) Inventor: Gregory L. Singleton, Austin, TX (US)

(73) Assignee: BreakingPoint Systems, Inc., Austin, TX (US)

( * ) Notice: Subject to any disclaimer, the term of this patent is extended or adjusted under 35 U.S.C. 154(b) by 205 days.

(21) Appl. No.: 13/529,154

(22) Filed: Jun. 21, 2012

(65) Prior Publication Data

US 2013/0342993 A1    Dec. 26, 2013

(51) Int. Cl.  
*H05K 7/20* (2006.01)

(52) U.S. Cl.  
USPC ............... 361/690; 361/679.48; 361/679.5; 361/692; 361/694; 361/695; 361/719; 165/80.3; 165/104.33; 165/122; 165/124; 454/184

(58) Field of Classification Search  
USPC ............ 361/679.46–679.55, 688–697, 361/700–712, 715–724; 165/80.2, 80.3, 165/80.4, 80.5, 104.26, 104.29, 104.33, 165/121–127, 185; 174/15.1, 16.3, 252; 454/184  
See application file for complete search history.

(56) References Cited

U.S. PATENT DOCUMENTS

| | | | | |
|---|---|---|---|---|
| 4,628,992 A * | 12/1986 | Kennedy | .................... | 165/123 |
| 7,035,102 B2 * | 4/2006 | Holmes et al. | .................... | 361/695 |
| 7,251,139 B2 * | 7/2007 | Bhattacharya et al. | .................... | 361/719 |
| 7,391,618 B2 * | 6/2008 | Fujiya et al. | .................... | 361/727 |
| 7,408,773 B2 * | 8/2008 | Wobig et al. | .................... | 361/695 |
| 7,764,514 B2 * | 7/2010 | Mongia et al. | .................... | 361/818 |
| 7,957,140 B2 * | 6/2011 | Mongia | .................... | 361/695 |
| 8,077,458 B2 * | 12/2011 | Guan | .................... | 361/695 |
| 2002/0122296 A1 * | 9/2002 | Stone et al. | .................... | 361/687 |
| 2004/0149487 A1 * | 8/2004 | Yamamoto | .................... | 174/135 |

* cited by examiner

*Primary Examiner* — Michail V Datskovskiy  
(74) *Attorney, Agent, or Firm* — Egan, Peterman & Enders LLP.

(57) ABSTRACT

A heat management system may include a generally planar printed circuit board extending in a first plane, heat-generating electrical components mounted on a first side of the PCB, and an air baffle coupled to the PCB and configured to direct air flow across some of the components. The air baffle may include a generally planar air baffle body extending in a second plane parallel to and offset from the first plane of the PCB such that at least one of the components is located in an area between the air baffle body and the PCB, an opening in the generally planar body, and a generally planar wing coupled to the air baffle body at a first side of the opening and extending toward the PCB at an askew angle relative to the first plane of the air baffle body, the wing being configured to facilitate air flow through the opening.

17 Claims, 70 Drawing Sheets

IEEE STANDARD HEADER

| DEST MAC, 6 BYTES | SRC MAC, 6 BYTES | EthType, 2 BYTES |
|---|---|---|

CLD ACCESS DIRECTIVE FORMAT

| SEQUENCE 2 BYTES | COUNT 2 BYTES | CMD 2 BYTES | DATA... |
|---|---|---|---|

*FIG. 17*

EXAMPLE OF REGISTER ACCESS DIRECTIVE:

WRITE COMMAND:
        CMD = 0
        COUNT = NUMBER OR REGISTERS TO WRITE.

DATA 0 = 32 BIT ADDRESS 0
        DATA 1 = 32 BIT DATA 0
        DATA 2 = 32 BIT ADDRESS 1
        DATA 3 = 32 BIT DATA 1
            ⋮
        DATA n-1 = 32 BIT ADDRESS n/2
        DATA n = 32 BIT DATA n/2

RESPONSE:
    FPGA WILL ACKNOWLEDGE A SUCCESSFUL WRITE WITH A PACKET
    WITH THE FOLLOWING PARAMETERS:
        SEQ = SAME SEQ NUMBER THAT WAS SENT ON THE ON WRITE PACKET
        COUNT = NUMBER OF REGISTERS WRITTEN
        CMD = 0, WRITE COMMAND.
    THERE IS NO DATA PORTION ON THE RESPONSE FRAME.

*FIG. 18*

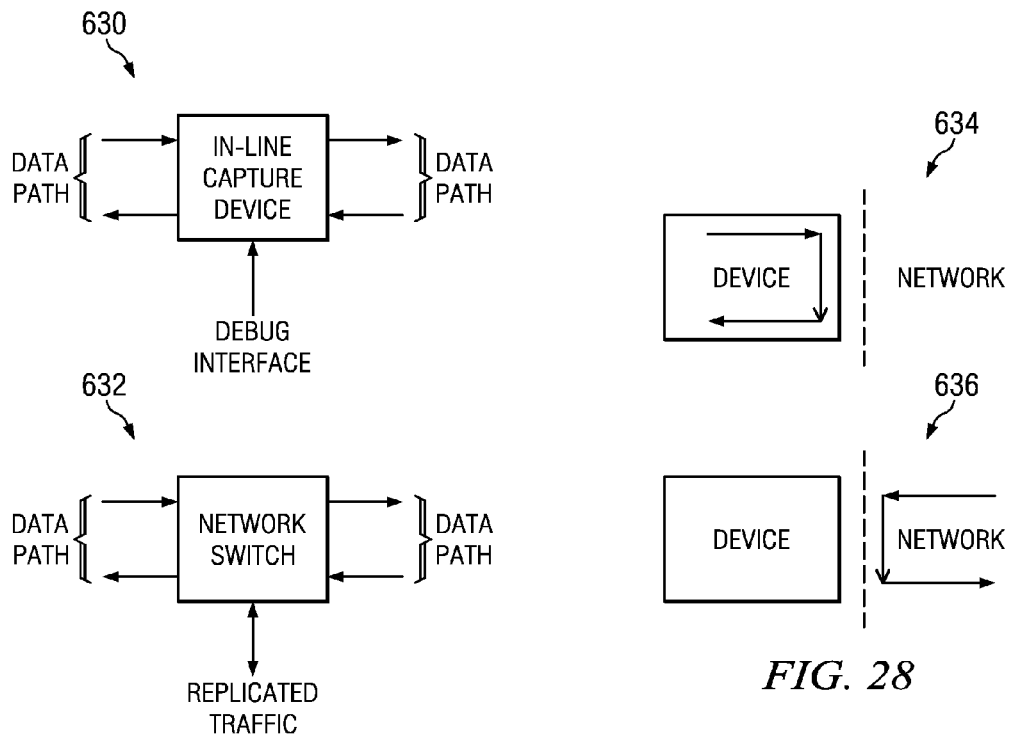
*FIG. 28*
*FIG. 27*
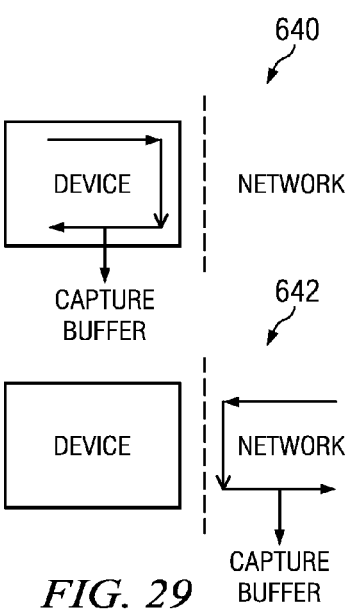
*FIG. 29*

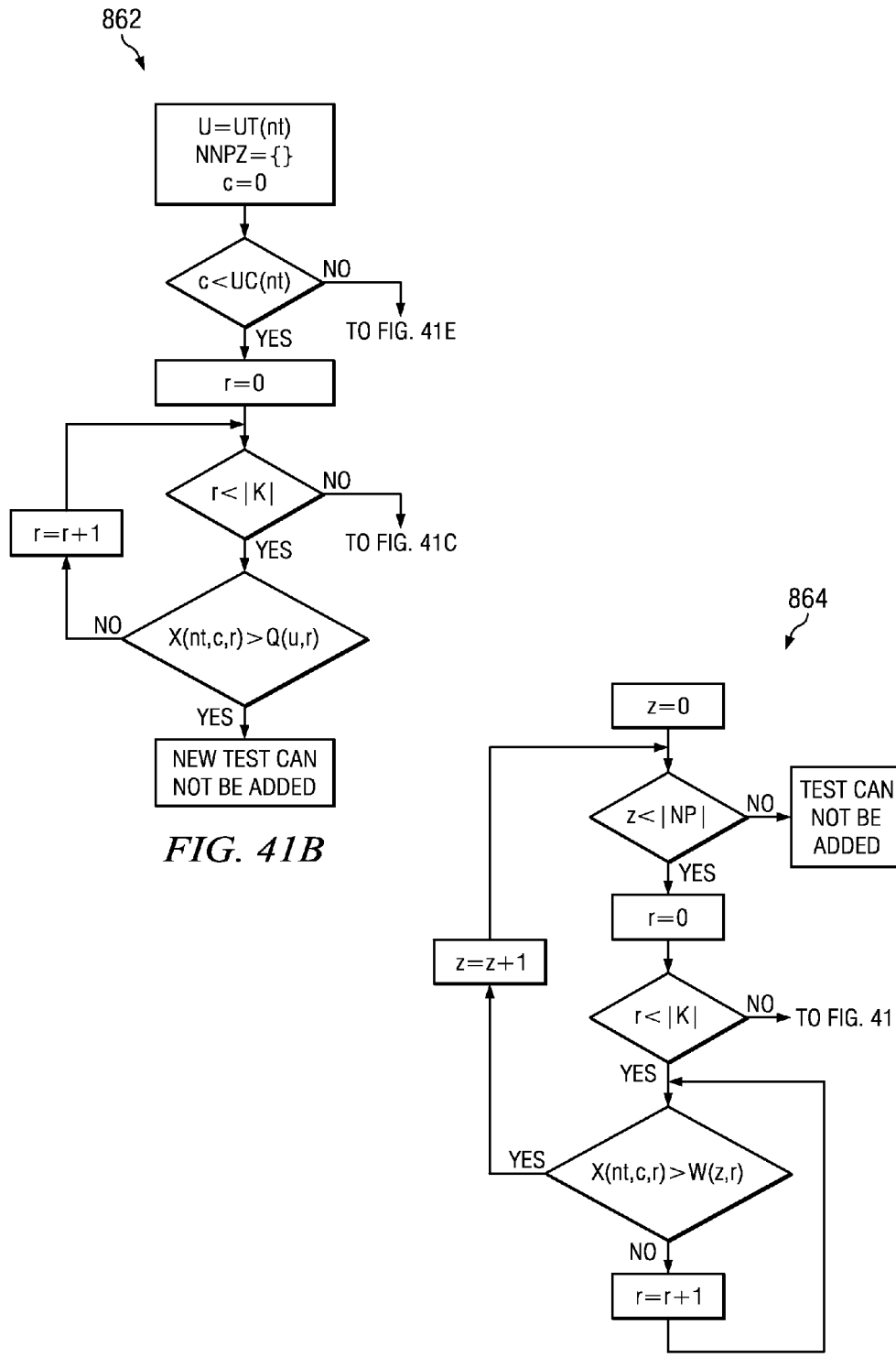

| Timestamp | Average Latency | lowest latency | low latency | middle latency | high latency | highest latency | lowest count | low count | middle count | high count | highest count |
|---|---|---|---|---|---|---|---|---|---|---|---|
| | | | | microseconds | | | | | packets | | |
| 0.000 | 0 | 0 < 10 | 10 < 100 | 100 < 1000 | 1000 < 10000 | > 10000 | 0 | 0 | 0 | 0 | 0 |
| 1.027 | 1.04159 | 0 < 10 | 10 < 100 | 100 < 1000 | 1000 < 10000 | > 10000 | 15,387 | 0 | 0 | 0 | 0 |
| 2.031 | 1.10548 | 0 < 10 | 10 < 100 | 100 < 1000 | 1000 < 10000 | > 10000 | 33,646 | 0 | 0 | 0 | 0 |
| 3.032 | 1.06711 | 0 < 0.25 | 0.25 < 0.625 | 0.625 < 1.375 | 1.375 < 1.625 | > 1.625 | 0 | 0 | 11,921 | 161 | 4,268 |
| 4.032 | 1.06518 | 0 < 0.375 | 0.375 < 0.75 | 0.75 < 1.375 | 1.375 < 1.75 | > 1.75 | 0 | 0 | 11,336 | 1,397 | 2,822 |
| 5.033 | 1.07099 | 0 < 0.25 | 0.25 < 0.625 | 0.625 < 1.375 | 1.375 < 1.75 | > 1.75 | 0 | 0 | 11,488 | 1,432 | 3,023 |
| 6.031 | 1.08587 | 0 < 0.25 | 0.25 < 0.625 | 0.625 < 1.375 | 1.375 < 1.75 | > 1.75 | 0 | 0 | 13,197 | 1,761 | 2,928 |
| 7.034 | 0.989925 | 0 < 0.25 | 0.25 < 0.625 | 0.625 < 1.375 | 1.375 < 1.75 | > 1.75 | 0 | 0 | 12,135 | 1,024 | 1,727 |
| 8.032 | 1.13146 | 0 < 0.25 | 0.25 < 0.625 | 0.625 < 1.375 | 1.375 < 1.75 | > 1.75 | 0 | 0 | 11,788 | 1,897 | 4,087 |
| 9.032 | 1.11002 | 0 < 0.25 | 0.25 < 0.625 | 0.625 < 1.25 | 1.25 < 1.625 | > 1.625 | 0 | 0 | 11,494 | 214 | 5,361 |
| 10.034 | 0.943932 | 0 < 0.375 | 0.375 < 0.75 | 0.75 < 1.5 | 1.5 < 1.75 | > 1.75 | 0 | 1 | 11,387 | 740 | 1,102 |
| 11.032 | 1.02658 | 0 < 0.25 | 0.25 < 0.625 | 0.625 < 1.5 | 1.5 < 1.875 | > 1.875 | 0 | 0 | 10,655 | 3,186 | 0 |
| 12.033 | 1.05971 | 0 < 0.375 | 0.375 < 0.625 | 0.625 < 1.125 | 1.125 < 1.5 | > 1.5 | 0 | 0 | 10,566 | 407 | 3,896 |
| 13.034 | 1.01196 | 0 < 0.375 | 0.375 < 0.625 | 0.625 < 1.25 | 1.25 < 1.625 | > 1.625 | 0 | 0 | 11,097 | 241 | 2,875 |
| 14.032 | 0.956884 | 0 < 0.25 | 0.25 < 0.625 | 0.625 < 1.375 | 1.375 < 1.75 | > 1.75 | 0 | 0 | 11,321 | 811 | 1,317 |
| 15.034 | 1.07357 | 0 < 0.375 | 0.375 < 0.625 | 0.625 < 1.25 | 1.25 < 1.5 | > 1.5 | 0 | 0 | 12,058 | 325 | 4,457 |

*FIG. 44*

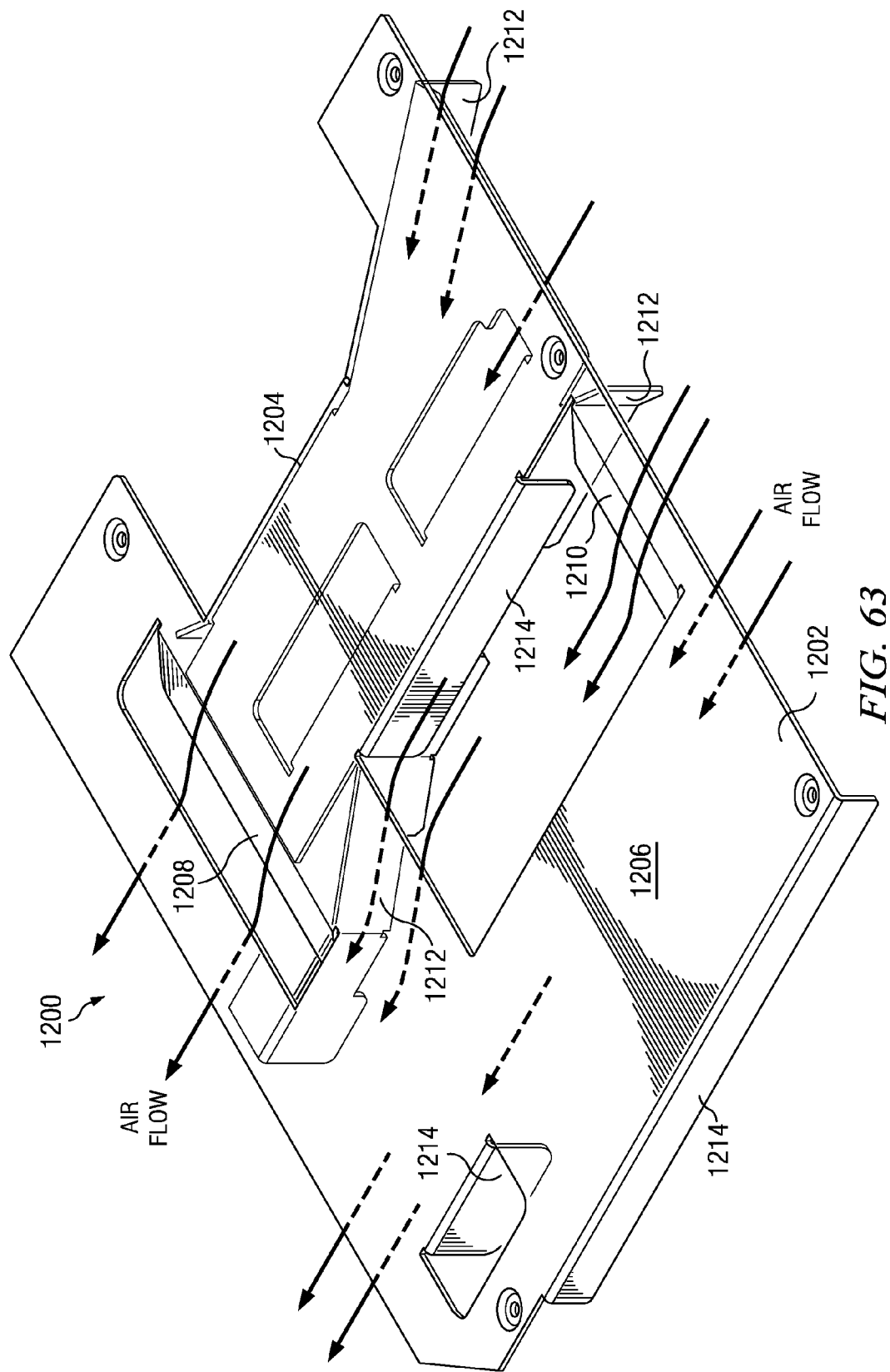

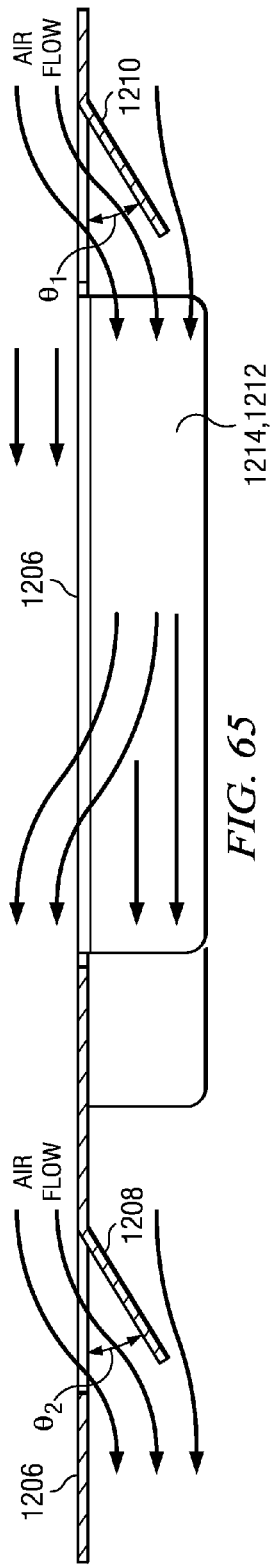
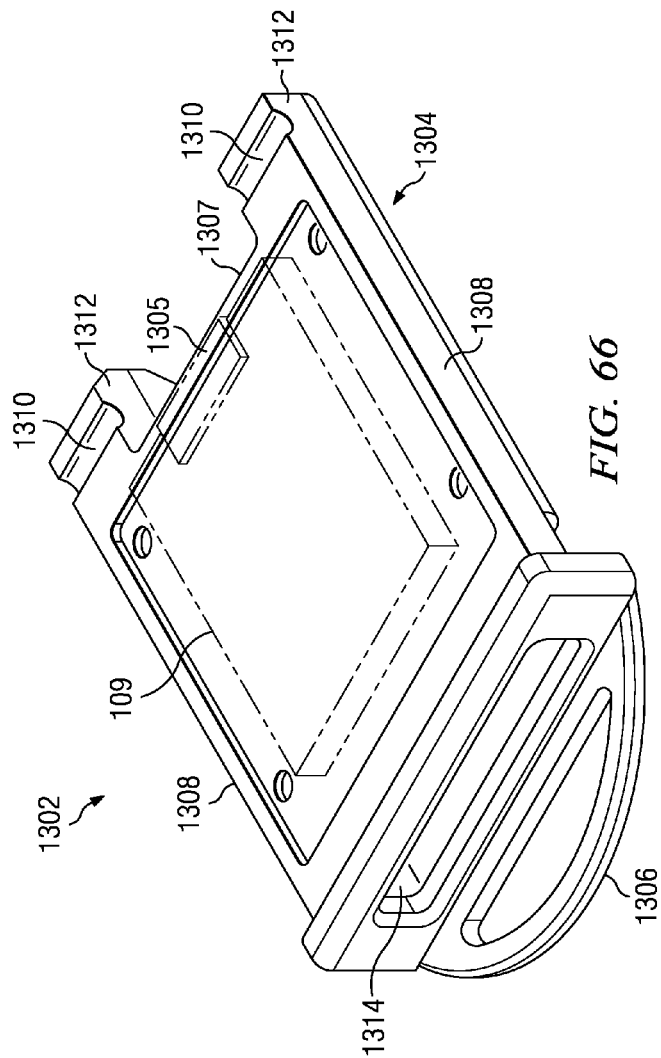

AIR FLOW MANAGEMENT DEVICE FOR USE IN AN ELECTRONICS SYSTEM

CROSS-REFERENCE TO RELATED APPLICATIONS

This application is a member of a family of related U.S. Co-Pending Applications filed Jun. 21, 2012, including: Ser. Nos. 13/529,207, 13/529,248, 13/529,289, 13/529,339, 13/529,372, 13/529,423, 13/529,479, 13/529,535, 13/529,575, 13/529,693, 13/529,745, 13/529,786 13/529,821, 13/529,859, 13/529,910, 13/529,932, 13/529,970, 13/529,983, 13/529,998, 13/530,019, 13/530,052, 13/530,059 and 13/530,094, all of which applications are hereby incorporated by reference in their entirety.

TECHNICAL FIELD

The present disclosure relates to systems and methods for testing communications networks, services, and devices, e.g., testing the traffic-handling performance and/or security of the network, network accessible devices, cloud services, and data center services.

BACKGROUND

Organizations are increasingly reliant upon the performance, security, and availability of networked applications to achieve business goals. At the same time, the growing popularity of latency-sensitive, bandwidth-heavy applications is placing heavy demands on network infrastructures. Further, cyber attackers are constantly evolving their mode of assault as they target sensitive data, financial assets, and operations. Faced with these performance demands and increasingly sophisticated security threats, network equipment providers (NEPs) and telecommunications service providers (SPs) have delivered a new generation of high-performance, content-aware network equipment and services.

Content-aware devices that leverage deep packet inspection (DPI) functionality have been around for several years, and new content-aware performance equipment is coming to market each year. However, recent high-profile performance and security failures have brought renewed focus to the importance of sufficient testing to ensure content-aware network devices can perform under real-world and peak conditions. The traditional approach of simply reacting to attacks and traffic evolution has cost organizations and governments billions. Today's sophisticated and complex high-performance network devices and the network they run on require a more comprehensive approach to testing prior to deployment than traditional testing tools are able to provide. NEPs, SPs, and other organizations require testing solutions capable of rigorously testing, simulating, and emulating realistic application workloads and security attacks at line speed. Equally important, these testing tools must be able to keep pace with emerging and more innovative products as well as thoroughly vet complex content-aware/DPI-capable functionality by emulating a myriad of application protocols and other types of content at ever-increasing speeds and feeds to ensure delivery of an outstanding quality of experience (QoE) for the customer and/or subscriber.

Network infrastructures today are typically built on IP foundations. However, measuring and managing application performance in relation to network devices remain challenges. To make matters worse, content-aware networking mandates controls for Layers 4-7 as well as the traditional Layer 2-3 attributes. Yet, to date, the bulk of the IP network testing industry has focused primarily on testing of Layers 2-3 with minimal consideration for Layers 4-7. Now with the rise of content-driven services, Layers 4-7 are increasingly strategic areas for network optimization and bulletproofing.

Even as NEPs and SPs rush to introduce newer, more sophisticated content-aware/DPI-capable devices to reap the associated business and recreational benefits these products deliver, the testing of these devices has remained stagnant. Legacy testing solutions and traditional testing practices typically focus on the IP network connection, especially routers and switches, and do not have sufficient functionality or capability to properly test this new class of devices. Nor are they aligned with content-driven approaches such as using and applying test criteria using stateful blended traffic and live security strikes at line speeds. The introduction of content-aware functionality into the network drives many new variables for testing that resist corner-case approaches and instead require realistic, randomized traffic testing at real-time speeds. The inability to test this new set of content-aware and software-driven packet inspection devices contributes to the deployment challenges and potential failure of many of them once they are deployed.

SUMMARY OF THE INVENTION

In one embodiment, a device for directing air flow for dissipating heat in an electronics system may comprise a generally planar body extending in a first plane; at least one guide member extending from the generally planar body in a direction perpendicular to the first plane; an opening in the generally planar body; and a generally planar wing coupled to the generally planar body at a first side of the opening, the generally planar wing extending in a second plane that is angularly offset from the first plane of the generally planar body by an angle between 20 degrees and 70 degrees.

In another embodiment, a heat management system for an electronics system may comprise a generally planar printed circuit board extending in a first plane; a plurality of heat-generating electrical components mounted on a first side of the printed circuit board; and an air baffle coupled to the printed circuit board and configured to direct air flow across at least some of the heat-generating electrical components. The air baffle may comprise a generally planar air baffle body extending in a second plane parallel to and offset from the first plane of the printed circuit board such that at least one of the heat-generating electrical components is located in an area between the air baffle body and the printed circuit board; an opening in the generally planar body; and a generally planar wing coupled to the air baffle body at a first side of the opening and extending toward the printed circuit board at an askew angle relative to the first plane of the air baffle body, the wing being configured to facilitate air flow through the opening in the generally planar body.

In another embodiment, a heat management system for an electronics system may comprise a generally planar printed circuit board extending in a first plane; a heat-generating electrical component mounted on a first side of the printed circuit board; a heat sink; and an air baffle. The heat sink may comprise a first portion located over the heat-generating electrical component and substantially free of convection-based heat dissipation structures; and a second portion located laterally with respect to the heat-generating electrical component and including an array of convection-based heat dissipation structures, such that heat generated by the heat-generating electrical component is received into the first portion of the heat sink, conductively transferred from the first portion to the second portion of the heat sink, and convectively dissipated from the second portion of the heat sink into an air flow. The air baffle may be coupled to the printed circuit board and may comprise a guidance structure at least partially positioned above the first portion of the heat sink, the guidance structure configured to increase a volume or a speed of an air flow across the second portion of the heat sink comprising the array of convection-based heat dissipation structures.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 13C illustrates an example user interface screen for configuring aspects of a network testing system, according to an example embodiment;

FIG. 13D illustrates an example interface screen for configuring a network testing application, according to an example embodiment;

FIG. 17 illustrates an example layout of Ethernet packets containing CLD control messages for use in a network testing system, according to certain embodiments;

FIG. 18 illustrates an example register access directive for writing data to CLD registers in a network testing system, according to certain embodiments;

FIG. 27 illustrates two example methods for capturing network data in a network testing system, according to an example embodiment;

FIG. 28 illustrates two data loopback scenarios that may be supported by a network testing system, according to an example embodiment;

FIG. 29 illustrates two example arrangements for data loopback and packet capture in a capture buffer of a network testing system, according to example embodiments;

FIGS. 41A-41E illustrate a process flow of an algorithm for determining whether a new test can be added to a set of tests running on a network testing system, and if so, distributing the new test to one or more network processors of the network testing system, according to an example embodiment;

FIG. 44 is an example table of a subset of the raw statistical data from which the chart of FIG. 43 may be derived, according to an example embodiment;

FIG. 63 shows a three-dimensional isometric view from above of an example air baffle for use in heat dissipation system of a network testing system, according to an example embodiment;

FIG. 65 shows a side view of the assembled air baffle of FIG. 63, illustrating air flow paths promoted by the air baffle, according to an example embodiment;

FIG. 66 illustrates an assembled drive carrier of a drive assembly of network testing system, according to an example embodiment;

DETAILED DESCRIPTION

Preferred embodiments and their advantages over the prior art are best understood by reference to FIGS. 1-70 below in view of the following general discussion.

Figure 1:
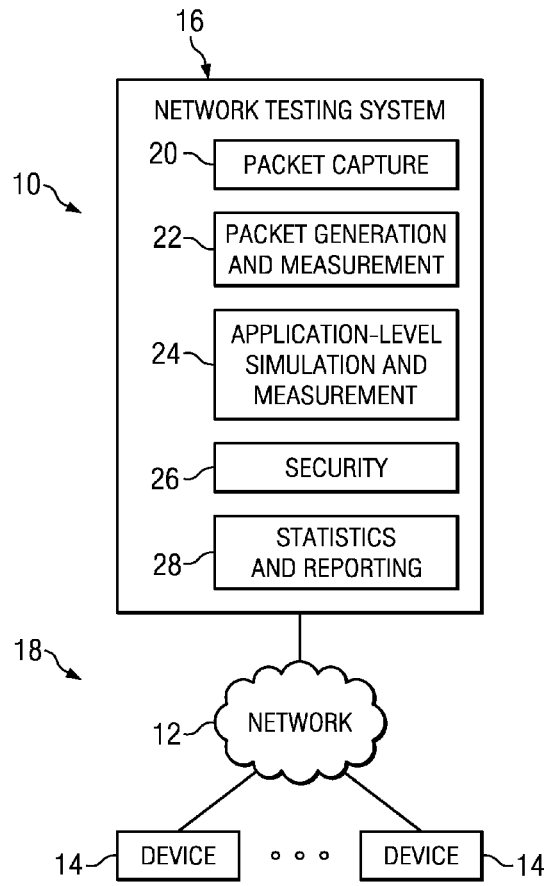
FIG. 1 illustrates a block diagram of an arrangement for testing the performance of a communications network and/or one or more network devices using a network testing system according to certain embodiments of the present disclosure.

FIG. 1 illustrates a general block diagram of an arrangement 10 for testing the performance of a communications network 12 and/or one or more network devices 14 using a network testing system 16, according to certain embodiments of the present disclosure. Test devices 14 may be part of a network 12 tested by network testing system 16, or may be connected to network testing system 16 by network 12. Thus, network testing system 16 may be configured for testing network 12 and/or devices 14 within or connected to network 12. For the sake of simplicity, the test network 12 and/or devices 14 are referred to herein as the test system 18. Thus, a test system 18 may comprise a network 12, one or more devices 14 within a network 12 or coupled to a network 12, one or more hardware, software, and/or firmware components of device(s) 14, or any other component or aspect of a network or network device.

Network testing system 16 may be configured to test the performance (e.g., traffic-handling performance) of devices 14, the security of a test system 18 (e.g., from security attacks), or both the performance and security of a test system 18. In some embodiments, network testing system 16 configured to simulate a realistic combination of business, recreational, malicious, and proprietary application traffic at sufficient speeds to test both performance and security together using the same data and tests. In some embodiments, network testing system 16 is configured for testing content-aware systems 18 devices 14 and/or content-unaware systems 18.

Network 12 may include any one or more networks which may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or any other appropriate architecture or system that facilitates the communication of signals, data and/or messages (generally referred to as data) via any one or more wired and/or wireless communication links.

Devices 14 may include any type or types of network device, e.g., servers, routers, switches, gateways, firewalls, bridges, hubs, databases or data centers, workstations, desktop computers, wireless access points, wireless access devices, and/or any other type or types of devices configured to communicate with other network devices over a communications medium. Devices 14 may also include any hardware, software, and/or firmware components of any such network device, e.g., operating systems, applications, CPUs, configurable logic devices (CLDs), application-specific integrated circuits (ASICs), etc.

In some embodiments, network testing system 16 is configured to model and simulate network traffic. The network testing system 16 may act as virtual infrastructure and simulate traffic behavior of network devices (e.g., database server, Web server) running a specific application. The resulting network traffic originated from the network testing system 16 may drive the operation of a test system 18 for evaluating the performance and/or security of the system 18. Complex models can be built on realistic applications such that a system 18 can be tested and evaluated under realistic conditions, but in a testing environment. Simultaneously, network testing system 16 may monitor the performance and/or security of a test system 18 and may collect various metrics that measure performance and/or security characteristics of system 18.

In some embodiments, network testing system 16 comprises a hardware- and software-based testing and simulation platform that includes of a number of interconnected subsystems. These systems may be configured to operate independently or in concert to provide a full-spectrum solution for testing and verifying network performance, application and security traffic scenarios. These subsystems may be interconnected in a manner to provide high-performance, highly-accurate measurements and deep integration of functionality.

For example, as shown in FIG. 1, network testing system 16 may comprise any or all of the following testing and simulation subsystems: a high-speed, high-resolution network packet capture subsystem 20, a high-speed packet generation and measurement subsystem 22, an application-level simulation and measurement subsystem 24, a security and exploit simulation and analysis subsystem 26, and/or a statistics collection and reporting subsystem 28. Subsystems 20-28 are discussed below in greater detail. In some embodiments, the architecture of network testing system 16 may allow for some or all of subsystems 20-28 to operate simultaneously and cooperatively within the same software and hardware platform. Thus, in some embodiments, system 16 is configured to generate and analyze packets at line rate, while simultaneously capturing that same traffic, performing application simulation, and security testing. In particular embodiments, system 16 comprises custom hardware and software arranged and programmed to deliver performance and measurement abilities not achievable with conventional software or hardware solutions.

Network testing system 16 may be connected to the test system 18 in any suitable manner, e.g., according to any suitable topology or arrangement. In some embodiments or arrangements, network testing system 16 may be connected on both sides of a system 18 to be tested, e.g., to simulate both clients and servers passing traffic through the test system. In other embodiment or arrangements, network testing system 16 may be connected to any entry point to the test system 18, e.g., to act as a client to the test system 18. In some embodiment or arrangements, network testing system 16 may act in both of these modes simultaneously.

FIGS. 2A-2G illustrate example topologies or arrangements in which network testing system 16 may be connected to a test system 18, e.g., depending on the type of the test system 18 and/or the type of testing or simulation to be performed by network testing system 16.

Figure 2A:
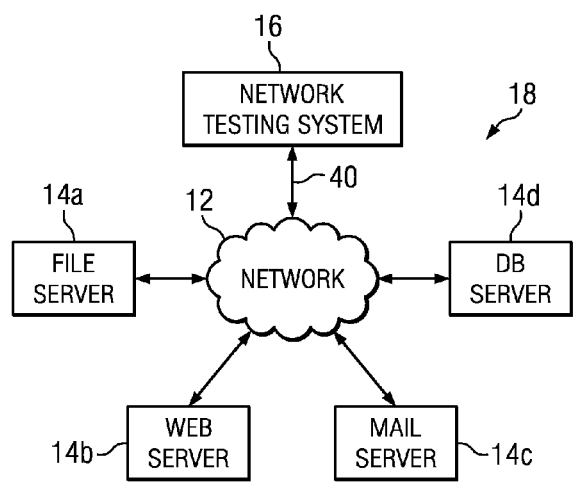
FIGS. 2A-2G illustrate example topologies or arrangements in which a network testing system according to certain embodiments may be connected to a test system, e.g., depending on the type of the test system and/or the type of testing or simulation to be performed by the network testing system.

FIG. 2A illustrates an example arrangement for testing a data center 18 using network testing system 16, according to an example embodiment. A data center 18 may include a collection of virtual machines (VMs), each specialized to run one service per VM, wherein the number of VMs dedicated to each service may be configurable. For example, as shown, data center 18 may include the following VMs: a file server 14*a*, a web server 14*b*, a mail server 14*c*, and a database server 14*d*, which may be integrated in the same physical device or devices, or communicatively coupled to each other via a network 12, which may comprise one or more routers, switches, and/or other communications links. In this example arrangement, network testing system 16 is connected to data center 18 by a single interface 40. Network testing system 16 may be configured to evaluate the data center 18 based on (a) its performance and resiliency in passing specified traffic. In other embodiments, network testing system 16 may be configured to evaluate the ability of the data center 18 to block malicious traffic.

Figure 2B:
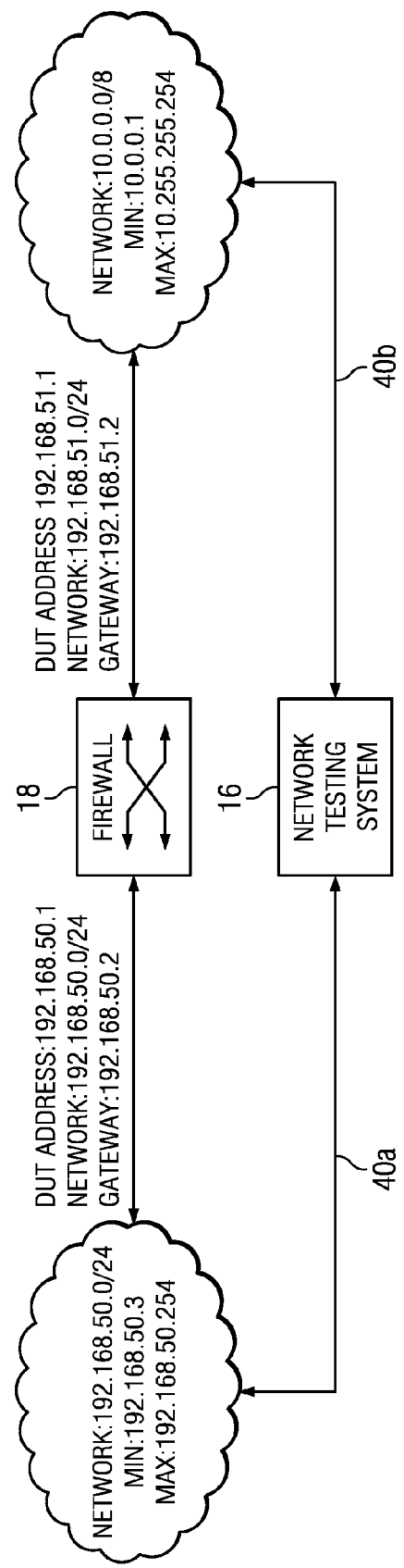

FIG. 2B illustrates an example arrangement for testing a firewall 18 using network testing system 16, according to an example embodiment. Firewall 18 may comprise, for example, a device which connects multiple layer 3 networks and applies a security polity to traffic passing through. Network testing system 16 may be configured to test the firewall 18 based on its performance and resiliency in passing specifically allowed traffic and its ability to withstand packet and protocol corruption. In this example arrangement, network testing system 16 is connected to firewall 18 by two interface 40*a* and 40*b*, e.g., configured to use Network Address Translation (NAT).

Figure 2C:
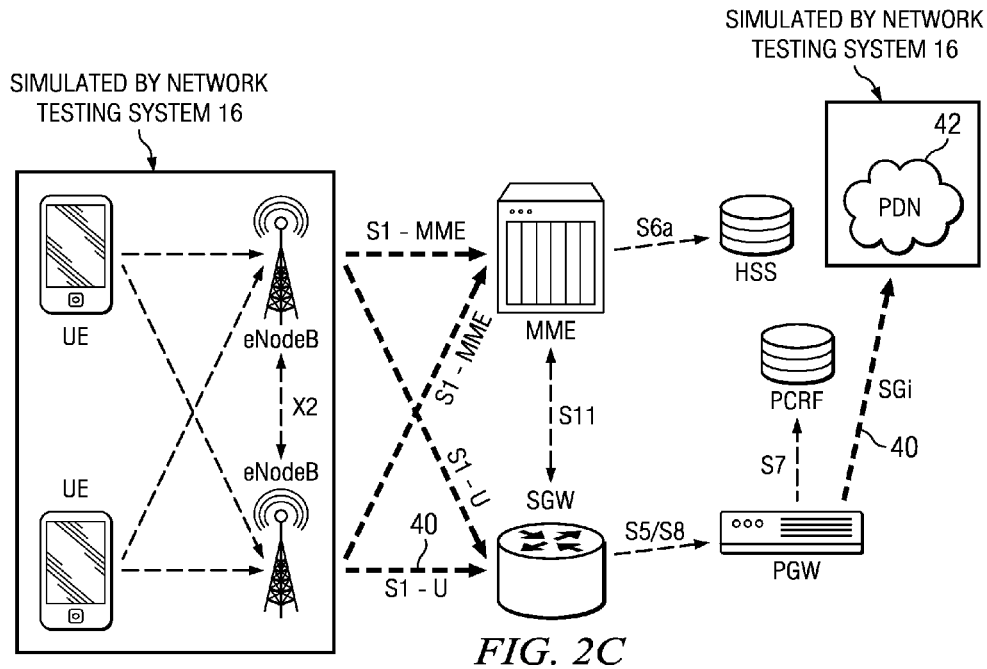
Figure 2D:
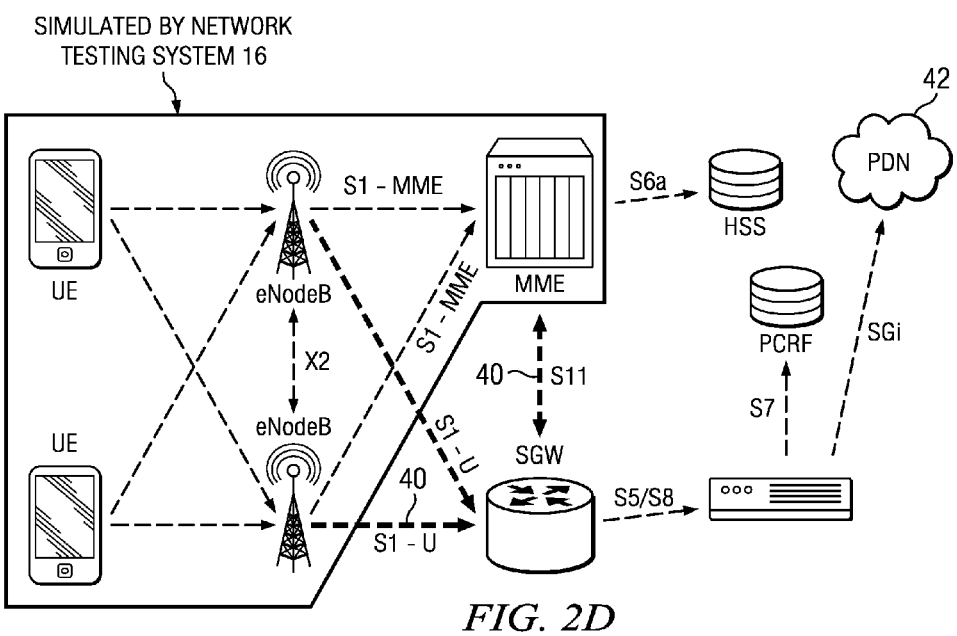
Figure 2E:
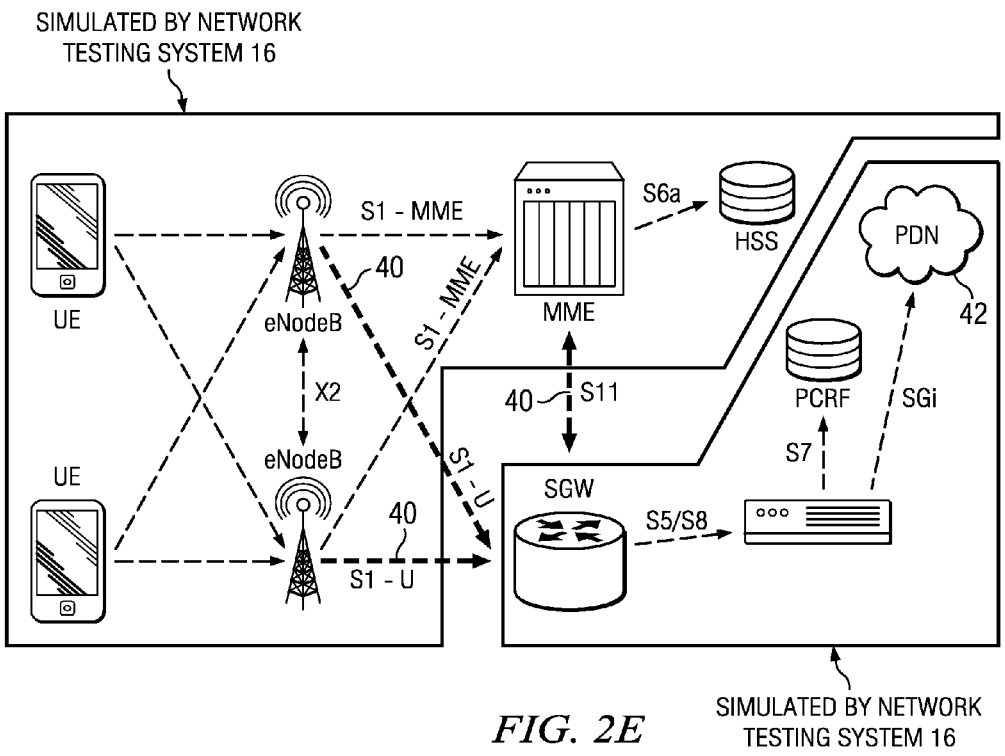

FIGS. 2C-2E illustrate example arrangements for testing an LTE network using network testing system 16, according to an example embodiment. As shown in FIGS. 2C-2E, an LTE network may comprise the System Architecture Evolution (SAE) network architecture of the 3GPP LTE wireless communication standard. According to the SAE architecture, user equipment (UEs) may be wirelessly connected to a mobility management entity (MME) and/or serving gateway (SGW) via eNodeB interface. A home subscriber server (HSS) may be connected to the MME, and the SGW may be connected to a packet data network gateway (PGW), configured for connecting network 18 to a public data network 42, e.g., the Internet.

In some embodiment, network testing system 16 may be configured to simulated various components of an LTE network in order to test other components or communication links of the LTE network 18. FIGS. 2C-2E illustrate three example arrangements in which system 16 simulates different portions or components of the LTE network in order to test other components or communication links of the LTE network (i.e., the tested system 18). In each figure, the portions or components 18 of the LTE network that are simulated by system 16 are indicated by a double-line outline, and connections between network testing system 16 and the tested components 18 of the LTE network are indicated by dashed lines and reference number 40.

In the example arrangement shown in FIG. 2C, network testing system 16 may be configured to simulate user equipment (UEs) and eNodeB interfaces at one end of the LTE network, and a public data network 42 (e.g., Internet devices) connected to the other end of the LTE network. As shown, network testing system 16 may be connected to the tested portion 18 of the LTE network by connections 40 that simulate the following LTE network connections: (a) S1-MME connections between eNodeB interfaces and the MME, (b) S1-U connection between eNodeB interfaces and the SGW; and (c) SGi connection between the PGW and public data network 42 (e.g., Internet devices).

The example arrangement shown in FIG. 2D is largely similar to the example arrangement of FIG. 2C, but the MME is also simulated by network testing system 16, and the LTE network is connected to an actual public data network 42 (e.g., real Internet servers) rather than simulating the public data network 42 using system 16. Thus, as shown, network testing system 16 is connected to the tested portion 18 of the LTE network by connections 40 that simulate the following LTE network connections: (a) S1-U connection between eNodeB interfaces and the SGW, and (b) S11 connection between the MME and SGW.

In the example arrangement shown in FIG. 2E, network testing system 16 is configured to simulate all components of the LTE network, with the expectation that a deep packet inspection (DPI) device, e.g., a firewall, intrusion detection or prevention device (e.g., IPS or IDS), load balancer, etc., will be watching and analyzing the traffic on interfaces S1-U and S11. Thus, network testing system 16 may test the performance of the DPI device.

Figure 2F:
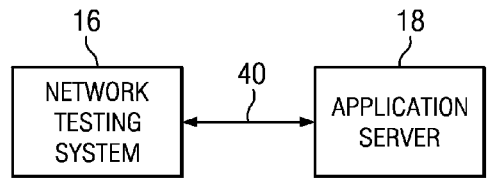

FIG. 2F illustrates an example arrangement for testing an application server 18 using network testing system 16, according to an example embodiment. Application server 18 may comprise, for example, a virtual machine (VM) with multiple available services (e.g., mail, Web, SQL, and file sharing). Network testing system 16 may be configured to evaluate the application server 18 based on its performance and resiliency in passing specified traffic. In this example arrangement, network testing system 16 is connected to application server 18 by one interface 40.

Figure 2G:
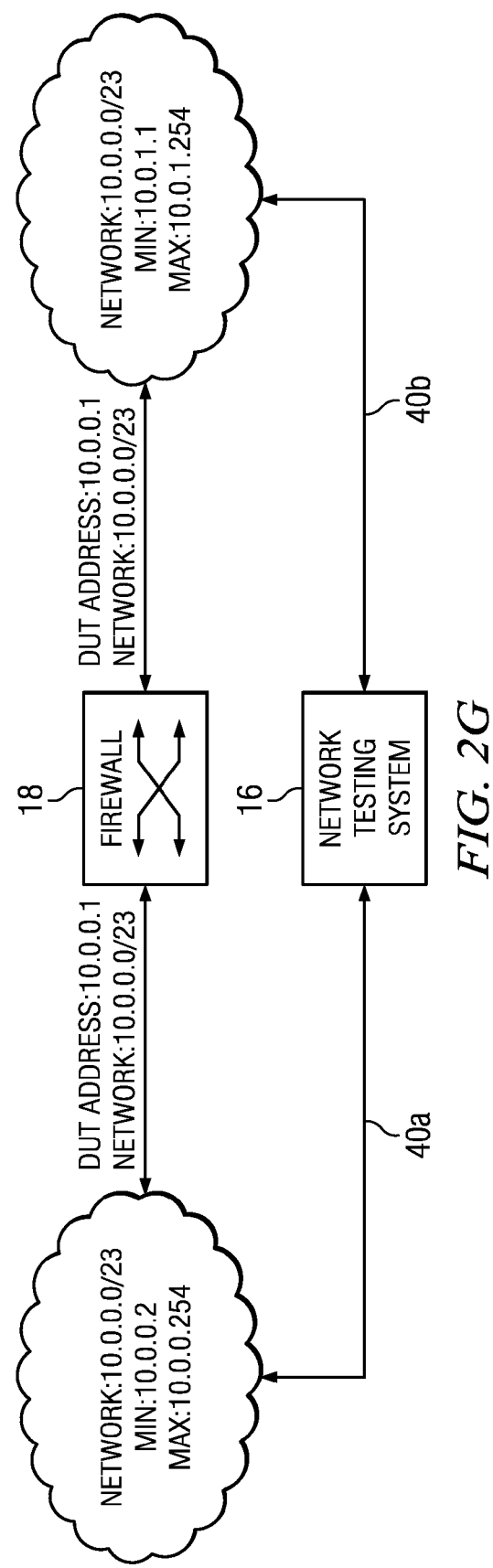

FIG. 2G illustrates an example arrangement for testing a switch 18 using network testing system 16, according to an example embodiment. Switch 18 may comprise, for example, a layer 2 networking device that connects different segments on the same layer 3 network. Network testing system 16 may be configured to test the switch 18 based on its performance and resiliency against frame corruption. In this example arrangement, network testing system 16 is connected to switch 18 by two interface 40*a* and 40*b*.

Figure 3:
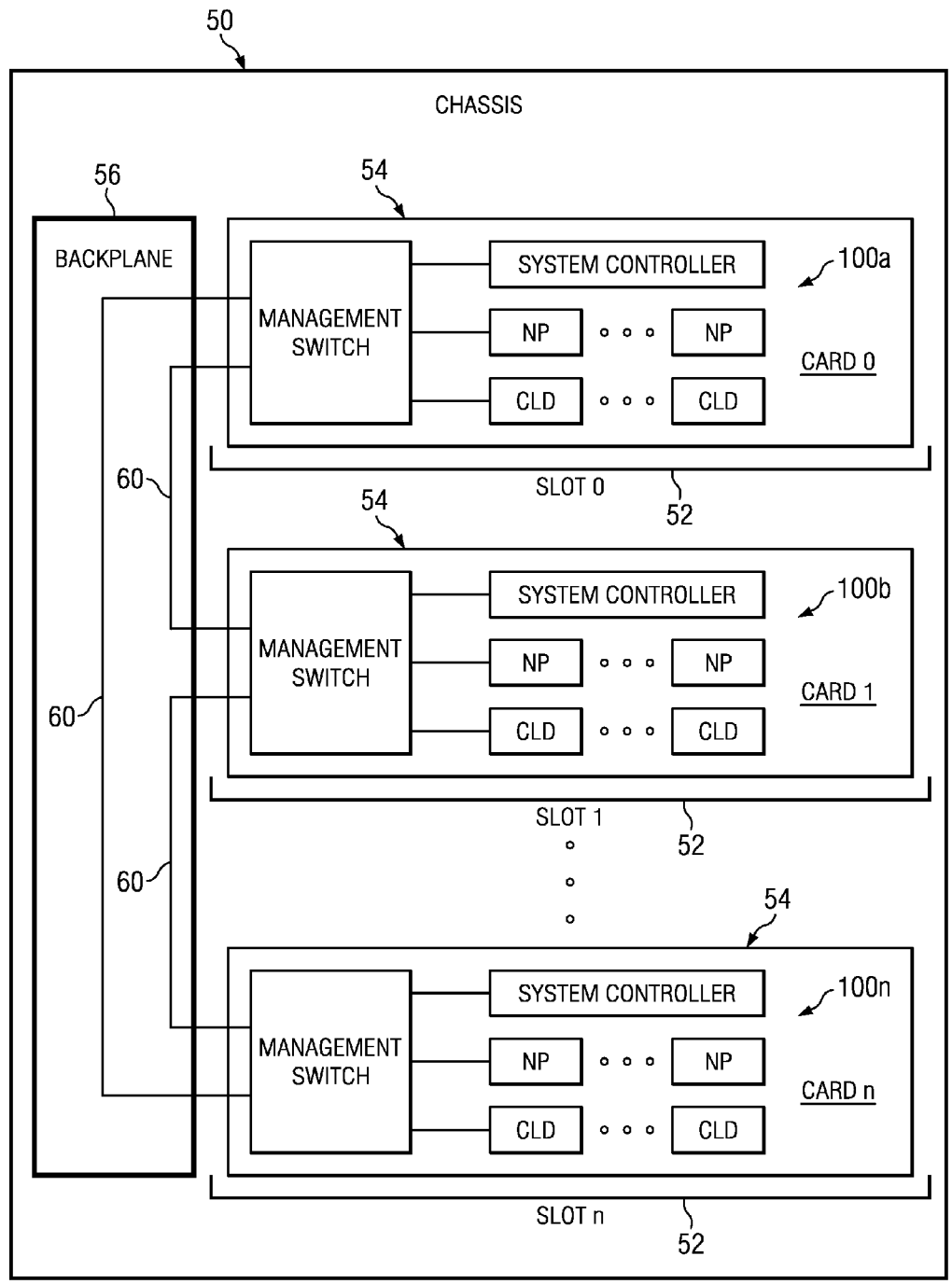
FIG. 3 illustrates an example configuration of a network testing system, according to an example embodiment.

FIG. 3 illustrates an example configuration of a network testing system 16, according to example embodiments. Network testing system 16 may include a chassis 50 including any suitable number of slots 52, each configured to receive a modular card, or blade, 54. A card or blade 54 may comprise one or more printed circuit boards (e.g., PCB 380 discussed below). For example, as shown, chassis 50 may include Slot 0 configured to receive Card 0, Slot 1 configured to receive Card 1, . . . and Slot n configured to receive Card n, where n equals any suitable number, e.g., 1, 2, 3, 4, 5, 7, or more. For example, in some embodiments, chassis 50 is a 3-slot chassis, a 5-slot chassis, or a 12-slot chassis. In other embodiments, system 16 comprises a single card 54.

Each card 54 may be plugged into a backplane 56, which may include physical connections 60 for communicatively connecting cards 54 to each other, as discussed below. While cards may be interconnected, each card is treated for some purposes as an independent unit. Communications within a card are considered to be "local" communications. Two different cards attached to the same backplane may be running different versions of software so long as the versions are compatible.

Each card 54 may include any architecture 100 of hardware, software, and/or firmware components for providing the functionality of network testing system 16. For example, card 0 may include an architecture 100*a*, card 1 may include an architecture 100*b*, . . . , and card n may include an architecture 100*n*. The architecture 100 of each card 54 may be the same as or different than the architecture 100 of each other card 54, e.g., in terms of hardware, software, and/or firmware, and arrangement thereof.

Each architecture 100 may include a system controller, one or more network processors, and one or more CLDs connected to a management switch 110 (and any other suitable components, e.g., memory devices, communication interfaces, etc.). Cards 54 may be communicatively coupled to each other via the backplane 56 and management switches 110 of the respective cards 54, as shown in FIG. 3. In some embodiments, backplane 56 include physical connections for connecting each card 54 directly to each other card 54. Thus, each card 54 may communicate with each other card 54 via the management switches 110 of the respective cards 54, regardless of whether one or more slots 52 are empty or whether one or more cards 54 are removed.

In some embodiments, each card 54 may be configured to operate by itself, or cooperatively with one or more other cards 54, to provide any of the functionality discussed herein.

Figure 4:
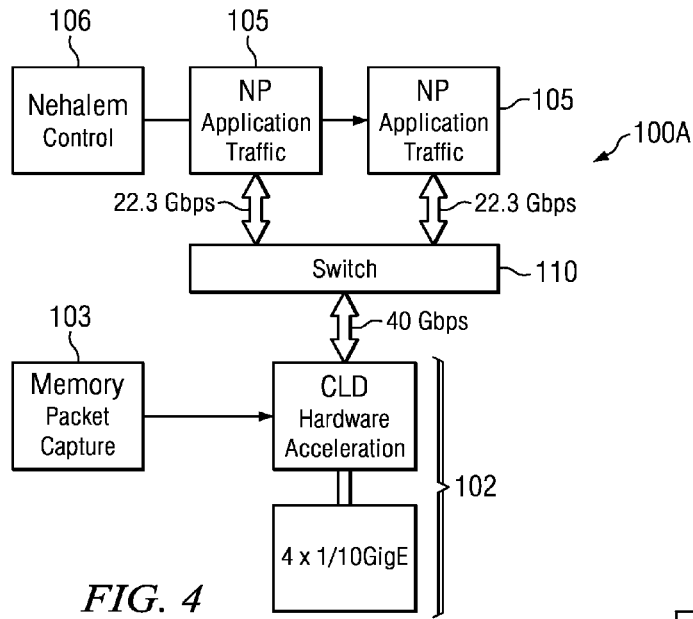
FIG. 4 is a high-level illustration of an example architecture of a card or blade of a network testing system, according to an example embodiment.

FIG. 4 is an high-level illustration of an example architecture 100A of a card 54 of network testing system 16, according to an example embodiment. As shown, example architecture 100A, referred to as a "testing and simulation architecture," may include a controller 106, two network processors 105 and multiple CLDs 102 coupled to a management switch 110, and memory 103 coupled to the CLDs 102.

In general, controller 106 is programmed to initiate and coordinate many of the functions of network testing system 16. In some embodiments, controller 106 may be a general purpose central processing unit (CPU) such as an Intel x86 compatible part. Controller 106 may run a general-purpose multitasking or multiprocessing operating system such as a UNIX or Linux variant.

In general, network processors 105 are programmed to generate outbound network data in the form of one or more data packets and are programmed to receive and process inbound network data in the form of one or more data packets. In some embodiments, network processors 105 may be general purpose CPUs. In other embodiments, network processors 105 may be specialized CPUs with instruction sets and hardware optimized for processing network data. For example, network processors may be selected from the Netlogic XLR family of processors.

Configurable logic devices (CLDs) 102 provide high-performance, specialized computation, data transfer, and data analysis capabilities to process certain data or computation intensive tasks at or near the network line rates.

As used herein, the term configurable logic device (CLD) means a device that includes a set of programmable logic units, internal memory, and high-speed internal and external interconnections. Examples of CLDs include field programmable gate arrays (FPGAs) (e.g. ALTERA STRATIX family, XILINX VIRTEX family, as examples), programmable logic devices (PLDs), programmable array logic devices (PAL), and configurable programmable logic devices (CPLDs) (e.g., ALTERA MAXII, as an example). A CLD may include task-specific logic such as bus controllers, Ethernet media access controllers (MAC), and encryption/decryption modules. External interconnections on a CLD may include serial or parallel data lines or busses. External interconnections may be specialized to support a particular bus protocol or may be configurable, general-purpose I/O connections. Serial and parallel data connections may be implemented via specialized hardware or through configured logic blocks.

Memory within a configurable logic device may be arranged in various topologies. Many types of configurable logic devices include some arrangement of memory to store configuration information. In some devices, individual programmable logic units or clusters of such units may include memory blocks. In some devices, one or more larger shared banks of memory are provided that are accessible to programmable logic units via internal interconnections or busses. Some configurable logic devices may include multiple arrangements of memory.

A configurable logic device may be configured, or programmed, at different times. In some circumstances, a configurable logic device may be programmed at the time of manufacture (of the configurable logic device or of a device containing the configurable logic device). This manufacture-time programming may be performed by applying a mask to the device and energizing a light or other electromagnetic wave form to permanently or semi-permanently program the device. A configurable logic device may also be programmed electronically at manufacture time, initialization time, or dynamically. Electronic programming involves loading configuration information from a memory or over an input/output connection. Some configurable logic devices may include onboard non-volatile memory (e.g., flash memory) for storing configuration information. Such an arrangement allows the configurable logic device to program itself automatically when power is applied.

As used herein, the terms processor and CPU mean general purpose computing devices with fixed instruction sets or microinstruction sets such as x86 processors (e.g., the INTEL XEON family and the AMD OPTERON family, as examples only), POWERPC processors, and other well-known processor families. The terms processor and CPU may also include graphics processing units (GPUs) (e.g., NVIDIA GEFORCE family, as an example) and network processors (NPs) (e.g, NETLOGIC XLR and family, INTEL IXP family, CAVIUM OCTEON, for example). Processors and CPUs are generally distinguished from CLDs as defined above (e.g., FPGAs, CPLDs, etc.) Some hybrid devices include blocks of configurable logic and general purpose CPU cores (e.g., XILINX VIRTEX family, as an example) and are considered CLDs for the purposes of this disclosure.

An application-specific integrated circuit (ASIC) may be implemented as a processor or CLD as those terms are defined above depending on the particular implementation.

As used herein, the term instruction executing device means a device that executes instructions. The term instruction executing device includes a) processors and CPUs, and b) CLDs that have been programmed to implement an instruction set.

Management switch 110 allows and manages communications among the various components of testing architecture 100A, as well as communications between components of testing architecture 100A and components of one or more other cards 54 (e.g., via backplane 56 as discussed above with respect to FIG. 3). Management switch 110 may be a Ethernet layer 2 multi-port switch.

Figure 5:
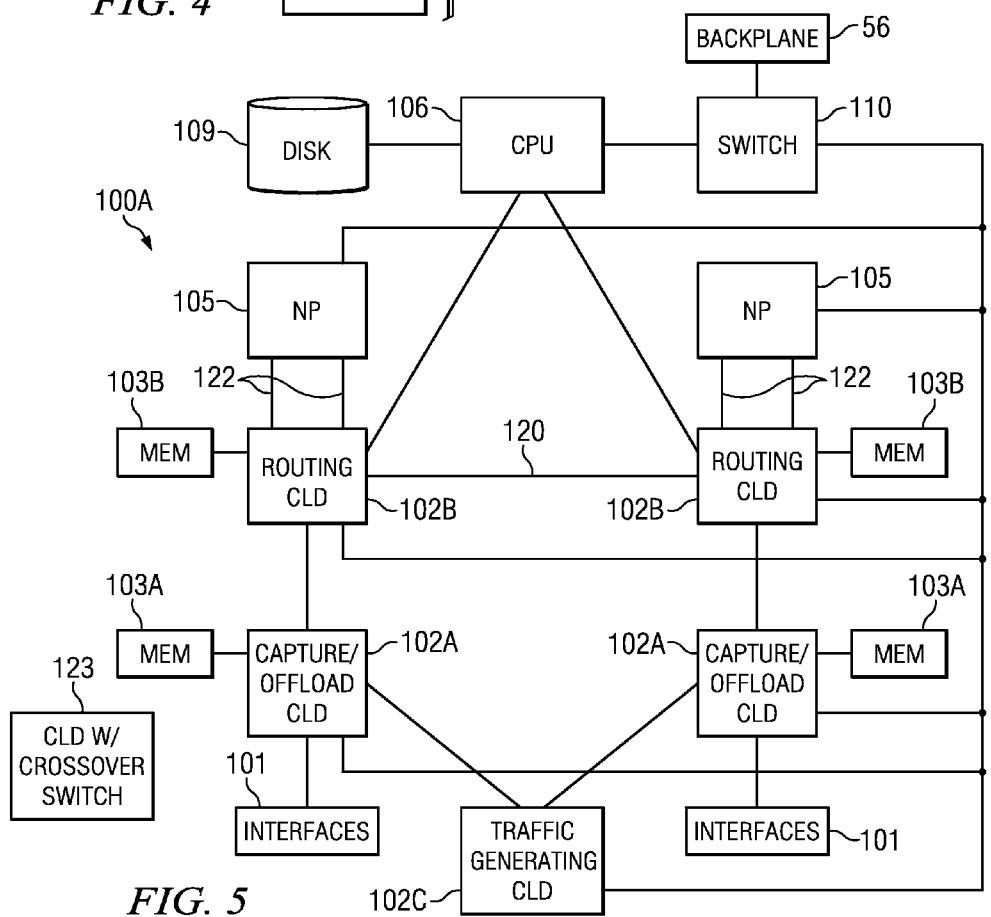
FIG. 5 is a more detailed illustration of the example testing and simulation architecture shown in FIG. 4, according to an example embodiment.

FIG. 5 is a more detailed illustration of the example testing and simulation architecture 100A shown in FIG. 4, according to an example embodiment. As shown, example testing and simulation architecture 100A includes controller 106; memory 109 coupled to controller 106; two network processors 105; various CLDs 102 (e.g., capture and offload CLDs 102A, router CLDs 102B, and a traffic generation CLD 102C); memory devices 103A and 103B coupled to CLDs 102A and 102B, respectively; management switch 110 coupled to network processors 105 and CLDs 102A, 102B, and 102C, as well as to backplane 56 (e.g., for connection to other cards 54); test interfaces 101 for connecting testing architecture 100A to a system 18 to be tested; and/or any other suitable components for providing any of the various functionality of network testing system 16 discussed herein or understood by one or ordinary skill in the art.

As discussed above, the components of example architecture 100A may be provided on a single blade 54, and multiple blades 54 may be connected together via backplane 54 to create larger systems. The various components of example architecture 100A are now discussed, according to example embodiments.

Test Interfaces 101

Test interfaces 101 may comprise any suitable communication interfaces for connecting architecture 100A to a test system 18 (e.g., network 12 or device 14). For example, test interfaces 101 may implement Ethernet network connectivity to a test system 18. In one embodiment, interfaces 101 may work with SFP+ modules, which allow changing the physical interface from 10 Mbps 10-BaseT twisted pair copper wiring to 10 Gbps long-range fiber. The test interfaces 101 may include one or more physical-layer devices (PHYa) and SFP+ modules. The PHYs and SFP+ modules may be configured using low-speed serial buses implemented by the capture and offload CLDs 102A (e.g., MDIO and I2C).

Capture and offload CLDs 102A

An CLD (Field Programmable Gate Array) is a reprogrammable device that can be modified to simulate many types of hardware. Being reprogrammable, it can be continually expanded to offer new acceleration and network analysis functionality with firmware updates. Example testing and simulation architecture 100A includes various CLDs designated to perform different functions, including two "capture and offload CLDs" 102A capturing data packets, two "router CLDs" 102B for routing data between components of architecture 100A, and a traffic generation CLD 102C for generating traffic that is delivered to the test system 18.

The capture and offload CLDs 102A have the following relationships to other components of testing and simulation architecture 100A:

1. Each capture and offload CLDs 102A is connected to one or more test interfaces 101. Thus, CLDs 102A are the first and last device in the packet-processing pipeline. In some embodiments, Ethernet MACs (Media Access Controllers) required to support 10/100/1000 and 10000 Mbps Ethernet standards are implemented within CLDs 102A and interact with the physical-layer devices (PHYs) that implement with the test interfaces 101.

2. Each capture and offload CLDs 102A is also connected to a capture memory device 103A that the CLD 102A can write to and read from. For example, each CLD 102A may write to capture memory 103 when capturing network traffic, and read from memory 103 when performing capture analysis and post-processing.

3. Each capture and offload CLDs 102A is connected to the traffic generation CLD 102C. In this capacity, the CLDs 102A is a pass-through interface; packets sent by the traffic generation CLD 102C are forwarded directly to an Ethernet test interface 101 for delivery to the test system 18

4. Each capture and offload CLDs 102A is connected to a router CLD 102B for forwarding packets to and from the NPs (105) and the controller 106.

5. Each capture and offload CLDs 102A is connected to the management switch 110 which allows for configuration of the CLD 102A and data extraction (in the case of capture memory 103) from the controller 106 or a network processor 105.

Each capture and offload CLDs 102A may be programmed to implement the following functionality for packets received from test interfaces 101. First, each capture and offload CLD 102A may capture and store a copy of each packet received from a test interface 101 in the capture memory 103 attached to CLD 102A, along with a timestamp for when that packet arrived. Simultaneously, the capture and offload CLD 102A may determine if the packet was generated originally by the traffic generation CLD 102C or some other subsystem. If CLD 102A determines that the packet was generated originally by the traffic generation CLD 102C, the CLD 102A computes receive statistics for the high-speed packet generation and measurement subsystem 22 of system 16 (e.g., refer to FIG. 1). In some embodiments, the packet is not forwarded to any other subsystem in this case. Alternatively, if capture and offload CLD 102A determines that a packet was not generated originally by the traffic generation CLD 102C, the capture and offload CLD 102A may parse the packet's layer 2/3/4 headers, validate all checksums (up to 2 layers), insert a receive timestamp, and forward the packet to the closest router CLD 102B for further processing.

Each capture and offload CLDs 102A may also be programmed to implement the following functionality for packets that it transmits to a test interface 101 for delivery to the test system 18. Packets received at a capture and offload CLD 102A from the traffic generation CLD 102C are forwarded by the CLD 102A as-is to the test interface 101 for delivery to the test system 18. Packets received at a capture and offload CLD 102A from a router CLD 102B may have instructions in the packet for specific offload operations to be performed on that packet before it is sent out trough a test interface 101. For example, packets may include instructions for any one or more of the following offload operations: (a) insert a timestamp into the packet, (b) calculate checksums for the packet on up to 2 layers of IP and TCP/UDP/ICMP headers, and/or (c) split the packet into smaller TCP segments via TCP segmentation offload. Further, a capture and offload CLD 102A may forward a copy of each packet (or particular packets) for storage in the capture memory 103B attached to the CLD 102A, along with a timestamp indicating when each packet was sent.

In addition to forwarding packets out a test interface 101, each capture and offload CLD 102A may be configured to "simulate" a packet being sent and instead of actually transmitting the packet physically on a test interface 101. This "loopback" mode may be useful for calibrating timestamp calculations for the rest of architecture 100A or system 16 by providing a fixed, known latency on network traffic. It may also be useful for debugging hardware and network configurations.

Capture Memory 103

As discussed above, each capture and offload CLDs 102A may be connected to capture memory device 103A that the CLD 102A can write to and read from. Capture memory device 103A may comprise any suitable type of memory device, e.g., DRAM, SRAM, or Flash memory, hard dive, or any other memory device with sufficient bandwidth. In some embodiments, a high-speed double data rate SDRAM (e.g., DDR2 or DDR3) memory interface is provided between each capture and offload CLDs 102A and its corresponding capture memory device 103A. Thus, data may be written at near maximum-theoretical rates to maintain an accurate representation of all packets that arrived on the network, within the limits of the amount of available memory.

Router CLDs 102B

Router CLDs 102B may have similar flexibility as the capture and offload CLD 102A. Router CLDs 102B may implement glue logic that allows the network processors 105 and controller 106 the ability to send and receive packets on the test network interfaces 101. Each router CLD 102B may have the following relationships to other components of testing and simulation architecture 100A:

1. Each router CLD 102B is connected to a capture and offload CLD 102A, which gives it a set of "local" test interface (e.g., Ethernet interfaces) 101 with which it can send and receive packets.

2. The router CLDs 102B are also connected to each other by an interconnection 120. Thus, packets can be sent and received on "remote" test interfaces 101 via an interconnected router CLD 102B. For example, the router CLDs 102B shown on the right side of FIG. 5 may send and receive packets via the test interface 101 shown on the left side of FIG. 5 by way of interconnection 120 between the two CLDs 102B.

3. A network processor 105 may connect to each router CLD 102B via two parallel interfaces 122 (e.g., two parallel interfaces 10 gigabit interfaces). These two connections may be interleaved to optimize bandwidth utilization for network traffic. For example, they may be used both for inter-processor communication (e.g., communications between network processors 105 and between controller 106 and network processors 105) and for sending traffic to and from the test interfaces 101.

4. Controller 106 also connects to each router CLD 102B. For example, controller 106 may have a single 10 gigabit connection to the each router CLD 102B, which may serve a similar purpose as the network processor connections 122. For example, they may be used both for inter-processor communication and for sending traffic to and from the test interfaces 101.

5. Each router CLD 102B may include a high-speed, low-latency SRAM memory. This memory may be used for storing routing tables, statistics, TCP reassembly offload, or other suitable data.

6. Each router CLD 102B is connected to the management switch 110, which may allow for configuration of the router CLD 102B and extraction of statistics, for example.

In some embodiments, for packets sent from a network processor 105 or controller 106, the sending processor 105, 106 first specifies a target address in a special internal header in each packet. This address may specify a test interface 101 or another processor 105, 106. The router CLD 102B may use the target address to determine where to send the packet next, e.g., it may direct the packet to the another router CLD 102B or to the nearest capture and offload CLD 102A.

For incoming packets from the test system 18 that arrive at a router CLD 102B, more processing may be required, because the target address header is absent for packets that have arrived from the test system 18. In some embodiments, the following post-processing is performed by a router CLD 102B for each incoming packet from the test system 18:

1. The router CLD 102B parses the packet is parsed to determine the VLAN tag and destination IP address of the packet.
2. The router CLD 102B consults a programmable table of IP addresses (e.g., implemented using memory built-in to the CLD 102B) to determine the address of the target processor 105, 106. This contents of this table may be managed by software of controller 106.
3. The router CLD 102B computes a hash function on the source and destination IP addresses and port numbers of the packet.
4. The router CLD 102B inserts a 32-bit hash value into the packet (along with any latency, checksum status, or other offload information inserted by the respective offload and capture CLD 102A).
5. The router CLD 102B then uses the hash value to determine the optimal physical connection to use for a particular processor address (because a network processor 105 has two physical connections 122, as shown in FIG. 5).
6. If the packet is not IP, has no matching VLAN, or has no other specific routing information, the router CLD 102B consults a series of "default" processor addresses in an auxiliary table (e.g., implemented using memory built-in to the CLD 102B).

In some embodiments, the router CLD 102B also implements TCP reassembly offloads and extra receive buffering using attached memory (e.g., attached SRAM memory). Further, it can be repurposed for any other suitable functions, e.g., for statistics collection by network processor 105.

Network Processors 105

Each network processor (NP) 105 may be a general purpose CPU with multiple cores, security, and network acceleration engines. In some embodiments, each network processor 105 may be an off-the-shelf processor designed for network performance. However, it may be very flexible, and may be suitable to perform tasks ranging from low-level, high-speed packet generation to application and user-level simulation. Each network processor 105 may have the following relationships to other components of testing and simulation architecture 100A:

1. Each network processor 105 may be connected to a router CLD 102B. The router CLD 102B may provide the glue logic that allows the processor 105 to send and receive network traffic to the rest of the system and out the test interfaces 101 to the test system 18.
2. Each network processor 105 may be also connected to the management switch 110. In embodiments in which the network processor 105 has no local storage (e.g. a disk drive), it may load its operating system and applications from the controller 106 via the management network. As used herein, the "management network" includes management switch 110, CLDs 102A, 102B, and 102C, backplane 56, and controller 106.
3. Because the CLDs 102 are all connected to the management switch 110, the network processors 105 may be responsible for managing and configuring certain aspects of the router CLDs 102B and offload and capture CLDs 102A.

In some embodiments, each network processor 105 may also have the following high-level responsibilities:

1. The primary TCP/IP stack used for network traffic simulation executes on the network processor 105.
2. IP and Ethernet-layer address allocation and routing protocols are handled by the network processor 105.
3. User and application-layer simulation also run on the network processor 105.
4. The network processor 105 works with software on the controller 106 to collect statistics, which may subsequently be used by the statistics and reporting engine 162 of subsystem 28.
5. The network processor 105 may also collect statistics from CLDs 102A, 102B, and 102C and report them to the controller 106. In an alternative embodiment, the controller 106 itself is configured to collect statistics directly from CLDs 102A, 102B, and 102C.

Controller 106

Controller 106 may compare any suitable controller programmed to control various functions of system architecture 100A. In some embodiments, controller 106 may be a general purpose CPU with multiple cores, with some network but no security acceleration. For example, controller 106 may be an off-the-shelf processor designed primarily for calculations and database performance. However, it can also be used for other tasks in the system 100A, and can even be used as an auxiliary network processor due to the manner in which it is connected to the system. Controller 106 may have the following relationships to other components of testing and simulation architecture 100A:

1. Controller 106 manages a connection with a removable disk storage device 109 (or other suitable memory device).
2. Controller 106 may connect to the management switch 110 to configure, boot, and manage all other processors 105 and CLDs 102 in the system 100A.
3. Controller 106 is connected to each router CLD 102B for the purpose of high-speed inter-processor communication with network processors 105 (e.g., to provide a 10 Gbps low-latency connection to the network processors 105 in addition to the 1 Gbps connection provided via the management switch 110), as well as generating network traffic via test interfaces 101.

Controller 106 may be the only processor connected directly to the removable disk storage 109. In some embodiments, all firmware or software used by the rest of the system 100A, except for firmware required to start the controller 106 itself (BIOS) resides on the disk drive 109. A freshly manufactured system 100A can self-program all other system components from the controller 106.

In some embodiments, controller 106 may also have the following high-level responsibilities:

1. Controller 106 serves the user-interface (web-based) used for managing the system 100A.
2. Controller 106 runs the middle-ware and server applications that coordinates the rest of the system operation.
3. Controller 106 serves the operating system and application files used by network processors 105.
4. Controller 106 hosts the database, statistics and reporting engine 162 of statistics collection and reporting subsystem 28.

Traffic Generation CLD 102C

The of the traffic generation CLD 102C is to generate traffic at line-rate. In some embodiment, traffic generation CLD 102C is configured to generate layer 2/layer 3 traffic; thus, traffic generation CLD 102C may be referred to as an L2/L3 traffic CLD.

In an example embodiment, traffic generation CLD 102C is capable of generating packets at 10 Gbps, using a small packet size (e.g., the smallest possible packet size), for the four test interfaces 101 simultaneously, or 59,523,809 packets per second. In some embodiments, this functionality may additionally or alternatively be integrated into each capture and offload CLD 102A. Traffic generation CLD 102C may have the following relationship to other components of testing and simulation architecture 100A:

1. Traffic generation CLD 102C is connected to capture and offload CLDs 102A. For example, traffic generation CLD 102C may be connected to capture and offload CLDs 102A via two 20 Gbps bi-directional links. Traffic generation CLD 102C typically only sends traffic, but is may also be capable of receiving traffic or other data.

2. Traffic generation CLD 102C is connected to the management switch 110 which allows for configuration of CLD 102C for generating traffic. Controller 106 may be programmed to configure traffic generation CLD 102C, via management switch 110.

Like other CLDs, traffic generation CLD 102C is reconfigurable and thus may be reconfigured to provide other functions as desired.

Buffer/Reassembly Memory 103B

A buffer/reassembly memory device 103B may be coupled to each router CLDs 102B. Each memory device 103B may comprise any suitable memory device. For example, each memory device 103B may comprise high-speed, low-latency QDR (quad data rate) SRAM memory attached to the corresponding router CLD 103B for various offload purposes, e.g., statistics collection, packet buffering, TCP reassembly offload, etc.

Solid State Disk Drive 109

A suitable memory device 109 may be coupled to controller 106. For example, memory device 109 may comprise a removable, solid-state drive (SSD) in a custom carrier that allows hot-swapping and facilitates changing software or database contents on an installed board. Disk drive 109 may store various data, including for example:

1. Firmware that configures the CLDs 102 and various perhipherals;

2. An operating system, applications, and statistics and reporting database utilized by the controller 106; and 3. An operating system and applications used by each network processor 105.

Management Switch 110

The management switch 110 connects to every CLD 102, network processor 105, and control CPU 106 in the system 100A. In some embodiments, management switch 110 comprises a management Ethernet switch configured to allow communication of for 1-10 Gbit traffic both between blades 54 and between the various processors 105, 106 and CLDs 102 on each particular blade 54. Management switch 110 may route packets based on the MAC address included in each packet passing through switch 110. Thus, management switch 110 may essentially act as a router, allowing control CPUs 106 to communication with network processor 105 and CLD 102 on the same card 54 and other cards 54 in the system 16. In such embodiment, all subsystems are controllable via Ethernet, such that additional processors and CLDs may be added by simply chaining management switches 110 together.

In an alternative embodiment, control CPU 106 of different cards 54 may be connected in any other suitable manner, e.g., by a local bus or PCI, for example. However, in some instances, Ethernet connectivity may provide certain advantages over a local bus or PCI, e.g., Ethernet may facilitate more types of communication between more types of devices than a local bus or PCI.

Backplane 56

Network testing system 16 may be configured to support any suitable number of cards or blades 54. In one embodiment, system 16 is configured to support between 1 and 14 cards 54 in a single chassis 50. Backplane 56 may provide a system for interconnecting the management Ethernet provided by the management switches 110 of multiple cards 54, as well as system monitoring connections for measuring voltages and temperatures on cards 54, and for debugging and monitoring CPU status on all cards 54, for example. Backplane 56 may also distribute clock signals between all cards 54 in a chassis 50 so that the time stamps for all CPUs and CLDs remain synchronized.

Network Testing Subsystems and System Operation

In some embodiments, network testing system 16 may provide an integrated solution that provides some or all of the following functions: (1) high-speed, high-resolution network packet capture, (2) high-speed packet generation and measurement, (3) application-level simulation and measurement, (4) security and exploit simulation and analysis, and (5) statistics collection and reporting. Thus, as discussed above with respect to FIG. 1, network testing system 16 may comprise a high-speed, high-resolution network packet capture subsystem 20, a high-speed packet generation and measurement subsystem 22, an application-level simulation and measurement subsystem 24, a security and exploit simulation and analysis subsystem 26, and/or a statistics collection and reporting subsystem 28. The architecture of system 16 (e.g., example architecture 100A discussed above or example architecture 100B discussed below) may allow for some or all of these subsystems 20-28 to operate simultaneously and cooperatively within the same software and hardware platform. Thus, system 16 may be capable of generating and analyzing packets at line rate, while simultaneously capturing that same traffic, performing application simulation and security testing.

Figure 6A:
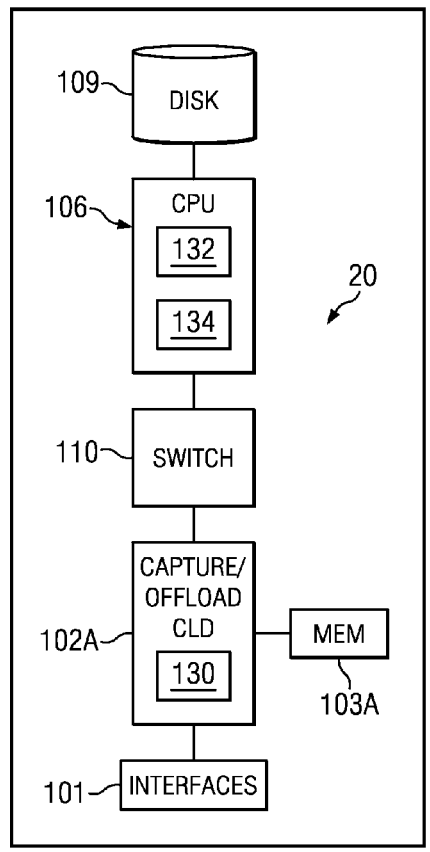
FIGS. 6A and 6B illustrates relevant components and an example process flow, respectively, of an example high-speed, high-resolution network packet capture subsystem of a network testing system, according to an example embodiment.
Figure 8B:
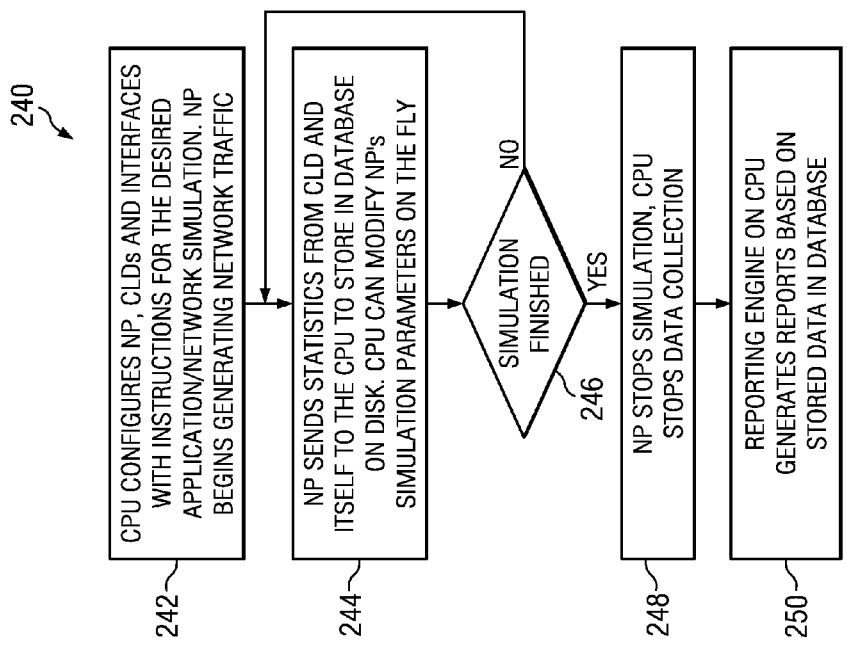
FIGS. 8A and 8B illustrates relevant components and an example process flow, respectively, of an example application-level simulation and measurement subsystem of a network testing system, according to an example embodiment.
Figure 8A:
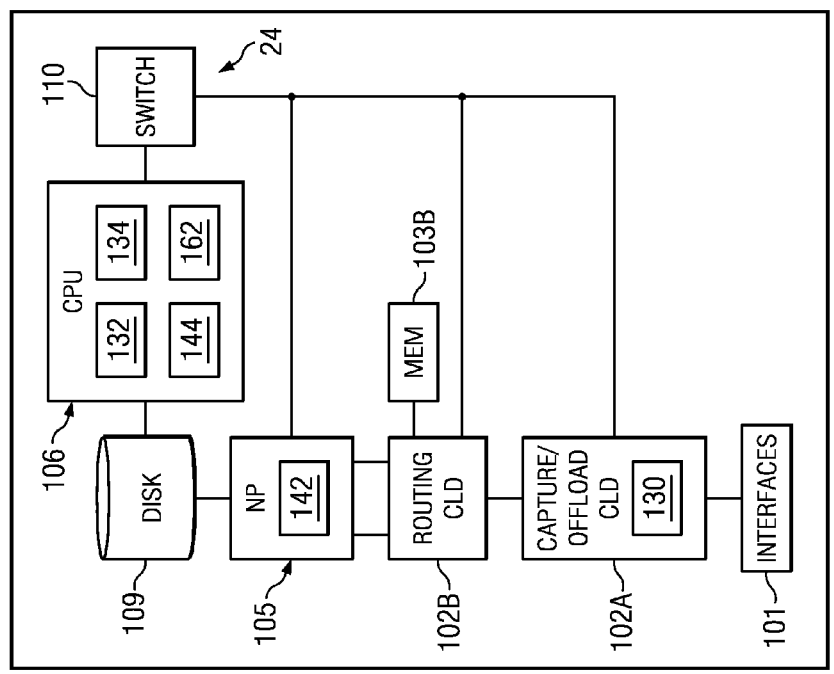
Figure 9A:
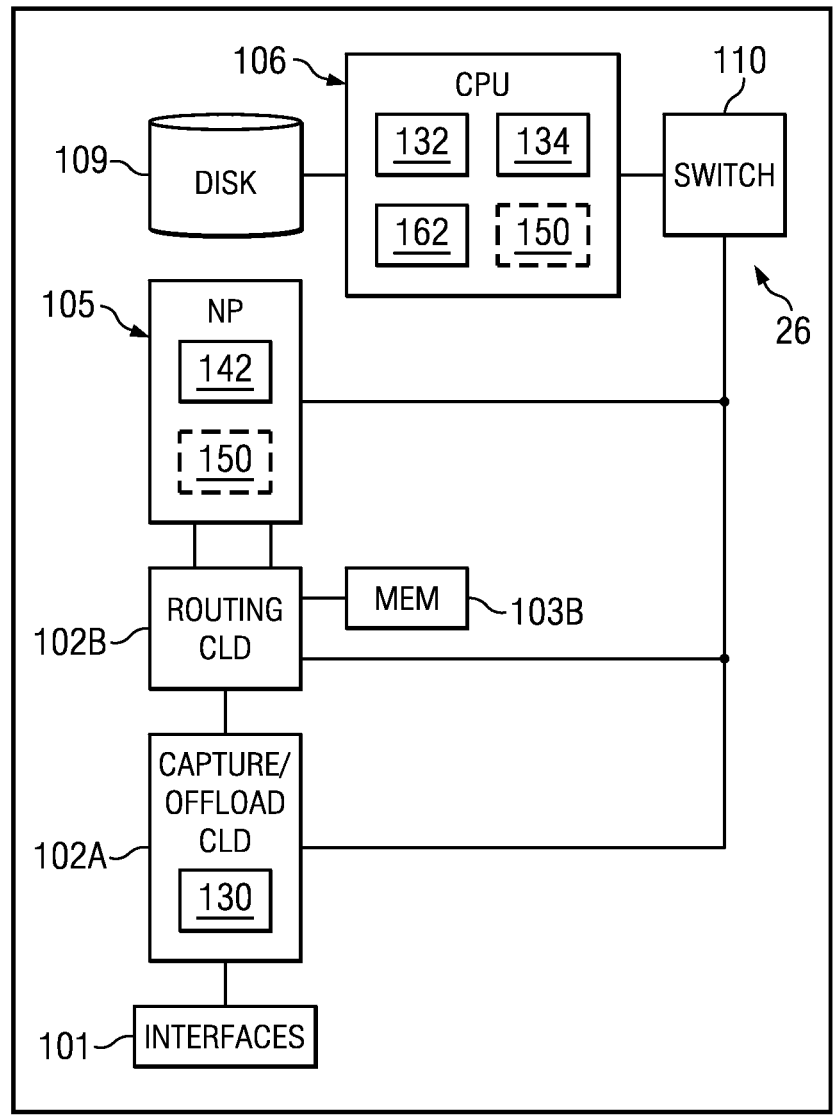
FIGS. 9A and 9B illustrates relevant components and an example process flow, respectively, of an example security and exploit simulation and analysis subsystem of a network testing system, according to an example embodiment.
Figure 9B:
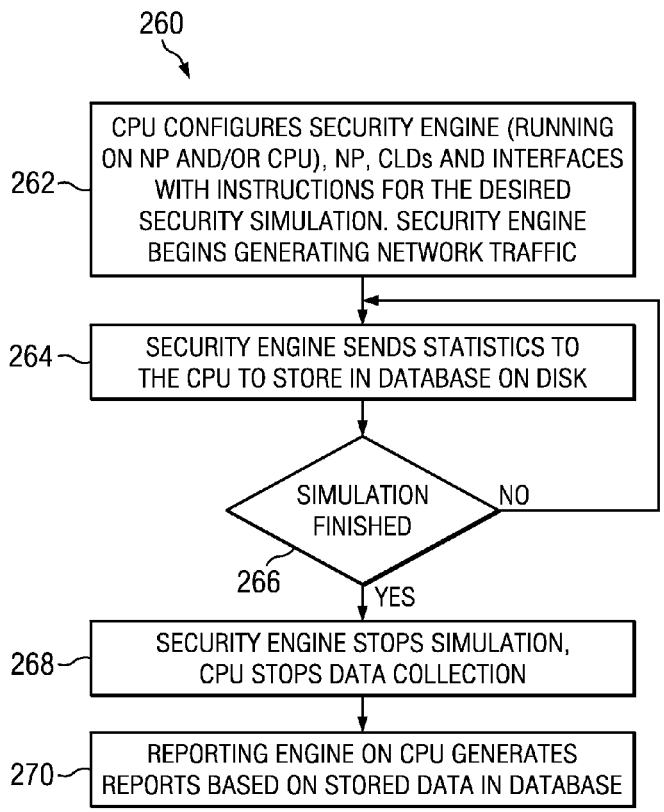
Figure 10:
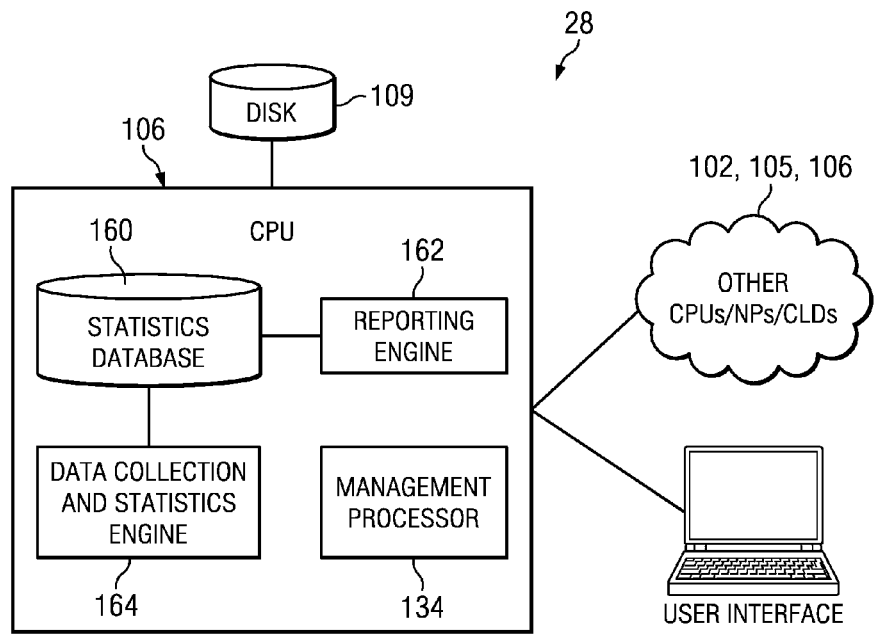
FIG. 10 illustrates relevant components of an example statistics collection and reporting subsystem of a network testing system, according to an example embodiment.

FIGS. 6A-10 illustrates the relevant components and method flows provided by each respective subsystem 20-28. In particular, FIGS. 6A and 6B illustrate relevant components and an example process flow provided by high-speed, high-resolution network packet capture subsystem 20; FIGS. 7A and 7B illustrate relevant components and an example process flow provided by high-speed packet generation and measurement subsystem 22; FIGS. 8A and 8B illustrate relevant components and an example process flow provided by application-level simulation and measurement subsystem 24; FIGS. 9A and 9B illustrate relevant components and an example process flow provided by security and exploit simulation and analysis subsystem 26; and FIG. 10 illustrate relevant components of statistics collection and reporting subsystem 28. The components of each subsystem 20-28 correspond to the components of example architecture 100A shown in FIGS. 4 and 5. However, it should be understood that each subsystem 20-28 may be similarly implemented by any other suitable system architecture, e.g., example architecture 100B discussed below with reference to FIG. 15.

High-Speed, High-Resolution Network Packet Capture Subsystem 20

Modern digital networks involve two or more or nodes that send data between each other over a shared, physical connection using units of data called packets. Packets contain information about the source and destination address of the nodes, application information. A network packet capture is the observing and storage of packets on the network for later debugging and analysis.

Network packet capture may be performed for various reasons, e.g., lawful intercept (tapping), performance analysis, and application debugging, for example. Packet capture devices can range in complexity from a simple desktop PC (most PCs have limited capture abilities built into their networking hardware) to expensive purpose-built hardware.

These devices vary in both their capacity and accuracy. A limited capture system is typically unable to capture all types of network packets, or sustain capture at the maximum speed of the network.

In contrast, network packet capture subsystem 20 of network testing system 16 may provide high-speed, high-resolution network packet capture capable of capturing all types of network packets (e.g., Ethernet, TCP, UDP, ICMP, IGMP, etc.) at the maximum speed of the tested system 18 (e.g., 4.88 million packets per second, transmit and receive, per test interface).

FIG. 6A illustrates relevant components of subsystem 20. In an example embodiment, network packet capture subsystem 20 may utilize the following system components:

(a) One or more physical Ethernet test interface (PHY) 101.

(b) An Ethernet MAC (Media Access Controller) 130 implemented inside CLD 102A per physical interface 101 which can be programmed to enter "promiscuous mode," in which the Ethernet MAC can be instructed to snoop all network packets, even those not addressed for it. Normally, an Ethernet MAC will only see packets on a network that include its local MAC Address, or that are addressed for "broadcast" or "multicast" groups. A MAC Address may be a 6-byte Ethernet media access control address. A capture system should be able to see all packets on the network, even those that are not broadcast, multicast, or addressed with the MAC's local MAC address. In some embodiments, it may be desirable to enter a super-promiscuous mode in order to receive even "erroneous" packets. Typical Ethernet MACs will drop malformed or erroneous packets even if in promiscuous mode on the assumption that a malformed or erroneous packet is likely damaged and the sender should resend a correct packet if the message is important. These packets may be of interest in a network testing device such as system 16 to identify and diagnose problem connections, equipment, or software. Thus, the Ethernet MAC of CLD 102A may be configured to enter super-promiscuous mode in order to see and capture all packets on the network, even including "erroneous" packets (e.g., corrupted packets as defined by Ethernet FCS at end of a packet).

(c) A capture and offload CLD 102A.

(d) Capture memory 103A connected to CLD 102A.

(e) Controller software 132 of controller 106 configured to start, stop and post-process packet captures.

(f) A management processor 134 of controller 106 configured to execute the controller software 132.

(g) Management switch 110 configured to interface and control the capture and offload CLD 102A from the management processor 134.

An example network packet capture process is now described. When the packet capture feature is enabled by a user via the user interface provided by the system 100A (see FIG. 13C), controller 106 may configure the Ethernet MACs 130 and PHYs 101 to accept all packets on the network, i.e., to enter "promiscuous mode." Controller 106 may then configure the capture and offload CLD 102A to begin storing all packets sent or received via the Ethernet MAC/PHY in the high-speed capture memory 103A attached to the CLD 102A. When the Ethernet MAC/PHY sends or receives a packet, it is thus captured in memory 103A by CLD 102A. For each captured packet, CLD 102A also generates and records a high-resolution (e.g., 10 nanosecond) timestamp in memory 103A with the respective packet. This timestamp data can be used to determine network attributes such as packet latency and network bandwidth utilization, for example.

Using the architecture discussed herein, system 16 can store packets sent and received at a rate equivalent to the maximum rate possible on the network. Thus, as long as there is sufficient memory 103A attached to the CLD 102A, a 100% accurate record of the traffic that occurred on test system 18 may be recorded. If memory 103A fills up, a wrapping mechanism of CLD 102A allows CLD 102A to begin overwriting the oldest packets in memory with newer packets.

To achieve optimal efficiency, CLD 102A may store packets in memory in their actual length and may use a linked-list data structure to determine where the next packet begins. Alternatively, CLD 102A may assume all packets are a fixed size. While this alternative is computationally efficient (a given packet can be found in memory by simply multiplying by a fixed value), memory space may be wasted when packets captured on the network are smaller than the assumed size.

CLD 102A may also provide a tail pointer that can be used to walk backward in the list of packets to find the first captured packet. Once the first captured packet is located, the control software 132 can read the capture memory 103A and generate a diagnostic file, called a PCAP (Packet CAPture) file, which can be sent to the user and/or stored in disk 109. This file may be downloaded and analyzed by a user using a third-party tool.

Because there can be millions of packets in the capture memory 103A, walking through all of the packets in the packet capture to located the first captured packet based on the tail pointer may take considerable time. Thus, CLD 102A may provide a hardware-implementation that walks the linked list and can provide the head pointer directly. In addition, copying the capture memory 103A to a file that is usable for analysis can take additional time. Thus, CLD 102A may implement a bulk-memory-copy mode that speeds up this process.

Figure 6B:
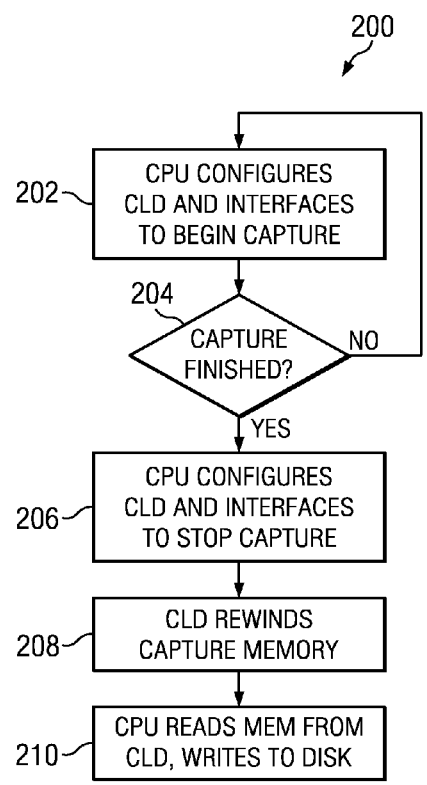

FIG. 6B illustrates an example network packet capture process flow 200 provided by subsystem 20 shown in FIG. 6A and discussed above. At step 202, controller 106 may configure the capture and offload CLD 102A and test interfaces 101 to begin packet capture, e.g., as discussed above. At step 204, the packet capture may finish. Thus, at step 206, controller 106 may configure CLD 102A and test interfaces 101 to stop packet capture.

At step 208, CLD 102A may rewind capture memory 103A, e.g., using tail pointers as discussed above, or using any other suitable technique. At step 210, controller 106 may read dta from capture memory 103A and write to disk 109, e.g., in the form of a PCAP (Packet CAPture) file as discussed above, which file may then be downloaded and analyzed using third-party tools.

Table 1 provides a comparison of the performance of network packet capture subsystem 20 to certain conventional solutions, according to an example embodiment of system 16.

TABLE 1

|  | Network packet capture subsystem 20 | Conventional desktop PC | Conventional dedicated solution |
| --- | --- | --- | --- |
| Storage medium | RAM (4 GB) | disk | disk (high-speed) |
| Timestamp resolution | nanoseconds | milliseconds | nanoseconds |
| Speed per interface | 14M pps | 100k pps | Millions of pps |

In some embodiments, dedicated packet capture memory and hardware may be omitted, e.g., for design simplicity, cost, etc. In such embodiments, a software-only implementation of packet capture may instead be provided, although such implementation may have reduced performance as compared with the dedicated packet capture memory and hardware subsystem discussed above.

High-Speed Packet Generation and Measurement Subsystem 22

Modern networks can transport packets at a tremendous rate. A comparison of various network speeds and the maximum packets/second that they can provide is set forth in Table 2.

TABLE 2

| Network speed | Era | Maximum packets/second |
| --- | --- | --- |
| 10 Mbps Ethernet | early 1990s | 14,880 packets/sec |
| 100 Mbps Ethernet | late 1990s | 148,809 packets/sec |
| 1 Gbps Ethernet | early 2000s | 1,488,095 packets/sec |
| 10 Gbps Ethernet | late 2000s | 14,880,952 packets/sec |
| 40 Gbps Ethernet | early 2010s | 59,523,809 packets/sec |
| 100 Gbps Ethernet | early 2010s | 148,809,523 packets/sec |

The data rate for the fastest network of a given era typically exceeds the number of packets/second that a single node on the network can practically generate. Thus, to test the network at its maximum-possible packet rate, one might need to employ either many separate machines, or a custom solution dedicated to generating and receiving packets at the highest possible rate.

Figure 7A:
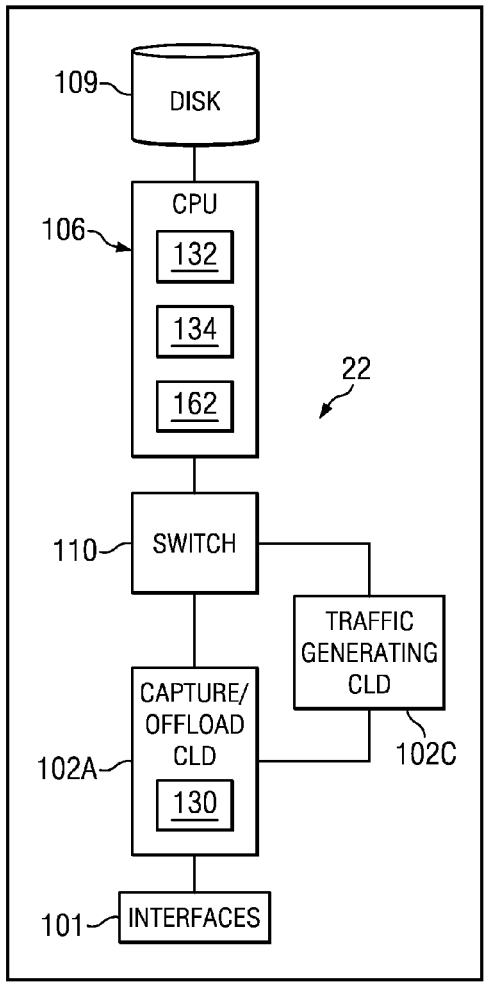
FIGS. 7A and 7B illustrates relevant components and an example process flow, respectively, of an example high-speed packet generation and measurement subsystem of a network testing system, according to an example embodiment.

As discussed above, network testing system 16 may include a high-speed packet generation and measurement subsystem 22 for providing packet generation and measurement at line rate. FIG. 7A illustrates relevant components of subsystem 22. In an example embodiment, high-speed packet generation and measurement subsystem 22 may utilize the following system components:

(a) One or more physical Ethernet test interface (PHY) 101.

(b) An Ethernet MAC (Media Access Controller) 130 on capture and offload CLD 102A per physical interface 101.

(c) An L2/L3 traffic generation CLD 102C configured to generate packets to be sent to the Ethernet MAC 130.

(d) A capture and offload CLD 102A configured to analyze packets coming from the Ethernet MAC 130.

(e) Controller software 132 of controller 106 configured to generate different types of network traffic.

(f) Controller software 132 of controller 106 configured to manage network resources, allowing the CLD-generated traffic to co-exist with the traffic generated by other subsystems, at the same time.

(g) A management processor 134 of controller 106 configured to execute the controller software 132.

The CLD solution provided by subsystem 22 is capable of sending traffic and analyzing traffic at the maximum packet rate for 10 Gbps Ethernet, which may be difficult for even a high-end PC. Additionally, subsystem 22 can provide diagnostic information at the end of each packet it sends. This diagnostic information may include, for example:

1. a checksum (e.g., CRC32, for verifying packet integrity);
2. a sequence number (for determining if packets were reordered on the network);
3. a timestamp (for determining how long the packet took to traverse the network); and/or
4. a signature (for uniquely distinguishing generated traffic from other types of traffic).

The checksum may be placed at the end of each packet. This checksum covers a variable amount of the packet, because as a packet traverses the network, it may be expected to change in various places (e.g., the time-to-live field, or the IP addresses). The checksum allows verification that a packet has not changed in unexpected ways or been corrupted in-transit. In some embodiments, the checksum is a 32-bit CRC checksum, which is more reliably able to detect certain types of corruption that the standard 16-bit 2's complement TCP/IP checksums.

The sequence number may allow detection of packet ordering even if the network packets do not normally have a method of detecting the sequence number. This sequence number may be 32-bit, which wraps less quickly on a high-speed network as compared to other standardized packet identifiers, e.g., the 16-bit IP ID.

The timestamp may have any suitable resolution. For example, the timestamp may have a 10 nanosecond resolution, which is fine-grained enough to measure the difference in latency between a packet traveling through a 1 meter and a 20 meter optical cable (effectively measuring the speed of light.)

The signature field may allows the CLD 102A to accurately identify packets that need analysis from other network traffic, without relying on the simulated packets having any other identifiable characteristics. This signature also allows subsystem 22 to operate without interfering with other subsystems while sharing the same test interfaces 101.

Figure 7B:
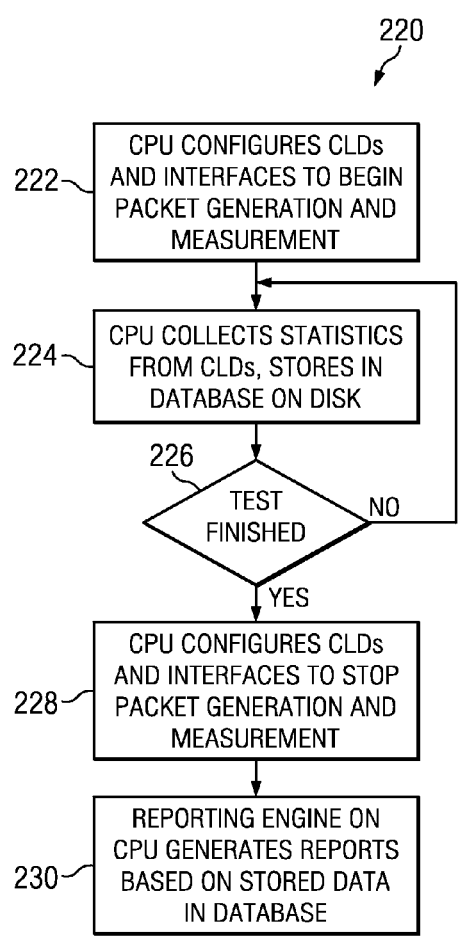

FIG. 7B illustrates an example network packet capture process flow 220 provided by subsystem 22 shown in FIG. 7A and discussed above. At step 222, controller 106 may configure traffic generation CLD 102C, capture and offload CLDs 102A, and test interfaces 101 to begin packet generation and measurement. At step 224, controller 106 may collect statistics from capture and offload CLDs 102A related to the kind and quantity of network traffic that was generated and received, and store the statistics in disk 109. At step 226, the test finishes. Thus, at step 228, controller 106 may configure traffic generation CLD 102C, capture and offload CLDs 102A, and test interfaces 101 to stop packet generation and measurement. At step 230, a reporting engine 162 on controller 106 may generate reports based on data collected and stored at step 224.

Application-Level Simulation and Measurement Subsystem 24

While high-speed packet generation and analysis can be used to illustrate raw network capacity, integrity and latency, modern networks also analyze traffic beyond individual packets and instead look at application flows. This is known as deep packet inspection. Also, it is often desired to measure performance of not only the network itself but individual devices, such as routers, firewalls, load balancers, servers, and intrusion detection and prevention systems, for example.

To properly exercise these systems, higher-level application data is sent on top of the network. Network testing system 16 may include an application-level simulation and measurement subsystem 24 to provide such functionality. FIG. 8A illustrates relevant components of subsystem 24. In an example embodiment, application-level simulation and measurement subsystem 24 may utilize the following system components:

(a) One or more physical Ethernet test interface (PHY) 101.

(b) An Ethernet MAC (Media Access Controller) 130 capture and offload CLD 102A per physical interface 101.

(c) Multiple network processors 105 configured to generate and analyze high-level application traffic.

(d) Multiple capture and offload CLDs 102A and router CLDs 102B configured to route traffic between the Ethernet MACs 130 and the network processors 105 and to perform packet acceleration offload tasks.

(e) Software 142 of network processor 105 configured to generate application traffic and generate statistics.

(f) Controller software 132 of controller 106 to manage network resources, allowing the network processor-generated application traffic to co-exist with the traffic generated by other subsystems, at the same time.

(g) A management processor 134 on controller 106 configured to execute the controller software 132.

Application-Level Simulation: Upper Layer

In some embodiments, the network processors 105 execute software 142 that implements both the networking stack (Ethernet, TCP/IP, routing protocols, etc.) and the application stack that is typically present on a network device. In this sense, the software 142 can simulate network clients (e.g., Desktop PCs), servers, routers, and a whole host of different applications. This programmable "application engine" software 142 is given instructions on how to properly simulate a particular network or application by an additional software layer. This software layer may provide information such as:

1. Addresses and types of hosts to simulate on the network,
2. Addresses and types of hosts to target on the network,
3. Types of applications to simulate, and/or
4. Details on how to simulate a particular application (mid-level instructions for application interaction).

The details on how to simulate applications reside in software 144 that runs on the management processor 134 on controller 106. A user can model an application behavior in a user interface (see, e.g., FIGS. 13A-13D) that provides high-level application primitives, such as to make a database query or load a web page, for example. These high-level behaviors are translated by software 144 into low-level instructions, such as "send a packet, expect 100 bytes back," which are then executed by the application engine 142 running on the network processor 105. New applications can be implemented by a user (e.g., a customer or in-house personnel), without any changes to the application engine 142 itself. Thus, it is possible to add new functionality without upgrading software.

Application-Level Simulation: Lower Layer

Physically, the network processors 105 connect to multiple CLDs 102. All packets that leave the network processor 105 first pass through one or more CLDs 102 before they are sent to the Ethernet interfaces 101, and all packets that arrive via the Ethernet interfaces 101 pass through one or more CLDs 102 before they are forwarded to a network processor 105. The CLDs 102 are thus post- and pre-processors for all network processor traffic. In addition, the packet capture functionality provided by subsystem 20 (discussed above) is able to capture all network processor-generated traffic.

The CLDs 102A and 102B may be configured to provide some or all of the following additional functions:

1. Programmable timestamp insertion and measurement (by CLD 102A),
2. TCP/IP Checksum offload (by CLD 102A),
3. TCP segmentation offload (by CLD 102A), and/or
4. Incoming packet routing and load-balancing, to support multiple network processors using the same physical interface (by CLD 102B).

For timestamp insertion, a network processor 105 can request that the CLD 102A insert a timestamp into a packet originally generated by the network processor 105 before it enters the Ethernet. The CLD 102A can also supply a timestamp for when a packet arrives before it is forwarded to a network processor 105. This is useful for measuring high-resolution, accurate packet latency in a way typically only available to a simple packet generator on packets containing realistic application traffic. Unlike conventional off-the-shelf hardware that can insert and capture timestamps, CLD 102A is configured to insert a timestamp into any type of packet, including any kind of packets, e.g., PTP, IP, TCP, UDP, ICMP, or Ethernet-layer packets, instead of only PTP (Precision Time Protocol) packets as part fo the IEEE 1588 standard.

TCP/IP checksum offload may also be performed by the CLDs 102A. Unlike a typical hardware offload implemented by an off-the-shelf Ethernet controller, the CLD implementation of system 16 has an additional feature in that any packet can have multiple TCP/IP checksums computed by CLD 102A on more than one header layer in the packet. This may be especially useful when generating packets that are tunneled, and thus have multiple TCP, IP or UDP checksums. Conventional solutions cannot perform a checksum on more than one header layer in a packet.

For TCP segmentation offload, a single large TCP packet can automatically be broken into smaller packets by CLD 102A to fit the maximum transmission unit (MTU) of the network. TCP segmentation offload can save a great deal of CPU time when sending data at high speeds. Conventional solutions are typically implemented without restrictions, such as all offloaded TCP segments will have the same timestamp. In contrast, the CLD implementation of system 16 allows timestamping of individual offloaded TCP segments as if they had been sent individually by the network processor 105.

Incoming packet routing and load balancing enable multiple network processors 105 to be used efficiently in a single system. Conventional load-balancing systems rely on some characteristic of each incoming packet to be unique, such as the IP or Ethernet address. In the event that the configured attributes for incoming packets are not unique, a system can make inefficient use of multiple processors, e.g., all traffic goes to one processor rather than being fairly distributed. In contrast, the CLD 102B implementation of packet routing in system 16 provides certain features not typically available in commodity packet distribution systems such as TCAMs or layer-3 Ethernet switches. For example, the CLD 102B implementation of system 16 may provide any one or more of the following features:

1. The CLD implementation of system 16 can be reconfigured to parse packets two headers deep. If all traffic has a single outer header, e.g., tunneled traffic, the system can look further to find unique identifiers in the packets.

2. The system 16 may employ a hardware implementation of jhash (a hashing algorithm designed by Bob Jenkens, available at http://burtleburtle.net/bob/c/lookup3.c) to distribute packets, which is harder to defeat than other common implementation such as CRC and efficiently distributes packets that differ by very few bits.

3. Packets can be routed on thousands of arbitrary IP ranges as well using a lookup table built into the CLDs 102B.

FIG. 8B illustrates an example network packet capture process flow 240 provided by application-level simulation and measurement subsystem 24 shown in FIG. 8A and discussed above. At step 242, controller 106 may configure network processors 105, traffic generation CLD 102C, capture and offload CLDs 102A, and test interfaces 101 for a desired application/network simulation. A network processor 105 may then begin generating network traffic, which is delivered via test interfaces 101 to the test system 18. At step 244, the network processor 105 may send statistics from itself and from CLDs 102A and 102B to controller 106 for storage in disk drive 109. Controller 106 may dynamically modify simulation parameters of the network processor 105 during the simulation.

At step 246, the simulation finishes. Thus, at step 248, the network processor 105 stops simulation, and controller 106 stops data collection regarding the simulation. At step 250, the reporting engine 162 on controller 106 may generate reports based on data collected and stored at step 244.

Security and Exploit Simulation and Analysis Subsystem 26

In both isolated networks and the public Internet, vulnerable users, applications and networks continue to be exploited in the form of malware (virus, worms), denial of service (DoS), distributed denial of service (DDoS), social engineering, and other forms of attack. Network testing system 16 may be configured to generate and deliver malicious traffic to a test system 18 at the same time that it generates and delivers normal "background" traffic to test system 18. In particular, security and exploit simulation and analysis subsystem 26 of system 16 may be configured to generate such malicious traffic. This may be useful for testing test system 18 according to various scenarios, such as for example:

1. "Needle in a haystack" or lawful intercept testing (i.e., locating bad traffic among good traffic),
2. Testing the effectiveness of intrusion prevention/detection mechanisms, and/or
3. Testing the effectiveness of intrusion prevention/detection mechanisms under load.

FIG. 9A illustrates relevant components of security and exploit simulation and analysis subsystem 26, according to an example embodiment. In this embodiment, subsystem 26 may utilize the following system components:

(a) One or more physical Ethernet test interface (PHY) 101.

(b) An Ethernet MAC (Media Access Controller) 130 implemented in CLD 102A (see FIG. 6A) per physical interface 101.

(c) Multiple network processors 105 configured to generate and analyze high-level application traffic.

(d) Multiple capture and offload CLDs 102A and router CLDs 102B configured to route traffic between the Ethernet MACs 130 and the network processors 105 and to perform packet acceleration offload tasks.

(e) A "security engine" 150 comprising software 150 configured to generate malicious application traffic and to verify its effectiveness. Security engine 150 may be provided on a network processor 105 and/or controller 106, and is thus indicated by dashed lines in FIG. 9A.

(f) Controller software 132 of controller 106 to manage network resources, allowing the malicious application traffic to co-exist with the traffic generated by other subsystems, at the same time.

(g) A management processor 134 on controller 106 configured to execute the controller software 132, collect and store statistics, and/or generate malicious application traffic.

As mentioned above, security engine 150 may be provided on a network processor 105 and/or controller 106. For example, in some scenarios, the application engine 142 employed by the network processor 105 is used to generate malicious traffic when high-performance is required. In other scenarios, the management processor 134 of controller 106 can generate malicious traffic packet-by-packet and forward these to the network processor 105 as if they were generated locally. This mechanism may be employed for more sophisticated attacks that do not require high performance.

FIG. 9B illustrates an example network packet capture process flow 260 provided by security and exploit simulation and analysis subsystem 26 shown in FIG. 9A and discussed above. At step 262, controller 106 may configure the security engine 150 (running on network processor(s) 105 and/or controller 106), network processors 105, traffic generation CLD 102C, capture and offload CLDs 102A, and test interfaces 101 with instructions for a desired security simulation. Security engine 150 may then begin generating network traffic, which is delivered via test interfaces 101 to the test system 18. At step 264, security engine 150 may send statistics to controller 106 for storage in disk drive 109. Controller 106 may dynamically modify simulation parameters of the security engine 150 during the simulation.

At step 266, the simulation finishes. Thus, at step 268, security engine 150 stops simulation, and controller 106 stops data collection regarding the simulation. At step 270, the reporting engine 162 on controller 106 may generate reports based on data collected and stored at step 264.

Statistics Collection and Reporting Subsystem 28

The management processor 134 of controller 106, in addition to providing a place for much of the control software for various subsystems to execute, may also host a statistics database 160 and reporting engine 162. Statistics database 162 both stores raw data generated by other subsystems as well as derives its own data. For instance, subsystem 20 or 22 may report the number and size of packets generated on a network over time. Statistics database 160 can then compute the minimum, maximum, average, standard deviation, and/or other statistical data regarding the data rate from these two pieces of data. Reporting engine 162 may comprise additional software configured to convert statistics into reports including both data analysis and display of the data in an user-readable format.

FIG. 10 illustrates relevant components of statistics collection and reporting subsystem 28, according to an example embodiment. In this embodiment, the sub-components of the statistics and reporting subsystem 28 may include:

1. A statistics database 160.
2. A storage device 109 to store data collected by other sub-components (e.g. a solid-state flash drive).
3. A data collection engine 164 configured to converts raw data from sub-components into a normalized form for the database 160.
4. A reporting engine 162 configured to allow analyzing and viewing data both in real-time and offline.
5. A management processor 134 configured to run the database 160 and software engines 162 and 164.

Reporting engine 162 and data collection engine 164 may comprise software-based modules stored in memory associated with controller 106 (e.g., stored in disk 109) and executed by management processor 134.

Figure 11:
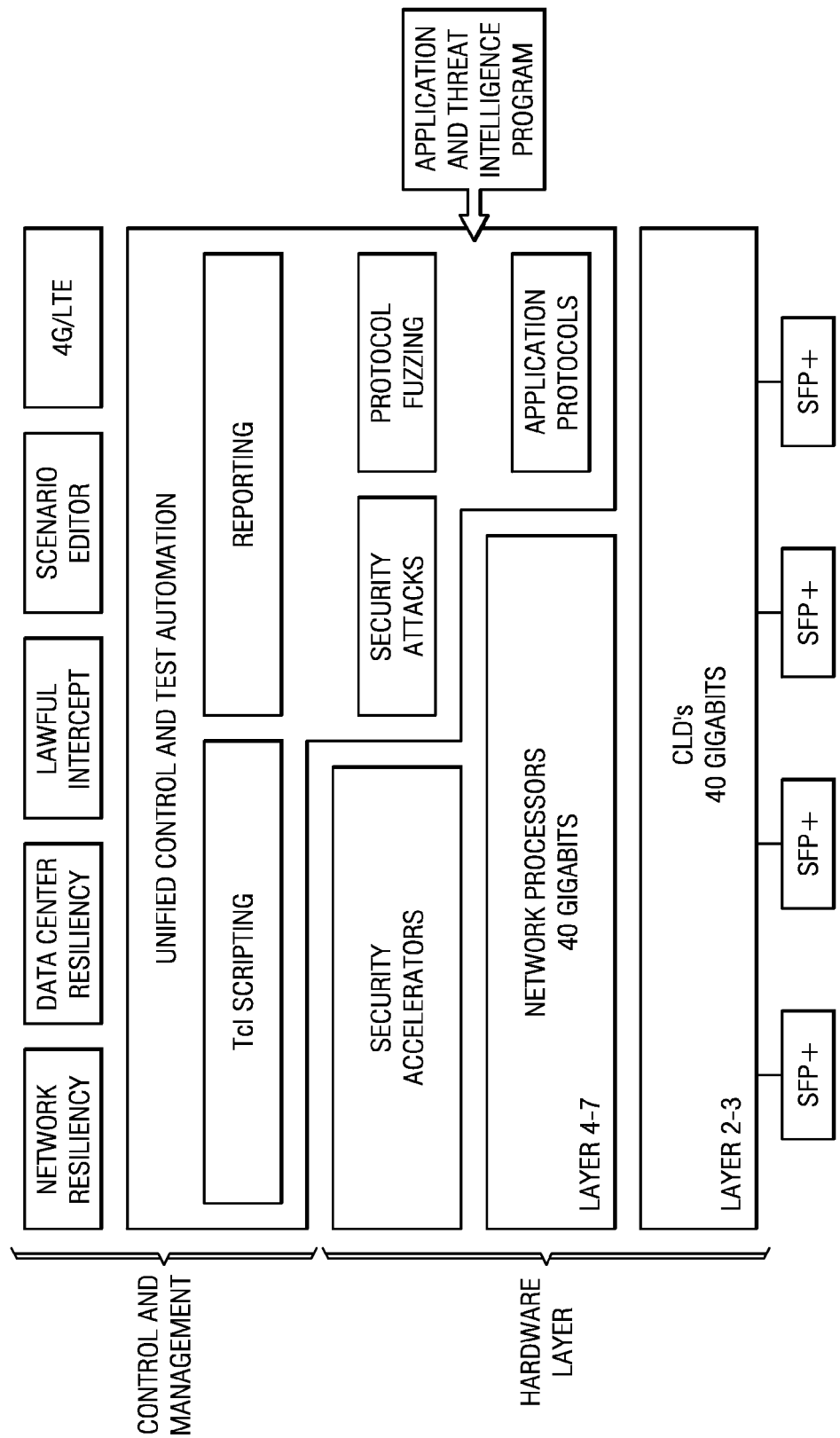
FIG. 11 illustrates a layer-based view of an example application system architecture of a network testing system, according to example embodiments.

FIG. 11 illustrates one view of the application system architecture of system 16, according to certain embodiments of the present disclosure. The system architecture may be subdivided into software control and management layer and hardware layers. Functionality may be implemented in one layer or may be implemented across layers.

In the control and management layer, example applications are shown including network resiliency, data center resiliency, lawful intercept, scenario editor, and 4G/LTE. Network and data center resiliency applications may provide an automated, standardized, and deterministic method for evaluating and ensuring the resiliency of networks, network equipment, and data centers. System 16 provides a standard measurement approach using a battery of real-world application traffic, real-time security attacks, extreme user load, and application fuzzing. That battery may include a blended mix of application traffic and malicious attacks, including obfuscations.

Lawful intercept applications may test the capabilities of law enforcement systems to process realistic network traffic scenarios. These applications may simulate the real-world application traffic that lawful intercept systems must process—including major Web mail, P2P, VoIP, and other communication protocols—as well as triggering content in multiple languages. These applications may create needle-in-a-haystack scenarios by embedding keywords to ensure that a lawful intercept solution under test detects the appropriate triggers; tax the performance of tested equipment with a blend of application, attack, and malformed traffic at line rate; and emulate an environment's unique background traffic by selecting from more than tens of application protocols, e.g., SKYPE, VoIP, email, and various instant messaging protocols.

The scenario editor application may allow modification of existing testing scenarios or the creation of new scenarios using a rules-based interface. The scenario editor application may also enable configuration of scenarios based on custom program logic installed on system 16.

The 4G/LTE application may allow testing and validation of mobile networking equipment and systems including mobile-specific services like mobile-specific web connections, mobile device application stores, and other connections over modern wireless channels. These applications may create city-scale mobile data simulations to test the resiliency of mobile networks under realistic application and security traffic. Tests may measure mobility infrastructure performance and security under extreme network traffic conditions; stress test key LTE network components with emulation of millions of user devices and thousands of transmission nodes; and validate per-device accounting, billing, and policy mechanisms.

Tcl scripting modules may allow web-based user interface design and configuration of existing and user-created applications. Reporting modules may allow generation of standardized reports on test results, traffic analysis, and ongoing monitoring data.

Supporting those applications is the unified control and test automation subsystem including two software modules, Tcl scripting and reporting, and three hardware modules, security attacks, protocol fuzzing, and application protocols. The latter three modules comprise the application and threat intelligence program. Underlying the applications are three hardware layers including security accelerators, network processors, and configurable logic devices (CLDs).

Security accelerator modules may provide customizable hardware acceleration of security protocols and functions. Security attack modules may provide customizable hardware implementation of specific security attacks that may be timing specific or may require extremely high traffic generation (e.g., simulation of bot-net and denial of service attacks). Protocol fuzzying modules may test edge cases in networking system implementations. A protocol fuzzying module may target a specific data value or packet type and may generate a variety of different values (valid or invalid) in turn. The goal of a fuzzer may be to provide malicious or erroneous data or to provide too much data to test whether a device will break and therefore indicate a vunerability. A protocol fuzzying module may also identify constraints by systematically varying as aspect of the input data (e.g., packet size) to determine acceptable ranges of input data. Application protocols modules may provide customizable hardware implementation or testing of specific network application protocols to increase overall throughput.

Figure 12:
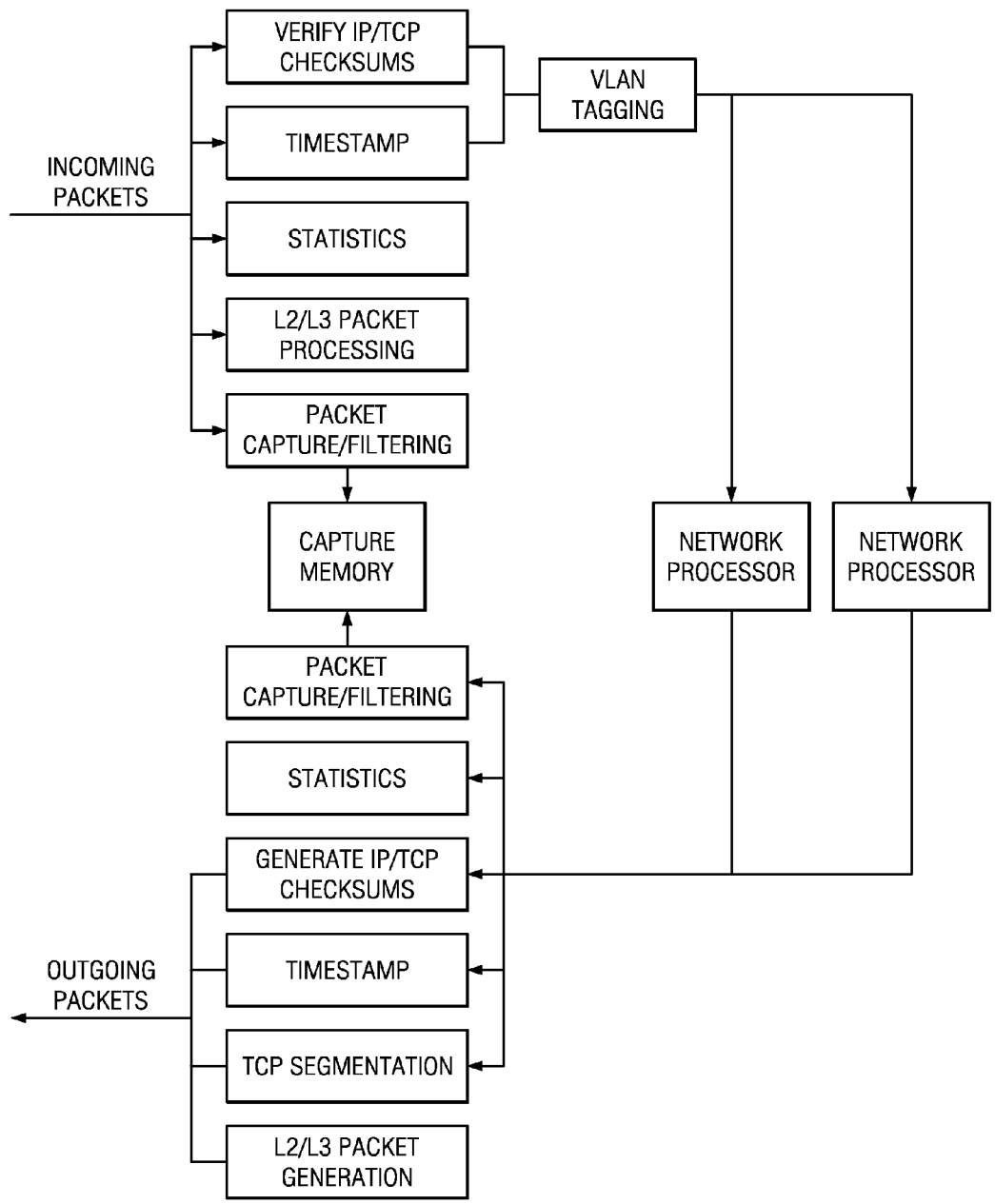
FIG. 12 illustrates select functional capabilities implemented by of a network testing system, according to certain embodiments.

FIG. 12 illustrates one view of select functional capabilities implemented by system 16, according to certain embodiments of the present disclosure. Incoming packets, also called ingress packets, arriving on external interfaces may be processed by one or more of several core functional modules in high-speed configurable logic devices, including:

Verify IP/TCP Checksums: Checksums provide some indication of network data integrity and are calculated at various networking layers including Layer 2 (Ethernet), Layer 3 (Internet Protocol), and Layer 4 (Transport Control Protocol). Bad checksums are identified and may be recorded.

Timestamp: Timestamps may be used to measure traffic statistics, correlate captured data with real-time events, and/or to trigger events such as TCP retransmissions. Ingress packets are each marked with a high-resolution timestamp upon receipt.

Statistics: Statistics may be gathered to monitor various aspects of systems under test or observation. For example, response time may be measured as a simulated load is increased to measure scalability of a device under test.

L2/L3 Packet processing: In the process of verifying checksums, the configurable logic devices may record information (e.g., IP and TCP packet offsets within the current ingress packet) about the packet layout to speed later processing.

Packet capture/filtering: Many applications benefit from packet capture into capture memory that allows subsequent analysis of observed traffic patterns. Filtering may be used to focus the capture process on packets of particular interest.

The output of one or more of these functional modules, along with VLAN processing, may be fed into one or more network processors along with the ingress packet. Likewise, egress packets generated by the network processors may be processed by one or more of several core functional modules in high-speed configurable logic devices, including:

Packet capture/filtering: Many applications benefit from packet capture into capture memory that allows subsequent analysis of generated traffic patterns. Filtering may be used to focus the capture process on packets of particular interest.

Statistics: Statistics may be gathered to monitor the output of system 16. For example, these statistics may be gathered to analyze the performance of application logic executing on a network processor or control processor.

Generate IP/TCP checksums: Checksum calculation is an expensive process that may be effectively offloaded to a configurable logic device for a significant performance gain.

Timestamp: A high-resolution timestamp may be added just prior to transmission to enable precise measurement of response times of tested systems.

TCP segmentation: This process is data and processing intensive and may be effectively offloaded to a configurable logic device for a significant performance gain.

L2/L3 packet generation: Some types of synthetic network traffic may be generated by a configurable logic device in order to maximize output throughput and saturate the available network channels.

Figure 13A:
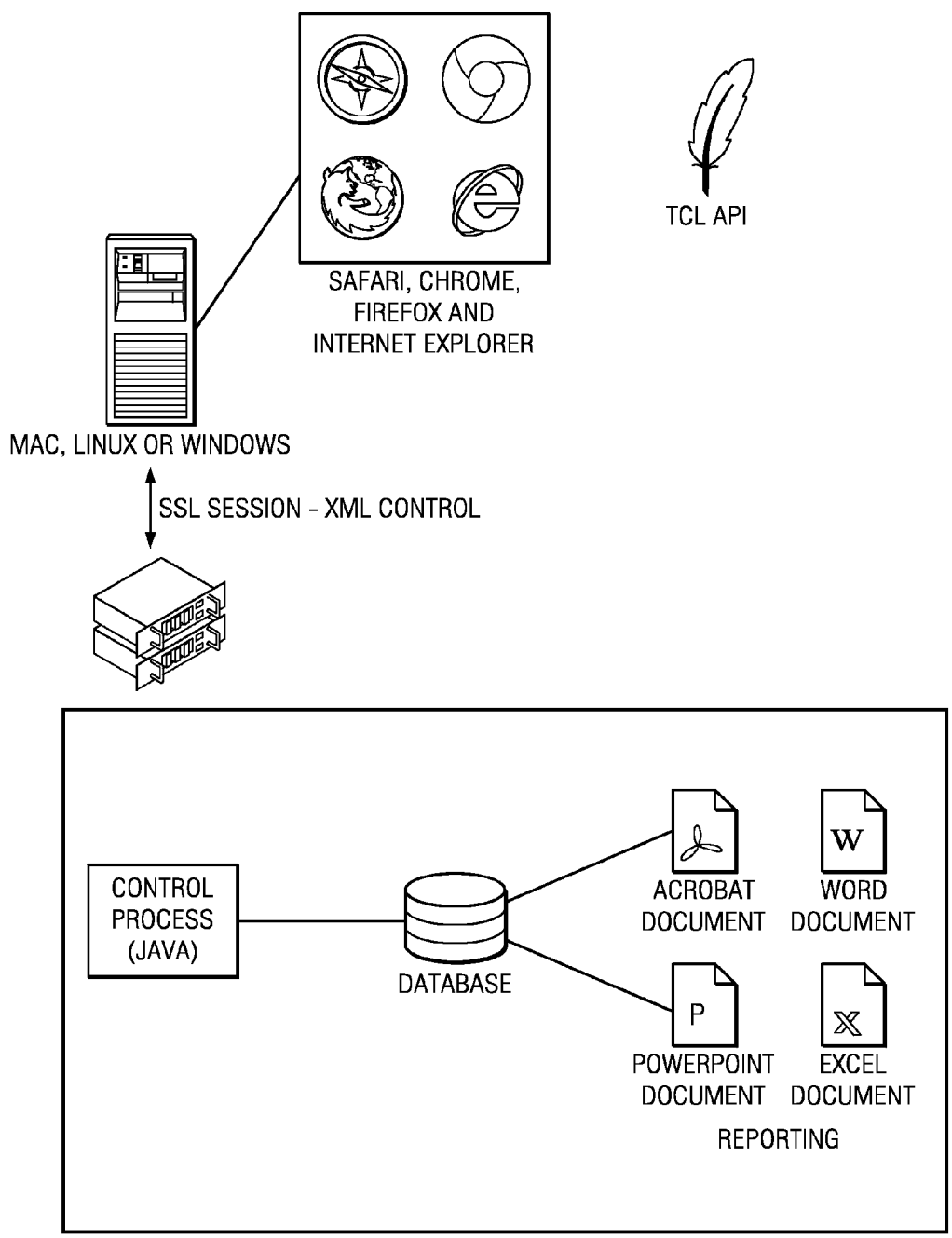
FIG. 13A illustrates example user application level interfaces to a network testing system, according to example embodiments.

FIG. 13A illustrates user application level interfaces to system 16, according to certain embodiments of the present disclosure. In some embodiments, a workstation (e.g., running a standard operating system such as MAC OSX, LINUX, or WINDOWS) may provide a server for user control and configuration of system 16. In some embodiments, that workstation generates a web interface (e.g., via TCL scripts) that may be accessible via a standard web browser. This web interface may communicate with system 16 via an extensible markup language (XML) interface over a secure sockets layer (SSL) connection. In some embodiments, a reporting system may be provided with control process (e.g., one written in the JAVA programming language) mining data from a database to generate reports in common formats such as portable document format (PDF), WORD format, POWERPOINT format, or EXCEL format.

Figure 13B:
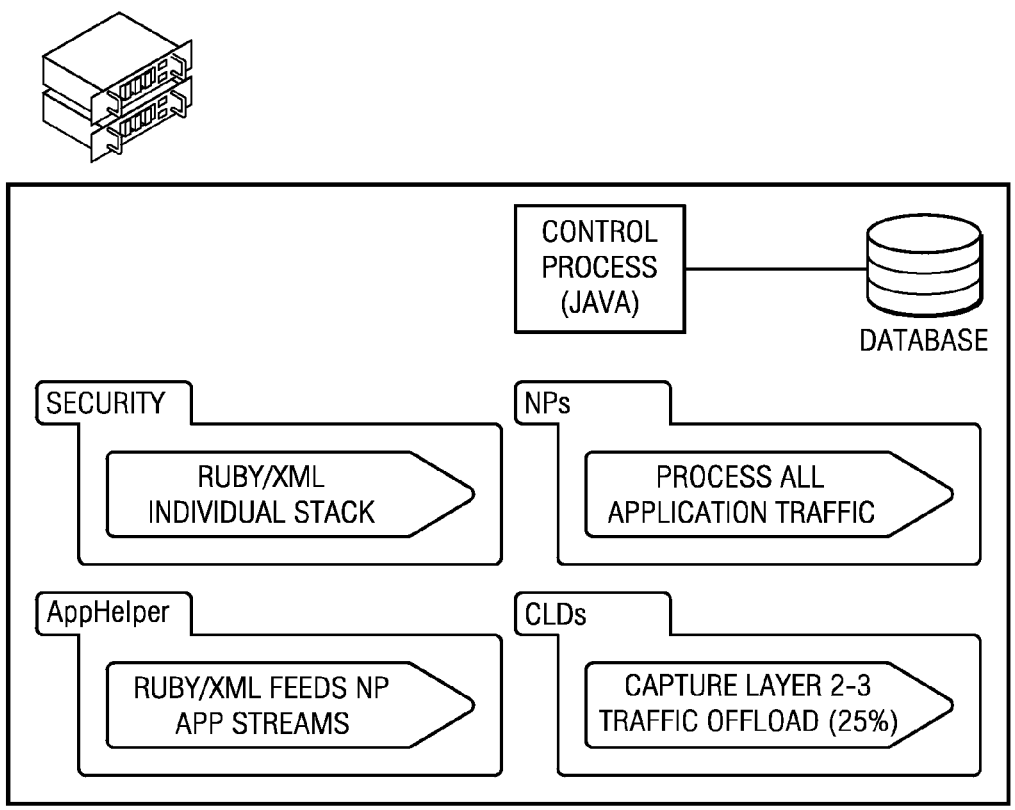
FIG. 13B illustrates example user application level interfaces to a network testing system, according to example embodiments.

FIG. 13B illustrates user application level interfaces to system 16, according to certain embodiments of the present disclosure. A control process (e.g., one written in JAVA), may manipulate configuration data in database to control various parameters of system 16. For example, security parameters may configure a RUBY/XML interface to provide individual access to certain configuration and reporting options. In another example, application helper modules may be added and/or configured to control application streams on the network processors. In a further example, network processor configuration parameters may be set to route all application traffic through the network processors. In a final example, the capture CLD and L2/L3 CLD may be configured to offload a portion of traffic, e.g., 25%, from the network processors.

Figure 13C:
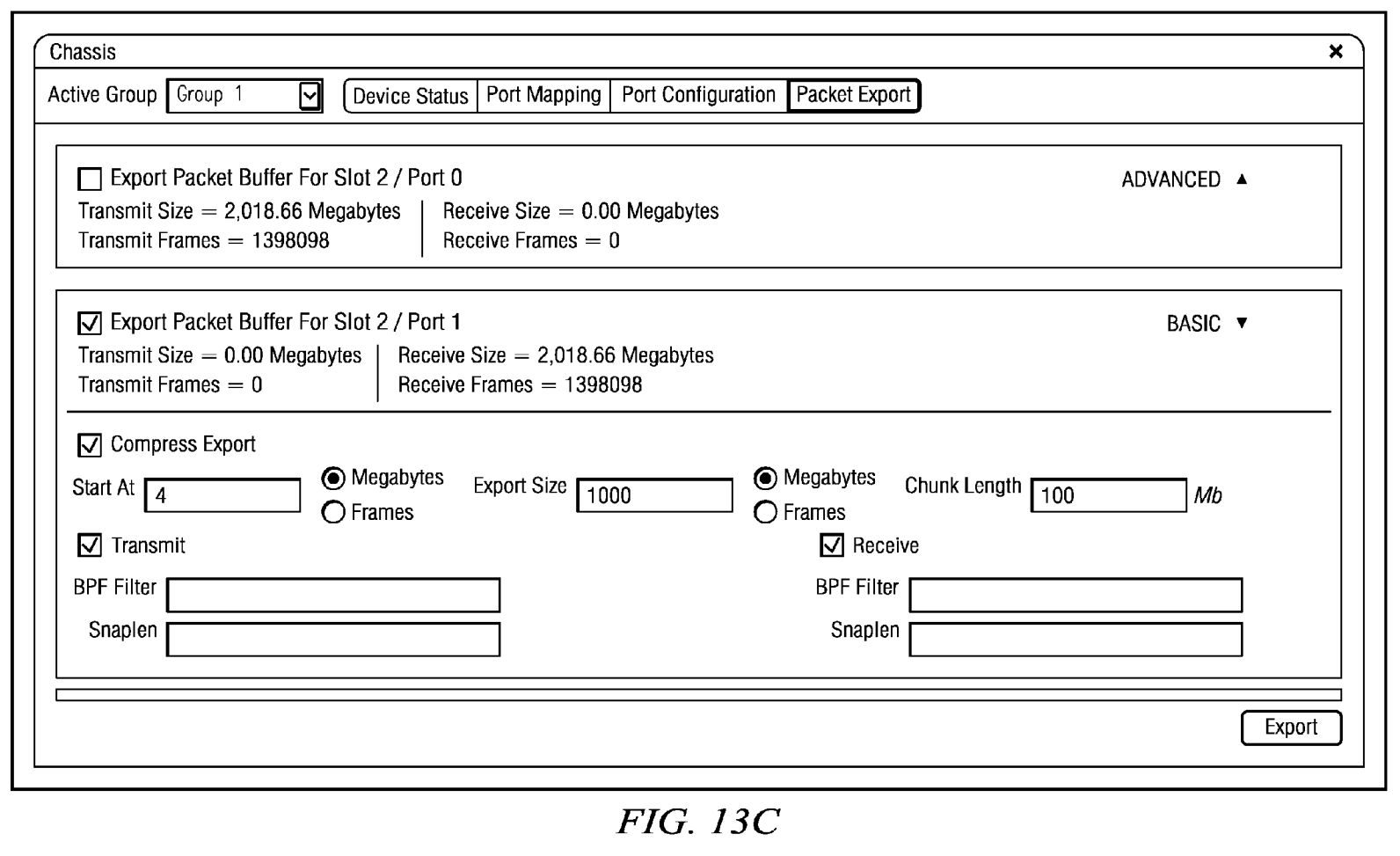

FIG. 13C illustrates a user interface screen for configuring aspects of system 16, according to certain embodiments of the present disclosure. Specifically, the screen in FIG. 13C may allow a user to configure the process by which captured packet data may be exported at an interval to persistent storage, e.g., on drive 109.

Figure 13D:
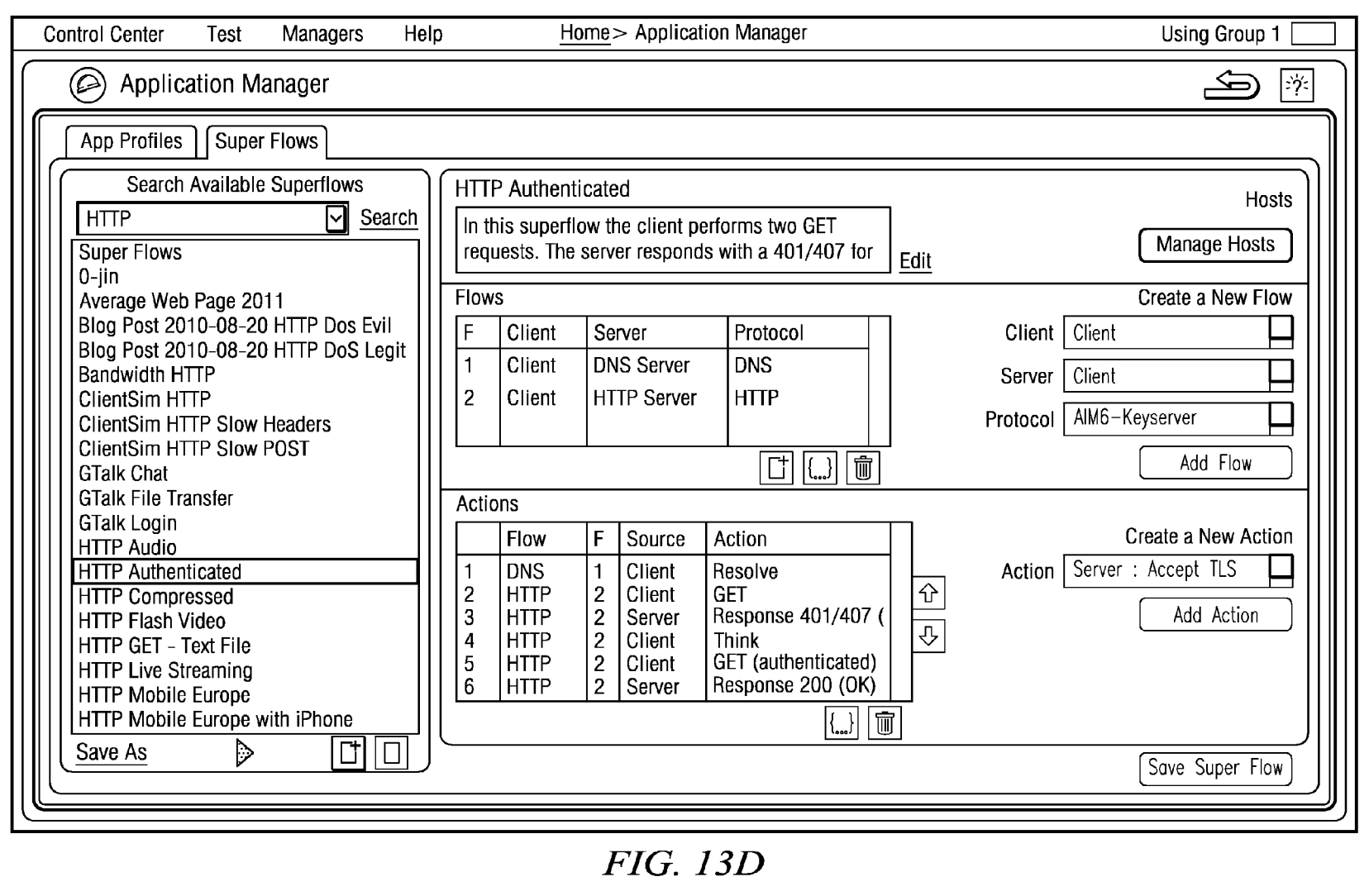

FIG. 13D illustrates a user interface screen for configuring a network testing application, according to certain embodiments of the present disclosure. Specifically, the screen in FIG. 13D may allow a user to configure various types of synthetic data flows to be generated by system 16. The screen shows the flow type "HTTP Authenticated" as selected and shows the configurable subflows and actions relevant to that overall flow type.

Specific Example Implementation of Architecture 100A

Figure 14A:
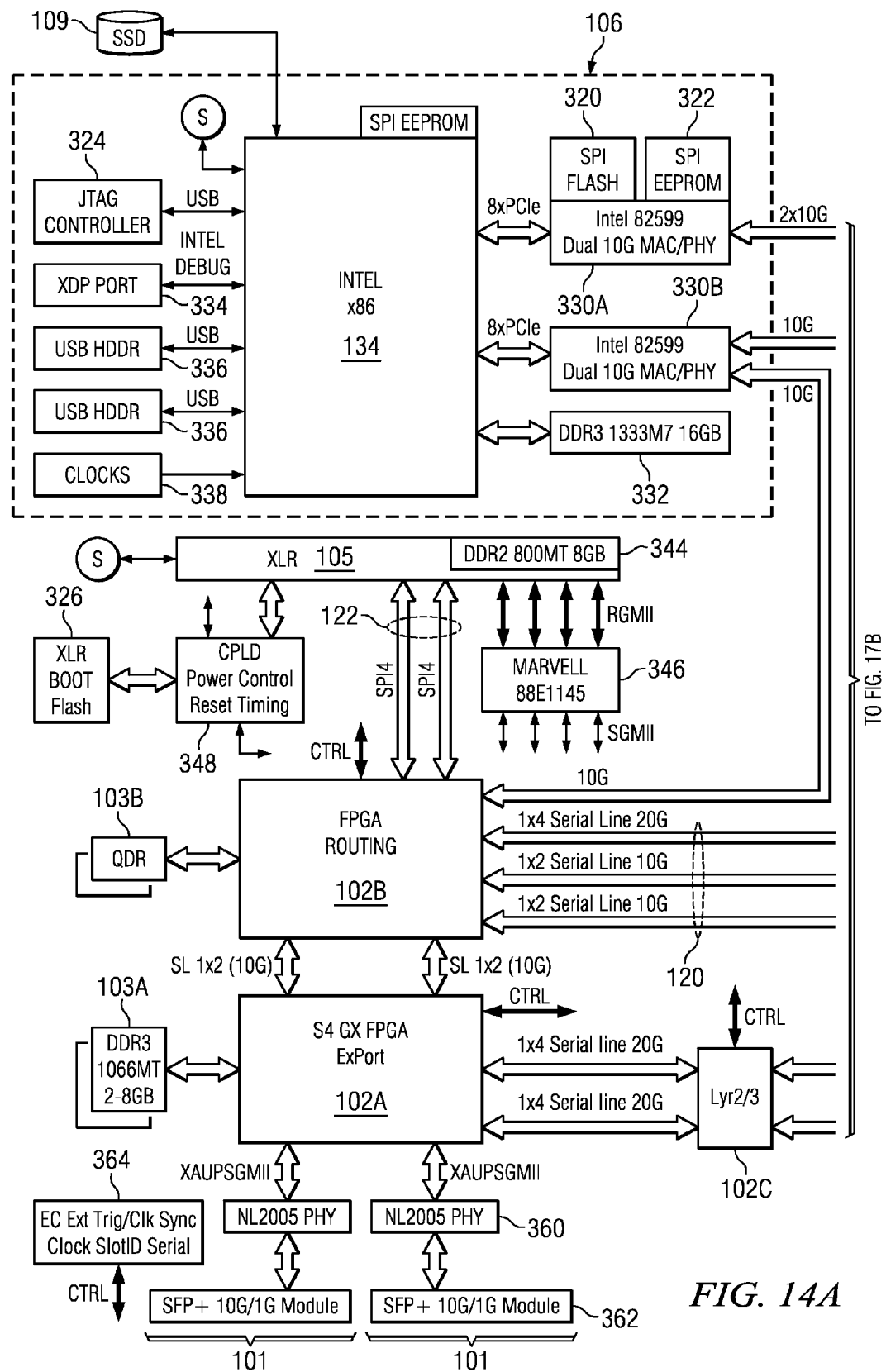
FIGS. 14A-14B illustrate a specific implementation of the architecture of a network testing system, according to one example embodiment.
Figure 14B:
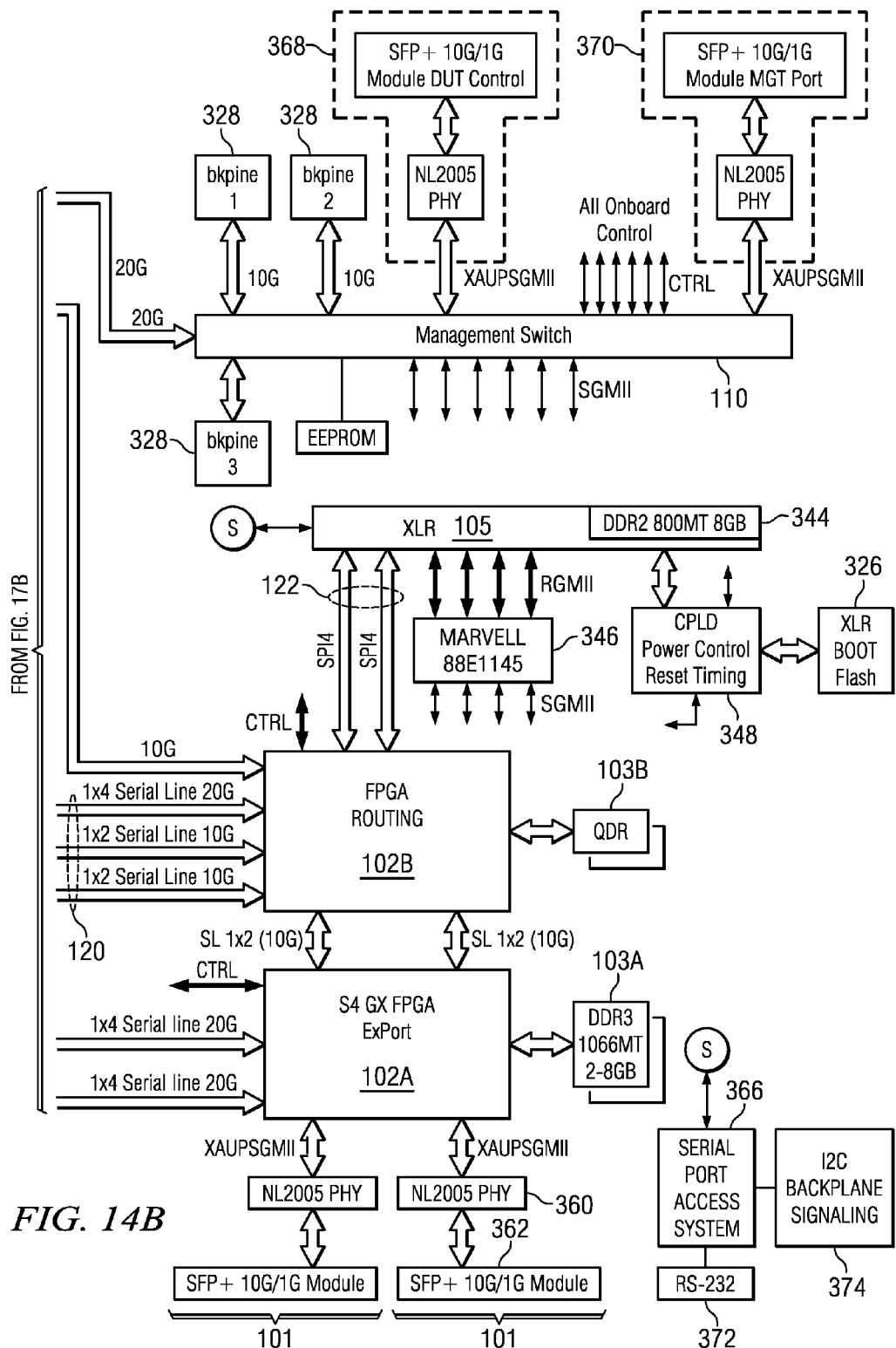

FIGS. 14A-14B illustrate a specific implementation of the testing and simulation architecture 100A shown in FIGS. 4 and 5, according to an example embodiment.

Controller 106 provides operational control of one or more blades in architecture 100A. Controller 106 includes control processor 134 coupled to an electrically erasable programmable read only memory (EEPROM) containing the basic input and output system (BIOS), universal serial bus (USB) interfaces 336, clock source 338, joint test action group (JTAG) controller 324, processor debug port 334, random access memory (RAM) 332, and Ethernet medium access controllers (MACs) 330A and 330B coupled to non-volatile memories 320/322. EEPROM memory 322 may be used to store general configuration options, e.g., the MAC address(es), link types, and other part-specific configuration options. Flash memory 320 may be used to store configurable applications such as network boot (e.g., PXE Boot).

Controller 106 may be an integrated system on a chip or a collection of two or more discrete modules. Control processor 134 may be a general purpose central processing unit such as an INTEL x86 compatible processor. In some embodiments, control processor 134 may be an INTEL XEON processor code-named JASPER FOREST and may incorporate or interface with additional chipset components including memory controllers and input/output controllers, e.g., the INTEL IBEX PEAK south bridge. Control processor is coupled, e.g., via a serial peripheral interface to non-volatile memory containing BIOS software. (Note that references in this specification to SPI interfaces, for example those interconnecting CLDs and/or network processors, are references to the system packet interface (SPI-4.2) rather than the serial peripheral interface.) The BIOS software provides processor instructions sufficient to configure control processor 134 and any chipset components necessary to access storage device 109.

The BIOS also includes instructions for loading, or booting, an operating system from storage device 109 or a USB memory device connected to interface 336.

USB interfaces 336 provide external I/O access to controller 106. USB interfaces 336 may be used by an operator to connect peripheral devices such as a keyboard and pointing device. USB interfaces 336 may be used by an operator to load software onto controller 106 or perform any other necessary data transfer. USB interfaces 336 may also be used by controller 106 to access USB connected devices within system 100A.

Clock source CK505 is a clock source to drive the operation of the components of controller 106. Clock source may be driven by a crystal to generate a precise oscillation wave.

JTAG controller 324 is a microcontroller programmed to operate as a controller for JTAG communications with other devices. JTAG provides a fallback debugging and programming interface for various system components. This protocol enables fault isolation and recovery, especially where a device has been incompletely or improperly programmed, e.g., due to loss of power during programming. In certain embodiments, JTAG controller 324 is a CYPRESS SEMICONDUCTOR CY68013 microcontroller programmed to execute JTAG instructions and drive JTAG signal lines. JTAG controller 324 may include or be connected to a non-volatile memory to program the controller on power up.

Processor debug port 334 is a port for debugging control processor 106 as well as chipset components. Processor debug port 334 may conform to the INTEL XDB specification.

RAM 332 is a tangible, computer readable medium coupled to control processor 134 for storing the instructions and data of the operating system and application processes running on control processor 134. RAM 332 may be double data rate (DDR3) memory.

Ethernet MACs 330A and 330B provide logic and signal control for communicating with standard Ethernet devices. These MACS may be coupled to control processor 134 via a PCIe bus. MACS 330A and 330B may be INTEL 82599 dual 10 Gbps parts. In some embodiments, MACs 330A and 330B may be incorporated into control processor 134 or the chipset devices. Ethernet MACs 330A and 330B are coupled to non-volatile memories 320/322.

Controller 106 is coupled to tangible, computer readable medium in the form of mass storage device 109, e.g., a solid state drive (SSD) based on high speed flash memory. In some embodiments, controller 106 is coupled to storage device 109 via a high speed peripheral bus such as an SATA bus. Storage device 109 includes an operating system, application level programs to be executed on one or more processors within the system, and other data and/or instructions used to configure various components or perform the tasks of the present disclosure. Storage device 109 may also store data generated by application level programs or by hardware components of the system. For example, network traffic captured by capture/offload CLDs 102A may be copied to storage device 109 for later retrieval.

Network processor 105 provides software programmable computing that may be optimized for network applications. Network processor may be a NETLOGIC XLR processor. Network processor 105 is coupled to memory 344, boot flash 326, CPLD 348, and Ethernet transceiver 346. Memory 344 is a tangible, computer readable storage medium for storing the instructions and data of the operating system and application processes running on network processor 105. RAM 332 may be double data rate (DDR3) memory. Boot flash 326 is non-volatile memory storing the operating system image for network processor 105. Boot flash 326 may also store application software to be executed on network processor 105. CPLD 348 may provide glue logic between network processor 205 and boot flash 326 (e.g., because the network processor may be capable of interfacing flash memory directly). CPLD 348 may also provide reset and power sequencing for network processor 105.

Network processor 105 provides four parallel Ethernet ports, e.g., RGMII ports, for communicating with other devices via the Ethernet protocol. Ethernet transceiver 346, e.g., MARVELL 88E1145 serializes these four ports to provide interoperability with the multiport management switch 110. Specifically, in some embodiments, network processor 105 provides four Reduced Gigabit Media Independent Interface (RGMII) ports, each of which requires twelve pins. The MARVELL 88E1145 transceiver serializes these ports to reduce the pin count to four pins per port.

Routing FPGA 102B is a configurable logic device configured to route network packets between other devices within the network testing system. Specifically, FPGA 102B is a field programmable gate array and, in some embodiments, is an ALTERA STRATIX 4 device. FPGAs 102 may also be XILINX VIRTEX, ACTEL SMARTFUSION, or ACHRONIX SPEEDSTER parts. Routing FPGA 102B may be coupled to tangible computer-readable memory 103B to provide increased local (to the FPGA) data storage. In some embodiments, memory 103B is 8 MB of quad data rate (QDR) static RAM. Static RAM operates at a higher speed than dynamic RAM (e.g., as DDR3 memory) but has a much lower density.

Offload/capture FPGA 102A is a configurable logic device configured to perform a number of functions as packets are received from external ports 101 or as packets are prepared for transmission on external ports 101. Specifically, FPGA 102B is a field programmable gate array and, in some embodiments, is an ALTERA STRATIX 4 device. Offload/capture FPGA 102A may be coupled to tangible computer-readable memory 103A to provide increased local (to the FPGA) data storage. In some embodiments, memory 103A is two banks of 16 GB of DDR3 RAM. Memory 103A may be used to store packets as they are received. Offload/capture FPGA 102A may also be coupled, e.g. via XAUI or SGMII ports to external interfaces 101, which may be constructed from physical interfaces 360 and transceivers 362. Physical interfaces 360 convert the XAUI/SGMII data format to a gigabit Ethernet signal format. Physical interfaces 360 may be NETLOGIC AEL2006 transceivers. Transceivers 362 convert the gigabit Ethernet signal format into a format suitable for a limited length, direct attach connection. Transceivers 362 may be SFP+ transceivers for copper of fiber optic cabling.

Layer 2/Layer 3 FPGA 102C is a configurable logic device configured to generate layer 2 or layer 3 egress network traffic. Specifically, FPGA 102B is a field programmable gate array and, in some embodiments, is an ALTERA STRATIX 4 device.

Management switch 110 is a high-speed Ethernet switch capable of cross connecting various devices on a single blade or across blades in the network testing system. Management switch 110 may be coupled to non-volatile memory to provide power-on configuration information. Management switch 110 may be a 1 Gbps Ethernet switch, e.g., FULCRUM/INTEL FM4000 or BROADCOM BCM5389. In some embodiments, management switch 110 is connected to the following other devices:

controller 106 (two SGMII connections);
each network processor 105 (four SGMII connections);
each FPGA 102A, 102B, and 102C (one control connection);
backplane 328 (three SGMII connections);
external control port 368; and
external management port 370.

Serial port access system 366 provides direct data and/or control access to various system components via controller 106 or an external serial port 372, e.g., a physical RS-232 port on the front of the blade. Serial port access system 366 (illustrated in detail in FIG. 46 and discussed below) connects via serial line (illustrated in FIGS. 14A and 14B as an S in a circle) to each of: control processor 106, each network processor 105, external serial port 372, and an I2C backplane signaling system 374. As discussed below with respect to FIG. 46 I2C backplane signaling system 374 may be provided for managing inter-card serial connections, and may include a management microcontroller (or "environmental controller") 954, I2C connection 958 to backplane 56, and an I2C IO expander 956. Serial lines may be multipoint low-voltage differential signaling (MLVDS).

Alternative System Architecture 100B

Figure 15:
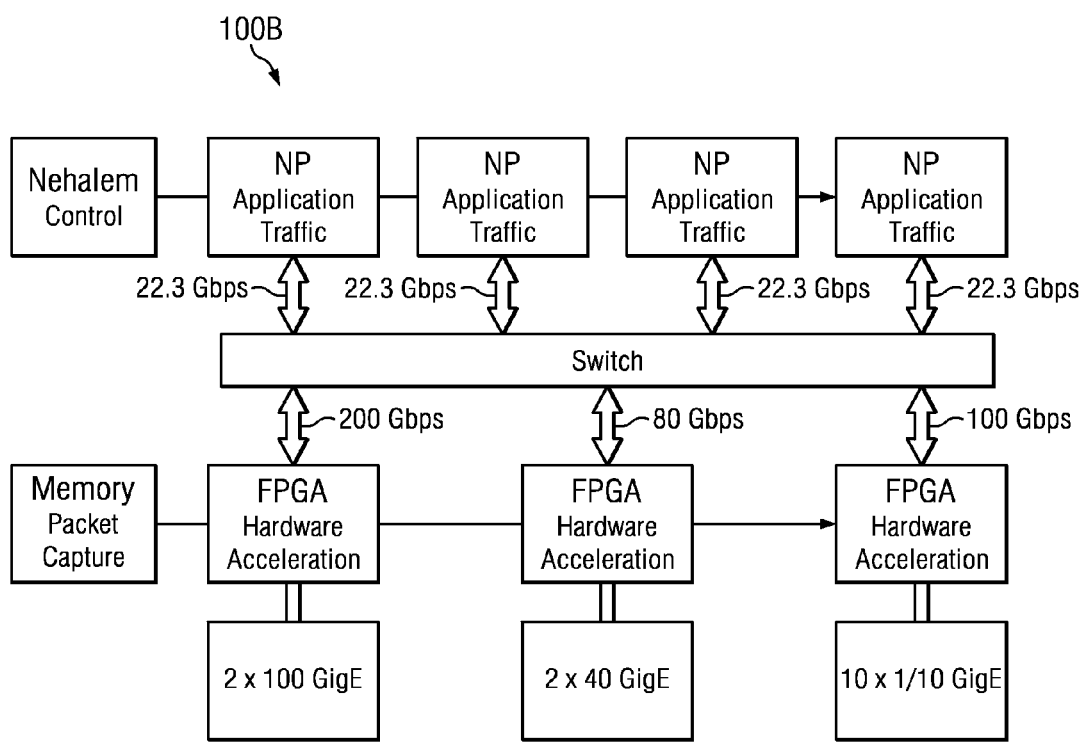
FIG. 15 illustrates an example of an alternative architecture of the network testing system, according to an example embodiment.

FIG. 15 illustrates an alternative testing and simulation architecture 100B, according to an example embodiment. Architecture 100B may be generally similar to architecture 100A shown in FIGS. 4-10, but includes additional network processors 105 and FPGAs 102. In particular, example architecture 100B includes four network processors 105 and a total of 14 FPGAs 102 connected to a management switch 110. In this embodiment, a single control processor may distribute workloads across two additional network processors and a total of 14 FPGAs coordinated with a single high-bandwidth Ethernet switch. This embodiment illustrates the scalability of the FPGA pipelining and interconnected FPGA/network processor architecture utilizing Ethernet as a common internal communication channel.

Figure 16:
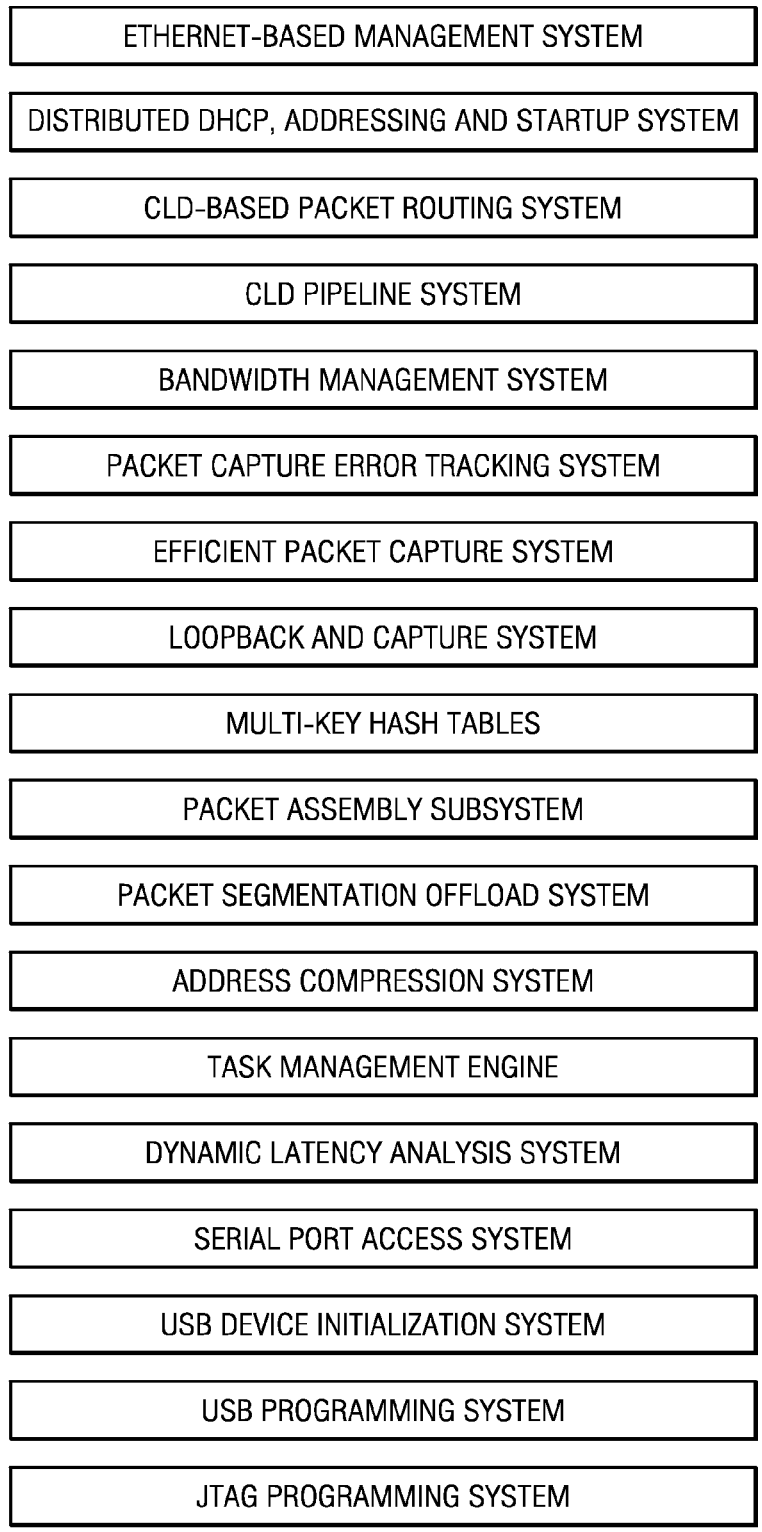
FIG. 16 illustrates various sub-systems configured to provide various functions associated with a network testing system, according to an example embodiment.

FIG. 16 illustrates various sub-systems configured to provide various functions associated with system 16 as discussed herein. For example, control system 450 may include any or all of the following sub-systems:

An Ethernet-based management system;
a distributed DHCP, Addressing and Startup management system;
a CLD-based packet routing system;
a processor-specific routing system;
a CLD pipeline system;
a bandwidth management system;
a packet capture error tracking system;
an efficient packet capture system;
a data loopback and capture system;
a CLD-based hash function system;
multi-key hash tables;
a packet assembly subsystem;
a packet segmentation offload system;
an address compression system;
a task management engine;
a dynamic latency analysis system;
a serial port access system;
a USB device initialization system;
a USB programming system; and
a JTAG programming system.

Each sub-system of control system 450 may include, or have access to, any suitable hardware devices, software, CLD configuration information, and/or firmware for providing the respective functions of that sub-system, as disclosed herein. The hardware devices, software, CLD configuration information, and/or firmware of each respective sub-system may be embodied in a single device of system 16, or distributed across multiple devices of 16, as appropriate. The software, CLD configuration information, and/or firmware (including any relevant algorithms, code, instructions, or other logic) of each sub-system may be stored in any suitable tangible storage media of system 16 and may and executable by any processing device of system 16 for performing functions associated with that sub-system.

Ethernet Based Management

CLDs in the present disclosure provide specialized functions, but require external control and management. In some embodiments of the present disclosure, control CPU 106 provides this external control and management for the various CLDs on a board. Control CPU 106 may program any one of the CLDs on the board (e.g., 102A, 102B, 102C, or 123) to configure the logic and memory of that CLD. Control CPU 106 may write instructions and/or data to a CLD. For example, control CPU 106 may send instructions to traffic generating CLD 102C to have that device generating a specified number of network messages in a particular format with specified characteristics. In another example, control CPU 106 may send instructions to capture/offload CLD 102A to read back latency statistics gathered during a packet capture window.

CLDs are usually managed via a local bus such as a PCI bus. Such an approach does not scale to large numbers of CLDs and does not facilitate connectivity between multiple CLDs and multiple CPUs. Some bus designs also require the payment of licensing fees. The present disclosure provides a CLD management solution based on the exchange of specialized Ethernet packets that can read and write CLD memories (i.e., CLD registers).

In some embodiments, CLDs in the present disclosure contain embedded Ethernet controllers designed to parse incoming specially formatted packets as command directives for memory access to be executed. In this approach, the CLD directly interprets the incoming packets to make the access to internal CLD memory without intervention by an intermediate CPU or microcontroller processing the Ethernet packets. Simultaneous requests from multiple originating packet sources (e.g., CPUs) are supported through the use of a command FIFO that queues up incoming requests. After each command directive is completed by the CLD, a response packet is sent back to the originating source CPU containing the status of the operation.

Three layers of packet definition are used to form the full command directive, packet source and destination addressing, the Ethernet type field, and the register access directive payload. The destination MAC (Media Access Controller) address of each CLD contains the system mapping scheme for the CLDs while the source MAC contains the identity of the originating CPU. Note that in some embodiments, the MAC addresses of each CLD is only used within the network testing system and are never used on any external network link. Sub-fields within the destination MAC address (6 bytes total in length) identify the CLD type, an CLD index and a board slot ID. The CLD type refers to the function performed by that particular CLD within the network testing system (i.e., traffic generating CLD or capture/offload CLD). A pre-defined Ethernet-Type field is matched to act as a filter to allow the embedded Ethernet controller ignore unwanted network traffic. These 3 fields within the packet conform to the standard Ethernet fields (IEEE 802.3).

This conformance allows implementation of the network with currently available interface integrated circuits and Ethernet switches. Ethernet also requires fewer I/O pins than a bus like PCI, therefore freeing up I/O capacity on the CLD and reducing the trace routing complexity of the circuit board.

Following the MAC addressing and Ethernet type fields a proprietary command format is defined for access directives supported by the CLD. Some embodiments support instructions for CLD register reads and writes, bulk sequential register reads and writes, and a diagnostic loopback or echo command. Diagnostic loopback or echo commands provide a mechanism for instructing a CLD to emulate a network loopback by swapping the source and destination addresses on a packet and inserting the current timestamp to indicate the time the packet was received.

FIG. 17 illustrates the layout of the Ethernet packets containing CLD control messages according to certain embodiments of the present disclosure. The first portion of the packet is the IEEE standard header for Ethernet packets, including the destination MAC address, the source MAC address, and the Ethernet packet type field. The type field is set to value unused the IEEE standard to avoid conflicts with existing network protocols, especially within the networking stack on the control CPU. Immediately following the standard header is an access directive format including a sequence identifier, a count, a command field, and data to be used in executing the directive. The sequence number is an identifier used by the originator of the directive for tracking completion and/or timeout of individual directives. The count specifies the number of registers accessed by the command and the command field specifies the type of directive.

FIG. 18 illustrates an example register access directive for writing data to CLD registers, according to certain embodiments of the present disclosure. The command field value of 0x0000 indicates a write command. The count field specifies the number of registers to write. The data field contains a series of addresses and data values to be written. Specifically, the first 32 bits of the data field specify an address. The second 32 bits of the data field specify a value to be written to the register at the address specified in the first 32 bits of data. The remaining values in the data field, if any, are arranged in the same pattern: (address, data), (address, data), etc. The response generated at the completion of the directive is an Ethernet packet with a source MAC address of the CLD processing the directive, and a destination MAC address set to the source MAC address of the packet containing the directive. The response packet also contains the same Ethernet type, sequence number, and command as the directive packet. The count field of the response packet will be set to the number of registers written. The response packet will not contain a data portion.

In certain embodiments, a directive packet can contain only one type of directive (e.g., read or write), but can access a large number of register addresses within a CLD. In some embodiments, the packet size is limited to the standard maximum transmission unit of 1,500 bytes. In some embodiments, jumbo frames of 9,000 bytes are supported. By packing multiple instructions of the same type into a single directive, significant performance enhancement has been observed. In one configuration, startup time of a board was reduced from approximately a minute to approximately five seconds by configuring CLDs over Ethernet instead of over a PCI bus.

In some embodiments, access directives may be used to access the entire memory space accessible to a CLD. Some CLDs have a flat memory space where a range of addresses corresponds to CLD configuration data, another range of addresses corresponds to internal CLD working memory, and yet another range of addresses corresponds to external memory connected to the CLD such as quad data rate static random access memory (QDR) or double data rate synchronous dynamic access memory (DDR).

FIG. 5 illustrates an internal network configuration for certain embodiments of the present disclosure. In FIG. 5, Ethernet switch 110 connects to CPU 105 and both NPs 105. In addition, Ethernet switch 110 connects to routing CLDs 102B, capture/offload CLDs 102A, and traffic generating CLD 102C. In this configuration, any CPU may communicate with any CLD directly using Ethernet packets. Ethernet switch 110 also connects to backplane 56 to extend connectivity to CPUs or CLDs on other boards. The approach of the present disclosure could also facilitate direct communication between any of the attached devices including CLDs, network processors, and control processors.

Ethernet switch 110 operates as a layer 2 router with multiple ports. Each port is connected to a device (as discussed in the previous paragraph) or another switch (e.g., through the backplane connection). Ethernet switch 110 maintains a memory associating each port with a list of one or more MAC addresses of the device or devices connected to that port. Ethernet switch 110 may be implemented as a store and forward device receiving at least part of an incoming Ethernet packet before making a routing decision. The switch examines the destination MAC address and compares that destination MAC address with entries in the switch's routing table. If a match is found, the packet will be resent to the assigned port. If a match is not found, the switch may broadcast the packet to all ports. Upon receipt of a packet, the switch will also examine the source MAC address and compare that address to the switch's routing table. If the routing table does not have an entry for the source MAC address, the switch will create an entry associating the source MAC address with the port on which the packet arrived. In some embodiments, the switch may populates its routing table by sending a broadcast message (i.e., one with a destination address of FF:FF:FF:FF:FF:FF) to trigger responses from each connected device. In other embodiments, each device may include an initialization step of sending an Ethernet message through the switch to announce the device's availability on the system.

Because Ethernet is a simple, stateless protocol, additional logic is useful to ensure receipt and proper handling of messages. In some embodiments, each sending device incorporates a state machine to watch for a response or recognize when a response was not received within a predefined window of time (i.e., a timeout). A response indicating a failure or timeout situation is often reported in a system log. In some situations, a failure or timeout will cause the state machine to resend the original message (i.e., retry). In certain embodiments, each process running on control processor 106 needing to send instructions to other devices via Ethernet may use a shared library to open a raw socket for sending instructions and receiving responses. Multiplexing across multiple processes may be implemented by repurposing the sequence number field and setting that field to the process identifier of the requesting process. The shared library routines may include filtering mechanisms to ensure delivery of responses based on this process identifier (which may be echoed back by the CLD or network processor when responding to the request).

In certain embodiments, controller software 132 includes a software module called an CLD server. The CLD server provides a centralized mechanism for tracking failures and timeouts of Ethernet commands. The CLD server may be implemented as an operating system level driver that implements a raw socket. This raw socket is configured as a handler for Ethernet packets of the type created to implement the CLD control protocol. All other Ethernet packets left for handling by the controller's networking stack or other raw sockets.

Figure 19:
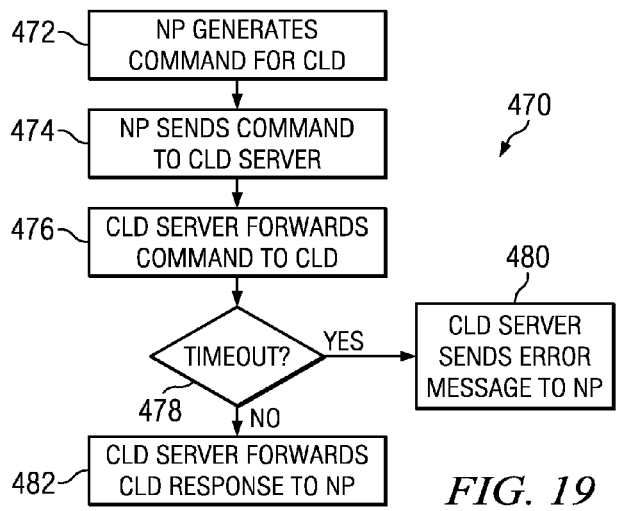
FIG. 19 illustrates an example flow of the life of a register access directive in a network testing system, according to an example embodiment.

FIG. 19 illustrates an example flow 470 of the life of a register access directive, according to certain embodiments of the present disclosure. At step 472, a network processor generates a command for a CLD. This command could be to generate 10,000 packets containing random data to be sent to a network appliance being tested for robustness under heavy load. The network processor generates an Ethernet packet for the directive with a destination MAC address of the control CPU 106. The source MAC address is the MAC address of the network processor generating the directive packet. The Ethernet type is set to type used for directive packets. The sequence number is set to the current sequence counter and that counter is incremented. The count field is set to 10,000 and the command field is set to the appropriate command type. The data field contains the destination IP address (or range of addresses) and any other parameters needed to specify the traffic generation command.

At step 474, the network processor sends the directive packet to control CPU 106 via switch 110. The directive packet is received by the CLD server through a raw port on the network driver of the control server. The CLD server creates a record of the directive packet and includes in that record the current time and at least the source MAC address and the sequence number of the directive packet. The CLD server modifies the directive packet as follows. The source MAC address is set to the MAC address of control CPU 106 and the destination MAC address is set to the MAC address of traffic generating CLD 102C. In some embodiments, the CLD server replaces the sequence number with its own current sequence number. In some embodiments, the CLD server may keep a copy of the entire modified directive packet to allow later retransmission.

At step 476, the CLD server transmits the modified directive packet, via switch 110, to traffic generating CLD 102C for execution.

At a regular interval, the CLD server examines its records of previously sent directives to and determines whether any are older than a predetermined age threshold. This might indicate that a response from the destination CLD is unlikely due to an error in transmission or execution of the directive. If any directives are older than the threshold, then a timeout is recognized at step 478.

In the case of a timeout, the CLD server generates an error message at step 480 to send to the requesting network processor. In some embodiments, CLD server may resend the directive one or more times before giving up and reporting an error. The CLD server also deletes the record of the directive packet at this time.

If a response is received prior to a timeout, CLD server removes the directive packet record and forwards the CLD response packet to the originating network processor at step 482. To forward the CLD response packet, the CLD server replaces the destination MAC address with the MAC address of the originating network processor. If the sequence number was replaced by the CLD server in step 474, the original sequence number may be restored. Finally the modified response packet is transmitted, via switch 110, to the originating network processor.

While the present disclosure describes the use of Ethernet, other networking technologies could be substituted. For example, a copper distributed data interface (CDDI) ring or concentrator could be used.

Dynamic MAC Address Assignment

In a typical IEEE 802 network, each network endpoint is assigned a unique MAC (Media Access Control) address. Normally the assigned MAC address is permanent because it is used in layer 2 communications (such as Ethernet) and unique addressing is a requirement.

As discussed above, network testing system 16 may utilize a configuration in which multiple Ethernet-configured devices internally communicate with each other over an internal Ethernet interface. In some embodiments, system 16 comprises a chassis 50 with multiple slots 52, and each containing a blade 54 with multiple Ethernet devices, e.g., CLDs 102, network processors 105, control processor 106, etc.

In some embodiments, the control CPU 106 of each blade 54 is the only component of system 16 with connectivity to external networks and is thus the public/external Ethernet interface of control CPU 106 is only component of system 16 that is assigned a globally unique "public" MAC address. Hardware and software of system 16 dynamically assigns each other Ethernet device in system 16 (including each network processor 105, each CLD 102, and local/internal Ethernet interfaces of control CPU 106) a MAC address that is unique within system 16, but need not be globally unique, as the internal Ethernet network of system 16 does not connect with external networks. In some embodiments, each of such Ethernet devices is dynamically assigned a unique MAC address based on a set of characteristics regarding that device and its location within the configuration of system 16. For example, in some embodiments, each network processor 105 and CLD in system 16 automatically derives a 6-byte MAC address for itself that has the following format:

1st Byte: fixed (indicates a non-global MAC address).
2nd Byte: indicates chip type: e.g., processor, CLD, or other type of device.
3rd Byte: indicates processor type or model, or CLD type or model: e.g., 20G, 10G, or 1G processor, router CLD, capture/offload CLD, etc.
4th Byte: indicates slot number.
5th Byte: indicates processor or CLD number, e.g., to distinguish between multiple instances of the same type of processor or CLD on the same card (e.g., two network processors 105 or two capture/offload CLDs 102a).
6th Byte: indicates processor interface (each interface to the management switch has its own MAC address).

Each CLD (e.g., FPGA 102) derives its own MAC address by reading some strapping IO pins on initialization. For example, a four-CLD system may have two pins that encode a binary number between 0 and 3. Strapping resistors are connected to these pins for each CLD, and the CLD reads the value to derive its MAC address. This technique allows system controller 106 to determine all of the encoded information based on the initial ARP (Address Resolution Protocol) request received from an Ethernet device on the internal Ethernet network. This flexibility allows new blades 54 to be defined that are compatible with existing devices without causing backwards compatibility problems. For example, if a new blade is designed that is compatible with an old blade, the model number stays the same. If the new blade adds a new CLD to system 16, then the new CLD is simply assigned a different CLD number for the MAC addressing. However, if a new blade is installed in system 16 that requires additional functionality on the system controller 106, the new blade may be assigned a new model number. Compatibility with existing blades can thus be preserved.

In addition, the dynamically assigned MAC addresses of Ethernet devices may be used by a DHCP server for booting such devices, as discussed below in detail.

Each processor may also have an IP address, which may be assigned by the DHCP server based on the MAC address of that device and a set of IP address assignment rules.

Distributed DHCP, Addressing and System Start-Up

As discussed above, system 16 may be housed in a chassis 50 that interconnects multiple cards 54 via a backplane 56. In some embodiments, all cards 54 boot a single software image. In other embodiments, each card 54 runs a different software image, possibly with different revisions, in the same chassis 50.

One challenge results from the fact that the cards 54 in chassis 50 are physically connected to each other via Ethernet over the backplane 56. In addition, some processors in system 16 may obtain their operating system image from other processors across the shared Ethernet using DHCP. DHCP is a broadcast protocol, such that a request from any processor on any card 54 can be seen from any other card 54. Thus, without an effective measure to prevent it, any processor can boot from any other processor that replies to its DHCP request quickly enough, including processors on other cards 54 from the requesting processor. This may be problematic in certain embodiments, e.g., embodiments that support hot swapping of cards 54. For example, if a CPU on card 1 boots from a CPU on card 2, and card 2 is subsequently removed from chassis 50, CPU 1 may crash.

Thus, in some embodiments (e.g., embodiments that support hot swapping of cards 54), to utilize multiple control processors 105 and drives 109 available in a multi-card system 16, as well as to allow for each control processor 106 to run an independent operating system, while maintaining Ethernet connectivity to the backplane 56, system 16 may be configured such that local network processors 105 boot from the local control processor 106 using DHCP, NFS (Network File System), and TFTP (Trivial File Transfer Protocol). This task is divided by a special dynamic configuration for the DHCP server.

First, the network processors 105 and control processor 106 on a card 54 determine what physical slot 52 the card 54 is plugged into. The slot number is encoded into the MAC address of local network processors 105. The MAC address of each network processor 105 is thus dynamic, but of a predictable format. The DHCP server on the control processor 106 configures itself to listen only for requests from network processors 105 (and other devices) with the proper slot number encoded in their MAC addresses. Thus, DHCP servers on multiple cards 54 listen for request on the shared Ethernet, but will only reply to a subset of the possible MAC addresses that are present in system 16. Thus, system 16 may be configured such that only one DHCP server responds to a DHCP request from any network processor 105. Each network processor 105 is thus essentially assigned to exactly one DHCP server, the local DHCP server. With this arrangement, each network processor 105 always boots from a processor on the same card as that network processor 105 (i.e., a local processor). In other embodiments, one or more network processor 105 may be assigned to the DHCP server on another card, such that network processors 105 may boot from a processor on another card.

A more detailed example of a method of addressing and booting devices in system 16 is discussed below, with reference to FIGS. 20-22. As discussed above, in a typical Ethernet-based network, each device has a globally unique MAC address. In some embodiments of network testing system 16, the control CPU 106 is the only component of system 16 with connectivity to external networks and is thus the only component of system 16 that is assigned a globally unique MAC address. For example, a globally unique MAC address for control CPU may be hard coded into a SPI-4.2 EEPROM 322 (see FIG. 20).

Thus, network processors 105 and CLDs 102 may generate their own MAC addresses according to a suitable algorithm. The MAC address for each device 102, 105, and 106 on a particular card 54 may identify the chassis slot 52 in which that card 54 is located, as well as other identifying information. In some embodiments, management switch 110 has no CPU and runs semi-independently. In particular, management switch 110 may have no assigned MAC address, and may rely on control CPU 106 for intelligence.

In some embodiments, network testing system 16 is configured such that cards 54 can boot and operate independently if desired, and be hot-swapped without affecting other the operation of the other cards 54, without the need for additional redundant hardware. Simultaneously, cards 54 can also communicate with each across the backplane 56. Such architecture may improve the scalability and reliability of the system, e.g., in high-slot-count systems. Further, the Ethernet-based architecture of some embodiments may simplify card layout and/or reduce costs.

Cards 54 may be configured to boot up in any suitable manner. FIGS. 20-22 illustrate an example boot up process and architecture for a card 54 of system 16, according to an example embodiment. In particular, FIG. 20 illustrates an example DHCP-based boot management system 290 including various components of system 16 involved in a boot up process, FIG. 21 illustrates an example boot-up process for a card 54, and FIG. 22 illustrates an example method for generating a configuration file 306 during the boot-up process shown in FIG. 21, according to an example embodiment.

Figure 20:
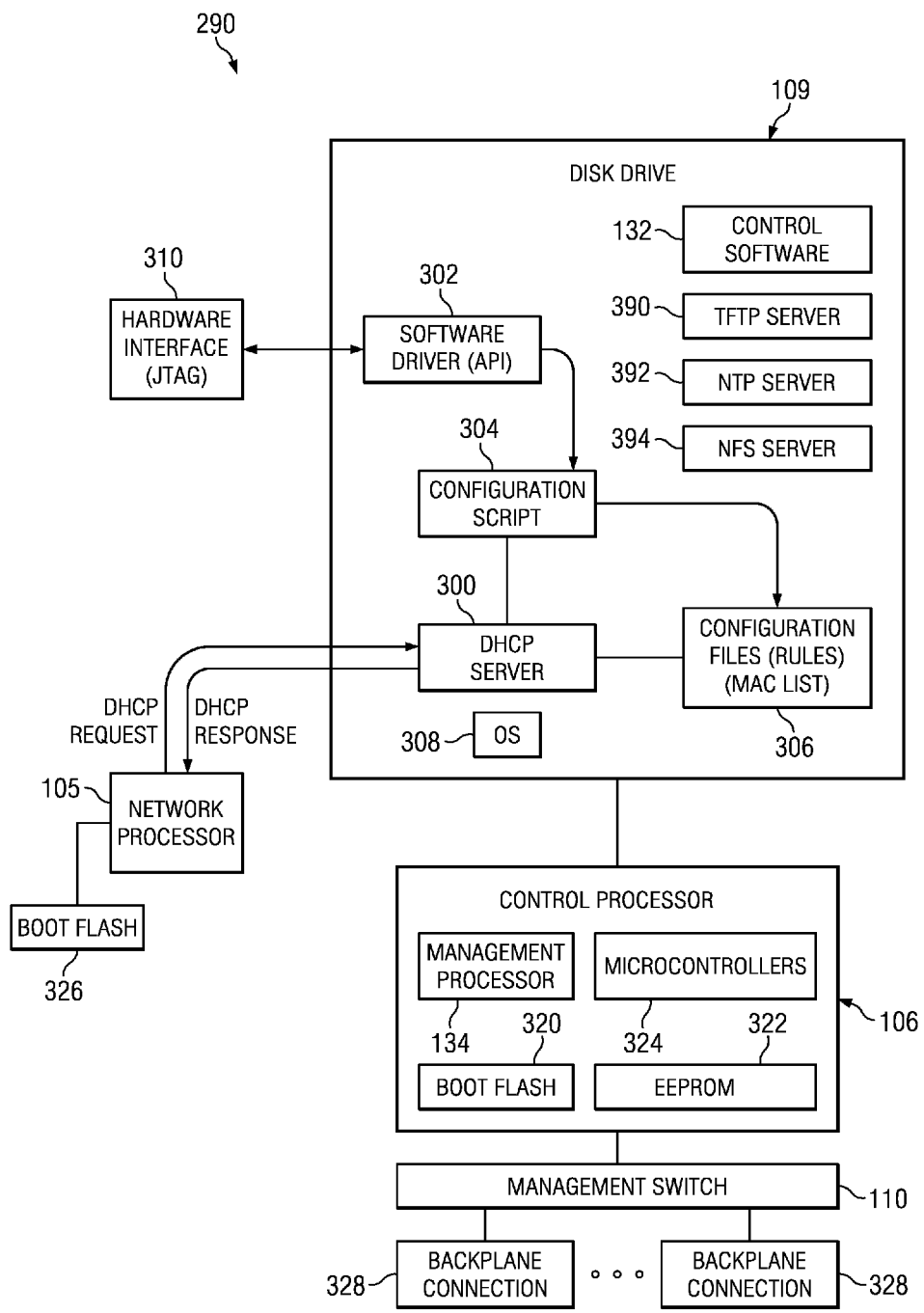
FIG. 20 illustrates an example DHCP-based boot management system in a network testing system, according to an example embodiment.

Referring to FIG. 20, a DHCP-based boot management system 290 may include control CPU 106 connected to a solid-state disk drive 109 storing a DHCP server 300, a software driver 302, a configuration script 304 configured to generate configuration files 306, an operating system 308, a Trivial File Transfer Protocol server (TFTP server) 340, a Network Time Protocol (NTP) or Simple Network Time Protocol (SNTP) server 342, and a Network File System (NFS server) 344. Configuration script 304 may communicate with external hardware via software driver 302 and a hardware interface (e.g., JTAG) 310. Controller 106 may include management processor 134, controller software 132, a bootflash 320, and an EEPROM 322.

As discussed below, configuration script 304 may be configured to run DHCP server 300, and to automatically and dynamically write new configuration files 306 based on the current configuration of system 16, including automatically generating a list of MAC addresses or potential MAC addresses for various devices for which communications may be monitored. Configuration script 304 may communicate with system hardware via software driver (API) 302 to determine the physical slot 52 in which the card 54 is located. Configuration file 306 generated by configuration script 304 may include a list of possible valid MAC addresses that may be self-generated by network processors 105 (as discussed below) or other offload processors such that DHCP server 300 can monitor for communications from network processors 105 on the same card 54. In some embodiments, configuration file 306 may also list possible valid MAC addresses for particular devices unable to boot themselves or particular devices on a card 54 located in a particular slot 52 (e.g., slot 0). Thus, by automatically generating a configuration file including a list of relevant MAC addresses, configuration script 304 may eliminate the need to manually compile a configuration file or MAC address list.

Figure 21:
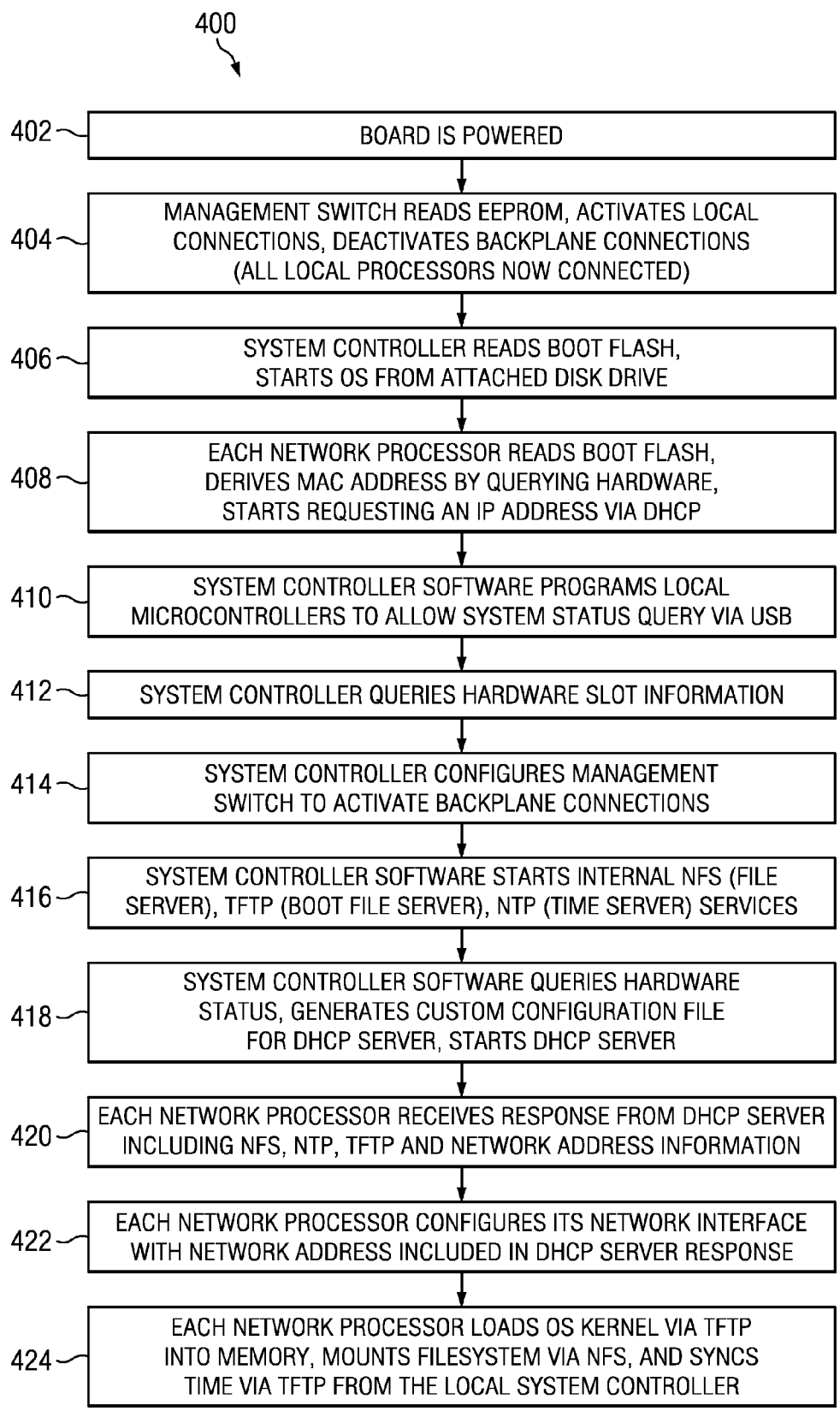
FIG. 21 illustrates an example DHCP-based boot process for a card or blade of a network testing system, according to an example embodiment.

FIG. 21 illustrates an example method 400 for booting up a card 54 of system 16, according to an example embodiment. The boot-up process may involve management switch 110, controller 106, network processors 105, CLDs 102, and backplane 56.

In general, control CPU 106 boots itself first, then boots management server 110, then loads DHCP server 300 and TFTP server 340, NTP server 342, and NFS server 344 stored on disk 109. After the control CPU 106 finishes loading its servers, each network processor 105 loads itself and obtains address and other information via a DHCP request and response. A more detailed description is provided below.

At step 402, the board 54 is powered. At step 404, management switch 110 reads an EEPROM connected to management switch 110, activates local connections between controller 106, network processors 105, and CLDs 102, etc. on card 54, and deactivates backplane connections 328, such that all local processors 105 and 106 and CLDs 102 are connected.

In some embodiments, board 54 disables signaling to the backplane 56 (by deactivating backplane connections 328) and keeps such connections deactivated unless and until board 54 determines a need to communicated with another board 54 in system 16. Enabling an Ethernet transceiver when there is no receiver on the other side on the backplane 56 causes extra electromagnetic radiation emissions, which may run counter FCC regulations. Thus, disabling backplane signaling may reduce unwanted electromagnetic radiation emissions, which may place or keep system 16 within compliance for certain regulatory standards.

In addition, in one embodiment, each management switch 110 can potentially connect to three other switches on the backplane 56 (in other embodiments, management switch 110 may connect to more other switches). The switch 110 may also provide a function called "loop detection" that is implemented via a protocol known as "spanning tree." Loops are typically undesirable in Ethernet systems because a packet may get caught in the loop, causing a "broadcast storm" condition. In certain embodiments, the backplane architecture of system 16 is such that if every switch 110 comes with its backplane connections enabled and all boards 54 are populated in the system, the switches 110 may detect a loop configuration and randomly disable ports, depending on which port was deemed to be "looped" first by system 16. This may cause boards 54 to become randomly isolated from each other on the backplane 56. Thus, by first disabling all backplane connections, and then carefully only enabling the connections in a manner that prevents a loop condition from occurring, the possibility of randomly isolating boards from each other may be reduced or eliminated. In other embodiments, this potential program is addressed by using a different backplane design, e.g., by using a "star" configuration as opposed to a "mesh" configuration, such that the backplane connections may remain enabled.

At step 406, system controller 106 reads bootflash 320 and loads its operating system 308 from attached disk drive 109. At step 408, each network processor 105 reads local bootflash 326 and begins a process of obtaining an operating system 308 from attached disk drive 109 via DHCP server 300, by requesting an IP address from DHCP server 300, as discussed below. Each network processor 105 can complete the process of loading an operating system 308 from disk drive 109 after receiving a DHCP response from DHCP server 300, which includes needed information for loading the operating system 308, as discussed below. In some embodiments, disk drive 109 stores different operating systems 308 for controller 106 and network processors 105. Thus, each processor (controller 106 and individual network processors 105) may retrieve the correct operating system 308 for that processor via DHCP server 300.

Bootflash 320 and 326 may contain minimal code sufficient to load the rest of the relevant operating system 308 from drive 109. Each network processor 105 on a card 54 automatically derives a MAC address for itself and requests an IP address by sending out a series of DHCP requests that include the MAC address of that network processor 105. As discussed above, the MAC address derived by each network processor 105 may indicate . . . To derive the slot-identifying MAC address for each network processor 105, instructions in bootflash 326 may interrogate a Complex Programmable Logic Device (CPLD) 348 to determine which slot 52 the card 54 is located in, which may then be incorporated in the MAC address for the network processor 105. Steps 404, 406, and 408 may occur fully or partially simultaneously.

At step 410, system controller software 132 programs local microcontrollers 324 so it can query system status via USB. At step 412, system controller 106 queries hardware slot information to determine which slot 52 the card 54 is located. At step 414, system controller 106 configures management switch 110 to activate backplane connections 328. Because slots 52 are connected in a mesh fashion by backplane 56, the backplane connections 328 may be carefully configured to avoid switch loops. For example, in an example 3-slot embodiment: in slot 0, both backplane connections 328 are activated; in slot 1, only one backplane connection 328 is activated; and in slot 2, the other backplane connection 328 is activated.

At step 416, system controller software 132 starts internal NFS server 344, TFTP server 340, and NTP server 342 services. At step 418, system controller software 132 queries hardware status, generates a custom configuration file 304 for the DHCP server 300, and starts DHCP server 300. After DHCP server 300 is started, each network processor 105 receives a response from DHCP server 300 of the local system controller 106 at step 420, in response to the DHCP requests initiated by that network processor 105 at step 408. The DHCP response to each network processor 105 may include NFS, NTP, TFTP and IP address information, and identify which operating system 308 to load from drive 109 (e.g., by including the path to the correct operating system kernel and filesystem that the respective network processor 105 should load and run).

At step 422, each network processor 105 configures its network interface with the supplied network address information. At step 424, each network processor 105 downloads the relevant OS kernel from drive 109 into its own memory using TFTP server 340, mounts filesystem via NFS server 344, and synchronizes its time with the clock of the local system controller 106 via NTP server 342.

In one embodiment, the NTP time server 342 is modified to "lie" to the network processors 105. Network processors 105 have no "realtime clock" (i.e., they always start up with a fixed date). With the NTP protocol, before an NTP server will give the correct time to a remote client, it must be reasonably sure that its own time is accurate, determined via "stratum" designation. This normally takes several minutes, which introduces an undesirable delay (e.g., the network processor 105 would need to delay boot). Thus, the NTP server immediately advertises itself as a stratum 1 server to fool the NTP client on the network processors 105 to immediately synchronize.

Figure 22:
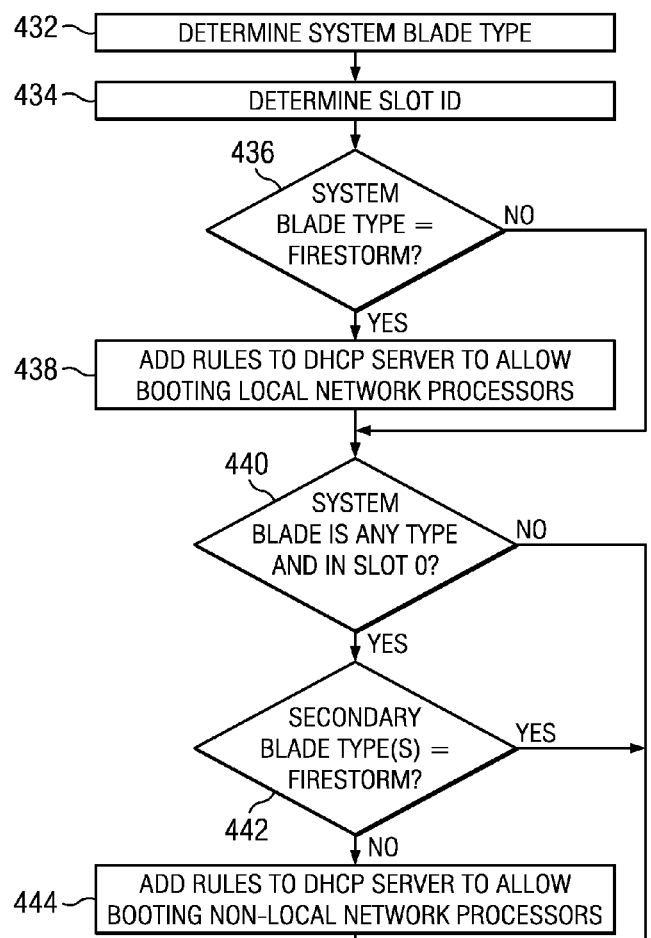
FIG. 22 illustrates an example method for generating a configuration file during a DHCP-based boot process in a network testing system, according to an example embodiment.

FIG. 22 illustrates an example method 430 for generating a configuration file 306 during the boot-up process shown in FIG. 21, according to an example embodiment. At steps 432 and 434, control software 132 determines the card type and the slot in which the card 54 is inserted by programming local microcontrollers 324 and querying microcontrollers 324 for the blade type and slot ID. At step 436, control software 132 determines whether the card is a specific predetermined type of card (e.g., a type of card that includes a local control processor). If so, at step 438, control software 132 activates the configuration script 304 to add rules to configuration file 306 that allow booting of local network processors 105 via DHCP server 300. If the card is not the specific predetermined type of card, control software 132 determines whether the card is in slot 0 (step 440), and whether any other slot in the chassis currently contains a different type of card (e.g., a card that does not include a local control processor) (step 442). If the card is in slot 0, and any other slot in the chassis currently contains a card of a type other than the specific predetermined type of card, the method advances to step 444, in which control software 132 activates the configuration script 304 to add rules to configuration file 306 that to allow booting non-local network processors (i.e., NPs in other cards in the chassis). Control software 132 may determine the number of slots in the chassis, and add MAC addresses for any processor type (e.g., particular type of network processor) that does not have a local control processor.

Packet Capture and Routing

CLD-Based Packet Routing

The generalized architecture characteristics of the embodiments of the present disclosure enable allows flexible internal routing of received network messages. However, some applications may require routing rules to direct traffic matching certain criteria to a specific network processor. For example, in certain embodiments, applications or situations, when a particular network processor sends a network message to a device under test it is advantageous that the responsive network message is routed back to the originating network processor, and in particular to the same core of the originating network processor, e.g., to maintain thread affinity. As another example, in some embodiments, applications, or situations, all network traffic received on a particular virtual local area network (VLAN) should be routed to the same network processor.

These solutions differ from conventional Internet Protocol (IP) routing approaches, which utilize a table of prefix-based rules In conventional IP routers, each rule includes an IP address (four bytes in IPv4) and a mask indicating which bits of the IP address should be considered when applying the rule. The IP router searches the list of rules for each received packet and applies the rule with the longest prefix match. This approach works well for IP routing because rules often apply to subnetworks defined by a specific number of most significant bits in an IP address. For example, consider a router with the following two rule prefixes:

a) 128.2.0.0 (255.255.0.0)—all traffic starting with 128.2
b) 128.0.0.0 (255.0.0.0)—all traffic starting with 128

A packet arriving with a destination address of 128.2.1.237 would match both rules, but rule "a" would be applied because it matches more bits of the prefix.

The conventional rule-based approach does not work well for representing rules with ranges. For example a rule applying to IP addresses from 128.2.1.2 to 128.2.1.6 would require five separate entries in a traditional routing table including the entries 128.2.1.2, 128.2.1.3, 128.2.1.4, 128.2.1.5, and 128.2.1.6 (each with a mask of 255.255.255.255). For certain testing applications, system 16 needs to bind ranges of IP addresses to a particular processor (e.g., a particular network processor or a particular control CPU). For example, in a network simulation, each processor may simulate an arbitrary set of hosts on a system. In certain embodiments, each packet received must arrive at the assigned processor so that the assigned processor can determine whether responses were out of sequence, incomplete, or delayed. To achieve this goal, routing CLDs 102A may implement a routing protocol optimized for range matching.

Figure 23:
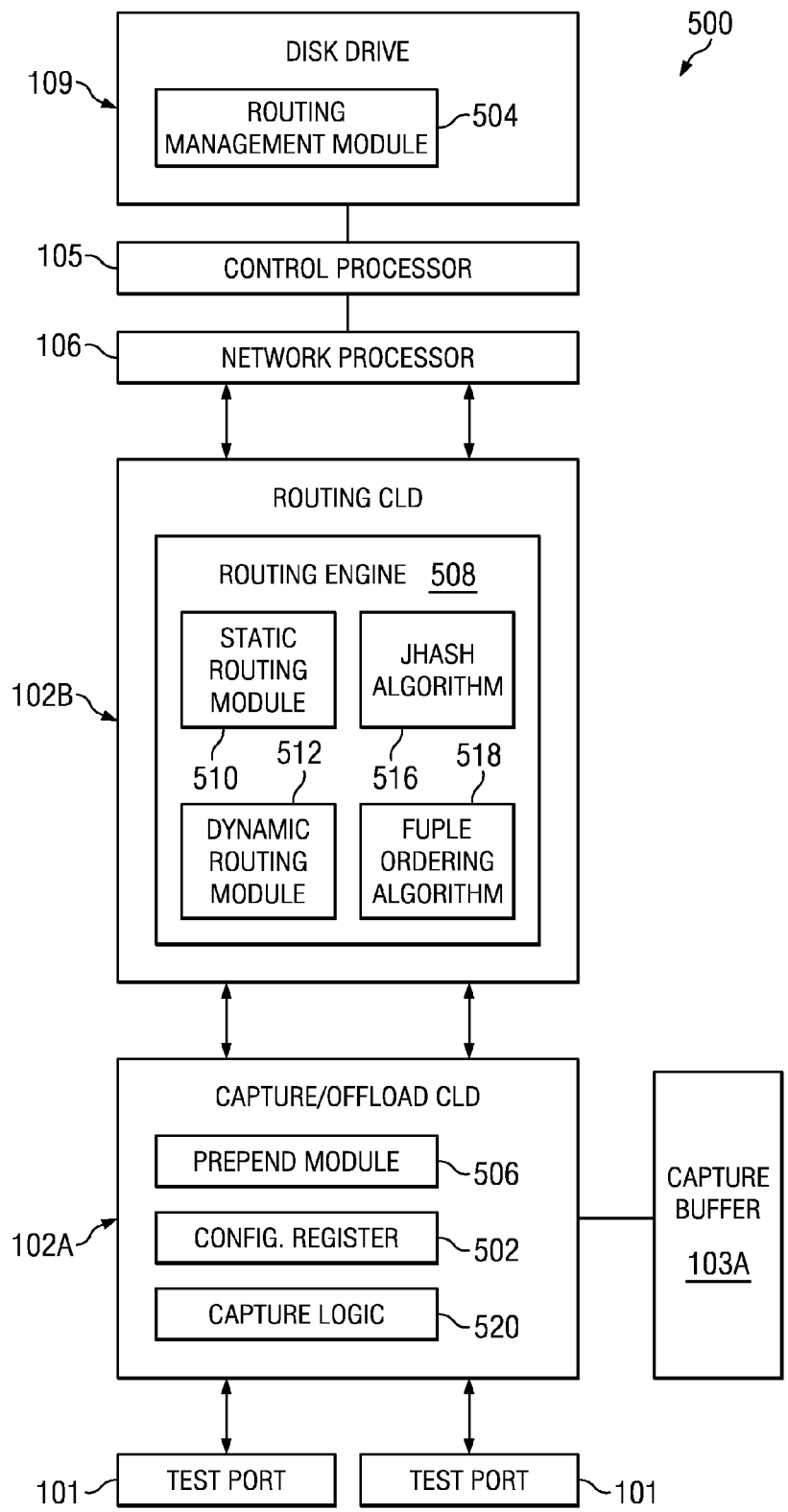
FIG. 23 illustrates portions of an example packet processing and routing system of a network testing system, according to an example embodiment.

FIG. 23 illustrates portions of an example packet processing and routing system 500, according to one embodiment. As shown, packet processing and routing system 500 may include control processor 106, a network processor 105, a routing CLD 102B (e.g., routing FPGA 102B shown in FIGS. 14A-14B), a capture/offload CLD 102A (e.g., capture/offload FPGA 102A shown in FIGS. 14A-14B), and test ports 101, and may include a configuration register 502, a routing management module 504, a prepend module 506, a capture logic 520, and a CLD-implemented routing engine 508, which may include a static routing module 510, and a dynamic routing module 512. Each of routing management module 504, prepend module 506, capture logic 520, and CLD-implemented routing engine 508, including static routing module 510 and dynamic routing module 512 may include any suitable software, firmware, or other logic for providing the various functionality discussed below. In example FIG. 23, configuration register 502 and prepend module 506 are illustrated as being embodied in capture/offload CLD 102A, while routing engine 508, including static routing module 510 and dynamic routing module 512, is illustrated as being embodied in routing CLD 102B. However, it should be clear that each of these modules may be implemented in the other CLD or may be implemented across both CLD 102A and CLD 102B (e.g., a particular module may include certain logic in CLD 102A for providing certain functionality associated with that module, and certain other logic in CLD 102B for providing certain other functionality associated with that module).

Figure 24:
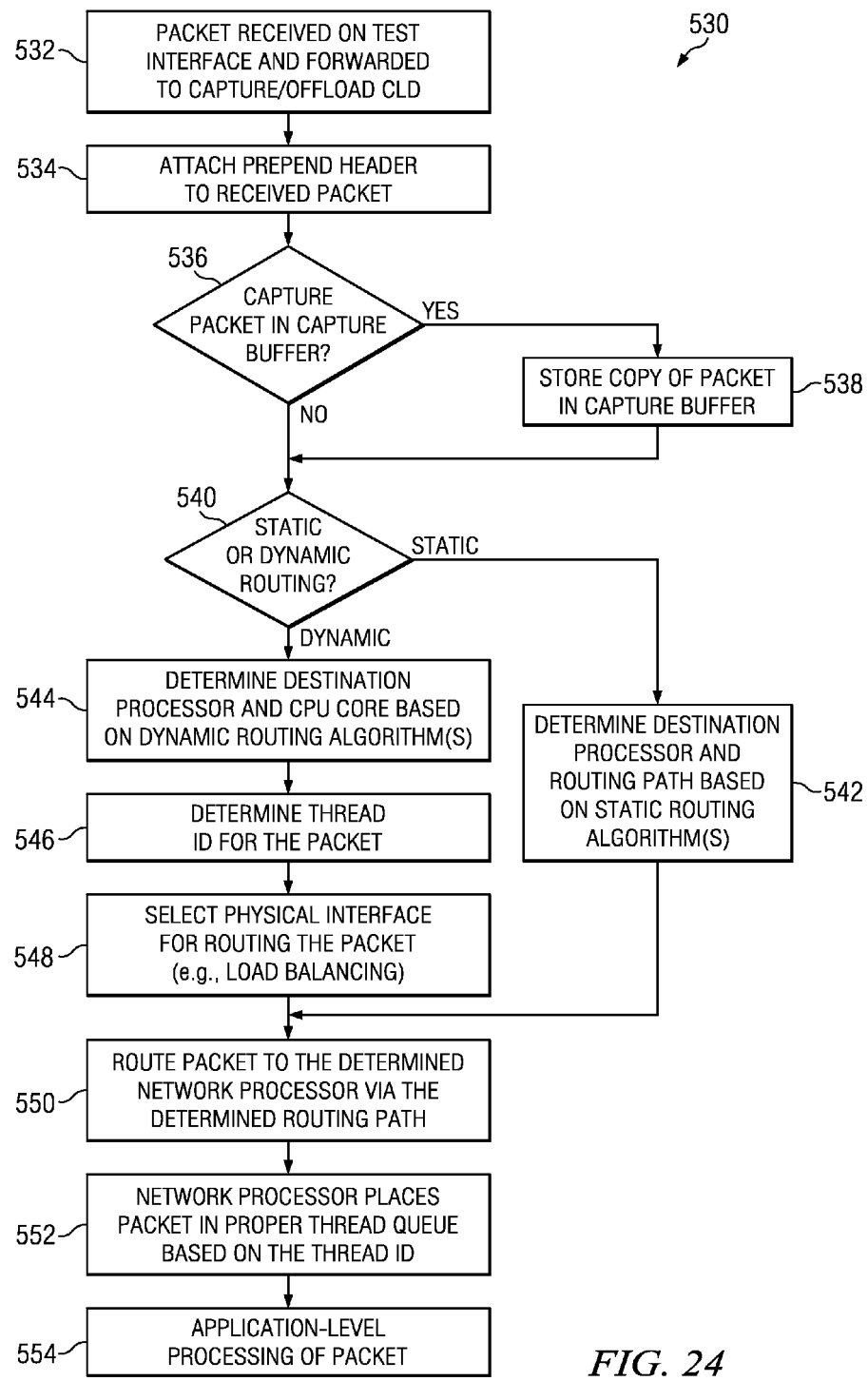
FIG. 24 illustrates an example method for processing and routing a data packet received by a network testing system using the example packet processing and routing system of FIG. 23, according to an example embodiment.

FIG. 24 is a flowchart illustrating an example method 530 for processing and routing a data packet received by system 16 using example packet processing and routing system 500 shown in FIG. 23, according to an example embodiment. At step 532, a packet (e.g., part of a data stream from test network 18) is received at system 16 on a test interface 101 and forwarded to capture/offload CLD 102A via a physical interface. At step 534, prepend module 506 attaches a prepend header to the received packet. The prepend header may include one or more header fields that are presently populated, including a timestamp indicting the arrival time of the packet, and one or more header fields that may be populated later, e.g., a hash value to be subsequently populated by routing module 508 in routing CLD 102B, as discussed below. The prepend header is discussed in greater detail below, following this description of method 530.

At step 536, capture/offload CLD 102A determines whether to capture the packet in capture buffer 103A, based on capture logic 520. Prior to the start of the present method, controller 106 may instruct capture logic 520 to enable or disable packet capture, e.g., for all incoming packets or selected incoming packets (e.g., based on specified filters applied to packet header information). Thus, at step 536, capture/offload CLD 102A may determine whether to capture the incoming packet, i.e., store a copy of the packet (including prepend header) in capture buffer 103A based on the current capture enable/disable setting specified by capture logic 520 and/or header information of the incoming packet. In one embodiment, prepend module 506 may include a capture flag in the prepend header at step 534 that indicates (e.g., based on capture logic 520 and/or header information of the incoming packet) whether or not to capture the packet Thus, in such embodiment, step 536 may simply involve checking for such capture flag in the prepend header.

Based on the decision at step 536, the packet may be copied and stored in capture buffer 103A, as indicated at step 538. The method may then proceed to the process for routing the packet to a network processor 105. Processing and routing system 500 may provide both static (or "basic") routing and dynamic routing of packets from ports 101 to network processors 105. At step 540, system 500 may determine whether to route the packet according to a static routing protocol or a dynamic routing protocol. Routing management module 504 running on control processor 106 may be configured to send instructions to configuration register 502 on CLDs 102A to select between static and dynamic routing as desired, e.g., manually based on user input or automatically by controller 106. Such selection may apply to all incoming packets or to selected incoming packets (e.g., based on specified filters applied to packet header information).

If static (or "basic") routing is determined at step 540, the packet may be forwarded to routing CLD 102B, at which static routing module 510 may apply a static routing algorithm at step 542 to determine a particular destination processor 105 and physical interface (e.g., a particular SPI-4.2 port bus and/or a particular XAUI port) for forwarding the packet to the destination processor 105. An example static packet routing algorithm is discussed below.

Alternatively, if dynamic routing is determined at step 540, the packet may be forwarded to routing CLD 102B, at which dynamic routing module 512 may apply a dynamic routing process at steps 544 through 548 to dynamically route the packet to the proper network processor 105, the proper core within that network processor 105, the proper thread group within that core, and the proper thread within that thread group (e.g., to route the packet to the thread assigned to the conversation in which that packet is involved, based on header information of the packet), as well as providing load balancing across multiple physical interfaces (e.g., multiple SPI4 interfaces) connected to the target network processor 105.

At step 544, dynamic routing module 512 may determine the proper destination network processor 105 and CPU core of that processor based on dynamic routing algorithms. At step 546, dynamic routing module 512 may determine a thread ID associated with the packet being routed. At step 548, dynamic routing module 512 may determine select a physical interface (e.g., a particular SP14 interface) over which to route the packet to the destination network processor 105, e.g., to provide load balancing across multiple physical interfaces. Each of these steps of the dynamic routing process, 544, 546, and 548, is discussed below in greater detail. It should also be noted that one or more of these aspects of the dynamic routing process may be incorporated into the static routing process, depending on the particular embodiment and/or operational situation. For example, in some embodiments, static routing may incorporate the thread ID determination of step 546 in order to route the packet to a particular thread corresponding to that packet.

Once the static or dynamic routing determinations are made as discussed above, routing CLD 1028 may then route packet to the determined network processor 105 over the determined routing path (e.g., physical interface(s)) at step 550. At step 552, the network processor 105 receives the packet and places the packet in the proper thread queue based on the thread ID determined at step 546. At step 554, the network processor 105 may then process the packet as desired, e.g., using any application-level processing. Various aspects of the routing method 530 are now discussed in further detail.

Prepend Header

In some embodiments, once the key has been obtained for an ingress packet, routing engine 508 may prepend a destination specific header to the packet. Likewise, every packet generated by control processor 106 or network processor 105 for transmission by interface 101 includes a prepend header that will be stripped off by capture/offload CLD 102A prior to final transmission. These prepend headers may be used to route this traffic internally n system 16.

The prepend header added by capture/offload CLD 102A to ingress packets arriving at interface 101 for delivery to a network processor may contain the following information, according to certain embodiments of the present disclosure:

```
struct np_extport_ingress_hdr {
    uint32_t timestamp;
    uint32_t physical_interface:3;
    uint32_t thread_id:5;
    uint32_t l3_offset:8;
    uint32_t l4_offset:8;
    uint32_t flags:8;
    uint32_t hash;
    uint32_t unused;
} _attribute_((_packed_))
```

The np_extport_ingress_hdr structure defines the prepend fields set on all packets arriving from an external port to be processed by a network processor, according to certain embodiments of the present disclosure. The timestamp field may be set to the time of receipt by the capture/offload CLD 102A receiving the packet from interface 101. This timestamp may be used to determine all necessary and useful statistics relating to timing as it stops the clock prior to any internal routing or transmission delays between components within the network testing system. The physical_interface field (which may be set by routing engine 508) contains information sufficient to uniquely identify the physical port on which the packet was originally received. The thread_id field contains information sufficient to uniquely identify the software thread on the network processor that will process this incoming packet.

As described elsewhere in this specification, maintaining ordering and assigning packets to thread groups ensures that the testing application has complete visibility into all of the packets in a given test scenario. The L3 and L4 offset fields indicate the location within the original packet of the OSI layer three and four packet headers. In some embodiments, these offset fields may be is determined by capture/offload CLDs 102A and stored for later use. Header offsets may be time-consuming to determine due to the possible presence of variable-length option fields and additional embedded protocol layers. Because the header offsets must be determined in order to perform other functions (e.g., checksum verification described below), this information may efficiently be stored in the prepend header for future reference. For instance, parsing VLAN tags can be time-consuming because there may be many different values that may be used for VLAN tag identification, and because VLAN headers may be stored on unaligned boundaries. However, if the capture/offload CLD 102A indicates that the L3 header is at a 14 byte offset, this fact may immediately indicate the lack of VLAN tags. In that case, routing engine 508 and/or network processor 105 may skip VLAN parsing altogether. In another instance, if parsing L3 headers (IPv4 and IPv6) can be slowed by the presence of option headers, which are of variable length. By looking at the L4 header byte offset, network processor 105 can immediately determine whether options are present and may skip attempts to parse those options if they are not present.

The flags field indicates additional information about the packet as received. In some embodiments, flags may indicate whether the certain checksum values were correct, indicating that the data was likely transferred without corruption. For example, flags may indicate whether layer 2, 3, or 4 checksums were valid or whether an IPv6 tunnel checksum is valid. The hash field is the hash value determined by capture/offload CLDs 102A and stored for later use.

The prepend header for packets generated by a network processor for transmission via interface 101 may contain the following information, according to certain embodiments of the present disclosure:

```
struct np_extport_egress_hdr {
    uint32_t unused;
    uint32_t physical_interface:3;
    uint32_t unused2:13;
    uint32_t timestamp_word_offset:8;
    uint32_t flags:8;
    uint32_t unused3[2];
} _attribute_((_packed_));
```

The np_extport_egress_hdr structure defines the prepend fields set on all packets generated by a network processor to be sent on an external port to be processed by a network processor, according to certain embodiments of the present disclosure. The physical_interface field contains information sufficient to identify the specific physical interface on which the packet was received. The timestamp_word_offset field indicates the location within the packet of the timestamp field for efficient access by capture/offload CLD 102A.

The prepend header for packets arriving via interface 101 for delivery to a control processor may contain the following information, according to certain embodiments of the present disclosure:

```
struct bps_extport_ingress_hdr {
    uint32_t timestamp;
    uint8_t intf;
    uint8_t l3_offset;
    uint8_t l4_offset;
    uint8_t flags;          // signals to processors the status of
                            checksums
    uint32_t hash;
    uint16_t ethtype;       // used to fool Ethernet MAC (0x800)
    uint16_t thread_id ;    // used for routing packets to a particular
                            // core/thread within a processor
};
```

The ethtype field is included in the prepend header and set to 0x800 (e.g., the value for Internet Protocol, Version 4 or IPv4) for ingress and egress traffic, though it ignored by the CLD and network processor hardware/software. This type value used to fool the Ethernet interface chipset (e.g., the INTEL 82599 Ethernet MAC or other suitable device) interfaced with the control processor into believing the traffic is regular IP over Ethernet when the system is actually using the area as a prepend header. Because this is a point-to-point link and because the devices on each end of the communication channel are operating in a raw mode or promiscuous mode, the prepend header may be handled properly on both ends without confusing a traditional networking stack. If the ethtype field were set to any value less than 0x600, the value would be treated as length instead under IEEE Standard 802.3x-1997.

The fields of the ingress prepend header for packets arriving on an external port and transmitted to the control processor are listed in the structure named bps_export_ingress_hdr. The timestamp field is set to the time of receipt by the capture/offload CLD 102A receiving the packet from interface 101. The intf field specifies the specific interface 101 on which the ingress packet arrived. The L3 and L4 offset fields indicate the location within the original packet of the OSI layer three and four packet headers. The flags field indicates additional information about the packet as received. In some embodiments, flags may indicate whether the certain checksum values were correct, indicating that the data was likely transferred without corruption. For example, flags may indicate whether layer 2, 3, or 4 checksums were valid or whether an IPv6 tunnel checksum is valid. The hash field is the hash value determined by capture/offload CLDs 102A and stored for later use. The thread_id field contains information sufficient to uniquely identify the software thread on the network processor that will process this incoming packet.

The prepend header for packets generated by a control processor for transmission via interface 101 may contain the following information, according to certain embodiments of the present disclosure:

```
struct bps_extport_egress_hdr {
    uint16_t l3_tunnel_offset;
    uint16_t tcp_mss;    // signals to tcp segmentation offload engine the
                         MSS
    uint8_t unused;
    uint8_t intf;        // test interface to send a packet on
    uint8_t timestamp_word_offset; // signals where to insert the
    timestamp
    uint8_t flags;
    uint32_t unused1;
    uint16_t ethtype;    // used to fool Ethernet MAC (0x800)
    uint16_t unused2;
};
```

The fields of the engress prepend header for packets generated by a control processor for transmission via an external port are listed in the structure named bps_export_egress_hdr. The field l3_tunnel_offset identifies the start of the layer 3 tunneled packet header within the packet. The field tcp_mss is a maximum segment size value for use by the TCP segmentation offload processing logic in capture/offload CLD 102A. The intf field specifies the specific interface port 101 that should transmit the packet. The field timestamp_word_offset specifies the location in the packet where the capture/offload CLD 102A should insert the timestamp just prior to transmitting the packet.

The flags field may be used to trigger optional functionality to be performed by, e.g., capture/offload CLD 102A prior to transmission of egress packets. For example, flag bits may be used to instruct capture/offload CLD 102A to generate and set checksums for the IP header, L4 header (e.g., TCP, UDP, or ICMP), and/or a tunnel header. In another example, a flag bit may instruct capture/offload CLD 102A to insert a timestamp at a location specified by timestamp_word_offset. In yet another example, a flag bit may be used to instruct capture/offload CLD 102A to perform TCP segmentation using the tcp_mss value as a maximum segment size.

In some embodiments, the prepend header is encapsulated in another Ethernet header (so a packet would structure be (Ethernet header→prepend header→real Ethernet header). Such embodiments add an additional 14 bytes per-packet in overhead to the communication process versus tricking the MAC using 0x800 as the ethtype value.

Static ("Basic") Packet Routing

Basic packet routing mode statically binds a port to a particular to a destination processor and bus/port. In some embodiments, configuration register 502 takes on the following meaning in the basic packet routing mode:

---

Configuration Register, Address 0x000F_0000:
    bits [1:0] = Destination for port 0
        00 = NP 0
        01 = NP 1
        10 = X86
        11 = Invalid, packets will get dropped.
    bits [6:2] = Invalid in static routing mode
    bit [7] = destination bus for port 0
        0 = SPI 0 / XAUI 0
        1 = SPI 1 / XAUI 1
    bit [8] = invalid in static routing mode
    bit [9] = enable CAM on port 0
        0 = static routing mode
        1 = dynamic routing / cam routing mode
    bits [17:16] = Destination for port 1
        00 = NP 0
        01 = NP 1
        10 = X86
        11 = Invalid, packets will get dropped.
    bits [22:18] = Invalid in static routing mode
    bit [23] = destination bus for port 1
        0 = SPI 0 / XAUI 0
        1 = SPI 1 / XAUI 1
    bit [24] = invalid in static routing mode
    bit [25] = enable CAM on port 1
        0 = static routing mode
        1 = dynamic routing / cam routing mode

---

Dynamic Routing

Packet processing and routing system 500 may provide dynamic packet routing in any suitable manner. For example, with reference to steps 544-548 of method 530 discussed above, dynamic routing module 512 may determine the proper destination network processor 105 and CPU core of that processor based on dynamic routing algorithms, determine a thread ID associated with the packet being routed, and select a physical interface (e.g., a paritcular SPI4 interface) over which to route the packet to the destination network processor 105, e.g., to provide load balancing across multiple physical interfaces.

In certain embodiments, dynamic routing module 512 is configured to determine ingress routing based on arbitrary IPv4 and IPv6 destination address ranges and VLAN ranges. Routing module 508 examines each ingress packet and generates a destination processor 105 and a thread group identifier associated with that processor. Thread groups are a logical concept on the network processors that each contain some number of software threads (i.e., multi-processing execution contexts). The second routing stage calculates a hash value (e.g., jhash value) based on particular header information in each ingress packet: namely, the source IP address, destination IP address, source port, and destination port. This hash value is used to determine which thread within the thread group determined by the CAM lookup to route the packet. In some embodiments, a predefined selected bit (e.g., a bit predetermined in nay suitable manner as the least significant bit (LSB)) of the hash is also used to determine which of multiple physical interfaces on the CPU (ie: SPI 0 or 1, or XAUI 0 or 1) to route the packet, e.g., to provide load balancing across the multiple physical interfaces.

The Content Addressable Memory (CAM) Lookup

Figure 25:
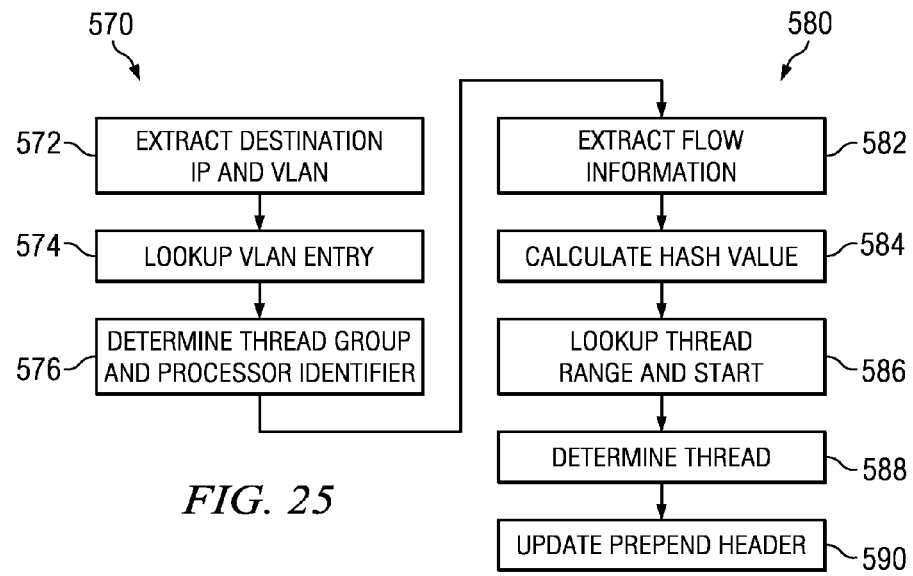
FIG. 25 illustrates a process of dynamic routing determination in a network testing system, according to an example embodiment.

FIG. 25 illustrates dynamic routing determination 570, according to certain embodiments of the present disclosure. At step 572, dynamic routing module 512 may extract destination IP address and VLAN identifier from the ingress packet to be routed. This extraction process may require routing CLD 102B to reparse the L3 headers of the ingress packet if the IP destination address and VLAN identifier were not stored in the prepend header by capture/offload CLD 102A.

At step 574, dynamic routing module 512 may perform a lookup into the VLAN table indexed by the VLAN identifier extracted from the packet to be routed. At step 576, dynamic routing module 512 may search the exception table for an entry matching the destination IP address of the ingress packet, or may fall back on a VLAN or system-wide default.

This method may be better understood in the context of certain data structures referenced above. Routing entries are stored in IP address ranges on a per-VLAN basis. The CAM is made up of a 4 k×32 VLAN table (e.g., one entry per possible VLAN value), a 16 k×256 Exception table, and a 16 k×32 key table. The VLAN table may indicate the default destination for that VLAN, and may contain the location in the exception table that contains IP ranges associated with that VLAN. In some embodiments, the VLAN table may include start and end indices into the exception table to allow overlap and sharing of exception table entries between VLAN values. Each of these tables may be setup or modified by routing management module 504. Additional information about these three routing tables is included as follows, according to certain embodiments of the present disclosure.

The VLAN table may be located at the following base address (e.g., in the address space of routine CLD 102B):

port 0 = 0x0030_0000-0x0030_0FFF
port 1 = 0x0050_0000-0x0050_0FFF

The Exception table may be located at the following base address (e.g., in the address space of routing CLD 102B):

port 0 = 0x0020_0000-0x0028_FFFF
port 1 = 0x0040_0000-0x0048_FFFF

Configuration Register, Address 0x000F_0000 (e.g., in the address space of routing CLD 102B):

bits [5:0] = Default key for port 0
bit [8] = enable ipv6 for port 0
bit [9] = enable CAM on port 0
bits [21:16] = Default key for port 1
bit [24] = enable ipv6 for port 1
bit [25] = enable CAM on port 1

In certain embodiments, each entry of the VLAN table may be a 32 bit word formatted as follows:

bits [14:0]: address of the first IP range entry in the Exception table for this VLAN
bits[15]: VLAN valid. This bit must be set to 1 for this VLAN entry to be considered valid
bits[21:16]: Number of exceptions for this VLAN
bits[30:24]: Default destination. Use this value if no range is matched in the exception table.
bits[31]: unused In certain embodiments, address bits [13:2] of the VLAN table are the VLAN identifier. So, to configure VLAN 12'h2783 for port 0, you would write to location 0x309E0C. Because entries in the VLAN table have a start address into the Exception Table and a count (e.g., bits[21:16]), it is possible to have VLAN entries with overlapping rules or one VLAN entry may reference a subset of the exception table referenced by another VLAN entry.

The exception table may contain all of the IP ranges for each VLAN. Any given entry in the exception table can contain 1 IPv6 exception or up to 4 IPv4 exceptions. IPv6 and IPv4 cannot be mixed in a single entry, however there is no restriction on mixing IPv6 entries with IPv4 entries.

Exception Base Address:
port 0=0x20_0000
port 1=0x40_0000

TABLE 3

| | | | | | | | | |
|---|---|---|---|---|---|---|---|---|
| | | | | | Exception Format | | | |
| offset | bits [255:224] | bits [223:192] | bits [191:160] | bits [159:128] | Bits [127:96] | Bits [95:64] | Bits [63:0] | Bits [31:0] |
| Base + | IPV4 | IPV4 | IPV4 | IPV4 | IPV4 | IPV4 | IPV4 | IPV4 |
| (Row * | Range 3 | Range 3 | Range 2 | Range 2 | Range 1 | Range 1 | Range 0 | Range 0 |
| 32) | Upper | lower | Upper | lower | Upper | lower | Upper | lower |
| | Address | address | Address | address | Address | address | Address | address |
| | | | IPV6 Range 0 Upper | | | | IPV6 Range 0 Lower | |

Key Base address:
   port 0 = 0x28_0000
   port 1 = 0x48_0000

TABLE 4

Key Table Format

| offset | bit[31] | Bits[30:24] | Bits[22:16] | Bits[14:8] | Bit[6:0] |
|---|---|---|---|---|---|
| Base + (Row * 4) | IPV6 Enable 0 = Row is 4 IPV4 Ranges 1 = Row is 1 IPV6 Range | IPV4 Range 3 Key | IPV4 Range 2 Key Unused in IPV6 | IPV4 Range 1 Key | IPV4 Range 0 Key IPV6 Range 0 Key |

In certain embodiments, each entry of the VLAN table has the following format:

IPv4 Entry:

```
Exception Table:

bits[255:224]: Range 3 upper address
bits[223:192]: Range 3 lower address
bits[191:160]: Range 2 upper address
bits[159:128]: Range 2 lower address
bits[127:96]: Range 1 upper address
bits[95:64]: Range 1 lower address
bits[63:32]: Range 0 upper address
bits[31:0]: Range 0 lower address
Key Table:

bit [31]: 0 = IPv4, 1 = IPv6.
Bits[30:24]: Key for range 3
bits[22:16]: Key for range 2
bits[14:8]: Key for range 1
bits[6:0]: Key for range 0
```

IPv6 Entry:

```
Exception Table:
bits[255:128]: Range 0 upper address
bits[127:0]: Range 0 lower address
Key Table:
bit [31]: 0 = IPv4, 1 = IPv6.
Bits[30:8] : Unused
bits[6:0] : Key for range 0
```

When a match is found for the destination IP address (it falls within a range defined in the exception table), the key for that entry is returned. If no match is found for that entry, the default key for that VLAN is returned. If there is no match for that VLAN, then the default key for the test interface is returned. In some embodiments, the format of the key is as follows:

```
key bits [1:0] = Destination processor
   00 = NP0
   01 = NP1
   10 = X86
   11 = UNUSED
key bits [5:2] = Processor thread group.
```

Flow Affinity

Many network analysis mechanisms require knowledge of the order in which packets arrived at system 16. However, with the significant parallelism present in system 16 (e.g., multiple processor's and multiple cores per processor), a mechanism is needed to ensure packet ordering. One approach employed is a method called "flow affinity." Under this method, packets for a given network traffic flow should always be received and processed by the same CPU thread. Otherwise, packets may be processed out of order as a flow ping-pongs between CPU threads, reducing performance as well as causing false-positive detection of packet loss for network performance mechanisms like TCP fast-retransmit. The rudimentary hardware support for flow affinity provided by network processor 105 is simply not sufficiently flexible to account for all the types of traffic processed by system 16. The present disclosure presents a flexible flow affinity solution through a flow binding algorithm implemented in a CLD (e.g., routing CLD 102B).

FIG. 25 illustrates the flow affinity determination 580, according to certain embodiments of the present disclosure. At step 582, routing module 508 parses each ingress packet to extract flow information, for example the 4-tuple of: destination IP address, source IP address, destination port, and source port of the ingress packet. This 4-tuple defines a flow. In some embodiments, the flow identifying information may be numerically sorted to ensure the same 4-tuple for packets sent in both directions, especially where system 16 is operating as a "bump in the line" between two devices under observation. In other embodiments, source and destination information may be swapped for packets received on a specific external interface port to achieve a similar result. At step 584, jhash module 516 calculates a hash value on the flow identification information. In some embodiments, the extraction and hash steps are performed elsewhere, e.g., offload/capture CLD 102A and the hash value is stored in the prepend header for use by flow affinity determination 580.

At step 586, routing module 508 looks up in Table 5 the number of threads value and starting thread value corresponding to the previously determined (e.g., at step 576) thread group and processor identifier for the packet. In some embodiments, each processor may have up to 16 thread groups. In other embodiments, each processor may have up to 32 thread groups. A thread group may have multiple threads associated with it. The routing management module 504 may configure the thread associations, e.g., by modifying Table 5 on routing CLDs 102B.

TABLE 5

| Thread Group | NP0: | NP1: | X86: | Bits[12:8] | Bits [4:0] |
|---|---|---|---|---|---|
| 0 | 0xF_0200 | 0xF_0280 | 0xF_0300 | Num threads | Starting Thread |
| 1 | 0xF_0204 | 0xF_0284 | 0xF_0304 | Num threads | Starting Thread |
| 2 | 0xF_0208 | 0xF_0288 | 0xF_0308 | Num threads | Starting Thread |
| 3 | 0xF_020C | 0xF_028C | 0xF_030C | Num threads | Starting Thread |
| 4 | 0xF_0210 | 0xF_0290 | 0xF_0310 | Num threads | Starting Thread |
| 5 | 0xF_0214 | 0xF_0294 | 0xF_0314 | Num threads | Starting Thread |
| 6 | 0xF_0218 | 0xF_0298 | 0xF_0318 | Num threads | Starting Thread |
| 7 | 0xF_021C | 0xF_029C | 0xF_031C | Num threads | Starting Thread |
| 8 | 0xF_0220 | 0xF_02A0 | 0xF_0320 | Num threads | Starting Thread |
| 9 | 0xF_0224 | 0xF_02A4 | 0xF_0324 | Num threads | Starting Thread |
| 10 | 0xF_0228 | 0xF_02A8 | 0xF_0328 | Num threads | Starting Thread |
| 11 | 0xF_022C | 0xF_02AC | 0xF_032C | Num threads | Starting Thread |
| 12 | 0xF_0230 | 0xF_02B0 | 0xF_0330 | Num threads | Starting Thread |
| 13 | 0xF_0234 | 0xF_02B4 | 0xF_0334 | Num threads | Starting Thread |
| 14 | 0xF_0238 | 0xF_02B8 | 0xF_0338 | Num threads | Starting Thread |
| 15 | 0xF_023C | 0xF_02BC | 0xF_033C | Num threads | Starting Thread |
| 16 | 0xF_0240 | 0xF_02C0 | 0xF_0340 | Num threads | Starting Thread |
| 17 | 0xF_0244 | 0xF_02C4 | 0xF_0344 | Num threads | Starting Thread |
| 18 | 0xF_0248 | 0xF_02C8 | 0xF_0348 | Num threads | Starting Thread |
| 19 | 0xF_024C | 0xF_02CC | 0xF_034C | Num threads | Starting Thread |
| 20 | 0xF_0250 | 0xF_02D0 | 0xF_0350 | Num threads | Starting Thread |
| 21 | 0xF_0254 | 0xF_02D4 | 0xF_0354 | Num threads | Starting Thread |
| 22 | 0xF_0258 | 0xF_02D8 | 0xF_0358 | Num threads | Starting Thread |
| 23 | 0xF_025C | 0xF_02DC | 0xF_035C | Num threads | Starting Thread |
| 24 | 0xF_0260 | 0xF_02E0 | 0xF_0360 | Num threads | Starting Thread |
| 25 | 0xF_0264 | 0xF_02E4 | 0xF_0364 | Num threads | Starting Thread |
| 26 | 0xF_0268 | 0xF_02E8 | 0xF_0368 | Num threads | Starting Thread |
| 27 | 0xF_026C | 0xF_02EC | 0xF_036C | Num threads | Starting Thread |
| 28 | 0xF_027D | 0xF_02F0 | 0xF_0370 | Num threads | Starting Thread |
| 29 | 0xF_0274 | 0xF_02F4 | 0xF_0374 | Num threads | Starting Thread |
| 30 | 0xF_0278 | 0xF_02F8 | 0xF_0378 | Num threads | Starting Thread |
| 31 | 0xF_027C | 0xF_02FC | 0xF_037C | Num threads | Starting Thread |

At step 588, routing module 508 may calculate the thread identifier based on the following formula:

thread[4:0]="Starting Thread"+(hash value MOD "Num threads")

At step 590, routing module 508 may update the packet's prepend header to include the thread identifier for subsequent use by the network processor.

Hash Function

Dynamic routing module 512 may perform a hash function in parallel with (or alternatively, before or after) the CAM lookup and/or other aspects of the dynamic routing process. Dynamic routing module 512 may extract header information from each ingress packet and calculates a hash value from such header information using the jhash algorithm. In a particular embodiment, dynamic routing module 512 extracts a 12-byte "4-tuple"—namely, source IP, destination IP, source port, and dest port—from the IP header and UDP header of each ingress packet, and applies a jhash algoritihm 516 to calculate a 32-bit jhash value from such 4-tuple. Dynamic routing module 512 may parse and calculate the hash value each packet at line rate in the FPGAs, which may thereby free up processor cycles in the network processors 105. For example, dynamic routing module 512 may embed the calculated hash value is into the prepend header of each packet so that the network processors 105 can make use of the hash without having to parse the packet or calculate the hash. Dynamic routing module 512 can then use the embedded jhash values for packet routing and load balancing as discussed herein.

As discussed herein, system 16 may utilize the jhash function written by Bob Jenkins (see http://burtleburtle.net/bob/c/lookup3.c) for various functions. As shown, the jhash function may be implemented by CLDs, e.g., FPGAs 102A and/or 102B of the example embodiment of FIGS. 14A-14B. For example, capture/offload FPGAs 102A or routing FPGA 102B may apply the jhash function to header information of incoming packets as discussed above, which may allow increased throughput through system 16 as compared to an arrangement in which the hash functions are implemented by network processors 105 or other CPUs.

In some embodiments, dynamic routing module 512 preprocesses the 4-tuple information before applying the hash function such that all communications of a particular two-way communication flow—in both directions—receive the same hash value, and are thus routed to the same processor core in order to provide flow affinity. Packets flowing in different directions in the same communication flow will have opposite source port and destination port data, which would lead to different hash values (and thus potentially different routing destinations) for the two sides of a particular conversation. Thus, to avoid this result, in one embodiment dynamic routing module 512 05 utilizes a tuple ordering algorithm 518 that orders the four items of the 4-tuple in numerical order (or at least orders the source port and destination port) before applying the hash algorithm, such that the ordered tuple to which the hash function is applied is the same for both sides of the conversation. This technique may be useful for particular applications, e.g., in "bump in the wire" configurations where it is desired to monitor both sides of a conversation (e.g., for simulating or testing a firewall).

Further, dynamic routing module 512 may use jhash value to determine which of multiple physical interfaces (e.g., multiple SPI-4.2 interfaces or multiple XAUI interfaces) to route each packet, e.g., for load balancing across such physical interfaces. For example, a predefined selected bit (e.g., a bit predetermined in any suitable manner as the least significant bit (LSB)) of the hash may be used to determine which physical interfaces on the CPU (e.g., SPI-4.2 port 0 or 1, or XAUI 0 or 1) to route the packet. In an example embodiment, bit 10 of the jhash value was selected to determine the port to route each packet. Thus, in an example that includes two SPI interfaces (SPI-4.2 ports 0 and 1) between routing CLD 102B and network processor 105, if hash[10]=0 for a particular packet, routing CLD 102B will forward the packet on SPI-4.2 port 0, and if hash[10]==1, it will send the packet on SPI-4.2 port 1. Using the hash value in this manner may provide a deterministic mechanism for substantially evenly distributing traffic over two or more parallel interconnections (e.g., less than 1% difference in traffic distribution over each of the different interconnections) due to the substantially random nature of the predefined selected hash value bit.

The process discussed above may ensure that all packets of the same communication flow (and regardless of their direction in the flow) are forwarded not only to the same network processor 105, but to that processor 105 via the same physical serial interface (e.g., the same SPI-4.2 port), which may ensure that packets of the same communication flow are delivered to the network processor 105 in the correct order, due to the serial nature of such interface.

Processor-Specific Routing

While many components provide channelized interconnections such as the SPI4 interconnections on the FPGAs, general purpose CPUs often do not. General purpose CPUs are designed to operate more as controllers of specialized devices rather than peers in a network of other processors. FIGS. 14A and 14B illustrate an approach to providing a channelized interconnection between the general purpose CPU of controller 106 and the routing CLDs 102B (shown as FPGAs), according to some embodiments of the present disclosure.

In FIG. 14A, INTEL XEON processor (labeled Intel Jasper Forrest) is configured as control processor 106. This processor is a quad core, x86 compatible processor with a Peripheral Component Interconnect Express (PCIe) interconnection to two INTEL 82599 dual channel 10 Gbps Ethernet medium access controllers (MACs). Rather than operating as traditional network connections, these components are configured to provide channelized data over four 10 Gbps connections. In particular, direct connections are provided between one of the INTEL 82599 MACs and the two Routing FPGAs 102B.

In this configuration, the prepend header (discussed above) is used to signal to the MAC that the packet should be passed along as an IP packet. The control processor has a raw packet driver that automatically adds and strips the prepend header to allow software processing of standard Ethernet packets.

As with the two SPI4 ports on the routing CLDs 102B, ingress traffic to the control processor should be load balanced across the two 10 Gbps Ethernet channels connecting the routing CLDs 102B and the INTEL 82599. The load balancing may operate in the same manner as that described above in the context of the SPI4 ports, based on a hash value. However, the routing process is more complicated. An ingress packet arriving at the routing CLD 102B illustrated in FIG. 14A will either be routed through the 10 Gbps Ethernet (e.g., XAUI) connection directly to the INTEL 82599 MAC or will be routed through the routing CLD 102B illustrated in FIG. 14B (e.g., via interconnection 120). In the latter scenario, routing CLD 102B illustrated in FIG. 14B will then route the packet through that CLD's 10 Gbps Ethernet (e.g., XAUI) connection directly to the INTEL 82599 MAC.

CLD Pipeline

In certain applications, the complexity of logic to be offloaded from a processors to a CLD becomes too great to efficiently implement in a single CLD. Internal device congestion prevents the device from processing traffic at line rates. Further, as the device utilization increases, development time increases much faster than a linear fashion as development tools employ more sophisticated layout techniques and spend more time optimizing. Traditional design approaches suggest solving this problem by selecting a more complex and capable CLD part that will provide excess capacity. Fewer components often reduces overall design and manufacturing costs even if more complex parts are individually more expensive.

In contrast, certain embodiments of the present invention take a different approach and span functionality across multiple CLDs in a careful deintegration of functionality. This deintegration is possible with careful separation of functions and through the use of low latency, high-throughput interconnections between CLDs. In some embodiments, a proprietary bus (e.g., the ALTERA SERIALLITE bus) is used to connect two or more compatible CLD devices to communicate with latencies and throughput approximating that of each device's internal I/O channels. This approach is referred to herein as pipelining of CLD functionality. Pipelining enables independent design and development of each module and the increased availability of I/O pins at the cost of additional processing latency. However, certain applications are not sensitive to increased latency. Many network testing applications fall into this category where negative effects of processing latency can be effectively neutralized by time stamping packets as they arrive.

In the embodiments illustrated by FIG. 4, CLD functionality is distributed across three CLDs. In these embodiments, egress network traffic either flows through routing CLD 102B and capture/offload CLD 102A or through traffic generating CLD 102C and capture/offload CLD 102A. Likewise, ingress network traffic flows through capture/offload CLD 102A and routing CLD 102B. The functions assigned to each of these devices is described elsewhere in this disclosure.

Bandwidth Management

In certain embodiments, each network processor has a theoretical aggregate network connectivity of 22 Gbps. However, this connectivity is split between two 11 Gbps SPI4 interfaces (e.g., interfaces 122). The method of distributing traffic across the two interfaces is a critical design consideration as uneven distribution would result in a significant reduction in the achieved aggregate throughput. For example, statically assigning a physical network interface (e.g., interface 101) to an SPI4 interface may not allow a single network processor to fully saturate a physical interface with generated network traffic. In another example, in some applications it is desirable to have a single network processor saturate two physical network interfaces. The user should not need to worry about internal device topologies in configuring such an application. Another core design constraint is the need to maintain packet ordering for many applications.

In some embodiments, software on a network processor assigns SPI4 interfaces to processor cores in the network processor such that all egress packets are sent on the assigned SPI4 interface. In some embodiments, processor cores with an odd number send data on SPI4-1 while those with an even number send data on SPI4-0. A simple bit mask operation can be used to implement this approach: SPI4 Interface—CORE_ID & 0x1. This approach could be scaled to processors with additional SPI4 ports using a modulus function.

In certain embodiments, ingress packets are routed through specific SPI4 interfaces based on the output of an appropriate hashing algorithm, for example the jhash algorithm described below. In some embodiments, the source and destination addresses of the ingress packet are input into the hashing algorithm.

In situations where the hashing algorithm varies based on the order of the input, it may be desirable to route packets between the same two hosts to the same interface on the network processor. For example, the network testing device may be configured to quietly observe network traffic between two devices in a "bump in the line" configuration. In this scenario, the routing CLD may first numerically sort the source and destination address (along with any other values input into the hash function) to ensure that the same hash value is generated regardless of which direction the network traffic is flowing.

Packet Capture Error Tracking

In certain embodiments, offload/capture CLDs 102A are configured to capture and store packets received on interfaces 101 in capture memory 103A. Packets may be captured to keep a verbatim record of all communications for later analysis or direct retrieval. Captured packets may be recorded in a standard format, e.g., the PCAP format, or with sufficient information to enable later export to a standard format.

With modern data rates on the order of 10 Gbps, packet capture may consume a significant amount of memory in a very short window of time. In certain embodiments, the packet capture facility of offload/capture CLDs 102A may be configurable to conserve memory and focus resources. In some embodiments, the packet capture facility may capture a limited window of all received packets, e.g., through the use of a circular capture memory described below. In certain embodiments, the packet capture facility may incorporate triggers to start and stop the capture process based on certain data characteristics of the received packets.

In some embodiments, offload/capture CLDs 102A verify one or more checksum values on each ingress packet. The result of that verification may be used to set one or more flags in the prepend header, as discussed elsewhere in this disclosure. Examples of checksums include the layer 2 Ethernet checksum, layer 3 IP checksum, layer 4 TCP checksum, and IPv6 tunneling checksum. Erroneous packets may be captured in order to isolate and diagnose the source of erroneous traffic.

In some embodiments, offload/capture CLDs 102A may apply a set of rules against each ingress packet. For example, packet sizes may be monitored to look for abnormal distributions of large or small packets. An abnormal number of minimum size or maximum size packets may signal erroneous data or a denial of service attack. Packet types may be monitored to look for abnormal distributions of layer 4 traffic. For example, a high percentage of TCP connection setup traffic may indicate a possible denial of service attack. In another example, a particular packet type, e.g, an address resolution protocol packet or a TCP connection setup packet, may trigger packet capture in order to analyze and/or record logical events.

In some embodiments, offload/capture CLDs 102A may include a state machine to enable capture of a set of packets based on a event trigger. This state machine may begin capturing packets when triggered by one or more rules described above. The state machine may discontinue capturing packets after capturing a threshold number of packets, at the end of a threshold window of elapsed time, and/or at when triggered by a rule. In some embodiments, offload/capture (e.g., by adding fields in the packet header) CLDs 102A may capture all ingress traffic into a circular buffer, and rules may be used to flag captured packets for later retrieval and analysis. In certain embodiments, a triggering event may cause the state machine to walk back through the capture buffer to retrieve a specified number or time window of captured packets to allow later analysis of the events leading up to the triggering event.

In certain embodiments, offload/capture CLDs 102A may keep a record of triggering events external to the packet capture data for later use in navigating the packet capture data. This external data may operate as an index into the packet capture data (e.g., with pointers into that data).

Efficient Packing of Packets in Circular Capture Memory

Existing packet capture devices typically set aside a fixed number of bytes for each packet (16 KB for example). This is very inefficient if the majority of the packets are 64B since most of the memory is left unfilled. The present disclosure is of a more efficient design in which each packet is stored in specific form of a linked list. Each packet will only use the amount of memory required, and the link will point to the next memory address whereby memory is packed with network data and no memory wasted. This allows the storage of more packets with the same amount of memory.

In some embodiments, capture/offload CLDs 102A implement a circular capture buffer capable of capturing ingress/ egress packets storing each in memory 103A. Some embodiments are capable of capturing ingress and/or egress packets at line rate. In some embodiments, memory 103A is subdivided into individual banks and each bank is assigned to an external network interface 101. In certain embodiments, network interface ports 101 are configured to operate at 10 Gbps and each port is assigned to a DDR2 memory interface. In certain embodiments, network interface ports 101 are configured to operate at 1 Gbps and two ports are assigned to each DDR2 memory interface. In these embodiments, the memory may be subdivided into two ranges exclusive to each port.

Figure 26:
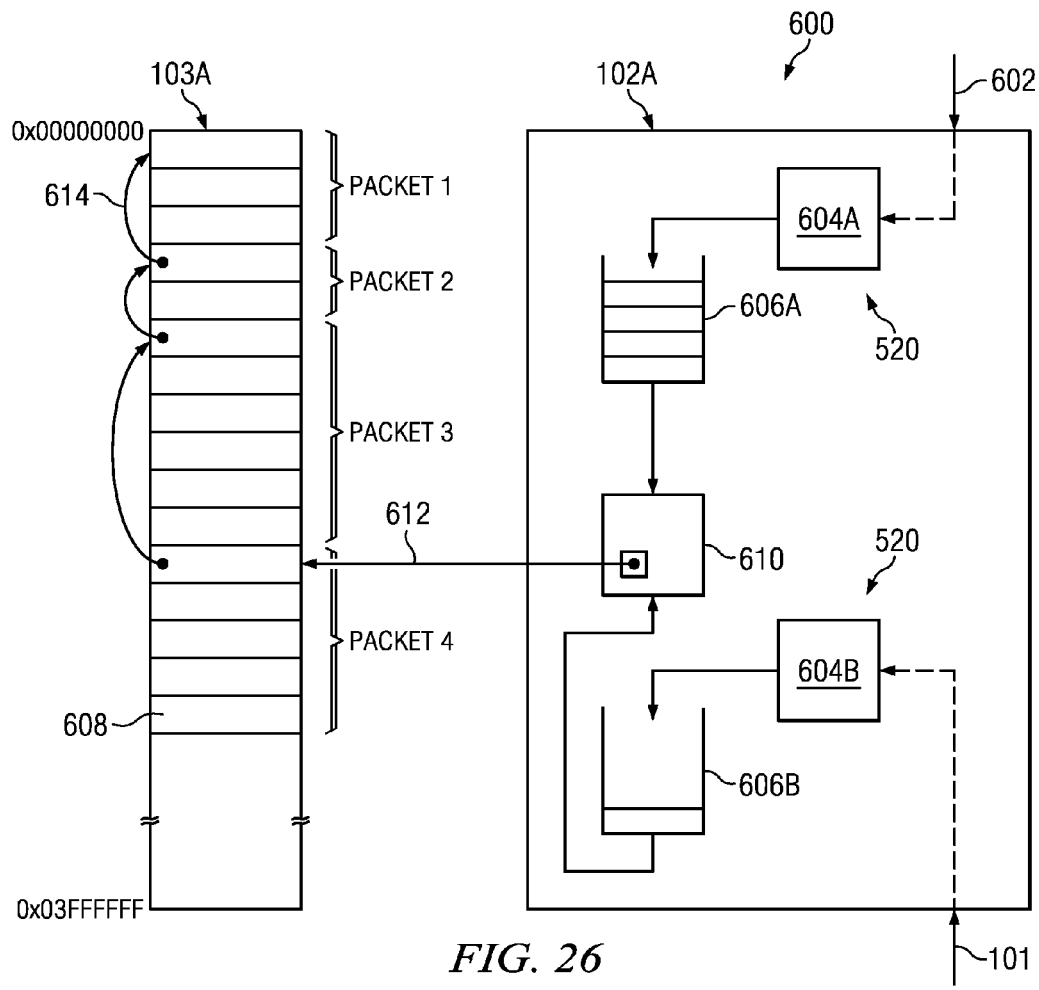
FIG. 26 illustrates an efficient packet capture memory system for a network testing system, according to an example embodiment.

FIG. 26 illustrates the efficient packet capture memory system 600, according to certain embodiments of the present disclosure. This system includes functionality implemented in offload/capture CLD 102A working in conjunction with capture buffer memory 103A. Offload/capture CLD 102A may include capture logic 520 including decisional logic 604A and 604B, first in first out (FIFO) memories 606A and 606B, buffer logic 610, and tail pointer 612. Memory 103A may be a DDR2 or DDR3 memory module with addressable units 608. Data in memory 103A may include a linked list of records including Packets 1 through 4. Each packet spans a number of addressable units 608 and each includes a pointer 614 to the previous packet in the list.

Circular Buffer/Packet Description

Below is a more detailed description of the data format of packet data in memory 103A, according to certain embodiments of the present disclosure. Packet data is written to memory 102A with a prepend header. The data layout for the first 32 Bytes of a packet captured in memory 103A may contain 16 bytes of prepended header information and 16 bytes of packet data. Subsequent 32 byte blocks are written in a continuous manner (wrapping to address 0A if necessary) until the entire packet has been captured. The last 32 byte block may be padded if the packet length (minus 16 bytes in the first block) is not an integer multiple of 32 bytes:

BOTH Egress/Ingress Packets [255:0]:

Data[255:128] = first 16 bytes of original packet data
Data[127:93] = Reserved
Data[91:64] = 28 bit DDR2 address of previous packet for this thread (ingress/egress)

-continued

```
Data[63:57] = DEFINED BELOW (Ingress/Egress definition)
Data[56:43] Byte count (does not include 4 bytes of corrupted CRC
   if indicated)
Data[42] = Thread type (1 = ingress, 0 = egress)
Data[41:40] = port number
Data[39:0] = 40 bit timestamp (10 ns resolution)
Egress ONLY:

Data [92] = Reserved
Data[63] = Corrupted CRC included in packet data (packet 4 bytes
   longer than byte count)
Data[62] = Corrupted IP checksum
Data[61] = Packet randomly corrupted
Data[60] = Packet corrupted from byte 256 until the end of packet
Data[59] = Packet corrupted in 65-255 byte range
Data[58] = Packet corrupted in lower 64 bytes
Data[57] = Packet fragmented
Ingress ONLY:

Data[92] = Previous packet caused circular buffer trigger
Data[63:62] = Reserved
Data[61] = IP checksum good
Data[60] = UDP/TCP checksum good
Data[59] = IP packet
Data[58] = UDP packet
Data[57] = TCP packet
```

In certain embodiments, the following algorithm describes the process of capturing packet data. As a packet arrives at offload/capture CLD 102A via internal interface 602, decisional logic 604A determines whether or not to capture the packet in memory 103A. This decision may be based on a number of factors, as discussed elsewhere in this disclosure. For example, packet capture could be manually enabled for a specific window of time or could be triggered by the occurrence of an event (e.g., a packet with an erroneous checksum value). In some embodiments, packet capture is enabled by setting a specific bit in the memory of CLD 102A. If the packet is to be captured, the packet is stored locally in egress FIFO 606A. A similar process applies to packets arriving at external interface 101, though decisional logic 604B will store captured ingress packets in ingress FIFO 606B. In each case, other processing may occur after the packet arrives and before the packet is copied into the FIFO memory. Specifically, information may be added to the packet (e.g., in a prepend header) such as an arrival timestamp and flags indicating the validity of one or more checksum values.

Buffer logic 610 moves packets from FIFOs 606A and 606B to memory 103A. Buffer logic 610 prioritizes the deepest FIFO to avoid a FIFO overflow. To illustrate the operation of buffer logic 610, consider the operation when packet capture is first enabled. In this initial state, both FIFOs are empty, tail pointer 612 is set to address 0x0, and memory 103A has uniform value of 0x0. In embodiments where memory 103A may have an initial value other than zero, capture/offload CLD 102A may store additional information indicating an empty circular buffer. Assume that packet capture is enabled.

At this time, an ingress packet arrives at external interface 101 and is associated with an arrival timestamp and flags indicating checksum success. Ingress decisional logic 604B creates the packet capture prepend header (the first 16 bytes of data described above) copies the packet with its prepend header into FIFO 606B. Next, buffer logic 610 copies the packet to the location 0x0, as this is the first packet stored in the buffer. In certain embodiments, memory 103A is DDR2 RAM, which has an effective minimum transfer unit of 256 bits, or 32 Bytes. In these embodiments, the packet is copied in 32 Byte units and the last unit may be padded.

When another ingress packet arrives at external interface 101, ingress decisional logic 604B follows the same steps and copies the packet with its prepend header into FIFO 606B. Next, buffer logic 610 determines that tail pointer 612 points to a valid packet record. The value of tail pointer 612 is copied into the prepend header of the current packet (e.g., at Data [91:64]) and tail pointer 612 is set to the address of the first empty block of memory 102B and buffer logic 610 copies the current packet to memory 103A starting at the address specified by tail pointer 612.

In certain embodiments, ingress packets are linked separately from egress packets as separate "threads" in the circular buffer. In these embodiments, at least one additional pointer will be maintained in CLD 102A in addition to tail pointer 610 to allow buffer logic 610 to maintain linkage for both threads. In particular, if the buffer is not empty, tail pointer 612 points to a packet of a particular thread type (e.g., ingress or egress). If a new packet to be stored of the same thread type, the tail pointer may be used to set the previous packet pointer in the new packet to be stored. If the new packet to be stored is of a different thread type, buffer logic 610 will reference a stored pointer to the last packet of the different thread type to set the previous packet pointer value on the new packet to be stored, but will still store the new packet after the packet identified by tail pointer 612.

Trigger Programming

In some embodiments, capture/offload CLD 102A may have three logic layers of trigger programming. The first layer may allow up to five combinatorial inverted or non-inverted inputs of any combination of VLAN ID, source/destination IP address, and source/destination port address to a single logic gate. All bits may be maskable in each of the five fields to allow triggering on address ranges.

The first level may have four logic gates. Each of the four logic gates may be individually programmed to be a OR, NOR, or AND gate. The IP addresses may be programmed to trigger on either IPV4 or IPV6 packets. The second level may have two gates and allow the combination of non-inverted inputs from the four first layer gates. These two second level gates may be individually programmed for an OR, NOR, or AND gate. The third level logic may be a single gate that allows the combination of non-inverted inputs from the four first layer gates and the two second level gates. This third level may be programmed for OR, NOR, or AND gate logic.

The logic may also allow for triggering on frame check sequence (FCS) errors, IP checksum errors, and UDP/TCP checksum errors.

Buffer Rewind

In some embodiments, CLD 102A may include rewind logic (e.g., as part of buffer logic 610) to generate a forward linked list in the process of generating a properly formatted PCAP file. This rewind logic is preferably implemented in CLD 102A due to its direct connection to memory 103A. The rewind logic, when triggered, may perform an algorithm such as the following, written in pseudo code:

```
wrap = FALSE; // note if rewind wraps around the end of the memory
next = tail;
cur = tail.prev;
prev = cur.prev;
end_of_buffer = tail + packet_length(tail);
while ( XOR (cur.prev < end_of_buffer, wrap) ) // invert test if buffer
        has wrapped cur.prev = next; // reverse pointer to next rather
        than previous element in list
        // shift pointers to next element in list
```

```
    next = cur;
    cur = prev;
    prev = cur.prev;
    if (cur < prev) then wrap = TRUE; // test for a wrap around
    in memory
end while
```

The rewind logic walks backward through the list starting at the tail, and changes each packet's previous pointer to be a next pointer, thus creating a forward linked list. Once completed, the variable cur points to the head of a fonvard-linked list that may be copied to drive 109 for persistent storage. Because the address 0x0 is a valid address, there is no value in checking for NULL pointers. Instead, buffer logic 610 should be careful to not copy any entries after the last entry, identified by tail pointer 612.

Data Loopback and Capture

FIG. 27 illustrates two methods for capturing network data. Arrangement 630 illustrates an in-line capture device with a debug interface. This arrangement is also called a "bump in the line" and can be inserted in a matter transparent to the other devices in the network. Arrangement 632 is a network switch configured to transmit copies of packets transmitted or inject previously captured packets.

In some embodiments, network testing system 16 may provide data loopback functionality, e.g., to isolate connectivity issues when configuring test environments. FIG. 28 illustrates two loopback scenarios. Scenario 634 provides a general illustration of an internal loopback implemented within a networking device that retains all networking traffic internal to that device. In conventional systems, loopback may be provided by connecting a physical networking cable between two ports of the same device, in order to route data exiting the device back into the device, rather than sending the data to an external network or device. In such a configuration, all data sent by one port of the device is immediately (subject to speed of light delay) delivered to the other port and back into the device. In system 16, internal loopback functionality may be provided by a virtual wire loopback technique, in which data originating from system 16 is looped back into the system 16 (without exiting system 16), without the need for physical cabling between ports. Such technique is referred to herein as "virtual wire loopback."

Scenario 636 provides a general illustration of an external loopback implemented outside a device, e.g., to isolate that device from network traffic. In this arrangement, data from an external source is looped back toward the external source or another external target, without entering the device. In some embodiments, system 16 may implement such external loopback functionality in addition to virtual wire internal loopback and/or physical wire internal loopback functionality discussed above.

In particular embodiments, system 16 provides internal loopback (virtual wire and/or physical wire loopback) and external loopback functionality, in combination with packet capture functionality, in a flexible configuration manner to enable analysis of internal or external traffic for comparison, analysis and troubleshooting (e.g., for latency analysis, timestamp zeroing, etc.).

FIG. 29 illustrates two general arrangements for data loopback and packet capture in a capture buffer, according to certain embodiments of system 16. Arrangement 640 illustrates an internal loopback with a capture buffer enabled. In this arrangement, the user can execute a simulated test scenario, export the capture buffer, and examine and validate the correctness of the traffic. This can be done without manual configuration of cables to save time and to avoid a physical presence at location of the network equipment. The user can also baseline the timing and latency of the traffic. With internal loopback enabled the return path is located before the physical layer transceiver modules so external latency information can be obtained by comparing to a configuration with a cabled loopback on the transceivers.

Arrangement 642 illustrates an external loopback with capture buffer enabled. In this arrangement, the network testing system becomes a transparent packet sniffer. All traffic can be captured as shown FIG. 27, the in-line capture device. Diagnostic pings or traffic can be sent from the external network equipment to validate the network testing system. Network traffic may be captured and analyzed prior to an actual test run before the network testing system is placed in-line. By providing the capability to move the capture interface point to both internal and external loopback paths and capture traffic of both configurations in the same manner, system configuration and debug are simplified.

Figure 30:
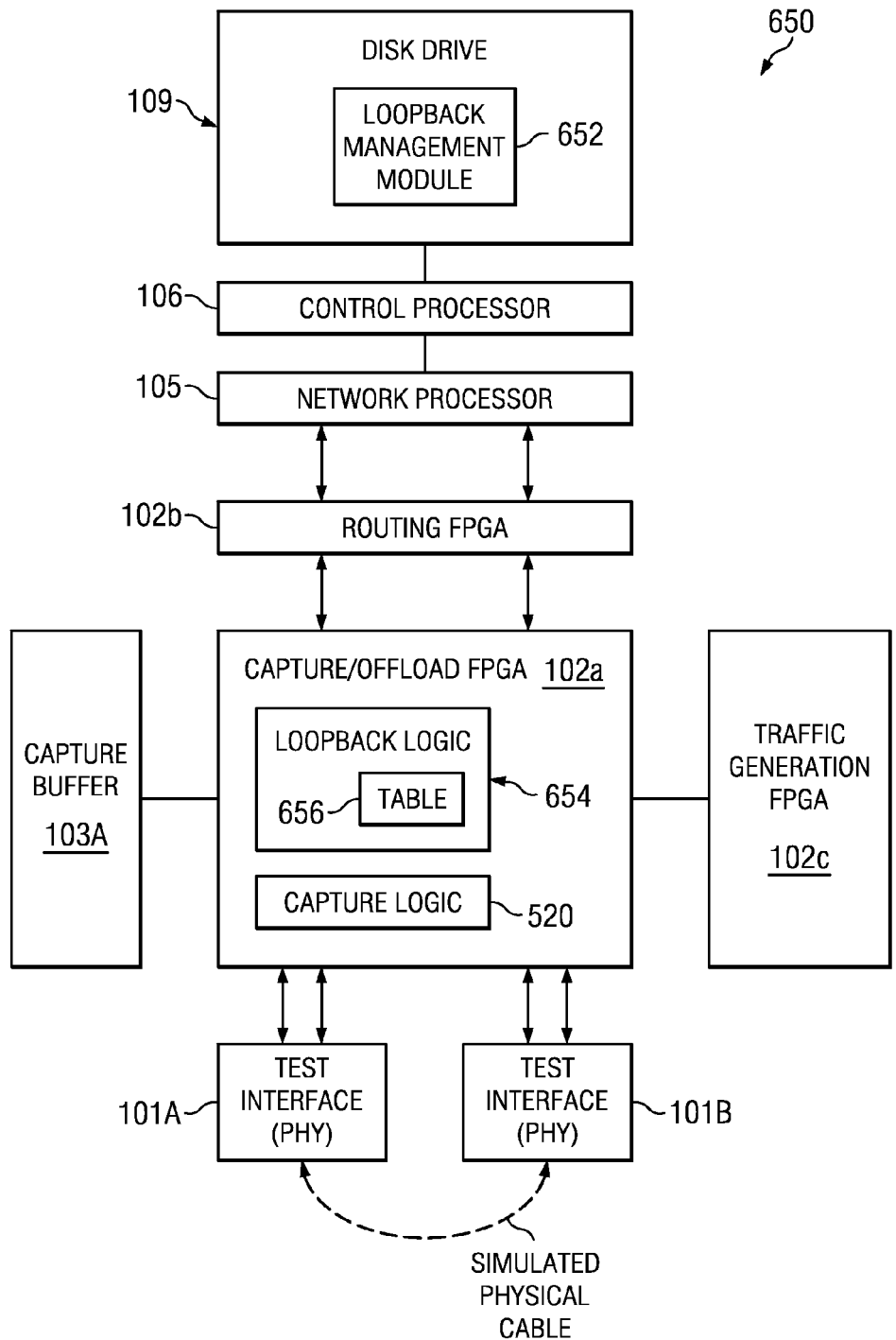
FIG. 30 illustrates aspects an example loopback and capture system in a network testing system, according to an example embodiment.
Figure 31:
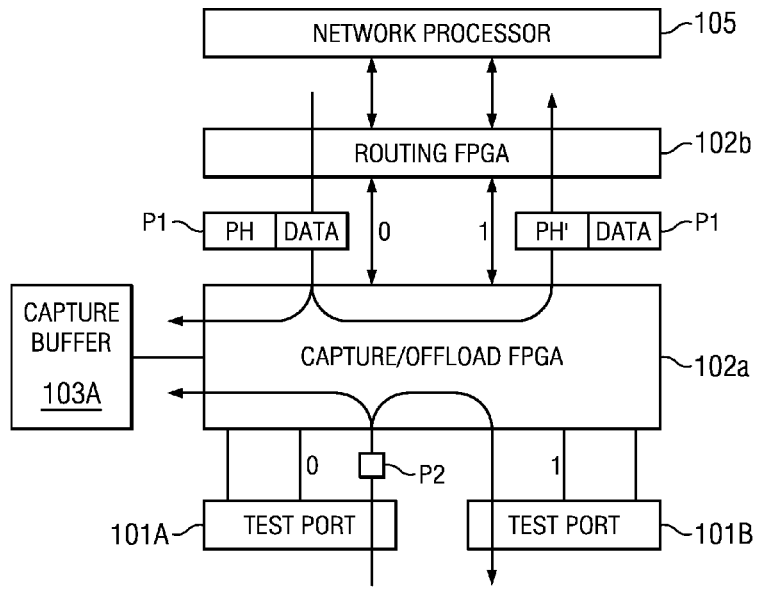
FIG. 31 illustrates example routing and/or capture of data packets in a virtual wire internal loopback scenario and an external loopback scenario provided in a network testing system, according to an example embodiment.

In some embodiments, network testing system 16 may include a loopback and capture system 650 configured to provide virtual wire internal loopback (and may also allow physical wire internal loopback) and external loopback, in combination with data capture functionality. FIG. 30 illustrates aspects an example loopback and capture system 650 relevant to one of the network processors 105 in system 16, according on one embodiment. Components of the example embodiment shown in FIG. 30 correspond to the example embodiments of system 16 shown in FIGS. 14A and 14B. FIG. 31 illustrates example data packet routing and/or capture for virtual wire internal loopback and external loopback scenarios provided by loopback and capture system 650, as discussed below.

As shown in FIGS. 30 and 31, system 650 may include a capture/offload FPGA 102*a* coupled to a pair of test interfaces 101A and 101B, a capture buffer 103A, a network processor 105 via a routing FPGA 102*b*, and a traffic generation FPGA 102*c*. Control processor 106 is coupled to network processor 105 and has access to disk drive 109. A loopback management module 652 having software or other logic for providing certain functionality of system 650 may be stored in disk drive 109, and loopback logic 654 and capture logic 520 configured to implement instructions from loopback management module 652, may be provided in FPGA 102*a*.

Loopback management module 652 may be configured to send control signals to capture/offload FPGA 102*a* to control loopback logic 654 to enable/disable an internal loopback mode and to enable/disable an external loopback mode, and to capture logic 520 to enable/disable data capture in buffer 103A. Such instructions from loopback management module 652 may be generated automatically (e.g., by control processor 106) and/or manually from a user (e.g., via a user interface of system 16). Thus, a user (e.g., a developer) may control system 650 to place system 16 (or at least a relevant card 54) in an internal loopback mode, an external loopback mode, or a "normal" mode (i.e., no loopback), as desired for various purposes, e.g., to execute a simulated test scenario, analyze system latency, calibrate a timestamp function, etc.

Thus, loopback logic 654 may be configured to control the routing of data entering capture/offload FPGA 102*a* to enable/disable the desired loopback arrangement. For example, with virtual wire internal loopback mode enabled, loopback logic 654 may receive outbound data from network processor 105 and reroute such data back to network processor 105 (or to other internal components of system 16), while capture logic 520 may store a copy of the data in capture buffer 103A if data capture is enabled. The data routing for such virtual wire internal loopback is indicated in the upper portion of FIG. 31. As another example, loopback logic 654 may enable virtual wire internal loopback mode to provide loopback of data generated by traffic generation FPGA 102c. For instance, loopback logic 654 may be configured in an internal loopback mode to route data from traffic generation FPGA 102c to network processor 105 (or to other internal components of system 16), while capture logic 520 may store a copy of the data in capture buffer 103A if data capture is enabled, instead of routing data from traffic generation FPGA 102c out of system 16 through port(s) 101. Control processor 106 (and/or other components of system 16) may subsequently access captured data from buffer 103A, e.g., via the Ethernet management network embodied in switch 110 of system 16, for analysis.

In some embodiments, loopback logic 654 may simulate a physical wire internal loopback, at least from the perspective of network processor 105, for a virtual wire internal loopback scenario. FIG. 30 indicates (using a dashed line) the connection of a physical cable between test interfaces 101A and 101B that may be simulated by such virtual wire internal loopback scenario. For example, loopback logic 654 may adjust header information of the looped-back data such that the data appears to network processor 105 to have arrived over a different test port 101 than the test port 101 that the data was sent out on. For example, if network processor 105 sends out data packets on port 0, loopback logic 654 may adjust header information of the packets such that it appears to network processor 105 that the packets arrived on port 1, as would result in a physical wire loopback arrangement in which a physical wire was connected between port 0 and port 1. Loopback logic 654 may provide such functionality in any suitable manner. In one embodiment, loopback logic 654 includes a port lookup table 656 that specifies for each egress port 101 a corresponding ingress port 101 for which network processor 105 may expect data to be looped-back through in an internal loopback mode. For example, in a four port system, port lookup table 656 may specify:

| egress port | ingress port |
|---|---|
| 1 | 0 |
| 0 | 1 |
| 2 | 3 |
| 3 | 2 |

To implement port lookup table 656, with reference to FIG. 31, loopback logic 654 reads the egress port number (in this example, port 0) from the prepend header PH on each data packet P1 received from network processor 105, determines the corresponding ingress port number (port 1) from table 656, and for each packet P1 inserts a new prepend header PH that includes the determined ingress port number (port 1). Thus, when packets P1 are received at network processor 105, they appear to have returned on port 1 (while in reality they do not even reach the ports).

Internal loopback mode (virtual or physical cable based) may be used for various purposes. For example, latency associated with system 16 and/or an external system (e.g., test system 18) may be analyzed by sending and receiving data using system 16 with internal loopback mode disabled and measuring the associated latency, sending and receiving data using system 16 with internal loopback mode enabled and measuring the associated latency, and comparing the two measured latencies to determine the extent of the overall latency that is internal to system 16 versus external to system 16. As another example, internal loopback mode (virtual or physical cable based) may be used to calibrate a timestamp feature of system 16, e.g., to account for inherent internal latency of system 16. In one embodiment, system 16 uses a 10 nanosecond timestamp, and system 650 may use internal loopback to calibrate, or "zero," the timestamp timing to $\frac{1}{10}$ of a nanosecond. The zeroing process may be used to measure the internal latency and calibrate the process such that the timestamp measures the actual external arrival time rather than the time the packet propagates through to the timestamp logic. This may be implemented, for example, by enabling the internal loopback mode and packet capture. When an egress packet arrives at capture/offload CLD 102A, the packet is time stamped and captured into packet capture buffer 350. The egress packet is then converted by the internal loopback logic into an ingress packet and time stamped on "arrival." The time-stamped ingress packet is also stored in packet capture buffer 350. The difference in time stamps between the egress and ingress packet is the measure of internal round-trip latency. This ability to measure internal latency can be especially valuable for configurable logic devices, where an image change may alter the internal latency.

As discussed above, loopback and capture system 650 may also provide external loopback functionality. That is, loopback management module 652 may instruct loopback logic 654 to route data received on one port (e.g., port 0) back out over another port (e.g., port 1) instead of forwarding such data into system 16 (e.g., to network processor 105, etc.), as indicated in FIG. 31 with respect to packets P2. Also, as with internal loopback mode, in external loopback mode, loopback management module 652 may also instruct capture logic 520 to store a copy of data passing through capture/offload FPGA 102a in capture buffer 103A, also indicated in FIG. 31. Control processor 106 (and/or other components of system 16) may subsequently access captured data from buffer 103A, e.g., via the Ethernet management network embodied in switch 110 of system 16, for analysis of such captured data. Thus, using external loopback mode, system 16 may essentially act as a "bump in the wire" sniffer for capturing data into a capture buffer.

Multi-Key Hash Tables

Standard implementations of hash tables map a single key domain to a value or set of values, depending on how collisions are treated. Certain applications benefit from a hash table implementation with multiple co-existent key domains. For example, when tracking network device statistics some statistics may be collected with visibility only into the IP address of a device while others may be collected with visibility only into the Ethernet address of that device. Another example application is a host identification table that allows location of a host device record by IP address, Ethernet address, or an internal identification number. A hash table with N key domains is mathematically described as follows:

$$f_1: K_1 \to V$$
$$f_2: K_2 \to V$$
$$\ldots$$
$$f_3: K_n \to V$$

An additional requirement is needed to ensure the above model represents a single hash table with N key domains instead of simply N hash tables that use the same value range:

If an entry y has a key $k_i$ in domain $K_i$, then all domains $K_1$ through $K_n$ must have a key $k_j$ such that $f_j(k_j)$ maps to the same entry y.

Standard hash table implementations organize data internally so that an entry can only be accessed with a single key. Various approaches exist to extend the standard implementation to support multiple key domains. One approach uses indirection and stores a reference to the value in the hash table instead of the actual value. The model becomes this:

$$f_1: K_1 \to R$$
$$f_2: K_2 \to R$$
$$...$$
$$f_3: K_n \to R$$

In this model R is the set of indirect references to values in V, and a lookup operation returns an indirect reference to the actual value, which is stored externally to the hash table. This approach has a negative impact on performance and usability. Performance degradation results from the extra memory load and store operations required to access the entry through the indirect reference. Usability becomes a challenge in multi-threaded environments because it is difficult to efficiently safeguard the hash table from concurrent access due to the indirect references.

Certain embodiments of the present disclosure support multiple independent key domains, avoid indirect references, and avoid the negative performance and usability impact associated with other designs that support multiple key domains. According to certain embodiments of the present invention, each hash table entry contains a precisely arranged set of links. Each link in the set is a link for a specific key domain. In some embodiments, a software macro is used to calculate the distance from each of the N links to the beginning of the containing entry. This allows the table to find the original object, much like a memory allocator finds the pointer to the head of a memory chunk. Defining the hash table automatically generates accessors to get the entry from any of N links inside the entry.

Figure 32:
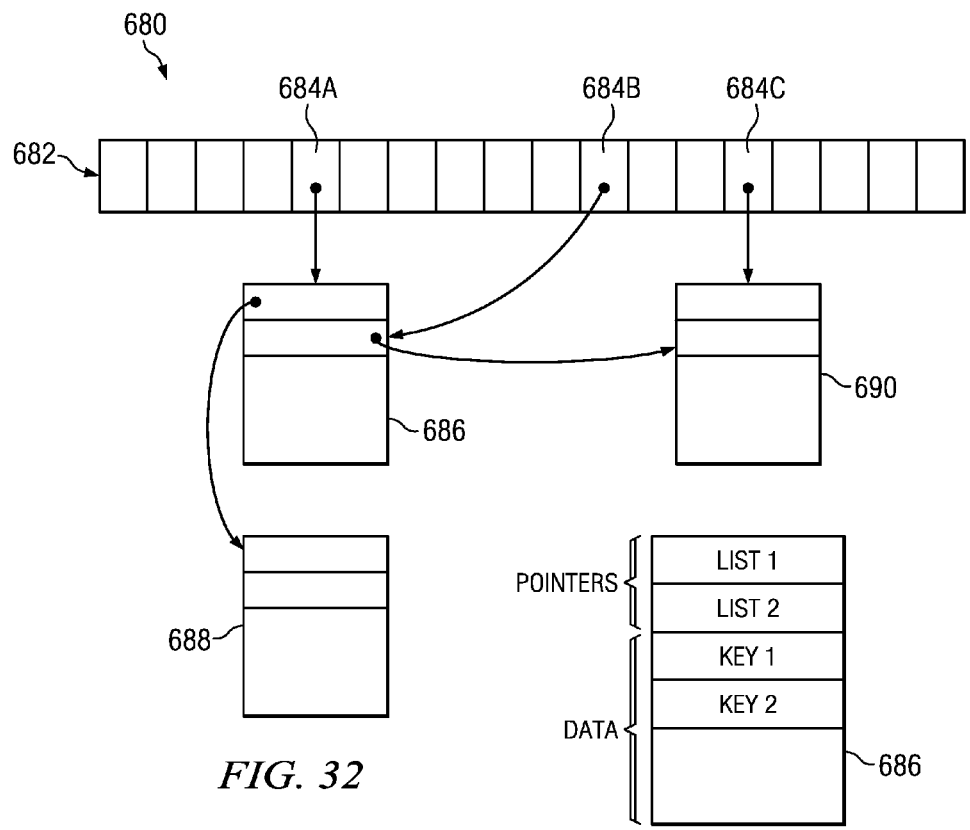
FIG. 32 illustrates an example multiple-domain hash table for use in a network testing system, according to an example embodiment.

FIG. 32 illustrates a multiple domain hash table according to certain embodiments of the present disclosure. Hash table 680 includes bucket array 682 with entries 684 pointing to linked list elements 686, 688, and 690: Linked list elements, e.g., 686, include pointers List1 and List2, and data including Key1 and Key2. List 1 is associated with Key1 and List2 is associated with Key2. Because entries 684 point to linked lists, hash value collisions are handled by adding additional linked list elements to the list originating at the bucket array corresponding to the hash value.

Bucket array 682 may be an array of pointers, e.g., 32 bit or 64 bit addresses, of length hash_length. Bucket array entries 684a through 684c are identified as non-NULL entries, meaning that each contains a valid pointer to a linked list element in memory. Bucket array entry 684a contains a pointer to linked list element 686. Linked list element 686 contains a pointer, e.g., the List1, to the next element in the linked list, if any. In FIG. 32, the List1 pointer in element 686 points to 688. The List 1 pointer in element 688 is NULL, indicating the end of the list linked to bucket array entry 684a.

Figure 33:
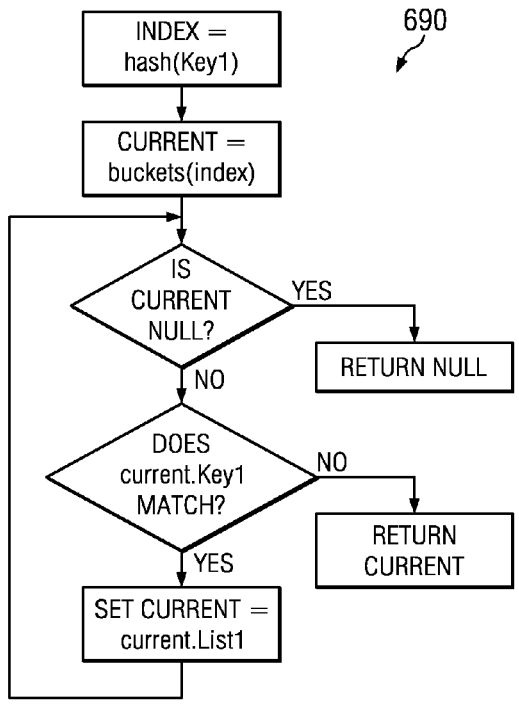
FIG. 33 illustrates an example process for looking up a linked list element based on a first key value, according to an example embodiments.

FIG. 33 illustrates an example process 690 for looking up linked list element 686 based on its Key1 value, according to certain embodiments of the present disclosure. Input Key1 of 686 into a hashing function to obtain index $V_1$. Index $V_1$ into bucket array 682 is bucket array entry 684a. Because that array entry is not NULL, follow the pointer and check each element in the linked list to see if the Key1 field of that element matches the Key1 value input into the hash value at the start of this process. Linked list element 686 is a match. Had Key1 of element 686 not matched, the algorithm would follow the List1 pointer to linked list element 688 and would continue walking the linked list until it found a match or a NULL pointer signaling the absence of a matching entry. The prior art describes this approach for a single key value.

Similar to bucket array entry 684a, entry 684b points to linked list element 686. However, in some embodiments of the present disclosure, entry 684b points to the List2 pointer in linked list element 686, which then points to element 690.

Figure 34:
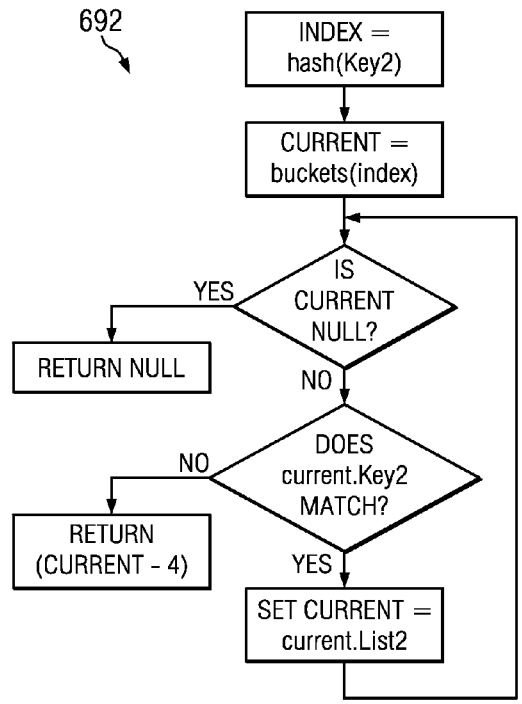
FIG. 34 illustrates an example process for looking up a linked list element 686 based on a second key value, according to an example embodiments.

FIG. 34 illustrates an example process 692 for looking up linked list element 686 based on its Key2 value, according to certain embodiments of the present disclosure. Input Key2 of 686 into a hashing function to obtain index $V_2$. Index $V_2$ into bucket array 682 is bucket array entry 684b. Because that array entry is not NULL, follow the pointer and check each element in the linked list to see if the Key2 field of that element matches the Key2 value input into the hash value at the start of this process. Linked list element 686 is a match. However, to retrieve the element, the address in bucket 684b should be adjusted upward the memory size of a pointer because bucket 684b points to the second record in that element. In some embodiments, three or more list pointers and associated key values are provided for.

Accordingly, linked list element 686 may be located in the same hash table using two different key values without the use of indirection and without addition any additional storage overhead. Adding another key to the same hash table merely requires the addition of two field entries in the linked list element data structure: the list pointer and key value.

In some embodiments, this multikey hash table implementation relies on two or more sets of accessor functions. Each set of accessor functions includes at least an insert function and a lookup function. The lookup function for Key1 operates as illustrated in FIG. 33 and the lookup function for Key 2 operates as illustrated in FIG. 34. The insert functions operate in a similar fashion. The insert function for Key1 performs the hash on Key1 of a new element and, if empty, points the bucket entry to the new element, or adds the new element to the end of the linked list. In some embodiments, the new element is added to the beginning of the linked list. The insert function for Key2 performs the hash on Key2 of a new element and, if empty, points the bucket entry to the List2 pointer of the new element, or adds the new element to linked list. The insert function for Key2 always points other entries to the List2 field of the new element rather than the start of that element.

In some embodiments, all sets of accessor functions use the same hash function. In other embodiments, one set of accessor functions uses a different hash function than a second set of accessor functions.

In certain embodiments, the accessor functions are generated programmatically using C/C++ style macros. The macros automatically handle the pointer manipulation needed to implement the pointer offsets needed for the second, third, and additional keys. A programmer need only reference the provided macros to add a new key to the hash table.

Packet Assembly and Segmentation

Segmentation

The transmission control protocol (TCP) is a standard internet protocol (e.g., first specified in request for comments (RFC) 675 published by the Internet Engineering Task Force in 1974). TCP generally aligns with Layer 4 of the Open Systems Interconnection (OSI) model of network abstraction layers and provides a reliable, stateful connection for networking applications. As an abstraction layer, TCP allows applications to create and send datagrams that are larger than the maximum transmission unit (MTU) of the network route between the end points of the TCP connection. Networking systems support TCP by transparently (to the application) segmenting over-sized datagrams at the sending network device and reassembling the segments at the receiving device. When a TCP channel is requested by an application, a setup protocol is performed wherein messages are sent between the two end-point systems. Intermediate network nodes provide information during this process about the MTU for each link of the initial route that will be used. The smallest reported MTU is often selected to minimize intermediate segmentation.

Many network interface controllers (NICs) provide automatic segmentation of a large packet into smaller packets using specialized hardware prior to transmission of that data via an external network connection such as an Ethernet connection. The architecture of system 16 differs from typical network devices because network processors 105 share network interfaces 101 and are not directly assigned NICs with specialized segmentation offload hardware. Further, network processors 105 do not include built-in TCP segmentation offload hardware. In order to efficiently handle TCP traffic, the present disclosure provides a CLD-based solution that post-processes jumbo-packets generated by the network processor and splits those packets into multiple smaller packets as specified in the header of a packet.

In certain embodiments of the present disclosure, the network processor includes a prepend header to every egress packet. That prepend header passes processing information to offload/capture CLD 102A. Two fields in the prepend header provide instructions for TCP segmentation. The first is a 14 bit field that passes the packet length information in bytes (TCPsegLen). TCP lengths can in theory then be any length from a single byte to a max of 16 KB. The second field is a single bit that enables TCP segmentation (TCPsegEn) for a given a packet.

Figure 35:
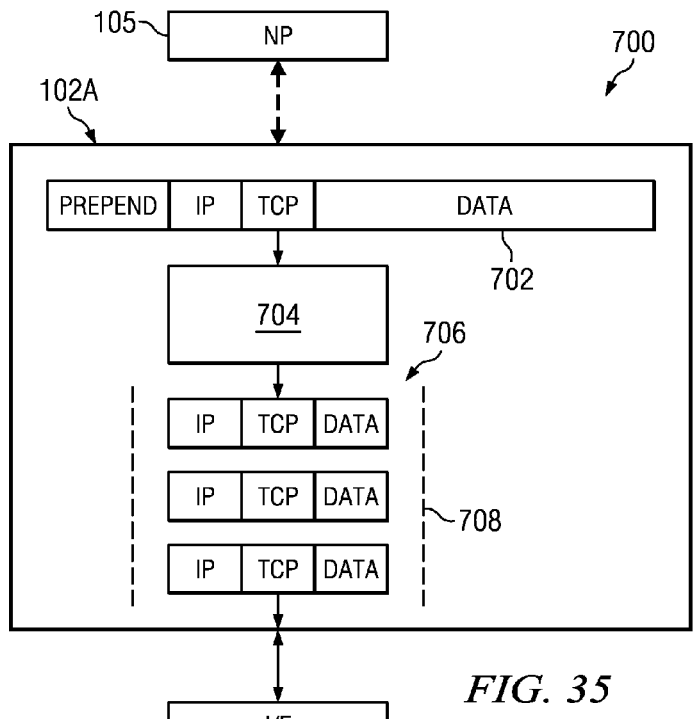
FIG. 35 illustrates an example segmentation offload process in a network testing system, according to an example embodiment.

FIG. 35 illustrates segmentation offload 700, according to certain embodiments of the present disclosure. Network processor 105 sends packet 702 to capture/offload CLD 102A (e.g., via routing CLD 102B). Packet 702 includes a prepend header and a datagram. Segmentation logic 704 includes logic to examine the prepend header and to segment the packet into a series of smaller packets, which may be stored in outbound FIFO 708 for subsequent transmission via external interface 101.

Figure 36:
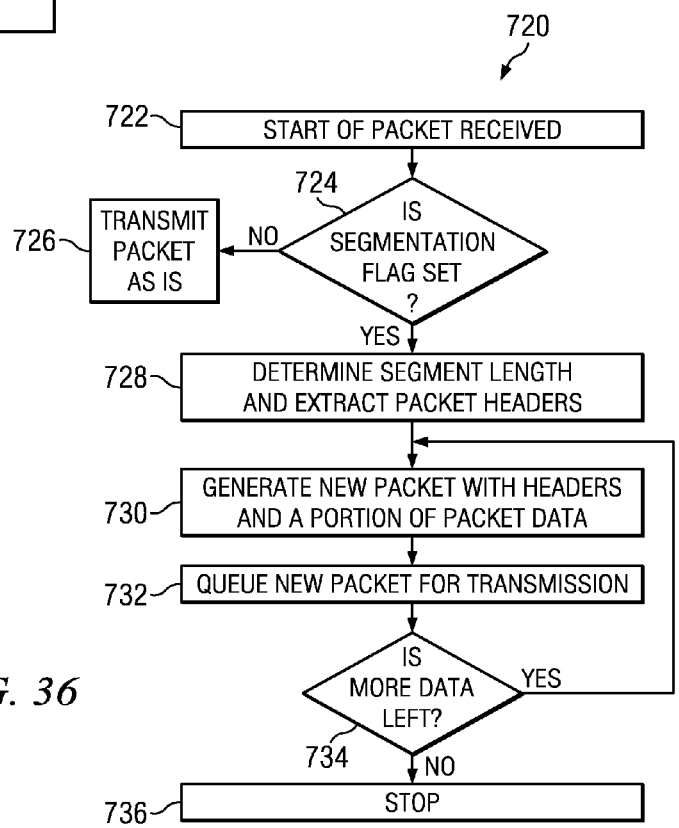
FIG. 36 illustrates another example segmentation offload process in a network testing system, according to an example embodiment.

FIG. 36 illustrates segmentation offload process 720, according to certain embodiments of the present disclosure. When a start of packet (SOP) is received at step 722 from a network processor, segmentation logic 704 is triggered. At step 724, segmentation logic 704 examines the packet's prepend header to see if a segmentation flag (e.g., the TCPsegEn bit) is set. If not, the packet is passed along as is at step 726.

If the segmentation flag is set, segmentation logic 704 determines the segment length (e.g, by extracting the 14 bit TCPseglen field from the prepend header) and extracts the packet's IP and TCP headers at step 728. Segmentation logic 704 may also determine whether the packet is an IPv4 or IPv6 packet and may verify that the packet is a properly formed TCP packet.

At step 730, segmentation logic 704 generates a new packet 706 the size of the segment length and copies in the original packet's IP and TCP headers. Segmentation logic 704 may keep a segment counter and set a segment sequence number on new packet. Segmentation logic 704 may then fill the data payload of new packet 706 with data from the data payload portion of original packet 722. Segmentation logic 704 may update the IP and TCP length fields to reflect the segmented packet length and generate IP and TCP checksums.

Once new packet 706 has been generated, that packet may be added to a first in first out (FIFO) queue at step 732 for subsequent transmission via external interface 101. At step 734, segmentation logic 704 may determine whether any new packets are needed to transmit all of the data from original packet 702. If not, the process stops at step 736. If so, step 730 is repeated. At step 730, if less data remains than can fill the data portion of a packet of length segment length, a small packet may be generated rather than padding the remainder.

Assembly

When TCP packets arrive at system 16, they may arrive as segments of an original, larger TCP packet. These segments may arrive in sequence or may arrive out of order. While a CPU is capable of reassembling the segments, this activity consumes expensive interrupt processing time. Many operating systems are alerted to the arrival of a new packet when the NIC triggers an interrupt on the CPU. Interrupt handlers often run in a special protected mode on the processor and switching in and out of this protected mode may require expensive context switching processes. Conventional systems offload TCP segment reassembly to the network interface card (NIC). However, these solutions require shared memory access between the receiving processor and its network interface card (NIC). Specifically, some commercially-available NICs manipulate packet buffers in shared memory mapped between the host CPU and the NIC. System 16 has no memory shared memory between the network processor and routing CLD 102B. Furthermore, a conventional PCI bus and memory architecture does not provide sufficient bandwidth to enable reassembly at the line rates supported by system 16. In the present disclosure, a TCP reassembly engine is provided in a CLD between external interfaces 101 and the destination network processor. This reassembly engine forwards TCP segment "jumbograms" to the network processor rather than individual segmented packets. The operation of the reassembly engine can reduce the number of packets processed by the NP by a factor of 5, which frees up significant processing time for performing other tasks.

Figure 37:
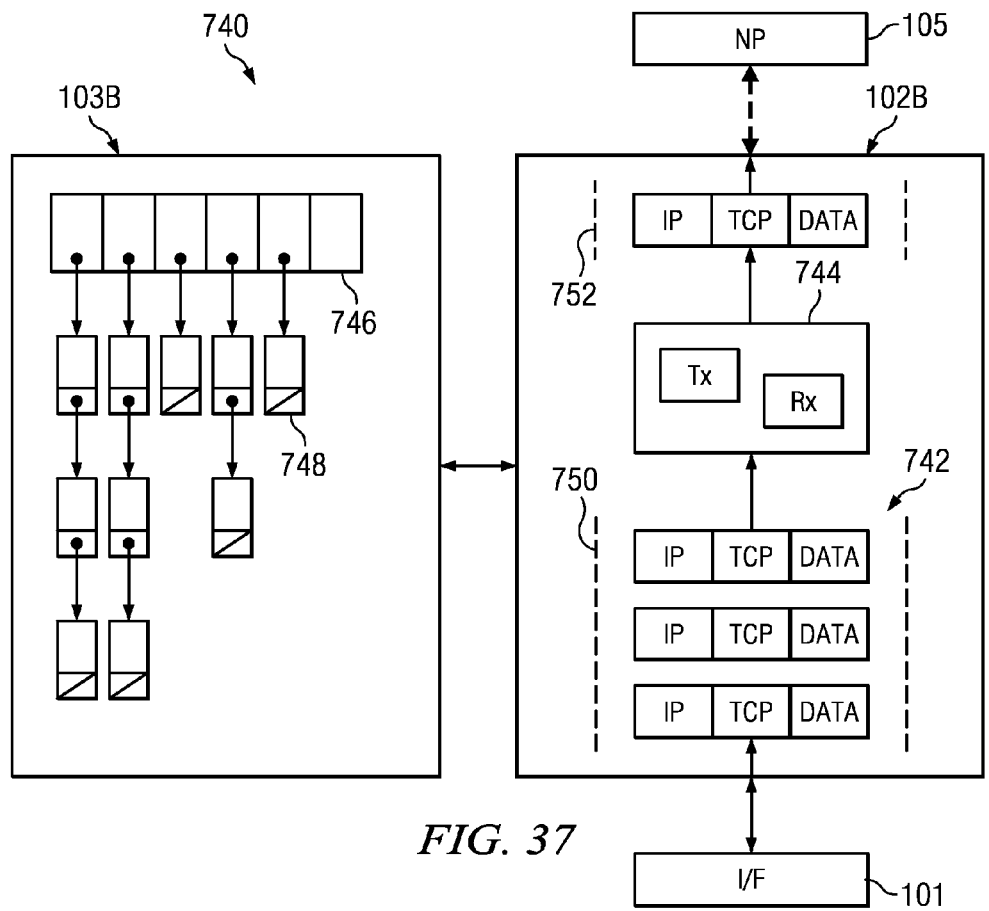
FIG. 37 illustrates an example packet assembly system of a network testing system, according to an example embodiment.

FIG. 37 illustrates packet assembly system 740. The packet assembly system includes routing CLD 102B and memory 103A. Routing CLD 102B includes assembly logic 744, which processes packet 742 received from external interface 101 (e.g., via offload/capture CLD 102A). Memory 103A includes packet record array 746, which contains pointers to linked lists of packet segments 748. In some embodiments, packet record array 746 may be in internal memory within CLD 102B. In some embodiments, packet assembly logic 744 may selectively forward received packet 742 to network processor 105 as-is, as a set of a partially reassembled TCP jumbogram, or as a fully reassembled jumbogram. In certain embodiments, received packets are queued in receive FIFO 750 and packets forwarded to network processor 105 are queue in transmit FIFO 752.

Network processor 105 may control the operation of assembly logic 744 by altering configuration parameters on the reassembly process. In some embodiments, network processor 105 may control the number of receive bucket partitions in memory 103B and/or the depth of each receive bucket partition. In certain embodiments, network processor 105 may selectively route certain packet flows through or around the assembly engine based on at least one of the subnet, VLAN, or port range.

Figure 38:
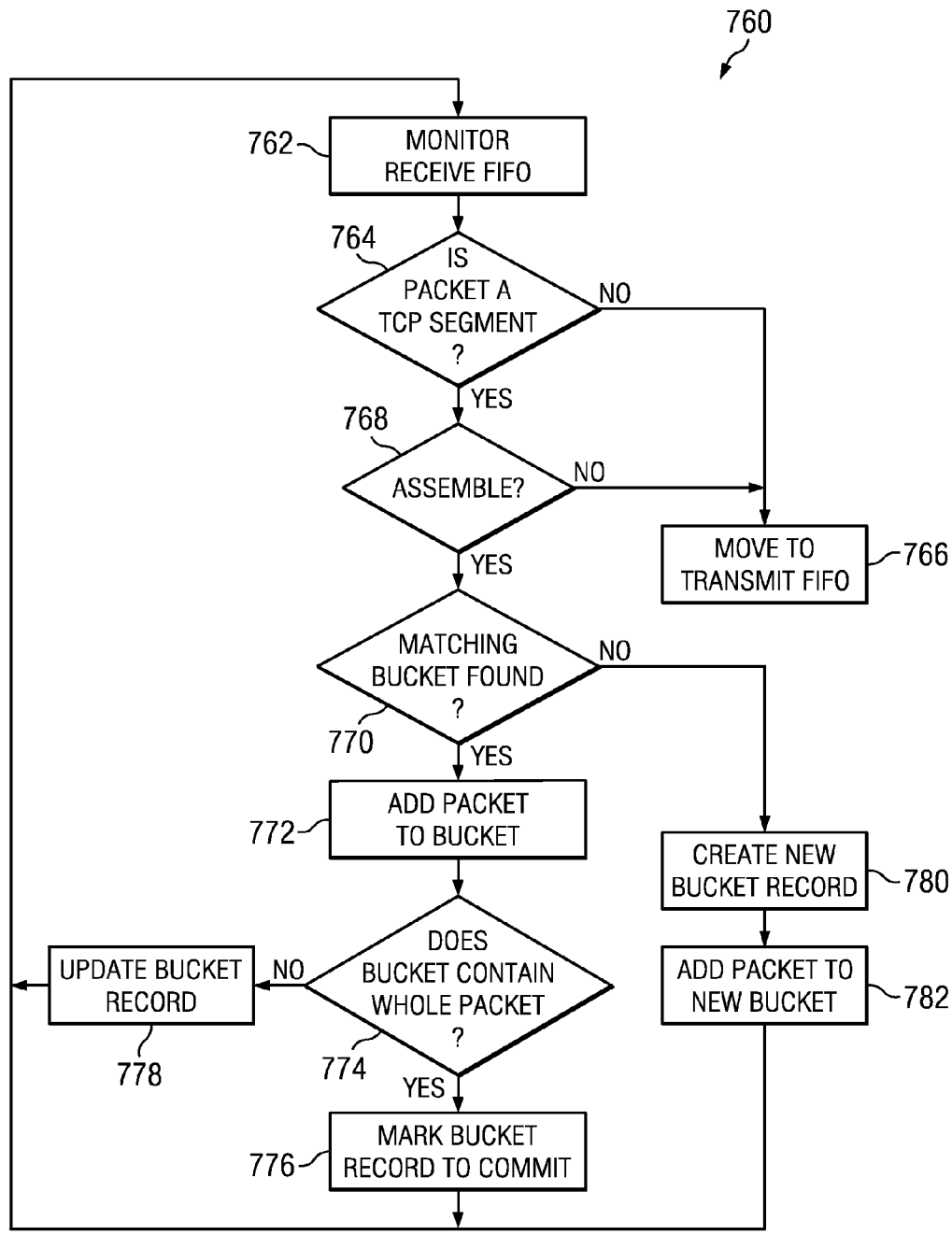
FIG. 38 illustrates an example process performed by a receive state machine (Rx) TCP segment assembly offload, according to an example embodiment.

FIG. 38 illustrates process 760 performed by receive state machine (Rx) in assembly logic 744, according to certain embodiments of the present disclosure. The receive state machine monitors receive FIFO at step 762. When a packet arrives (at step 764), the packet is examined to determine whether it is a segment of a TCP jumbogram. If not, the packet is queued in transmit FIFO (at step 766) for delivery to network processor 105. If the packet is a segment, the receive state machine may apply a bypass filter (at step 768) to determine whether assembly should be attempted. If not, the packet is queued for transmission as-is. If assembly should be attempted, the packet is compared to packet assembly records 746 (at step 770) to identify a matching packet segment bucket. This comparison process may include extraction of a 4-tuple of the IP source address, IP destination address, IP source port, and IP receive port. This 4-tuple may be sorted and input into a hash function (e.g., jhash) to generate a hash value. That hash value may be used to index into the packet assembly records array 746.

If a match is found, the packet is added to the matching bucket (at step 772). Receive state machine may insert the new packet into linked list 748 in the appropriate ordered location based on the packet's TCP sequence number. Receive state machine also checks whether this newest packet completes the sequence for this TCP jumbogram (at step 774). If so, receive state machine sets the commit bit on the corresponding packet assembly record 746 (at step 776). If the newest packet does not complete the sequence (at step 778), receive state machine updates the corresponding packet assembly record 746 and stops.

If no matching packet assembly record 746 was found (at step 770), then, space permitting, receive state machine creates a new record (at step 780) and adds the received packet to the newly assigned reassembly bucket list (at step 782).

Figure 39:
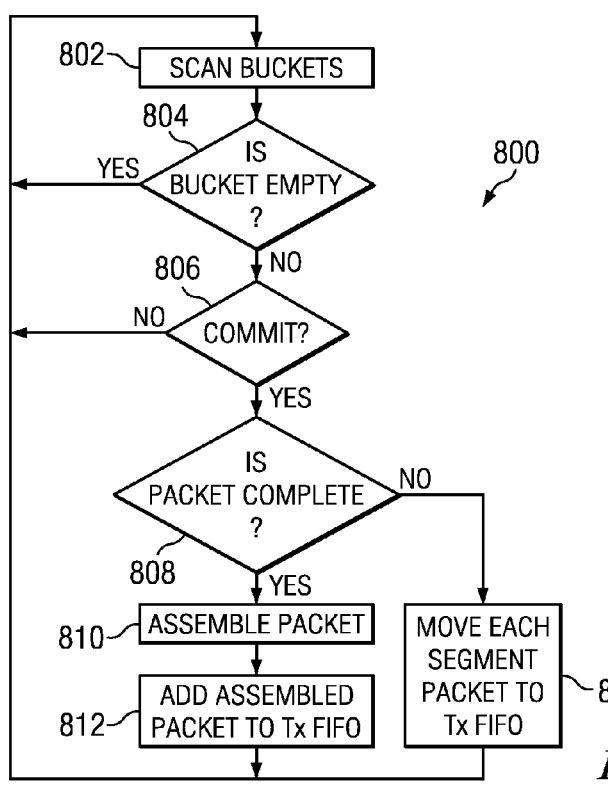
FIG. 39 illustrates an example process performed by s transmit state machine (Tx) for TCP segment assembly offload, according to an example embodiment.

FIG. 39 illustrates process 800 performed by transmit state machine (Tx) in assembly logic 744, according to certain embodiments of the present disclosure. Transmit state machine continually monitors each bucket in the assembly memories 103B (at step 802). The transmit state machine checks to see if the bucket is empty (at step 804). If the bucket is not empty, the following conditions are checked (at step 806) to determine if the packet should be committed to the network processor:

1. Commit bit is set. This bit can be set by the receive state machine.
2. Current time—Packet initial timestamp>Age-out value.
3. When only 1 free bucket remains, then the bucket with the oldest timestamp will be committed.

When a packet is being committed, the transmit state machine will set the lock bit on the packet assembly record marking it unavailable. If the packet is complete (at step 808), the transmit state machine will assemble (at step 810) a TCP jumbogram including the IP and TCP headers of, for example, the first packet in the sequence (after stripping out the TCP segmentation related fields), and the concatenated data portions of each segment packet. The transmit state machine (at step 812) adds the newly assembled TCP jumbogram to the transmit FIFO and clears the packet assembly record from memory 103B making it available for use by the receive state machine.

If the packet is not complete, but the current packet aged out or was forced out as the oldest packet in memory 103B, then transmit state machine (at step 814) may move each packet segment as-is to transmit FIFO 752 and clear out the corresponding packet assembly record.

32-Bit Pointer Implementation for 64-Bit Processors

On 64-bit systems pointers typically consume 8 bytes of computer memory (e.g., RAM). This is double the amount needed on 32-bit systems and can pose a challenge when migrating from a 32-bit system to a 64-bit system.

Typical solutions to this problem include: increasing the amount of available memory, and rewriting the software application to reduce the number of pointers used in that application. The first solution listed above is not always possible. For example, when shipping software-only upgrades to hardware systems already deployed at customer sites. The second solutions can be cost prohibitive and may not reduce memory requirements enough to enable the use of 64-bit pointers.

The system of the present disclosure specially aligns the virtual memory offsets in the operating system so that virtual addresses all fall under the 32 GB mark. This means that for pointers, the upper 29 bits are always zero and only the lower 35 bits are needed to address the entire memory space. At the same time, the system aligns memory chunks to an 8-byte alignment. This ensures that the lower 3 bits of an address are also zero.

As a result of these two implementation details, it is possible to transform a 64-bit pointer to a 32-bit pointer by shifting right 3 bits, and discarding the upper 32-bits. To turn the compressed address back to a 64-bit real address, one simply shifts the 32-bit address left by 3 bytes and stores in a 64-bit variable. Certain embodiments of the present disclosure may extend this approach to address 64 GB or 128 GB of memory by aligning memory chunks to 16 or 32-byte chunks, respectively.

Task Distribution

In some embodiments, system 16 comprises a task management engine 840 configured to allocate resources to users and processes (e.g., tests or tasks) running on system 16, and in embodiments that include multiple network processors 105, to distribute such processes among the multiple network processors 105 to provide desired or maximized usage of resources.

Definitions of certain concepts may be helpful for a discussion of task management engine 840. A "user" refers to a human user that has invoked or wishes to invoke a "test" using system 16. One or more users may run one or more tests serially or in parallel on one or more network processors 105. A test may be defined as a collection of "tasks" (also called "components") to be performed by system 16, which tasks may be defined by the user. Thus, a user may specify the two tasks "FTP simulation" and "telnet simulation" that define an example test "FTP and telnet simulation." Some other example tasks may include SMTP simulation, SIP simulation, Yahoo IM simulation, HTTP simulation, SSH simulation, and Twitter simulation.

Each task (e.g., FTP simulation) may have a corresponding "task configuration" that specifies one or more performance parameters for performing the task. An example task configuration may specify two performance parameters: 50,000 sessions/second and 100,000 simulations. The task configuration for each task may be specified by the requesting user, e.g., by selecting values (e.g., 50,000 and 10,000) for one or more predefined parameters (e.g., sessions/second and number of simulations).

Some example performance parameters for a traffic simulation task are provided below:
    Data Rate Unlimited: defines whether data rate limiting should be enabled or disabled for the test. Choose this option for maximum performance or when a test's data rate is naturally limited by other factors such as session rate. This option can be useful for determining the natural upper-bound for a performance test.

Data Rate Scope: defines whether the rate distribution number is treated as a per-interface limit or an aggregate limit on the traffic that this component generates. Because of the asymmetric nature of most application protocols, when per-interface limiting is enabled, client-side bandwidth is likely to be less than server-side bandwidth. This means that the aggregate bandwidth used for some protocols will be less than the sum of the max allowed per interface. If you need a fixed amount of throughput, use the aggregate limit.

Data Rate Unit: defines the units, either 'Frames/Second' or 'Megabits/Second' that the Minimum/Maximum data rates (below) represent.

Data Rate Type: 'Constant' indicates that all generated traffic will be at the data rate specified by the Minimum data rate field, 'Range' indicates that data rate should start at either the Minimum or Maximum data rate and increase or decrease over the course of the test, 'Random' indicates that data rate should be chosen randomly between Minimum and Maximum data rates, inclusive, changing once every tenth of a second during test execution.

Minimum/Maximum data rate: min/max data rate. Values of 1 to 1488095 (1 Gigabit ports) or 14880952 (10 Gigabit ports) are supported for 'Frames/Second'. Values of 1 to 1000 (1 Gigabit ports) or 10000 (10 Gigabit ports) are supported for 'Megabits/Second'.

Ramp Up Behavior:
  During the ramp up phase, TCP sessions are only opened, but no data is sent. This is useful for quickly setting up a large number of sessions without wasting bandwidth. This parameter defines what the test actually does during the ramp up phase. Note: after the ramp up phase, all sessions will fully open, even if the ramp up behavior was set to something other than "Full Open".
  "Full Open"—The full TCP handshake is performed on open
  "Full Open+Data"—Same as full, but start sending data
  "Full Open+Data+Full Close"—Same as full+data, but also do a full close for completed sessions.
  "Full Open+Data+Close with Reset"—Same as full+data, but also initiate the TCP close with a RST.
  "Half Open"—Same as full, but omit the final ACK
  "SYN Only"—Only SYN packets are sent
  "Data Only"—Only PSH data packets are sent, with no TCP state machine processing. This mode is not compatible with SSL nor with Conditional Requests. Any flow using SSL will send no packets.

SYN Only Retry Mode: defines the behavior of the TCP Retry Mechanism when dealing with the initial SYN packet of a flow, the following modes are permitted:
  "Continous"—Continue sending SYN packets, even if we have ran out of retries (Retry Count).
  "Continous with new session"—Same as "Continous", except we change the initial sequence number every "Retry Count" loop(s).
  "Obey Retry"—Send no more than "Retry Count" initial SYN packets.

Maximum Super Flows Per Second: defines the maximum number of Super Flows that will be instantiated per second. If there is one flow per Super Flow, as in Session Sender, this is functionally equivalent to the sum of TCP and UDP flows per second. In cases where there are multiple flows per Super Flow, you may see a varying number of effective flows per second.

Maximum Simultaneous Super Flows: defines the maximum simultaneous Super Flows that will exist concurrently during the test duration. If there is one flow per Super Flow, as in Session Sender, this is functionally equivalent to the sum of TCP and UDP flows. In cases where there are multiple flows per Super Flow, you may see a varying number of effective simultaneous flows. This value defines a shared resource between different test components, and is limited to 15,000,000. In other words, the total maximum simultaneous sessions for all components in a test will be less than or equal to 15,000,000.

Engine Selection: This parameter selects the type of engine with which to run the test component. Select "Advanced" to enable the default, full-featured engine. Select "Simple" to enable a simpler, higher-performance, stateless engine.

Performance Emphasis: This parameter adjusts whether the advanced engine's flow scheduler favors opening new sessions, sending on existing sessions, or a mixture of both. Select "Throughput" to emphasize sending data on existing sessions. Select "Simultaneous Sessions" to emphazise opening new sessions. Select "Balanced" to emphasize both equally—this is the default setting.

Statistic Detail: This parameter adjusts the level of statistics to be collected. Decreasing the number of statistics collected can increase performance and allow for targeted reporting. Select "Maximum" to enable all possible statistics. Select "Application Only" to enable only Application statistics (L7). Select "Transport Only" to enable only Transport statistics (L4/L3). Select "Minimum" to disable most statistics Unlimited Super Flow Open Rate: determines globally how fast sessions are opened. If set to true, sessions will be opened as fast as possible. This setting is useful for tests where the session rate is not the limiting factor for a test's performance. Note: this setting may produce session open rates faster than the global limit.

Unlimited Super Flow Close Rate: determines how fast sessions are closed. If set to false, session close rate will mirror the session open rate. If set to true, sessions will be closed as fast as possible.

Target Minimum Super Flows Per Second: specifies a minimum number of sessions that the test must open in order to pass in the final results. This is an aid for the user to define pass/fail criteria for a particular test. This parameter does not affect the network traffic of the test in any way.

Target Minimum Simultaneous Super Flows: specifies a minimum number of sessions per second that the test must open in order to pass in the final results. This is an aid for the user to define pass/fail criteria for a particular test. This parameter does not affect the network traffic of the test in any way.

Target Number of Successful matches: specifies the minimum number of successful matches required to pass in the final results. This is an aid for the user to define pass/fail criteria for a particular test. This parameter does not affect the network traffic of the test in any way.

Streams Per Super Flow: The maximum number of streams that will be instantiated for an individual Super Flow at one time. The effective number may be limited by the number of Super Flows in the test. Setting this to a lower number makes tests initialize faster and provides less-random application traffic. Setting this to a higher number causes test initialization to take more time, but with the benefit of more randomization, especially for static flows.

Content Fidelity: Select "High" Fidelity to generate more dynamic traffic. Select "Normal" Fidelity to generate simpler, possibly more performant, traffic.

Each task requires a fixed amount of "resources" to complete the task. A "resource" refers to any limited abstract quantity associated with a network processor 105, which can be given or taken away. Example resources include CPU resources (e.g., cores), memory resources, and network bandwidth. Each network processor 105 has a fixed set of resources.

A "port" refers to a test interface 101 to the test system 18 being tested. Thus, in example embodiments, a particular card 54 may have four or eight ports (i.e., interface 101) that may be assigned to user(s) by task management engine 840 for completing various tests.

In a conventional system, when test that requires certain resources is started, such resources may be available at the beginning of a test but then become unavailable at some point during the test run, e.g., due to other tests (e.g., from other users) being initiated during the test run. This may be particularly common during long running tests. When this situation occurs, the test may have to be stopped or paused, as the required resources for continuing the test are no longer available. Thus, it may be desirable to pre-allocate resources for each user so that it can be determined before starting a particular test if the particular test can run to completion without interruption. Thus, task management engine 840 may be programmed to allocate resources to users and/or processes (tests and components thereof (i.e., tasks)) before such processes are initiated, to avoid or reduce the likelihood of such processes being interrupted or cancelled due to lack of resources.

Allocation of Resources to Users

In some embodiments, task management engine 840 is programmed to allocate resources to users based on a set of rules and algorithms (embodied in software and/or firmware accessible by task management engine 840). In a particular embodiment, such rules and algorithms specify the following:

Rules:
1. Each user is allowed to reserve one or more ports 101 on a board 54.
2. Only one user may reserve any given port 101.
3. The resources on a particular board 54 allocated to each user correspond to the number of ports 101 on the board 54 allocated to/reserved by that user.
4. If all ports 101 on a board 54 are allocated to/reserved by a particular user, then all resources of that board 54 allocated to/reserved by that user. For example, if a user reserves 2 of 8 ports on a board, then 25% of all resources of that board are allocated to that user.

In view of these rules, task management engine 840 is programmed with the following algorithm for allocating the resources of a board 54 to one or more users.

Givens:
Let "U" denote the set of all users.
Let "NP" denote the set of all network processors 105 on the board 54.
Let "n" denote the number of ports 101 controlled by the network processors 105.
Let "K" denote the set of all possible abstract resources used by all network processors 105.
Let "NPR(z,r)" denote the amount of resource "r" that a particular network processor "z" currently has available, where "r" is a member of set "K" and "z" is a member of set "NP." The amounts are in abstract units relevant to the particular network processor.
Let "p(u)" denote the number of ports 101 reserved by a user "u," where u is a member of set "U."

Algorithm:

The algorithm getMaxResourceUtilization( ) computes the amount of each resource "r" available to a given user. The total amount of any given resource "r" will be the sum of that resource "r" across all network processors 105 on the board 54. Thus, the algorithm getMaxResourceUtilization( ) returns an array "UR(u,r)" where "r" is a member of "K" and "u" is a member of "U". Each element of the array represents the amount of the resource available to the user. The algorithm is as follows:

```
begin getMaxResourceUtilization( )
    set UR equal to { }
    for each r in K
        # R is the total amount of resource "r" among all network
        processors.
        set R = 0
        for each z in NP
            set R = R + NPR(z,r)
        end for
        # Distribute R among the users.
        for each u in U
            set UR(u,r) = R * p(u) / n
        end for
    end for
    return UR
end
```

Figure 40:
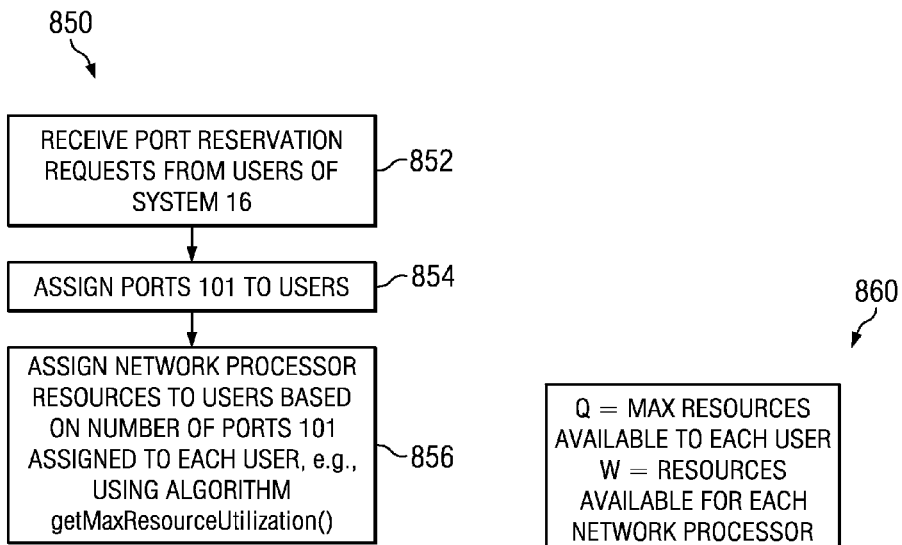
FIG. 40 illustrates an example method for allocating resources of network processors in a network testing system, according to an example embodiment.

FIG. 40 illustrates an example method 850 for allocating resources of network processors 105 in a system 16 to users, according to an example embodiment. At step 852, users submit requests to reserve test interfaces (or "ports") 101 for performing various tests of a test system 18. Users may submit such requests in any manner, e.g., via a user interface shown in FIG. 13A provided by system 16. Requests from different users may be made at different times. At step 854, task management engine 840 may assign ports 101 to users based on (a) port reservation requests made at step 852, (b) the number of currently available (i.e., unassigned) ports 101, and/or (c) one or more rules, e.g., a port reservation limit that applies to all users (e.g., each user can reserve a maximum of n ports at any given time), or port reservation limits based on the type or level of user (e.g., managers can reserve a maximum of 8 ports at any given time, while technicians can reserve a maximum of 4 ports at any given time).

At step 856, task management engine 840 may assign resources of network processors 105 to users based on the number of ports 101 assigned to each user by executing algorithm getMaxResourceUtilization( ) discussed above. As discussed above, task management engine 840 may assign the total quantity of each type of network processor resource to users on a pro rata basis, based on the number of ports assigned to each user. For example, if a user reserves 3 of 4 ports on a board, then 75% of each type of resource is assigned to that user.

Distribution of Tasks Across Network Processors

As discussed above, in some embodiments task management engine 840 is further programmed to distribute tasks (i.e., components of tests) among the multiple network processors 105 of system 16 to provide desired or maximized usage of resources, and to determine whether a particular test proposed or requested by a particular user can be added to the currently running tests on system 16. In particular, task management engine 840 may be programmed to distribute tasks based on a set of rules and algorithms (embodied in software and/or firmware accessible by task management engine 840). For example, such rules and algorithms specify the following:
Rules:
1. Each test is divided into tasks (also called components) that run in parallel.
2. Each task runs on a particular board 54 depending on the ports 101 used by that task.
3. A task may not span more than one board 54.
4. Each task will consume a fixed quantity of resources "r."
5. Each task on a board 54 will be assigned a particular network processor 105 based on the resource usage of that task and the resources on that board 54 allocated to the user.

In view of these rules, task management engine 840 is programmed with the following algorithm for allocating the resources of a board 54 to one or more users.
Givens:
Let "T" denote the set of all current running tests.
Let "nt" denote the proposed test to add to set "T."
Let "UT(t)" denote the user associated with test "t."
Let "UC(t)" denote the set of tasks for test "t."
Let "NPZ(t,c)" denote the network processor 105 associated with task "c" of test "t."
Let "X(t,c,r)" represent the amount of resource "r" used by task "c" in test "t."
Let "NPR(z,r)" denote the amount of resource "r" that a particular network processor "z" currently has available, where "r" is a member of set "K" and "z" is a member of set "NP." The amounts are in abstract units relevant to the particular network processor.
Let "Q" denote the resources currently available to each user, which may be defined for each user as the maximum resources available to that user, i.e., UR(u,r) determined by the algorithm getMaxResourceUtilization( ) minus any resources currently used by that user.
Let "W" denote the resources currently available to each network processor 105, which may be defined for each network processor 105 as the maximum resources available to that network processor 105, i.e., NPR(z,r) discussed above, minus any resources currently used by that network processor 105.

The following table defines and provides examples for the variables used in the task distribution algorithm addRunningTest( ):

| Variable | Definition | Example | | | | | | | |
|---|---|---|---|---|---|---|---|---|---|
| T | Set of all current running tests | | | t1 | | | | | |
| | | | | t2 | | | | | |
| | | | | t3 | | | | | |
| UT(t) | 1D array indexed by test, contains index of user | | | t1: u1 | | | | | |
| | | | | t2: u1 | | | | | |
| | | | | t3: u2 | | | | | |
| UC(t) | 1D array indexed by test, contains set of tasks "c" of each test "t" in set T | | | t1: c1, c2, c3 | | | | | |
| | | | | t2: c4 | | | | | |
| | | | | t3: c5, c6 | | | | | |
| NPZ(t, c) | 2D array indexed by task index and test index, contains index of the network processor associated with task "c" and test "t" | | | c1 | c2 | c3 | c4 | c5 | c6 |
| | | t1: | | np1 | np1 | np1 | np1 | np1 | np1 |
| | | t2: | | np1 | np1 | np1 | np1 | np2 | np2 |
| | | t3: | | np2 | np2 | np2 | np2 | np2 | np2 |
| NNPZ(t, c) | 2D array indexed by task index and test index, contains index of the network processor associated with task "c" and test "t," including entries for newly added test "nt" | | | c1 | c2 | c3 | c4 | c5 | c6 |
| | | t1: | | np1 | np1 | np1 | np1 | np1 | np1 |
| | | t2: | | np1 | np1 | np1 | np1 | np2 | np2 |
| | | t3: | | np2 | np2 | np2 | np2 | np2 | np2 |
| | | nt: | | np2 | np2 | np2 | np2 | np2 | np2 |
| X(t, c, r) | 3D array indexed by resource index, task index, test index. Contains the amount of resource "r" used by each task "c" of each test "t" | t1: | | | c1 | c2 | c3 | | |
| | | | r1: | | 5% | 10% | 30% | | |
| | | | r2: | | 20% | 15% | 25% | | |
| | | | r3: | | 15% | 10% | 20% | | |
| | | t2: | | | | | | | |
| | | | | | c4 | | | | |
| | | | r1: | | 15% | | | | |
| | | | r2: | | 30% | | | | |
| | | | r3: | | 20% | | | | |
| | | t3: | | | | | | | |
| | | | | | c5 | c6 | | | |
| | | | r1: | | 3% | 6% | | | |
| | | | r2: | | 5% | 10% | | | |
| | | | r3: | | 8% | 5% | | | |
| NPR(z, r) | 2D array indexed by resource index, and network processor index. Contains amount of resource "r" currently available on each network processor "z" | | | NP1 | NP2 | | | | |
| | | CPU: | | 30% | 50% | | | | |
| | | memory: | | 20% | 60% | | | | |
| | | bandwidth: | | 25% | 70% | | | | |
| K | 1D array of all possible resources of all network processors "z" | | | Total CPU resources | | | | | |
| | | | | Total memory resources | | | | | |
| | | | | Total n/w bandwidth resources | | | | | |
| r | resource (member of set K) | | | | | | | | |
| W | resources available for each network processor z | | | | | | | | |
| Q | maximum resources available to each user | | | | | | | | |
| t | test (member of set T) | | | | | | | | |
| c | task (component of a test "t") | | | | | | | | |
| nt | new test to be added to current set of running tests T | | | | | | | | |

| Variable | Definition | Example |
|---|---|---|
| NP | set of all network processors | |
| z | network processor (member of set NP) | |
| u | user | |

Algorithm:

The algorithm addRunningTest( ) determines whether to add (and if so, adds) a proposed test to a list of currently running tests on system 16. The algorithm addRunningTest( ) assumes that the resources used by the running tests do not exceed the total resources available on system 16. The algorithm first determines all resources consumed by running tests on system 16. The algorithm then determines whether it is possible to add all of the tasks of the test to one or more network processors 105 without exceeding (a) any quotas placed on the user (e.g., as specified for the user in the user resource allocation array UR(u,r) determined as described above), or (b) the maximum resources available to the relevant network processor(s) 105.

If it is impossible to add any task of the proposed test to any network processor based on the conditions discussed above, the algorithm determines not to add the test to the set of tasks running on system 16, and notifies the user that the test cannot be run. Otherwise, if all tasks of the proposed test can be added to system 16, the test is added to the list of running tests, and the tasks are assigned to their specified network processor(s) 105, as determined by the algorithm.

The algorithm is as follows:

```
begin addRunningTest(nt)
    # Determine the current resources available to each user.
    set Q = getMaxResourceUtilization( )
    # Determine the current resources available to each network
    processor.
    set W = NPR
    # Subtract resources used by the current running tests from the
    # resources available to the user and each network processor.
    for each test t in T
        set u = UT(t)
        for each c in UC(t)
            set z = NPZ(t,c)
            for each r in K
                # subtract the amount from the total available
                # to the user, and the total available to the
                processor.
                Q(u,r) = Q(u,r) − X(t)(c)(r)
                W(z)(r) = W(z)(r) − X(t)(c)(r)
            end for
        end for
    end for
    # Assign new tasks to a network processor
    set u = UT(nt)
    set NNPZ = { }
    for each c in UC(nt)
        # If the limit for any resource is exceeded, then fail
        for each r in K
            if X(nt,c,r) > Q(u,r)
                then fail
        end for
        # Look for any network processor that can accommodate the
        # resource request
        set found = false
        for each z in NP
            set all.ok = true
            for r in K
                if X(nt,c,r) > W(z,r)
                    then all.ok = false
            end for
```

```
            if all.ok then
                set found = true
                set foundz = z
            end if
        end for
        if not found, then fail
        # Assign the task to a network processor, and subtract its amount
        # from the total available to the user, and the total available to
        # the processor.
        set NNPZ(c) = foundz
        for each r in K
            Q(u,r) = Q(u,r) − X(nt)(c)(r)
            W(foundz,r) = W(foundz,r) − X(nt)(c)(r)
        end for
    end for
    # all tasks were assigned, we can add the test.
    add t to T
    for each c in UC(t)
        set NPZ(t,c) = NNPZ(c)
    end for
end
```

FIGS. 41A-41E illustrate a process flow of the addRunningTest(nt) algorithm executed by task management engine 840, as disclosed above.

Figure 41A:
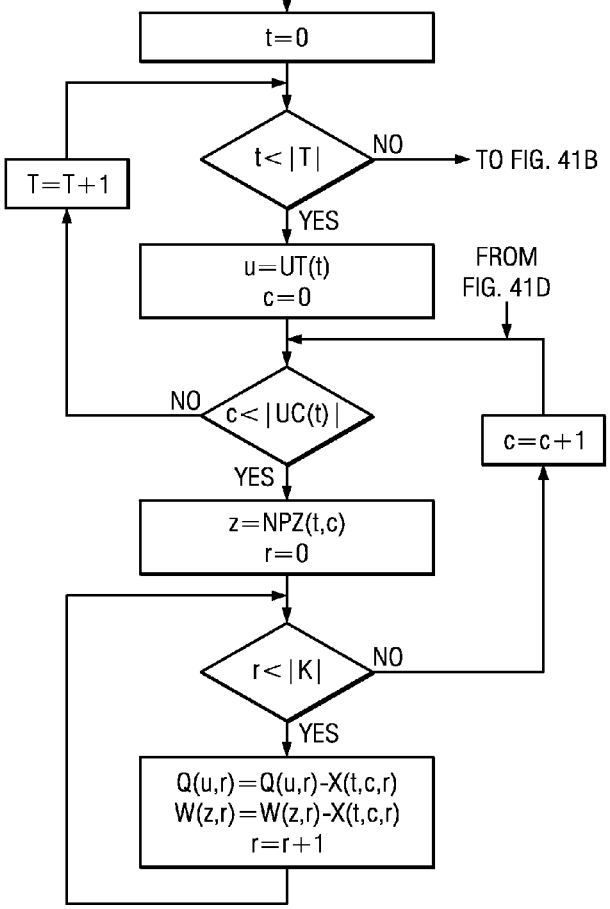

FIG. 41A illustrates a module 860 of the addRunningTest(nt) algorithm that determines the current resources available to each user, Q, and the current resources available to each network processor, W.

FIG. 41B illustrates a module 862 of the addRunningTest(nt) algorithm that determines whether any of the tasks of the proposed new test would exceed the current resources available to the user that has proposed the new test, as determined by algorithm module 860.

FIG. 41C illustrates a module 864 of the addRunningTest(nt) algorithm that determines whether the network processors can accommodate the tasks of the proposed new test, based on a comparison of the current resources available to each network processor determined by algorithm module 860 and the resources required for completing the proposed new task.

Figure 41D:
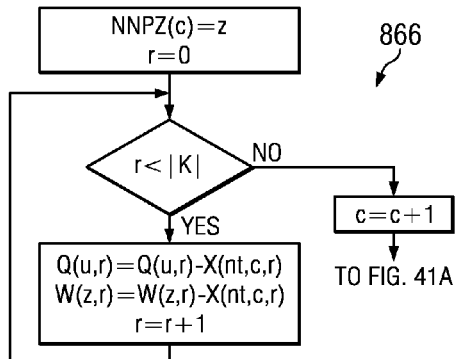

FIG. 41D illustrates a module 866 of the addRunningTest(nt) algorithm that assigns the tasks of the proposed new task to one or more network processors, if algorithm module 864 determines that the network processors can accommodate all tasks of the proposed new test.

Figure 41E:
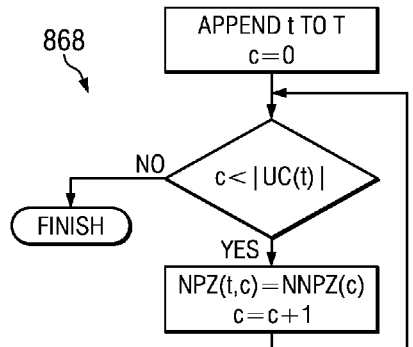

FIG. 41E illustrates a module 868 of the addRunningTest(nt) algorithm that adds the proposed new test to the set of tests, T, running on system 16. Task management engine 840 may then instruct control processor 106 and/or relevant network processors 105 to schedule and initiate the new test.

Figure 42:
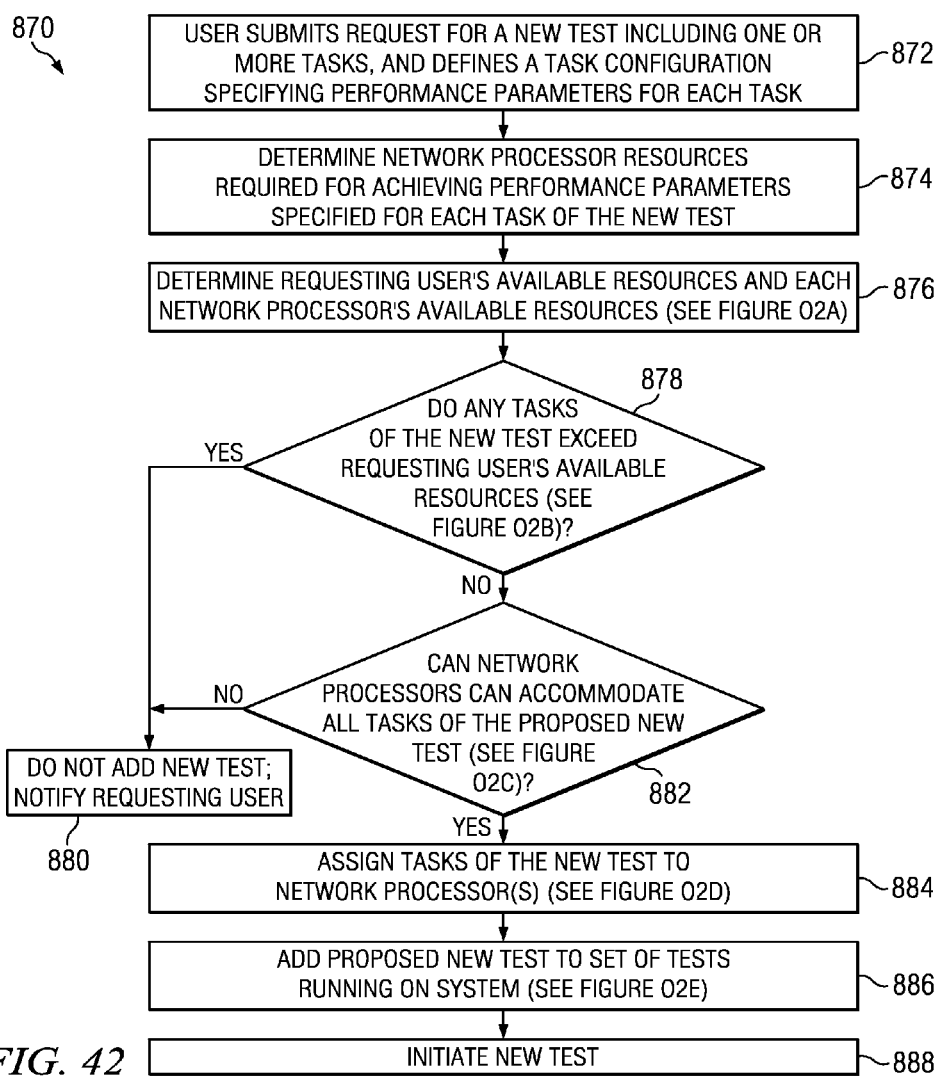
FIG. 42 illustrates an example method for implementing the algorithm of FIGS. 41A-41E in a network testing system, according to an example embodiment.

FIG. 42 illustrates an example method 870 for determining whether a test proposed by a user can be added to the current list of tests running on system 16 (if any), and if so, adding the test to the list of currently running tests on system 16 and distributing the tasks of the proposed test to one or more network processors 105 of system 16. At step 872, a user submits a request to run a new test on system 16, e.g., to test operational aspects of a test system 18. The users may submit such new test request in any manner, e.g., via a user interface shown in FIG. 13D provided by system 16.

In one embodiment, the user may define the proposed new test by (a) selecting one or more tasks to be included in the new test, e.g., by selecting from a predefined set of task types displayed by engine 840 (e.g., FTP simulation, telnet simulation, SMTP simulation, SIP simulation, Yahoo IM simulation, HTTP simulation, SSH simulation, and Twitter simulation, etc.), and (b) for each selected task, specifying one or more performance parameters, e.g., by selecting any of the example performance parameter categories listed above (Data Rate Unlimited, Data Rate Scope, Data Rate Unit, Data Rate Type, Minimum/Maximum data rate. Ramp Up Behavior, etc.) and entering or selecting a setting or value for each selected performance parameter category. Thus, for a telnet simulation tasks, the user may define the performance parameters of 50,000 sessions/second and 100,000 simulations.

At step 874, engine 840 may determine the amount of each type of network processor resource "r" required for achieving the performance parameters defined (in the relevant task configuration) for each task of the proposed new test, indicated as X(nt,c,r) in the algorithm above. For example, for a particular task of the new test, engine 840 may determine that the task requires 20% of the total CPU resources of network processors 105, 25% of the total memory resources of network processors 105, and 5% of the total network bandwidth resources of network processors 105. Engine 840 may determine the required amount of each type of network processor resource "r" in any suitable manner, e.g., based on empirical test data defining correlations between particular test performance parameters can empirically determined network processor resource quantities used by the relevant network processor(s) for achieving the particular performance parameters. In some instances, engine 840 may interpolate/extrapolate or otherwise analyze such empirical test data to determine the network processor resources X(nt,c,r) required for achieving the performance parameters of the particular task of the new test. In some embodiments, engine 840 may notify the user of the required network processor resources determined at step 874.

Task management engine 840 may then execute the addRunningTest(nt) algorithm disclosed above or other suitable algorithm to determine whether the proposed new test can be added to the set of currently running tests on system 16 (i.e., whether all tasks of the proposed new test can be added to system 16). At step 876, engine 840 may determine the current resources available to each user (or at least the current resources available to the requesting user) and the current resources available to each network processor, e.g., by executing algorithm module 860 shown in FIG. 41A. In some embodiments, engine 840 may display or otherwise notify the user of the current resources available to that user, e.g., by displaying the current resources on a display.

At step 878, engine 840 may determine whether any of the tasks of the proposed new test would exceed the current resources available to the requesting user, e.g., by executing algorithm module 862 shown in FIG. 41B. This may include a comparison of the required resources for each task as determined at step 874 with the current resources available to the requesting user as determined at step 876. If any of the tasks of the proposed new test would exceed the requesting user's currently available resources, the proposed new test is not added to system 16, as indicated at step 880. In some embodiments, engine 840 may display or otherwise notify the user of the results of the determination. At step 882, engine 840 may determine whether the network processors 105 can accommodate the tasks of the proposed new test, e.g., by executing algorithm module 864 shown in FIG. 41C. This may include a comparison of the required resources for each task as determined at step 874 with the current resources available to each network processor as determined as determined at step 876. If it is determined that the network processors 105 cannot accommodate the new test, the proposed new test is not added to system 16, as indicated at step 880. In some embodiments, engine 840 may display or otherwise notify the user of the results of the determination.

At step 884, if algorithm module 864 determines that the network processors can accommodate all tasks of the proposed new test, engine 840 assign the tasks of the proposed new task to one or more network processors 105, e.g., by executing algorithm module 866 shown in FIG. 41D. In some embodiments, engine 840 may display or otherwise notify the user of the assignment of tasks to network processor(s). At step 886, engine 840 may adds the proposed new test to the set of tests running on system 16, e.g., by executing algorithm module 868 shown in FIG. 41E. At step 888, task management engine 840 may then instruct control processor 106 and/or relevant network processors 105 to initiate the new test. In some embodiments, engine 840 may notify the user of the test initiation.

Dynamic Latency Analysis

In some embodiments, network testing system 16 may perform statistical analysis of received network traffic in order to measure the quality of service provided under a given test scenario. One measure of quality of service is network performance measured in terms of bandwidth, or the total volume of data that can pass through the network, and latency (i.e., the delay involved in passing that data over the network). Each data packet passing through a network will experience its own specific latency based on the amount of work involved in transmitting that packet and based on the timing of its transmission relative to other events in the system. Because of the huge number of packets transmitted on a typical network, measurement of latency may be represented using statistical methods. Latency in network simulation may be expressed in abstract terms characterizing the minimum, maximum, and average measured value. More granular statistical analysis may be difficult to obtain due to the large number of data points involved and the rate at which new data points are acquired.

In some embodiments, a network message may be comprised of multiple network packets and measurement may focus on the complete assembled message as received. In some testing scenarios, the focus of the analysis may be on individual network packets while other testing scenarios may focus on entire messages. For the purposes of this disclosure, the term network message will be used to refer to a network message that may be fragmented into one or more packets unless otherwise indicated.

This aspect of the network testing system focuses on the measurement of and visibility into the latency observed in the lab environment. The reporting period may be subdivided into smaller periodic windows to illustrate trends over time. A standard deviation of measured latencies may be measured and reported within each measurement window. Counts tracking how many packets fall within each of a set of latency ranges may be kept over a set of standard-deviation-sized intervals. Latency boundaries of ranges may be modified for one or more subsequent intervals, based at least in part on the average and standard deviation measured in the previous interval. Where these enhanced measurements are taken during a simulation, they may be presented to a user to illustrate how network latency was affected over time by events within the simulation.

Average

In certain embodiments, each packet transmitted has a timestamp embedded in it. When the packet is received, the time of receipt may be compared against the transmit time to calculate a latency. A count of packets and a running total of all latency measurements may be kept over the course of a single interval. At the end of the measurement interval, an average latency value may be calculated by dividing the running total by the count from that interval, and the count and sum may be reset to zero to begin the next interval. In some embodiments, a separate counter may be kept to count all incoming packets and may be used to determine the average latency value.

Standard Deviation

For a subset of the packets (e.g., one out of every n packets, where n is a tunable parameter), the latency may be calculated as above, and a running sum of the latency of this subset may be kept. In addition, a running sum of the square of the latencies measured for this subset may be calculated. Limiting the calculation to a subset may avoid the problem of arithmetic overflow when calculating the sum of squares. At the end of each interval, the standard deviation over the measured packets may be calculated using the "sum of squares minus square of sums" method, or $$\sigma = sqrt\left(sum(x^2) - \frac{(sum(x))^2}{n}\right)$$

In certain embodiments, a set of counters may be kept. A first pair of counters may represent latencies up to one standard deviation from the average, as measured in the previous measurement window. A second pair of counters may represent between one and two standard deviations from the average. A third pair of counters may represent two or more standard deviations from the average. Other arrangements of counters may be valuable. For example, additional counters may be provided to represent fractional standard deviation steps for a more granular view of the data. In another example, additional counters may be provided to represent three or four standard deviations away to capture the number of extreme latency events. In some embodiments, the focus of the analysis is on high latencies. In these embodiments, one counter may count all received packets with a latency in the range of zero units of time to one standard deviation above the average.

The counters may be maintained as follows. For each packet received, one of the counters is incremented based on the measured latency of that packet. At the end of each interval, the counts may be recorded (e.g., in a memory, database, or log) before the counters are reset. Also at the end of an interval, the boundaries between counters may be adjusted based on the new measured average and standard deviation.

In some embodiments, the interval length may be adjusted to adjust the frequency of measurement. For example, a series of short intervals may be used initially to calibrate the ongoing measurement and a series of longer intervals may be used to measure performance over time. In another example, long intervals may be used most of the time to reduce the amount of data gathered with short intervals interspersed regularly or randomly to observe potentially anomalous behavior. In yet another example, the interval length may be adjusted based on an internal or external trigger.

In some embodiments, the counters may be implemented within the capture/offload CLDs 102A. Locating the counters and necessary logic with CLDs 102A ensures maximal throughput of the statistical processing system and maximal precision without the possibility of side effects due to internal transfer delays between components within the network testing system.

Figure 43:
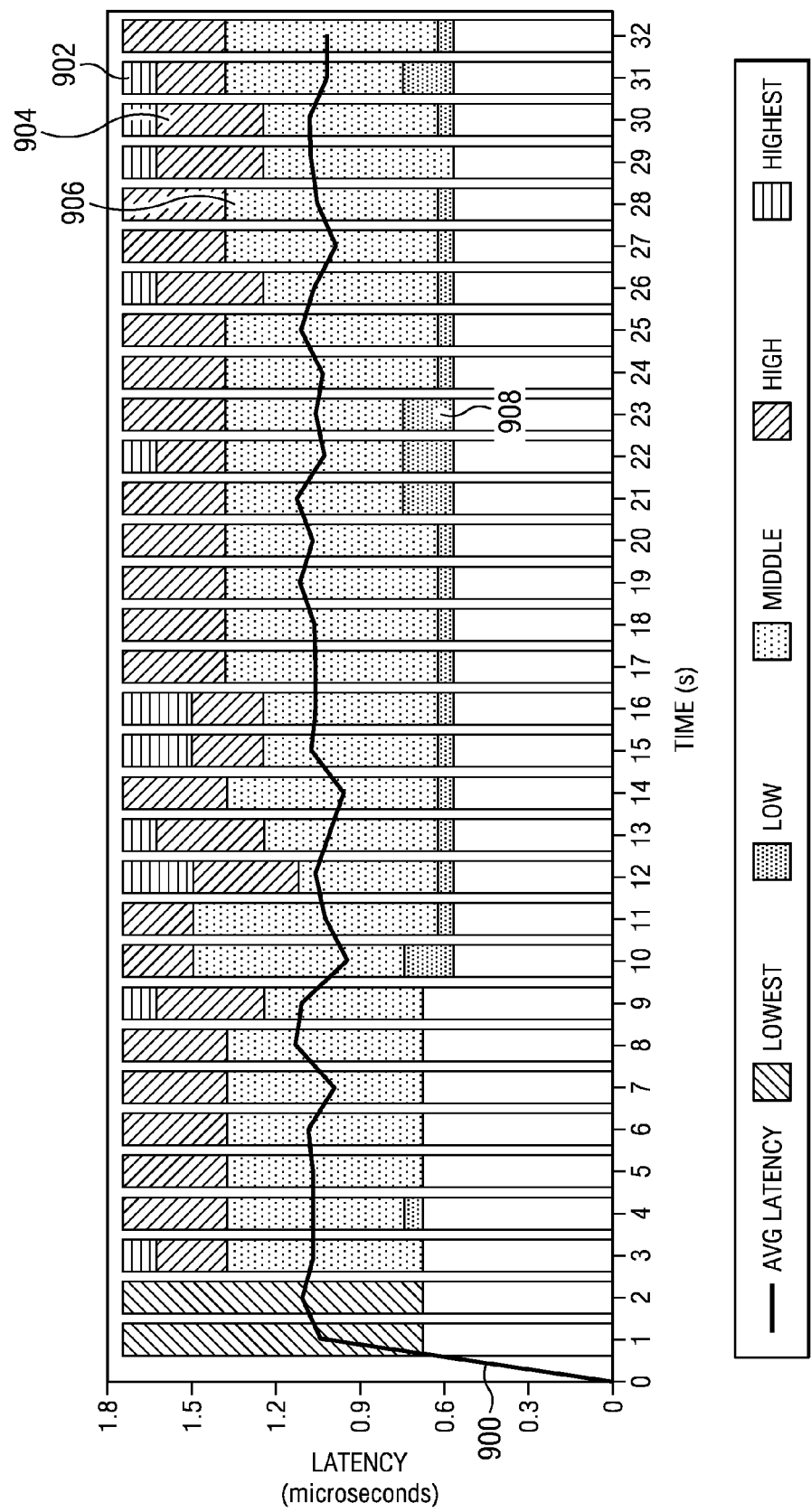
FIG. 43 illustrates the latency performance of an example device or infrastructure under test by a network testing system, as presented to a user, according to an example embodiment.

FIG. 43 illustrates the latency performance of the device or infrastructure under test as it is presented to a user, according to certain embodiments of the present disclosure. The chart presents latency as a function of time. Each column of the chart represents a time slice. Line 900 represents the average latency for messages received in that time slice. Each of blocks 902, 904, 906, and 908 represent bands of latencies, e.g., bands bounded by a multiple of standard deviations from average. In some embodiments, block 902 represents all messages received within the current time slice with latencies greater than two standard deviations from the average latency for the immediately preceding time slice. If no messages are received in that time slice meeting that criteria, then block 902 will not appear for that time slice. Similarly, block 904 represents all messages received within the current time slice with latencies greater than one standard deviation above the average but less than two standard deviations above the average. Block 906 represents all messages received within the current time slice with latencies within one standard deviation of the average. Block 908 represents all messages received within the current time slice with latencies more than one standard deviation blow the average but less than two standard deviations below the average. The edges of each block center and spread of a standard deviation curve measured in the immediately preceding time slice.

FIG. 44 is a table of a subset of the raw statistical data from which the chart of FIG. 43 is derived, according to certain embodiments of the present disclosure. The table includes a timestamp of the first message received within a time slice. The average latency represents the average latency for the messages received within that time slice. The next five columns of data indicate the bounds of each of five bands of latencies. These bounds may be described as threshold ranges. The final five columns indicate the number of messages received within each of the five bands.

Figure 45:
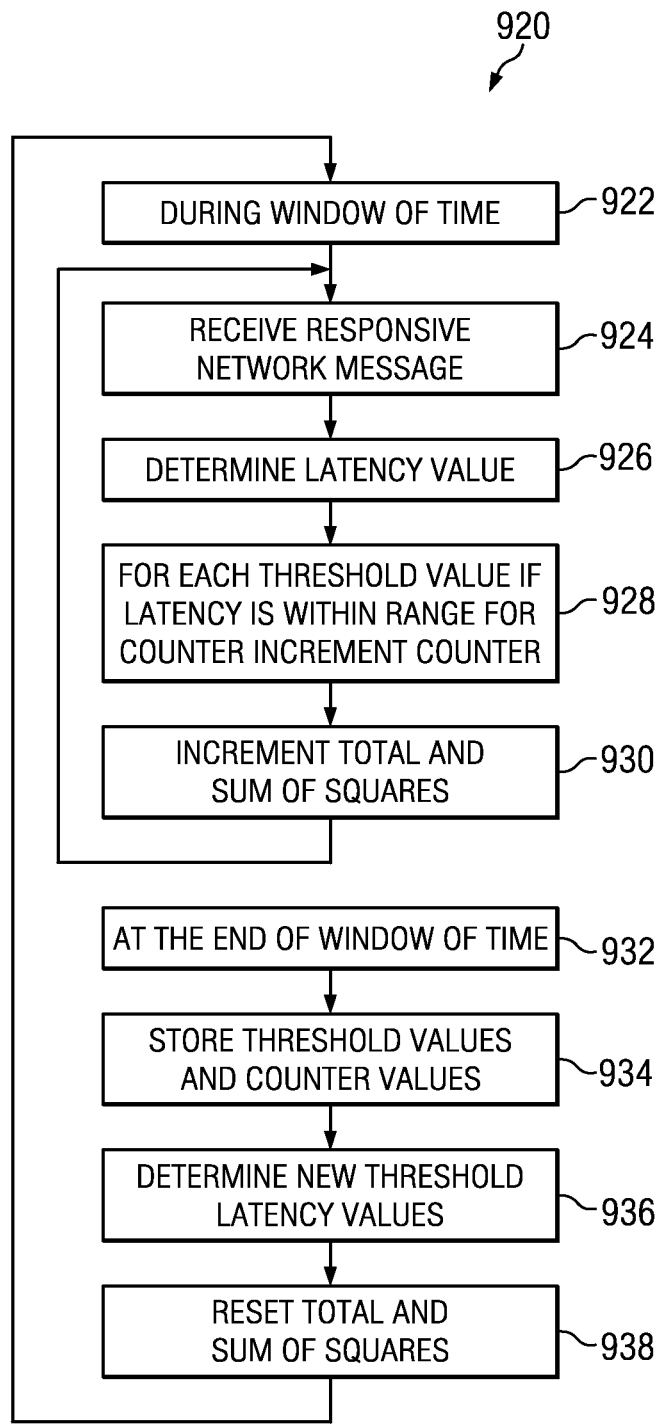
FIG. 45 is an example method for determining dynamic latency buckets according to an example embodiment of the present disclosure.

FIG. 45 is an example method 920 of determining dynamic latency buckets according to some embodiments of the present disclosure. The method of FIG. 45 may be performed entirely in capture/offload CLDs 102A as the implementing logic is sufficiently simple and because delay in calculating latency or new latency threshold values might interfere with the system's ability to process each received network message within the appropriate time interval. This method will be described in relation to the five buckets illustrated in FIGS. 43 and 44, though it is not limited to any particular number of buckets. The initial values of the threshold ranges may be set to values retrieved from a database of previously captured latencies or may be set arbitrarily. Asynchronous to this process is a parallel process that is generating and sending outbound network messages from the network testing device for which responsive network messages are expected.

Process 922 continues for a specified interval of time (e.g., one second). In process 922, a responsive network message is received at step 924 and stamped with a high-resolution clock value indicating a time of receipt. This responsive network message is examined and information is extracted that may be used to determine a when a corresponding outbound network message was sent. In some embodiments, the responsive network message includes a timestamp indicating when the corresponding outbound network message was sent. In other embodiments, a serial number or other unique identifier may be used to lookup a timestamp from a database indicating when the corresponding outbound network message was sent.

At step 926, the latency is calculated by subtracting the sent timestamp of the outbound network message from the receipt timestamp.

At step 928, the latency is compared against a series of one or more threshold values to determine which bucket should be incremented. Each bucket is a counter or tally of the number of packets received with a latency falling within the range for that bucket. In certain embodiments, the threshold values are represented as a max/min pair of latency values representing the range of values associated with a particular bucket. The series of buckets forms a non-overlapping, but continuous range of latency values. In the example illustrated in FIG. 44, in the initial configuration (at time equals zero), the lowest latency bucket is associated with a range of zero to less than 10 microseconds, the second latency bucket is associated with a range of ten microseconds to less than 100 microseconds, and so forth. In the illustration in FIG. 44, the lowest latency range starts at zero and highest latency range continues to infinity in order to include all possible latency values. In some embodiments, the latency ranges may not be all inclusive and extreme outliers may be ignored. As a final step with each received network message, two interval totals are incremented. The first is a total latency value. This total latency value is incremented by the latency of each received packet. The second is a sum of squares value, which is incremented by the square of the latency of the received packet, at step 930.

At the end of the time interval, process 932 stores the current statistics and adjusts the threshold values to better reflect the observed variation in latencies. First, the current latency counts and latency threshold range information is stored at step 934 for later retrieval by a reporting tool or other analytical software. In some embodiments, the information stored at this step includes all of the information in FIG. 44. Next, new threshold latency values are calculated at step 936.

In some embodiments, step 936 adjusts the threshold latency values to fit a bell curve to the data of the most recently captured data. In this process, the total received message count (maintained independently or calculated by summing the tallies in each bucket) and the total latency are used to calculate the average latency, or center of the bell curve. Then, the sum of squares value is used in combination with the average latency to determine the value of a latency that is one standard deviation away from the average. With the average and standard deviation known, the threshold ranges may be calculated to be: zero to less than two standard deviations below the average, two standard deviations to less than one standard deviations below the average, one standard deviation below to less than one standard deviation above, one standard deviation above to less than two standard deviations above the average, and two standard deviations above the average to infinity. Finally, the total latency and total sum of squares latency values are zeroed at step 938.

In embodiments where the threshold latency values do not encompass all possible latency values, outliers may be completely ignored, or may be used to only calculate the new threshold latency values. In the former case, step 930 will be skipped for each outlier message so as not to skew the average and standard deviation calculation. In the latter case, a running tally of all received messages is necessary and step 930 will be performed on all received messages.

Serial Port Access in Multi-Processor System

Serial ports on various processors in system 16 may need to be accessed during manufacturing and/or system debug phases. In conventional single-processor systems, serial port access to the processor is typically achieved by physically removing the board from the chassis and connecting a serial cable to an on-board connector. However, this may hinder debug ability by requiring the board to be removed to attach the connector, possibly clearing the fault on the board before the processor can even be accessed. Further, for multi-processor boards of various embodiments of system 16, the conventional access technique would require separate cables for each processor. This may cause increased complexity in the manufacturing setup and/or require operator intervention during the test, each of which may lengthen the test time and incur additional per board costs. Thus, system 16 incorporates a serial port access system 950 that provides serial access to any processor on any card 54 in system 16 without having to remove any cards 54 from chassis 50.

Figure 46:
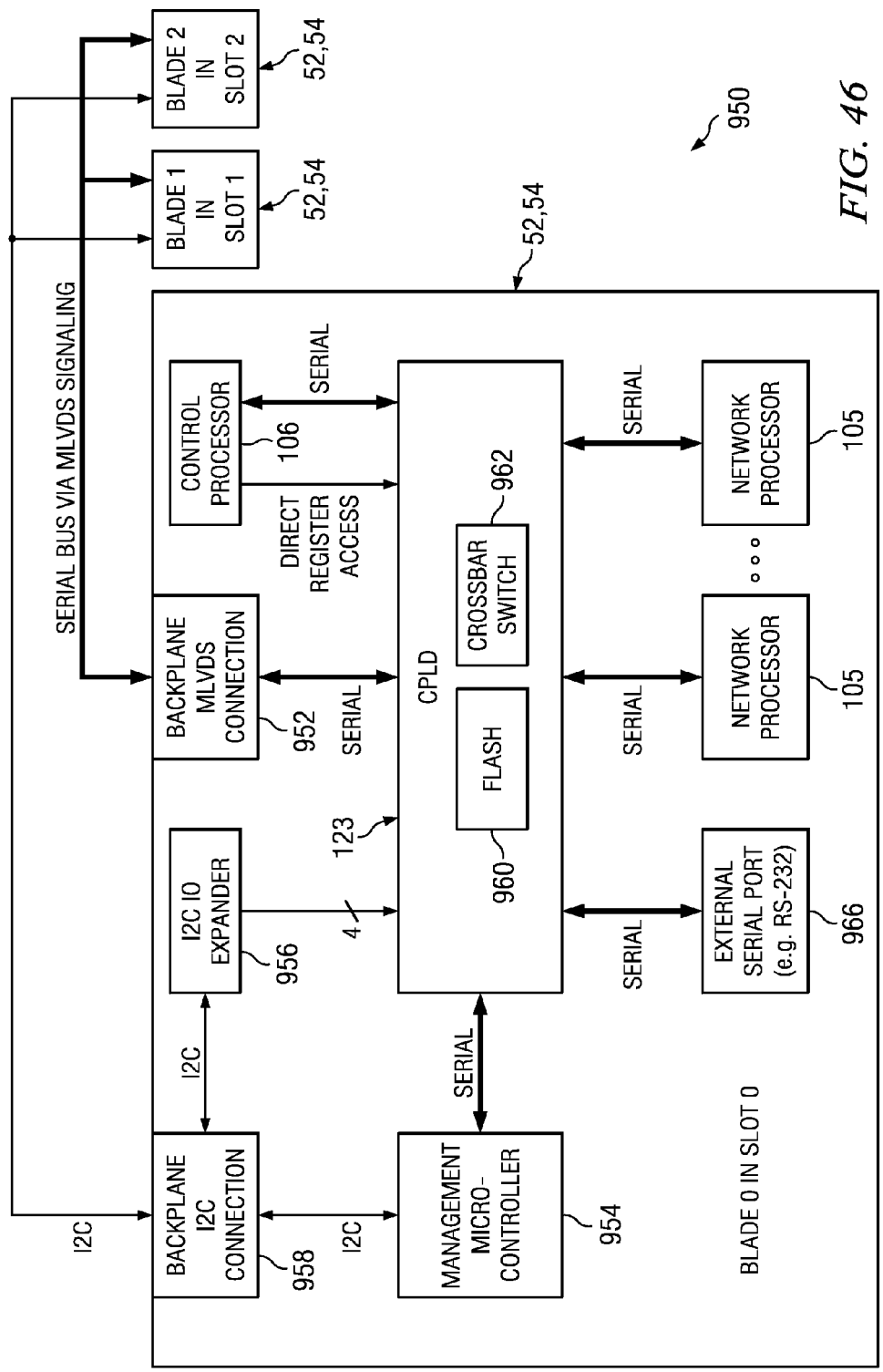
FIG. 46 illustrates an example serial port access system in a network testing system, according to an example embodiment.

FIG. 46 illustrates an example serial port access system 950 of system 16 that provides direct serial access to any processor on any card 54 in system 16 (e.g., control processors 106 and network processors 105) via the control processor 106 on any card 54 or via an external serial port on any card 54 (e.g., when control processors are malfunctioning). Serial port access system 950 includes various components of system 16 discussed above, as well as additional devices not previously discussed. As shown, serial port access system 950 on card 0 in slot 0 includes a crossbar switch 962 hosted on a CPLD (Complex Programmable Logic Device) 123, an external serial port 966 (in this example, an RS-232 connection), a backplane MLVDS (Multipoint LVDS) serial connection 952, a management microcontroller 954, an I2C IO expander 956, and a backplane I2C connection 958. Cards 1 and 2 in slots 1 and 2 may include similar components.

The crossbar switch 962 on each card 54 may comprise an "any-to-any" switch connected to all serial ports on the respective card 54. As shown in FIG. 46, crossbar switch 962 connects serial ports of control processor 106 (e.g., Intel X86 processor), each network processor 105 (e.g., XLR Network processors), external RS-232 connection 966, a shared backplane MLVDS connection 952, and management microcontroller 954 to provide direct serial communications between any of such devices. In particular, the serial ports may be set up to connect between any two attached serial ports through register writes to the CPLD 123. Crossbar switch 962 may comprise custom logic stored on each CPLD 123.

An MLVDS (Multipoint LVDS) shared bus runs across the multi-blade chassis backplane 56 and allows connectivity to the crossbar switch 962 in the CPLD 123 of each other card 54 in the chassis 50. Thus, serial port access system 950 allows access to serial ports on the same blade 54 (referred to as intra-blade serial connections), as well as to serial ports on other blades 54 in the chassis 50 via the MLVDS shared bus (referred to as inter-blade serial connections).

Figure 47:
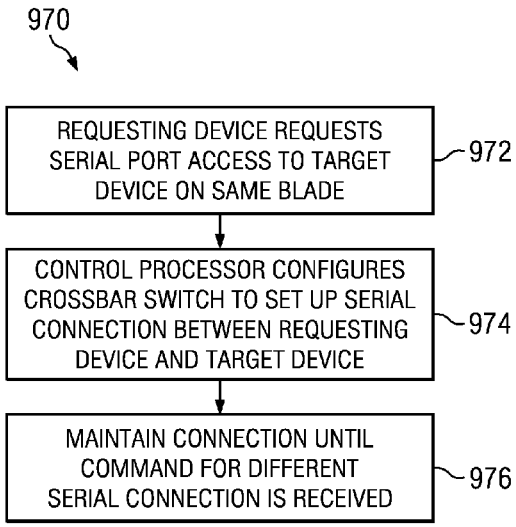
FIG. 47 illustrates an example method for setting up an intra-blade serial connection in a network testing system, e.g., when a processor needs to connect to a serial port on the same blade, according to an example embodiment.

FIG. 47 illustrates an example method 970 for setting up an intra-blade serial connection, e.g., when a processor needs to connect to a serial port on the same blade 54. At step 972, a requesting device on a particular blade 54 sends a command to the control processor 106 for serial access to a target device on the same blade 54. At step 974, control processor 106 uses it's direct register access to CPLD 123 containing the crossbar switch 962 to write registers and set up the correct connection between the requesting device and target device on blade 54. When the connection is made the two devices act as if their serial ports are directly connected. This connection will persist until a command is sent to control processor 106 to switch crossbar switch 962 to a new serial connection configuration, as indicated at step 976, at which point the control processor 106 uses it's direct register access to CPLD 123 to write registers and set up the new connection between the new requesting device and new target device (which may or may not be on the same blade 54).

Figure 48:
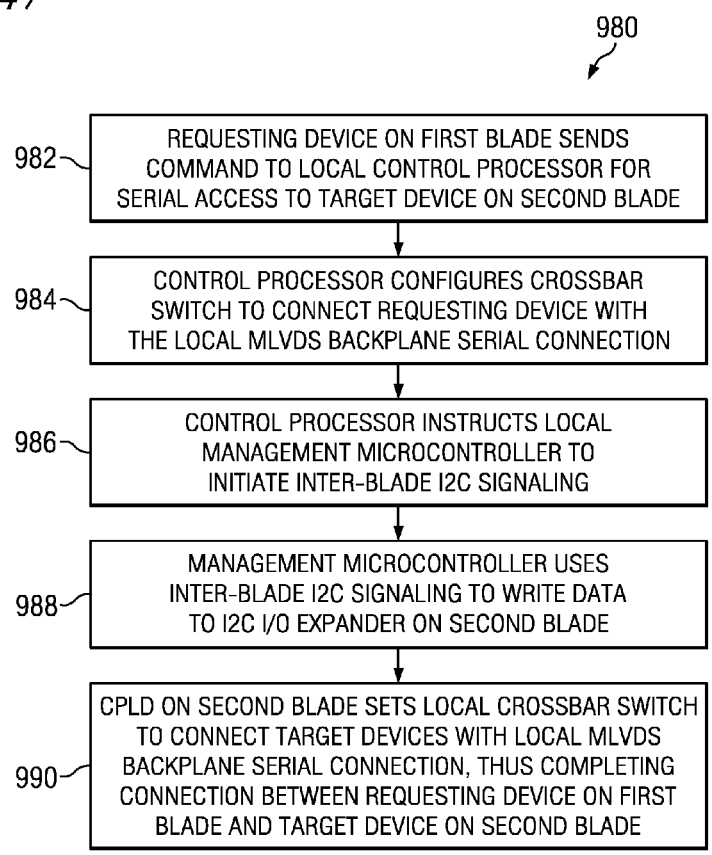
FIG. 48 illustrates an example method for setting up an inter-blade connection between a requesting device on a first blade with a target device on a second blade in a network testing system, according to an example embodiment.

FIG. 48 illustrates an example method 980 for setting up an inter-blade connection between a requesting device on a first blade 54 with a target device on a second blade 54. At step 982, a requesting device on a first blade 54 sends a command to the local control processor 106 for serial access to a target device on a second blade 54. At step 984, the control processor 106 on the first blade 54 sets the local CPLD crossbar switch 962 to connect the serial port of the requesting device with the shared backplane serial connection 952 on the first blade 54. The shared backplane serial connection 952 uses a MLVDS, or Multipoint Low Voltage Differential Signal, bus to connect to each other blade 54 in the system 16. MLVDS is a signaling protocol that allows one MLVDS driver along the net to send a signal to multiple MLVDS receivers, which allows a single pin to be used for carrying each of the TX and RX signals (i.e., a total of two pins are used) and allows inter-blade communication between any serial ports on any blade 54 in chassis 50. Protocols other than MLVDS would typically require a separate TX and RX signal for each blade in the system. Further, MLVDS communications are less noisy than certain other communication protocols, e.g., RS-232.

In addition to setting the registers on the CPLD 123 on the local blade 54, control processor 106 sends a message to the local management microcontroller 954 at step 986 to initiate an I2C-based signaling for setting the CPLD crossbar switch 962 on the second blade as follows. At step 988, the management microcontroller 954 uses it's I2C connectivity to the other blades 54 in the system to write to an I1C I/O expander 956 on the second blade 54 involved in the serial connection (i.e., the blade housing the target device). For example, the management microcontroller 954 sets 4 bits of data out of the I/O expander 956 on the second blade 54 that are read by the local CPLD 123. Based on these 4 bits of data, CPLD 123 on the second blade 54 sets the local crossbar configuration registers to connect the backplane serial MLVDS connection 952 on the second blade with the target device on the second blade at step 990. This creates a direct serial connection between the requesting device on the first blade and the target device on the second blade via the MLVDS serial bus bridging the two blades.

Thus, serial port access system 950 (a) provides each processor in system 16 direct serial access each other processor in system 16, and (b) provides a user direct serial access to any processor in system 16, either by way of control processor 106 or via external RS-232 serial port 966. If control processor 106 has booted and is functioning properly, a user can access any processor in system 16 by way of the control processor 106 acting as a control proxy, e.g., according to the method 970 of FIG. 47 (for intra-blade serial access) or the method 980 of FIG. 48 (for intra-blade serial access). Thus, control processor 106 can be used as a control proxy to debug other devices in system 16.

Alternatively, a user can access any processor in system 16 via physical connection to external RS-232 serial port 966 at the front of chassis 50. For example, a user may connect to external RS-232 serial port 966 when control processors 106 of system 16 are malfunctioning, not booted, or otherwise inaccessible or inoperative. Serial ports are primitive peripherals that allow basic access even if EEPROMs or other memory devices in the system are malfunctioning or inoperative. In addition, CPLD 123 is booted by its own internal flash memory program 960 and accepts RS-232 signaling/commands, such that crossbar switch 962 in CPLD 123 may be booted and operational even when control processors 106 and/or other devices of system 16 are malfunctioning, not booted, or otherwise inaccessible or inoperative. As another example, a user may connect a debug device or system to external RS-232 serial port 966 for external debugging of devices within system 16.

Thus, based on the above, serial port access system 950 including crossbar switch 962 allows single point serial access to all processors in a multi-blade system 16, and thus allows debugging without specialized connections to system 16.

USB Device Initialization

System 16 includes multiple programmable devices 1002 (e.g., microcontrollers) that must be programmed before each can perform its assigned task(s). One mechanism for programming a device 1002 is to connect it to a non-transient programmable memory (e.g., EEPROM or Flash) such that device 1002 will read programming instructions from that memory on power-up. This implementation requires a separate non-transient programmable memory per device 1002, which may significantly increase the part count and board complexity. In addition, a software update must be written to each of these non-transient programmable memories. This memory update process, often called "flashing" the memory, adds further design complexity and, if interrupted, may result in a non-functioning device.

Instead of associating each programmable device 1002 with its own memory, some embodiments of the present disclosure provide a communication channel between control processor 106 and at least some devices 1002 through which processor 106 can program each device 1002 from device images 1004 stored on drive 109. In these embodiments, updating a program for a device 1002 may be performed by updating a file on drive 109. In some embodiments, a universal serial bus (USB) connection forms the communication channel between control processor 106 and programmable devices 1002 through which each device 1002 may be programmed.

In an embodiment with one programmable device 1002, that device will automatically come out of reset and appear on the USB bus ready to be programmed. Control processor 106 will scan the USB bus for programmable devices 1002 and find one ready to be programmed. Once identified, control processor 106 will locate a corresponding image 1004 on drive 109 and will transfer the contents of image 1004 to device 1002, e.g., via a set of sequential memory transfers.

Certain embodiments require additional steps in order identify and program specific programmable devices 1002. The programmable devices are not pre-loaded with instructions or configuration information and each will appear identical as it comes out of reset, even though each must be programmed with a specific corresponding image 1004 in order to carry out functions assigned to that device within system 16. The USB protocol cannot be used to differentiate devices as it does not guarantee which order devices will be discovered or provide any other identifying information about those devices. As a result, control processor 106 cannot simply program devices 1002 as they are discovered because control processor 106 will not be able to identify the specific corresponding image 1004 associated with that device.

In one embodiment, each programmable device 1004 may be connected to an EEPROM or wired coding system (e.g., DIP switches or hardwired board traces encoding a device identifier) to provide minimal instructions or identification information. However, while this technique may enable device-specific programming, it involves initial pre-programming steps during the manufacturing process which may add time, complexity, and cost to the manufacturing process. Further, this technique may reduce the flexibility of the design precluding certain types of future software updates or complicating design reuse.

In some embodiments, system 16 includes a programmable device initiation system 1000 that uses one of the programmable devices 1002 (e.g., a USB connected microcontroller) as a reset master for the other programmable devices 1002, which allows the slave devices 1002 to be brought out of reset and uniquely identified by control processor 106 in a staggered manner, to ensure that each programmable device 1002 receives the proper software image 1004. These embodiments may eliminate the need for an EEPROM associated each USB device discussed above, and may thus eliminate the time and cost of pre-programming each EEPROM.

Figure 49:
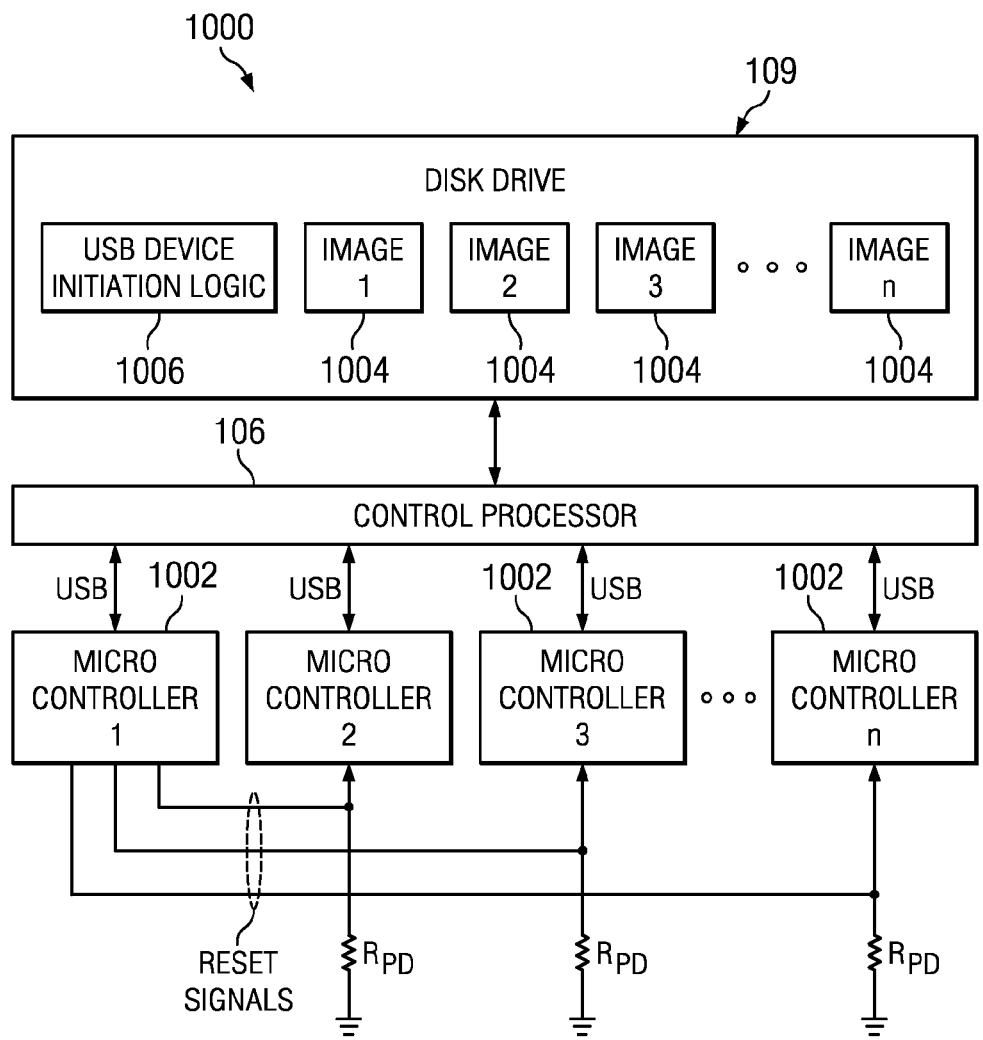
FIG. 49 illustrates an example USB device initiation system for use in a network testing system, according to an example embodiment.

FIG. 49 illustrates an example USB device initiation system 1000 for use in system 16, according to an example embodiment. As shown, a plurality of programmable devices 1002, in this case Microcontroller 1, Microcontroller 2, Microcontroller 3, . . . Microcontroller n, are connected to control processor 106 by USB. Microcontrollers 1-n may comprise any type of microcontrollers, e.g., Cypress FX2LP EZ-USB microcontrollers. Disk drive 109 connected to control processor 106 includes a plurality of software images 1004, indicated as Image 1, Image 2, Image 3, . . . Image n that correspond by number to the microcontrollers they are intended to be loaded onto. Disk drive 109 also stores programmable devices initiation logic 1006 (e.g., a software module) configured to manage the discovery and initiation of microcontrollers 1002, including loading the correct software image 1004 onto each microcontroller 1002. Logic 1006 may identify a master programmable devices (e.g., Microcontroller 1 in the example discussed below), as well as an order in which the multiple programmable devices will be brought up by control processor 106 and a corresponding ordering of images 1004, such that the ordering can be used to match each image 1004 with its correct programmable device 1002.

Figure 50:
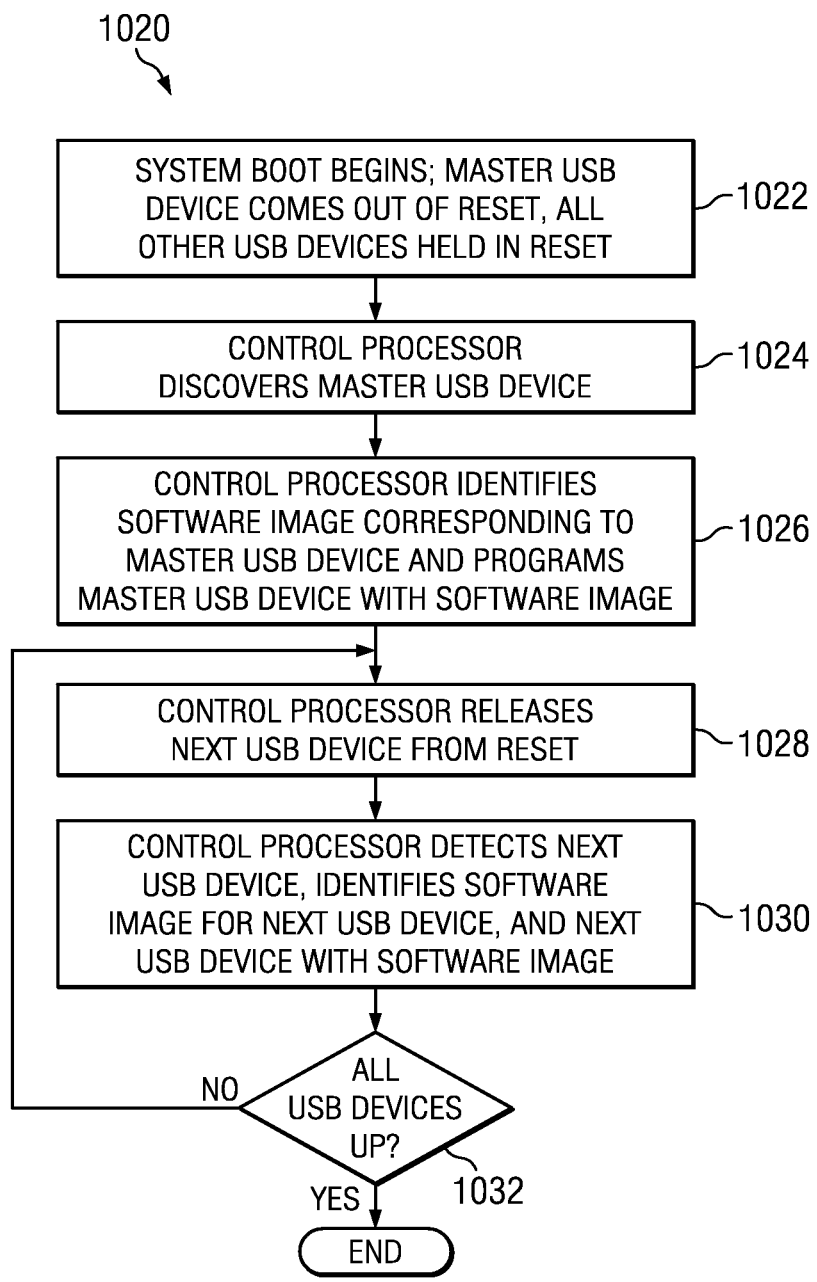
FIG. 50 illustrates an example method for managing the discovery and initiation of microcontrollers in the USB device initiation system of FIG. 49, according to an example embodiment.

In some embodiments, master programmable device 1002 has outputs connected to reset lines for each of the slave programmable devices 1002 as illustrated in FIG. 50. In other embodiments, master programmable device 1002 has fewer outputs connected to a MUX to allow control of more slave devices with fewer output pins. In certain embodiments, master programmable device 1002 has one output controlling the reset line of a single other programmable device 1002. That next programmable device also has an output connected to the reset line of a third programmable device 1002. Additional programmable devices may be chained together in this fashion where each programmable device may be programmed and then used as a master to bring the next device out of reset for programming.

FIG. 50 illustrates an example method 1020 for managing the discovery and initiation of microcontrollers 1002 using the programmable device initiation system 1000 of FIG. 49, according to an example embodiment. One of the programmable devices, in this example Microcontroller 1, is pre-selected as the master programmable device prior to system boot up, e.g., during manufacturing. At step 1022, system 16 begins to boot up. The pre-selected master programmable device, Microcontroller 1, comes out of reset as the system powers up (and before control processor 106 completes its boot process). Due to the operation of the pull-down circuits on the other programmable devices (indicated in FIG. 49 by pull-down resistors $R_{PD}$), Microcontrollers 2-n are held in reset at least until Microcontroller 1 has been programmed. At step 1024, control processor 106 (e.g., and Intel x86 processor running an operating system loaded from drive 109) boots up and performs a USB discovery process on the USB bus, and sees only Microcontroller 1. In response, at step 1026, control processor 106, having knowledge that Microcontroller 1 is the master USB device (as defined in logic 1006), determines from logic 1006 that Image 1 corresponds with Microcontroller 1, and thus programs Microcontroller 1 with Image 1 from drive 109. Once Microcontroller 1 is programmed, control processor 106 can access it via the USB connection and control the resets to the other USB devices. Thus, control processor 106 can then cycle through the USB devices one at a time, releasing them from reset, detecting them on the USB bus, and then programming the correct image on each device, as follows.

At step 1028, control processor 106 releases the next programmable device from reset using reset signaling shown in FIG. 49-1 by driving the output high that is connected to the reset pin on the next programmable device to be programmed, e.g., Microcontroller 2. At step 1030, control processor 106 detects this next device on the USB bus as ready to be programmed, determines using logic 1006 the image 1004 on drive 109 corresponding to that programmable device, and programs that image 1004 onto the programmable device. Using this method control processor 106 can cycle through the programmable devices (Microcontrollers 2-n) one by one, in the order specified in logic 1006, to ensure that each device is enumerated and programmed for correct system operation. Once control processor 106 determines that all programmable devices have come up, the method may end, as indicated at step 1032.

CLD Programming Via USB Interface and JTAG Bus

Programming via USB Interface

Past designs have used different methods to program CLDs and have caused design and update issues:

Programming from local flash/EEPROM: This method programs the CLDs immediately on boot so the parts are ready very quickly, however it also requires individual flash/EEPROM parts at each CLD. Also, CLD design files have become quite large (e.g., greater than 16 MB), and that file size is increasing software update time by requiring as much as five minutes per CLD to overwrite each flash/EEPROM memory.

Programming via software through CPLDs: This is another standard method to use the Fast Parallel programming method for the CLDs. In this approach, software installed on a CPLD from internal flash memory initiates the programming during each boot process. Connectivity to the CPLD from the control processor can be an issue with limited options available. To use a PCI connection between control processor 106 and a CLD to be programmed, the CPLD must implement PCI cores, which consumes valuable logic blocks and requires a licensing fee. Other communication options require the use of specialized integrated circuits. Moreover, this approach requires complex parallel bus routing to connect the CPLD to each CLD to be programmed. Long multi-drop parallel busses need to be correctly routed with minimal stubs and the lengths need to be controlled to maintain signal integrity on the bus. Some embodiments have 5 FPGA's placed across an 11"×18" printed computer board (PCB) resulting in long traces.

To enable fast, flexible programming of CLDs, an arrangement of components is utilized to provide software-based programming of CLDs controlled by control processor 106. In certain embodiments, one or more microcontrollers are provided to interface with the programming lines of CLDs (e.g., the Fast Parallel Programming bus on an FPGA). Those one or more microcontrollers are also connected to control processor 106 via a high speed serial bus (e.g., USB, IEEE 1394, THUNDERBOLT). The small size of the microcontroller combined with the simplified trace routing enabled by the serial bus allowed direct, high speed programming access without the need for long parallel bus lines. Furthermore, adding one or more additional microcontrollers could be accomplished with minimal negative impact to the board layout (due to minimal part size and wiring requirements) while allowing for further simplification of parallel bus routing.

Figure 51:
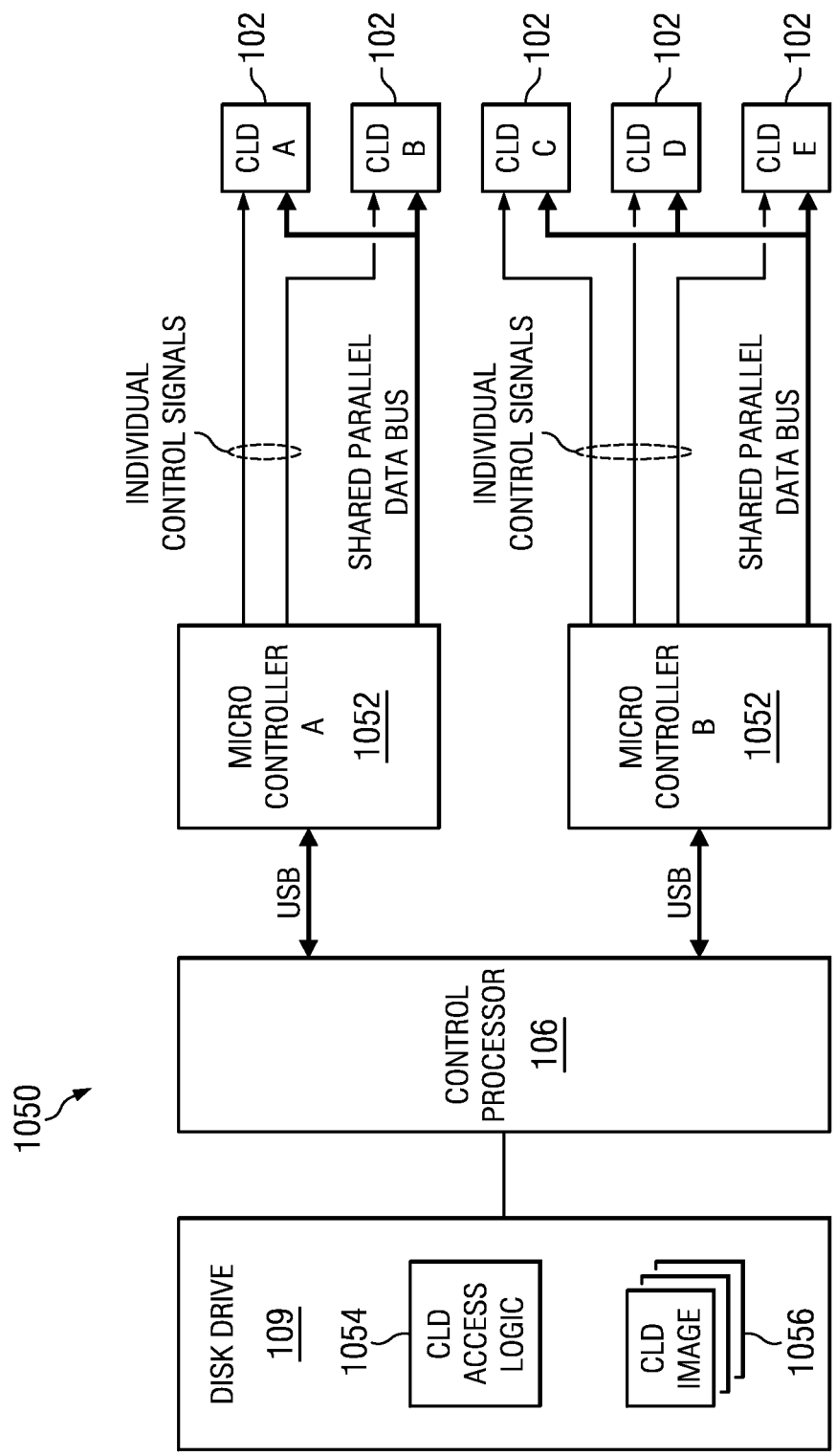
FIG. 51 illustrates an example serial bus based CLD programming system in a network testing system, according to an example embodiment.

FIG. 51 illustrates the serial bus based CLD programming system 1050 according to certain embodiments of the present disclosure. System 1050 includes control processor 106 coupled to drive 109, and microcontrollers 1052, and CLDs 102. Drive 109 includes CLD access logic 1054 (i.e., software to be executed on microcontrollers 1052) and CLD programming images 1056. Control processor 106 is coupled to microcontrollers 1052 via a high-speed serial bus (e.g., USB, IEEE 1394, THUNDERBOLT). Microcontrollers 1052 are coupled to CLDs 102 via individual control signals and a shared parallel data bus.

In certain embodiments, two microcontrollers (e.g., Cypress FX2 USB Microcontrollers) are provided. One is positioned near two CLDs 102 on one side of the board, and the other is positioned on the opposite side of the board near the other three CLDs 102. This placement allows for short parallel bus connections to each CLD to help ensure signal integrity on those busses.

Figure 52:
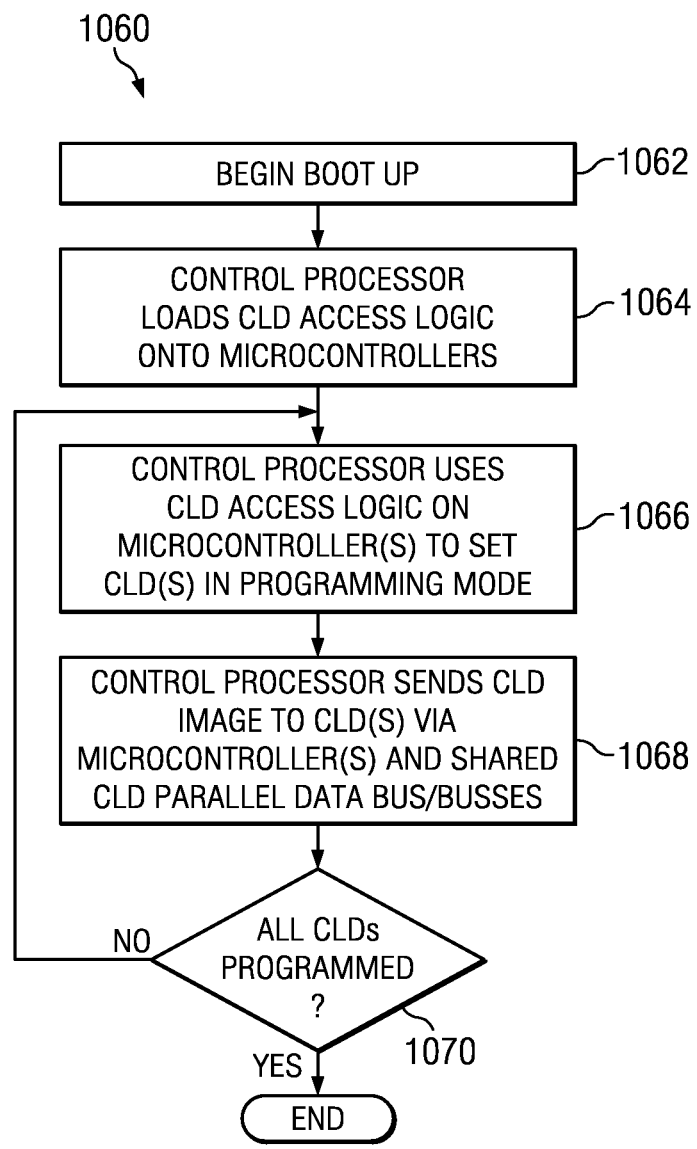
FIG. 52 illustrates an example programming process implemented by the serial bus based CLD programming system of FIG. 51, according to an example embodiment.

FIG. 52 illustrates an example programming process 1060 according to certain embodiments of the present disclosure. At step 1062, system 16 powers up and control processor 106 performs its boot process to load an operating system and relevant software modules. During this step, microcontrollers 1052 will power up and will signal availability for programming to control processor 106 via one or more serial connections (e.g., USB connections). At step 1064, control processor 106 locates each microcontroller 1052 and transfers CLD access logic images 1054 from disk 109 to each microcontroller. In some embodiments, an identical CLD access logic image 1054 is loaded on each microcontroller. In certain embodiments, each microcontroller 1052 has identifying information or is wired in a master/slave configuration (e.g., in a similar configuration as shown in FIG. 49) such that control processor 106 may load a specific CLD access logic image 1054 on each microcontroller 1052.

At step 1066, control processor 106 communicates with each microcontroller 1052 via CLD access logic to place the CLDs in programming mode. Microcontroller 1052 may perform this operation by driving one or more individual control signals to initiate a programming mode in one or more CLD 102. In some embodiments, microcontroller 1052 may program multiple CLD 102 simultaneously (e.g., with an identical image) by initiating a programming mode on each prior to transmitting a programming image. In some embodiments, microcontroller 1052 may program CLD 102 devices individually.

At step 1068, control processor 106 locates CLD image 1056 corresponding to the next CLD to program. Control processor 106 may locate the corresponding image file based on information hard-coded on one or more devices. In some embodiments, microcontrollers 1052 may have one or more pins hard-coded (e.g., tied high grounded by a pull-down resistor) to allow specific identification by control processor 106. In these embodiments, that identification information may be sufficient to allow control processor 106 to control a specific CLD 102 by driving a predetermined individual control signal line. In other embodiments, microcontrollers 1052 are programmed identically while CLDs 102 may have hard-coded pins to allow identification by the corresponding microcontroller 1052. In these embodiments, CLD access logic 1054 will include logic to control each CLD 102 individually in order to read the hard-coded pins and thereby identify that device by type (e.g., capture/offload CLD or L2/L3 CLD) or specifically (e.g., a specific CLD within system 16).

Once the corresponding CLD image has been identified, control processor 106 transfers the contents of that image (e.g., in appropriately sized sub-units) to microcontroller 1054 via the serial connection. Microcontroller 1054, via an individual control signal, initiates a programming mode on the CLD being programmed and loads image 1056 into the CLD via the shared parallel data bus.

At step 1070, control processor 106 determines whether another CLD 102 should be programmed and returns to step 1066 until all have been programmed.

The transfer speed of the serial bus (e.g., USB) is sufficiently fast to transfer even large (e.g., 16 MB) image files in a matter of seconds to each CLD. This programming arrangement also simplifies updates where replacing CLD image files 1056 on drive 109 will result in a CLD programming change after a restart. No complicated flashing (and verification) process is required.

Programming Via JTAG Bus

Any time flash memories or EEPROMs are updated through software there is a risk of corruption that may result in one or more non-functional devices. The present disclosure provides a reliable path to both program on-board devices such as CLD's as well as on-board memories (e.g., EEPROMs and flash memory). The present disclosure also provides a reliable path to recover from a corrupted image in most devices without rendering a board into a non-functional state (a.k.a., "bricking" a board). The present disclosure additionally provides a path for debugging individual devices.

In-system programming of all programmable devices on board is critical for field support and software upgrades. Past products did not have a good method for in system programming some devices and caused field returns when an update was needed or to recover from a corrupted device. The present disclosure provides a method to both update all chips as a part of the software upgrade process and to be able to recover from a corrupted image in an on-board memory device (e.g., EEPROM or flash).

In addition to image update and field support, the present disclosure also provides more convenient access to each CLD for in-system debug. Previous designs required boards be removed and cables attached to run the debug tools. The present disclosure provides in-place, in-system debug capability. This capability allows debugging of a condition that may be cleared by removing the board from the system.

Figure 53:
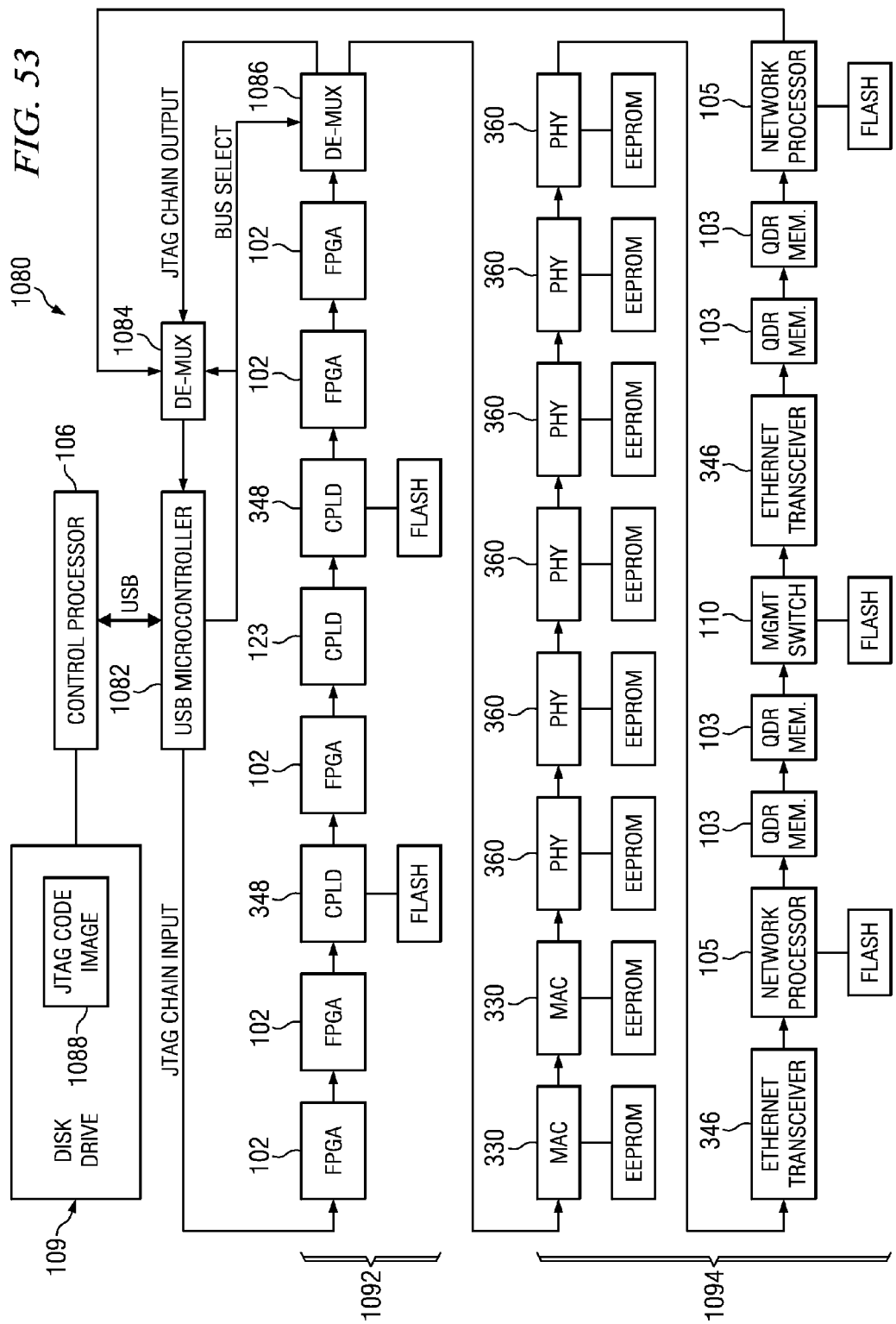
FIG. 53 illustrates an example JTAG-based debug system of a network testing system, according to an example embodiment.

FIG. 53 illustrates debug system 1080, according to certain embodiments of the present disclosure. Debug system 1080 includes JTAG code image 1088 (e.g. stored in drive 109), microcontroller 1082, control processor 106, JTAG chains 1092 and 1094, and demultiplexers 1084. Control processor 106 may load JTAG code image 1088 on microcontroller 1082 (e.g., over a USB connection) as part of the system boot sequence. In some embodiments, microcontroller 1082 is a CYPRESS microcontroller). JTAG code image 1088 provides software for implementing the JTAG bus protocol under interactive control by control processor 106. Demultiplexer 1084 enables segmentation of the JTAG bus into short segment 1092 and long segment including 1092 and 1094. In some embodiments, a multiplexer (controlled by the same bus select line) may be inserted between the JTAG chain input and both FPGA 102 and MAC 330 to create two independent JTAG busses. In these embodiments, demultiplexer 1086 is no longer necessary and the last FPGA 102 before that demultiplexer may be connected directly to demultiplexer 1084. In certain embodiments, JTAG chain input is a set of electrical connections including test mode select (TMS), test clock (TCK), and a directly connected test data in (TDI) connection. Each device in the chain has a direct connection between its test data out (TDO) pin and the next device's TDI pin, except where the final TDO connects to the demultiplexer.

To allow for both programming and CLD debug, the JTAG chain has been subdivided into two sections. The first section includes each CLD and the second section includes all other JTAG compatible devices in system 16. This division enables convenient access to and automatic recognition of ALTERA devices by certain ALTERA-supplied JTAG debug tools.

In certain embodiments, short chain 1092 provides JTAG access to the 5 FPGA's and 3 CPLD's on the board. This mode may be used to program the CPLD's on the board, to program the Flash devices attached to two CPLD's, and to run the ALTERA-supplied debug tools. The ALTERA tools are run through a software JTAG server interface. ALTERA tools running on a remote workstation may connect via a network connection to control processor 106 and access the JTAG controller. Control processor 106 may include a modified version of the standard LINUX URJTAG (Universal JTAG) program to enable CPLD and flash programming. Through that tool, control processor 106 may program the CPLD's, and through the programmed CPLD's, the tool can access each attached flash memory not directly connected to the JTAG bus. The flash memories may contain boot code for one or more network processors. Use of the JTAG bus to program these flash memories enables programming of the boot code without the processor running. Previous designs had to be pre-programmed and had the risk of "bricking" a system if a re-flash was interrupted. Recovery from such an interruption required a return of the entire board for lab repair. System 1080 allows the boot code to be programmed regardless of the state of the network processor allowing for in-field update and recovery.

When attached to the full chain (e.g., 1092 and 1094) the microcontroller has access to all the devices on the JTAG bus. The full chain may be used to program the Serial Flash containing the boot code for the networking switch 110 on the board. To program networking switch 110, the JTAG solhvare on control processor 106 may control the pins of networking switch 110 to write out a new flash image indirectly.

Branding Removable or Replaceable Components

As with many systems, drive 109 is a standard size and has a standard interface making it mechanically and electrically interchangeable with commodity hardware. However, not all drives have satisfactory performance and reliability characteristics. In particular, while a solid state device may provide sufficiently low access times and sufficiently high write throughput to maintain certain applications, a physically and electrically compatible 5,400 RPM magnetic drive might not. In some cases, high-volume purchasers of drives may purchase customized devices with manufacture supplied features for ensuring that only authorized drives are used within a system. To prevent users from operating system 16 with an unauthorized drive, control processor 106 may read certain information from drive 109 to verify that the drive is identified as an authorized drive.

Figure 69:
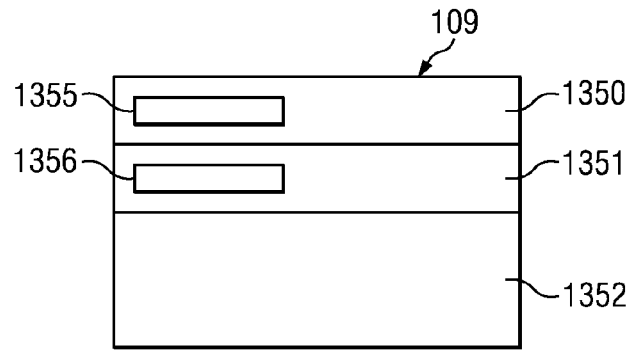
FIG. 69 illustrates a drive branding solution, according to certain embodiments of the present disclosure.

FIG. 69 illustrates a drive branding solution, according to certain embodiments of the present disclosure. In some embodiments, drive 109 is a persistent storage device such as a solid state drive (SSD) in communication with control processor 106 via a SATA interface. Drive 109 may include manufacture supplied read only memory 1350 including unique serial number 1355. Manufacturers provide unique serial numbers on storage devices to track manufacturing quality, product distribution, and purchase/warranty information. Read only memory 1350 may be permanently set in a write-once memory, e.g., in a controller circuit or read-only memory (ROM) device.

In some embodiments, drive 109 may be partitioned into two logical units, hidden partition 1351, including branding information 1356, and data partition 1352. In some embodiments, hidden partition 1350 may be a drive partition formatted, for example, in a non-standard format. In certain embodiments, hidden partition 1351 may be a standard drive partition formatted as a simple, standard file system (e.g., FAT). In some embodiments, branding information 1356 may be a raw data written to a specific block on hidden partition 1351. In some embodiments, branding information 1356 may data written to a file on hidden partition 1350.

Data partition 1352 may be a standard drive partition formatted as a standard file system (e.g., FAT, ext2, NTFS) and may contain operating system and application software, CLD images, packet capture data, and other instructions and data required by system 16.

Figure 70:
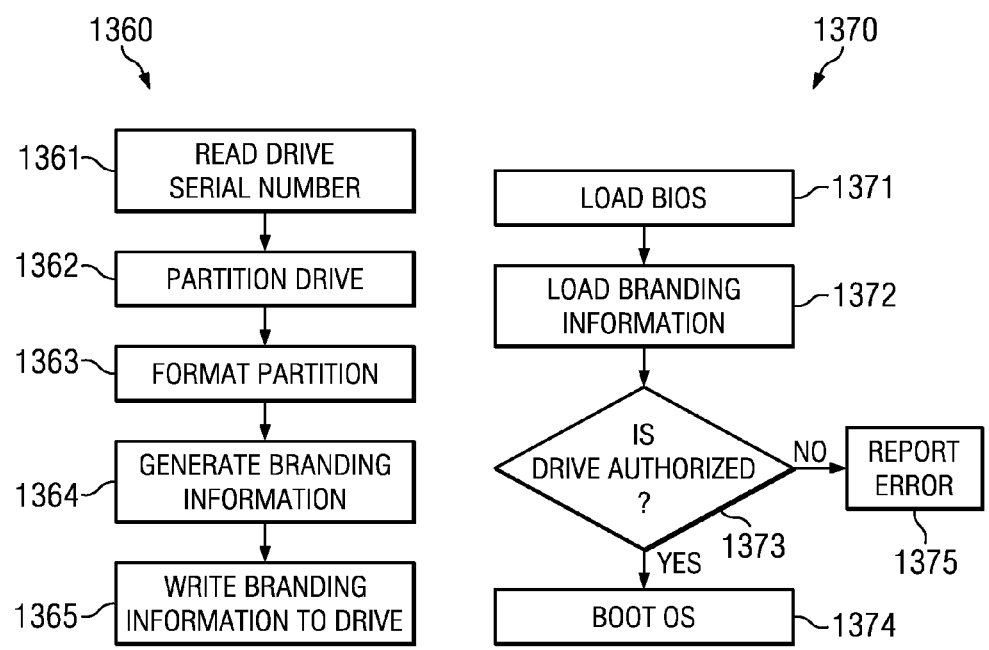
FIG. 70 illustrates branding and verification processes, according to certain embodiments of the present disclosure.

FIG. 70 illustrates branding and verification processes, according to certain embodiments of the present disclosure.

Branding process 1360 may include the following steps performed by a processor such as processor 106 on a second drive 109. At step 1361, software executing on processor 106 may read the drive serial number from read only memory 1350. At step 1362, that software may partition the drive into a hidden partition 1251 and a data partition 1352. At step 1363, the software may format hidden partition 1251. In some embodiments, step 1363 may be skipped if formatting is not required (e.g., where branding information 1356 is written as raw data to a specific block of partition 1351). At step 1364, the drive serial number is combined with secret information using a one-way function such as the jhash function or a cryptographic hash to obtain branding information 1356. At step 1365, branding information 1356 is written to hidden partition 1351. At this point, the drive will be recognized as authorized by system 16 and data partition 1352 may be formatted and loaded with an image of system 16.

Verification process 1370 may include the following steps performed by CPU 134. At step 1371, CPU 134 powers up and loads the basic input output system (BIOS) instructions stored in SPI EEPROM. At step 1372, CPU 134 accesses drive 109 and loads branding information 1356 and drive serial number 1355. At step 1373, CPU 134 verifies branding information 1356. In some embodiments, CPU 134 may apply a public key (which pairs with the private key used in step 1364) to decrypt branding information 1356. If the decrypted value matches serial number 1355, the drive may be recognized as authorized. In other embodiments, CPU 134 may combine serial number 1355 with the same secret used in step 1364 and in the same manner. If the result is the same as branding information 1356, the drive may be recognized as authorized.

If the drive is authorized, CPU 134 may begin to boot the operating system from partition 1352 at step 1374. If the drive is not authorized, CPU 134 may report an error at step 1375 and terminate the boot process. The error report may be lighting a light emitting diode (LED) on the control panel of system 16.

In some embodiments, verification process 1370 may be performed by software executed by the operating system as part of the operating system initialization process.

Physical Design Aspects and Heat Dissipation

Figure 54:
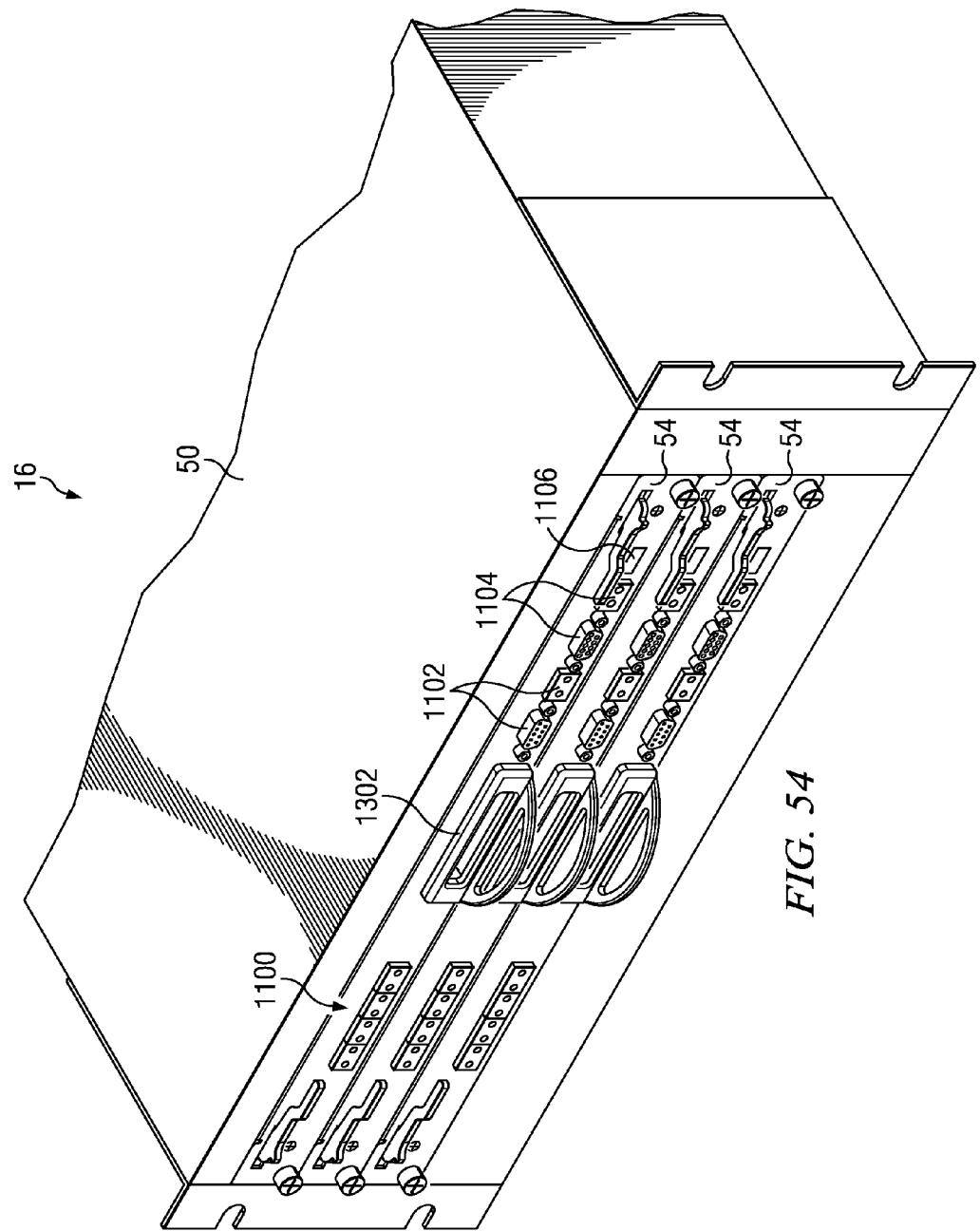
FIG. 54 illustrates a three-dimensional view of an example network testing system having three blades installed in a chassis, according to an example embodiment.

As discussed above, network testing system 16 may comprise one or more boards or cards 54 arranged in slots 52 defined by a chassis 50. FIG. 54 illustrates one example embodiment of network testing system 16 that includes a chassis 50 having three slots 52 configured to receive three cards 54. Each card 54 may have any number and types of external physical interfaces. In the illustrated example, each card 54 has a removable disk drive assembly 1300 that houses a disk drive 109; one or more ports 1102 for connection to a test system 18 for management of test system 18, one or more ports 1104 (e.g., including RS-232 port 996) for connection to controller 106 for managing aspects of card 54, a port 1106, e.g., a USB port for inserting a removable drive for performing software upgrades, software backup and restore, etc., for debugging card 54 (e.g., by connecting a keyboard and/or mouse to communicate with the card 54), or for any other purpose; and a number of ports 1100 corresponding to test interfaces 101. Each card 54 may also include a power button and any suitable handles, latches, locks, etc., for inserting, removing, and/or locking card 54 in chassis 50.

Heat dissipation presents significant challenges in some embodiments of system 16. For example, CLDs 102, processors 105 and 106, and management switch 110 may generate significant amounts of heat that need to be transferred away from system 16, e.g., out through openings in chassis 50. In some embodiments, limited free space and/or limited airflow within chassis 50 present a particular challenge. Further, in some embodiments of a multi-slot chassis 50, different slots 52 receive different amounts of air flow from one or more fans, and/or the physical dimensions of individual slots (e.g., the amount of free space above the card 54 in each respective slot 52) may differ from each other, the amount of volume and speed of air flow. Further, in some embodiments, the fan or fans within the chassis 50 tend to move air diagonally across the cards 54 rather than directly from side-to-side or front-to-back. Further, heat-generated by one or more components on a card 54 may transfer heat to other heat-generating components on the card 54 (e.g., by convection, or by conduction through the printed circuit board), thus further heating or resisting the cooling of such other heat-generating components on the card 54. Thus, each card 54 may include a heat dissipation system 1150 that incorporates a number of heat transfer solutions, including one or more fans, heat sinks, baffles or other air flow guide structures, and/or other heat transfer systems or structures.

Figure 55A:
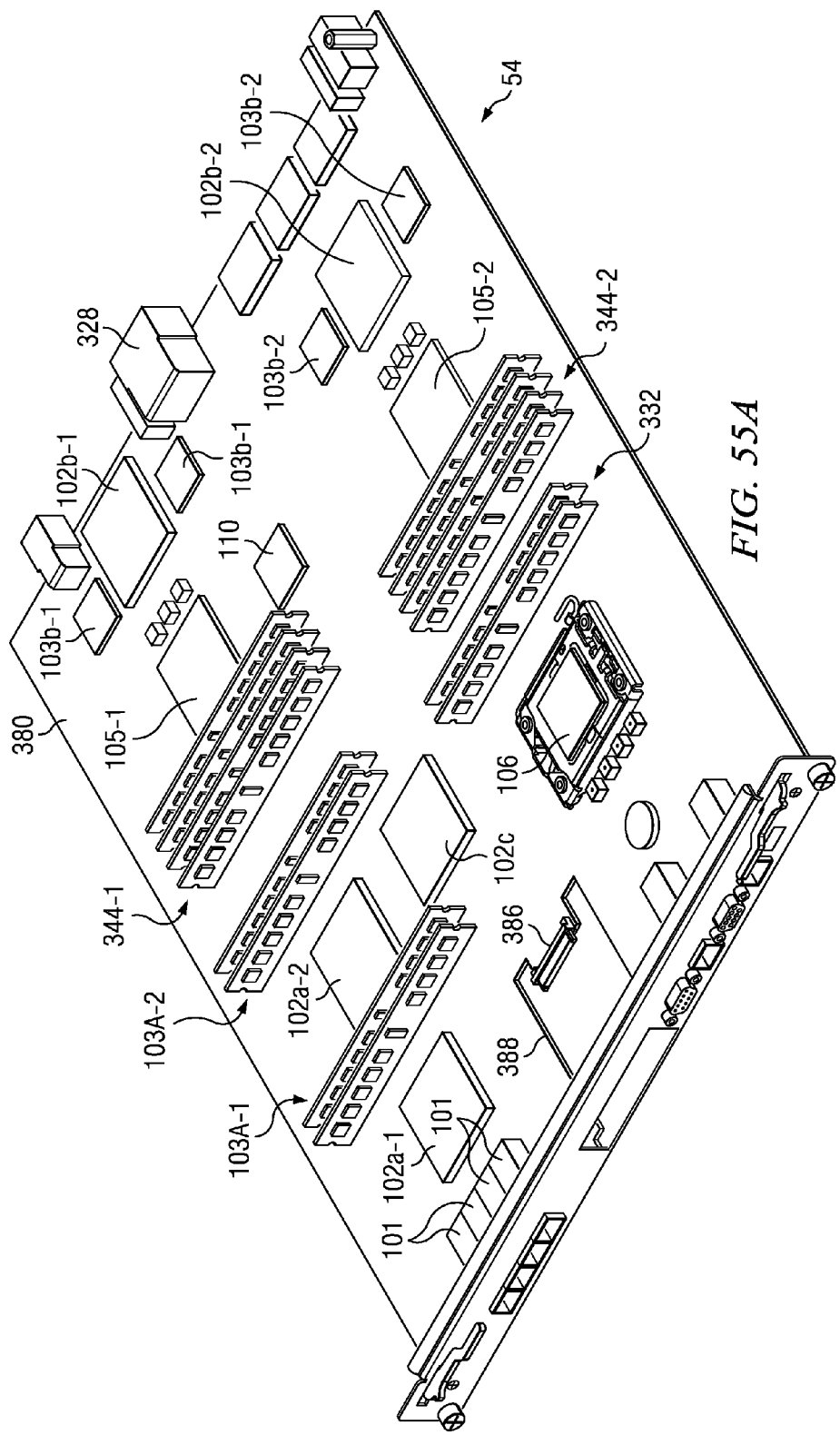
FIGS. 55A-59B illustrate various views of an example arrangement of devices on a card of a network testing system, at various stages of assembly, according to an example embodiment.
Figure 59A:
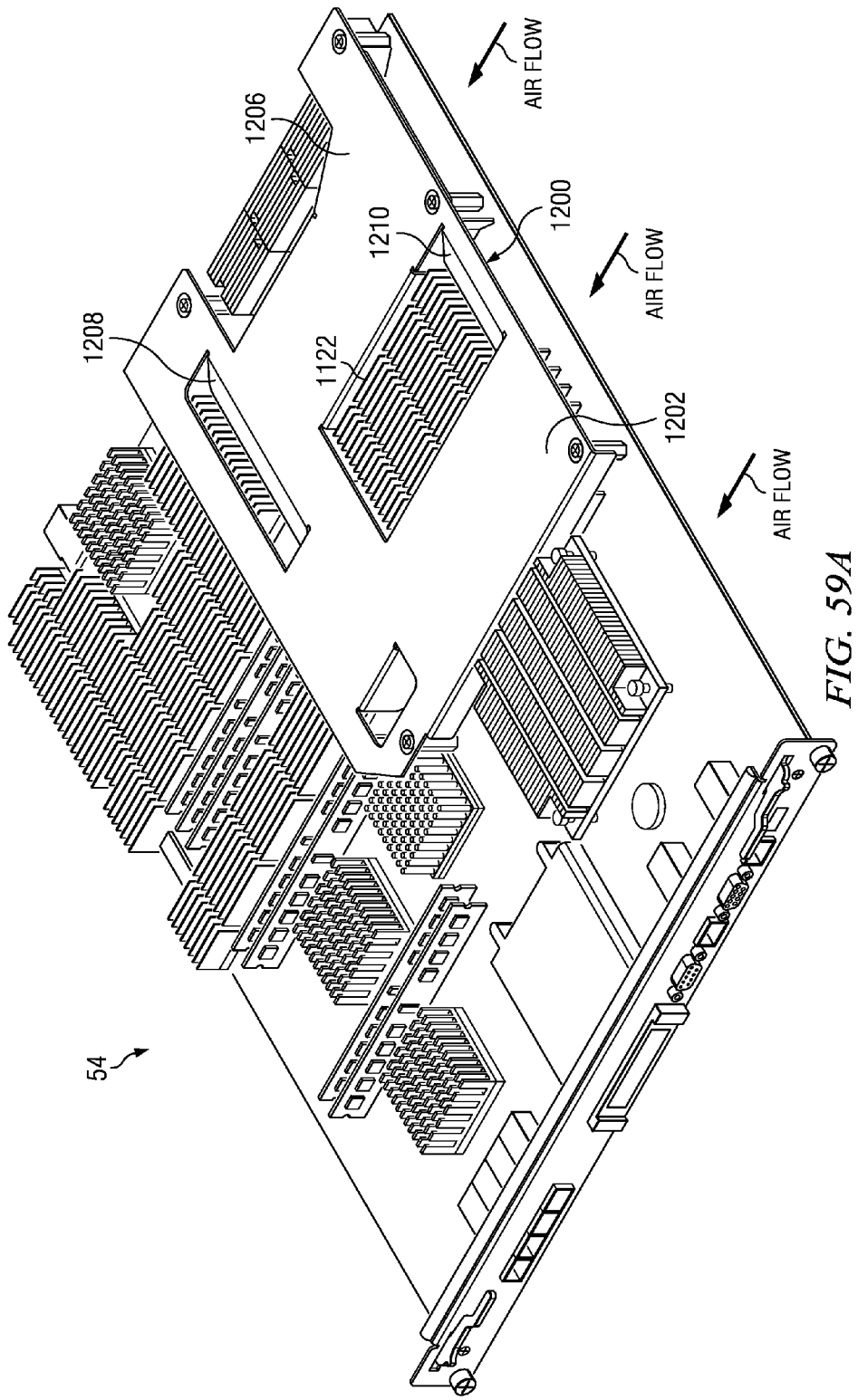
Figure 59B:
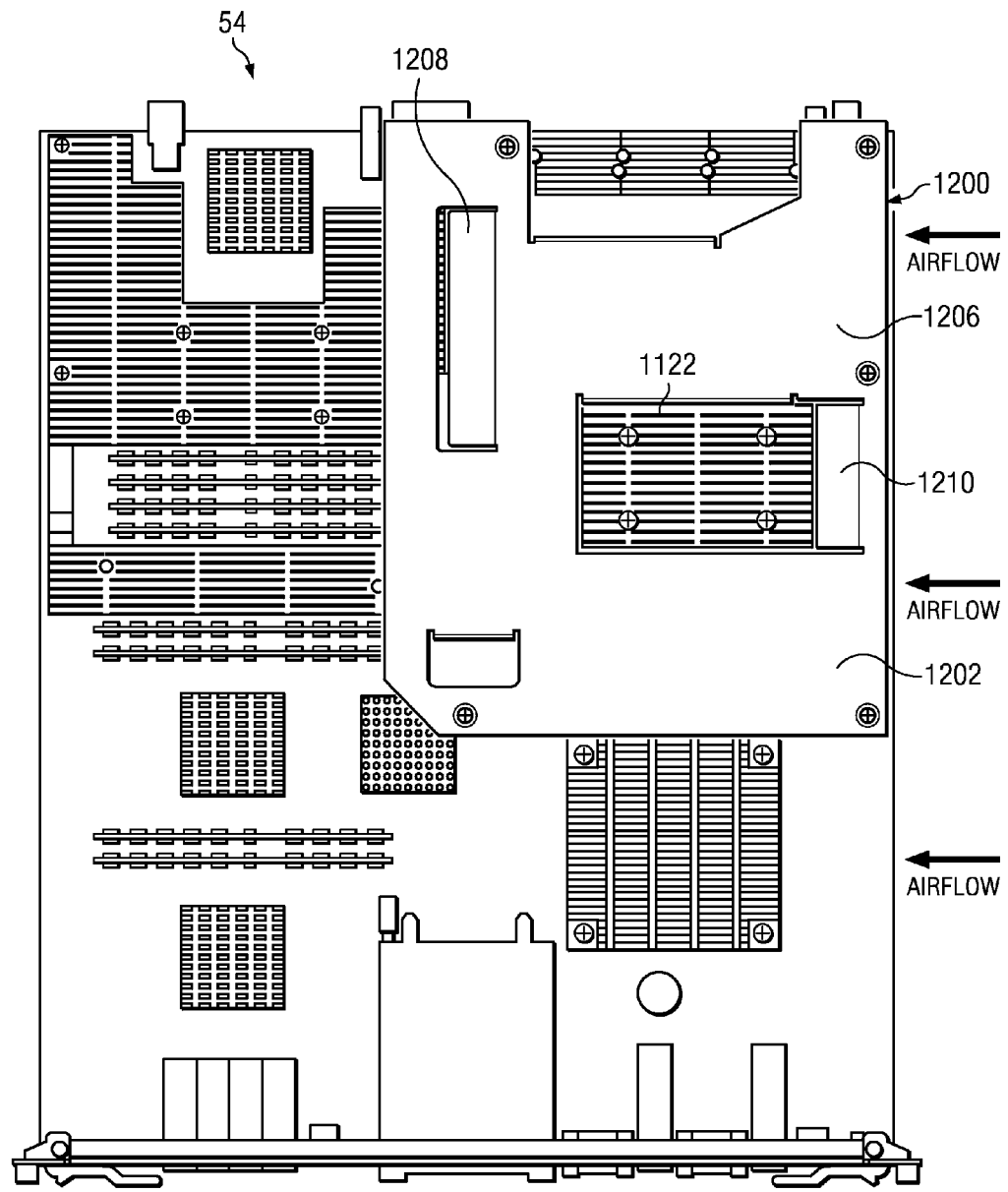

FIGS. 55A-59B illustrate various views of an example arrangement of devices on a card 54 including a heat dissipation system 1150, at various stages of assembly, according to an embodiment that corresponds with the embodiment shown in FIGS. 14A and 14B. In particular, FIGS. 55A and 55B show a three-dimensional view and a top view, respectively, of the example card 54 with heat-management components and removable disk drive assembly 1300 removed, in order to view the arrangement of various components of card 54. FIGS. 56A and 56B show a three-dimensional view and a top view, respectively, of card 54 with heat sinks and removable disk drive assembly 1300 installed. FIGS. 57A and 57B show a three-dimensional view and a top view, respectively, of card 54 with a two-part air baffle 1200 installed, in which a first part 1202 of the air baffle 1200 is shown as a transparent member in order to view an underlying second part 1204 of air baffle 1200. FIGS. 58A and 58B show a three-dimensional view and a top view, respectively, of card 54 with the first part 1202 of the air baffle 1200 removed in view the underlying second part 1204 of air baffle 1200. Finally, FIGS. 59A and 59B show a three-dimensional view and a top view, respectively, of card 54 with the first part 1202 of the air baffle 1200 installed over the second part 1204 and shown as a solid member.

Figure 55B:
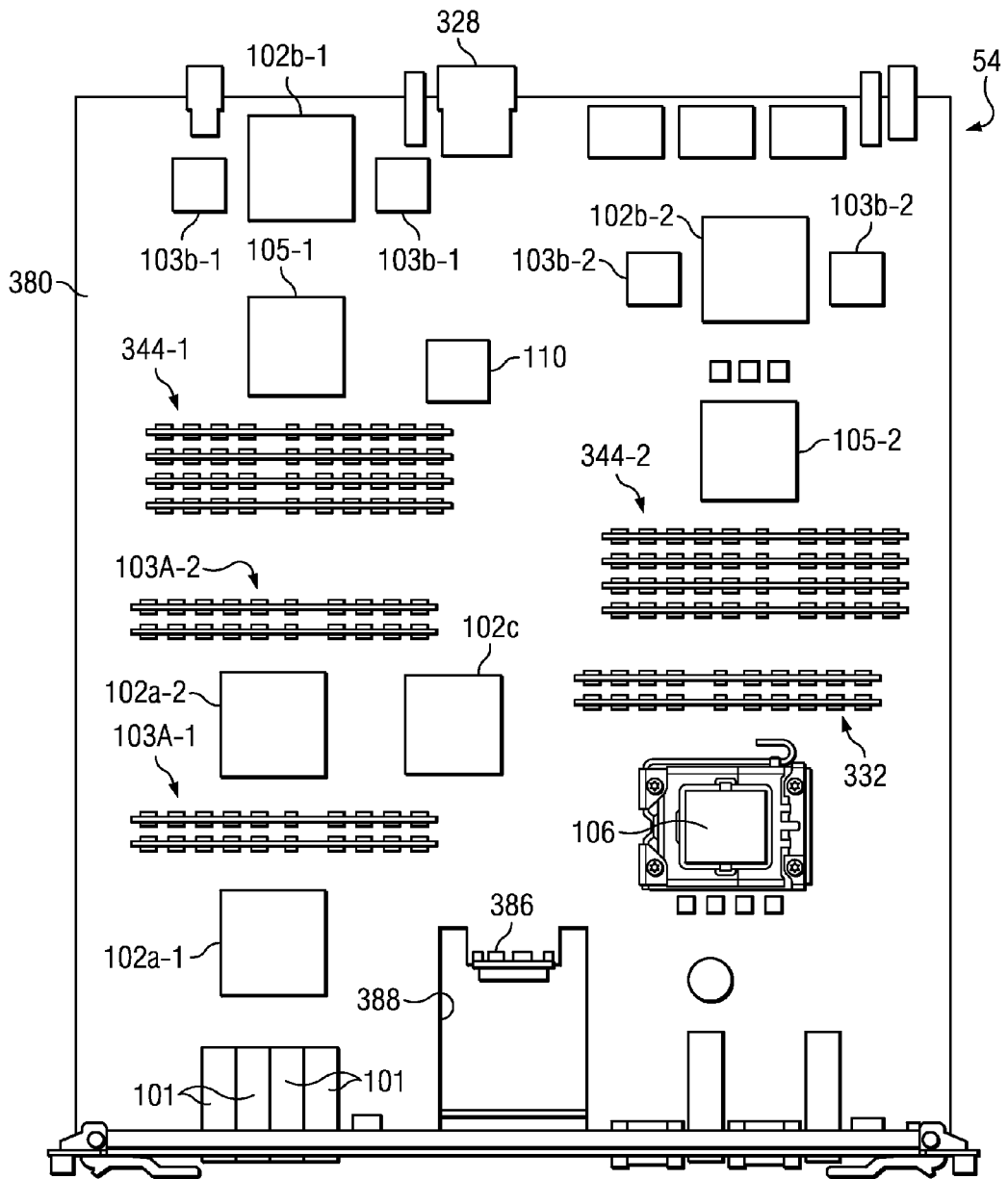

Turning first to FIGS. 55A and 55B, card 54 includes a printed circuit board 380 that houses a pair of capture and offload CLDs 102a-1 and 102a-2 and associated DDR3 SDRAM memory modules (DIMMs) 103A-1 and 103A-2, a pair of routing CLDs 102b-1 and 120b-2 and associated QDR SRAMs 103b-1 and 103b-2, a traffic generation CLD 102C, a pair of network processors 105-1 and 105-2 and associated DDR2 SDRAM DIMMs 344-1 and 344-2, a control processor 106 and associated DDR3 SDRAM DIMMs 332, a management switch 110, four test interfaces 101, a backplane connector 328, a notch or bay 388 that locates a drive connector 386 for receiving a disk drive assembly 1300 that houses a disk drive 109, and various other components (e.g., including components shown in FIGS. 14A and 14B). As shown, DIMMS 103A-1, 103A-2, 344-1, 344-2, and 332 may be aligned in the same direction, e.g., in order to facilitate air flow from one or more fans across card 54 in that direction, e.g., in a direction from side-to-side across card 54.

Figure 56A:
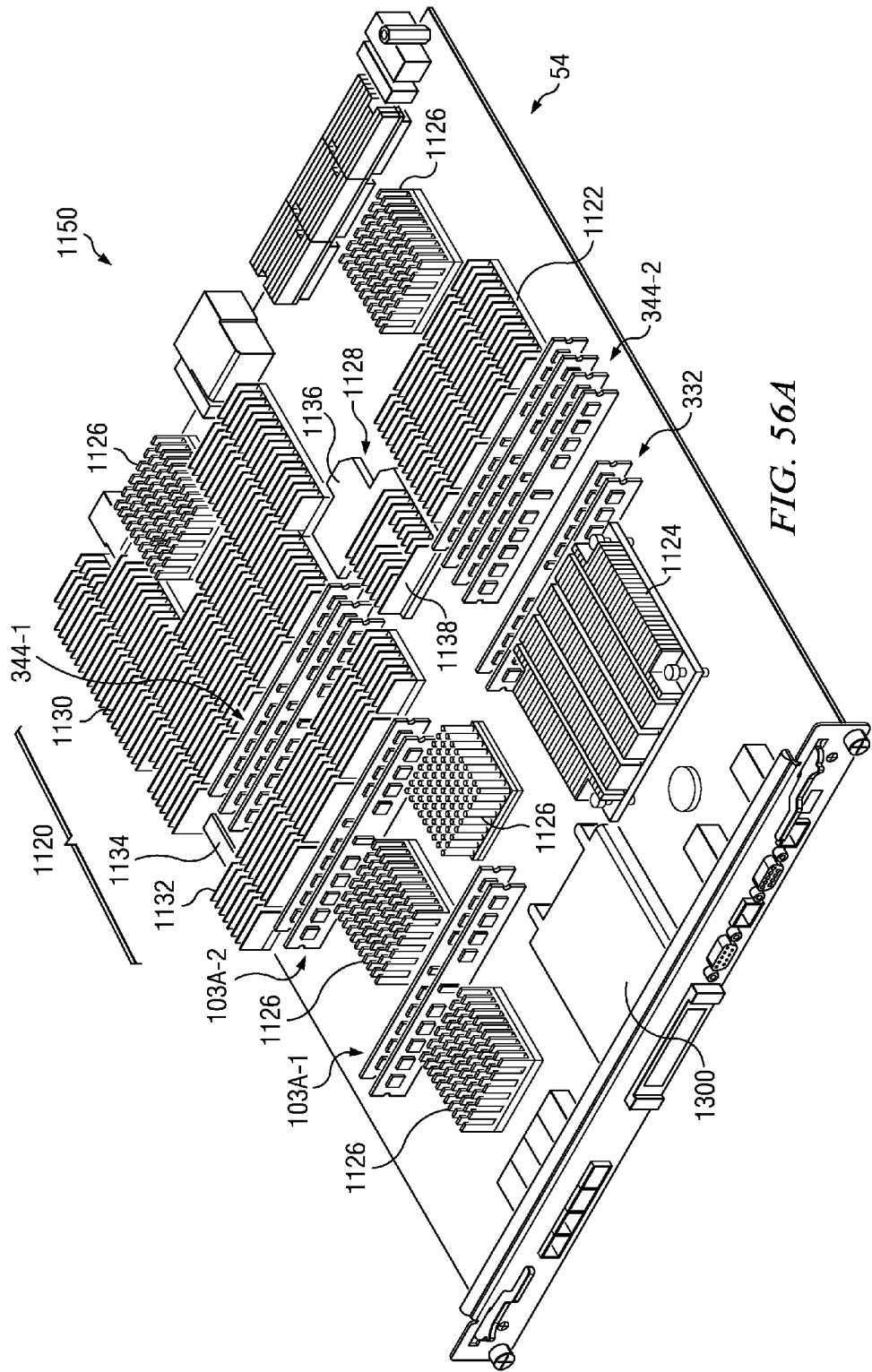
Figure 56B:
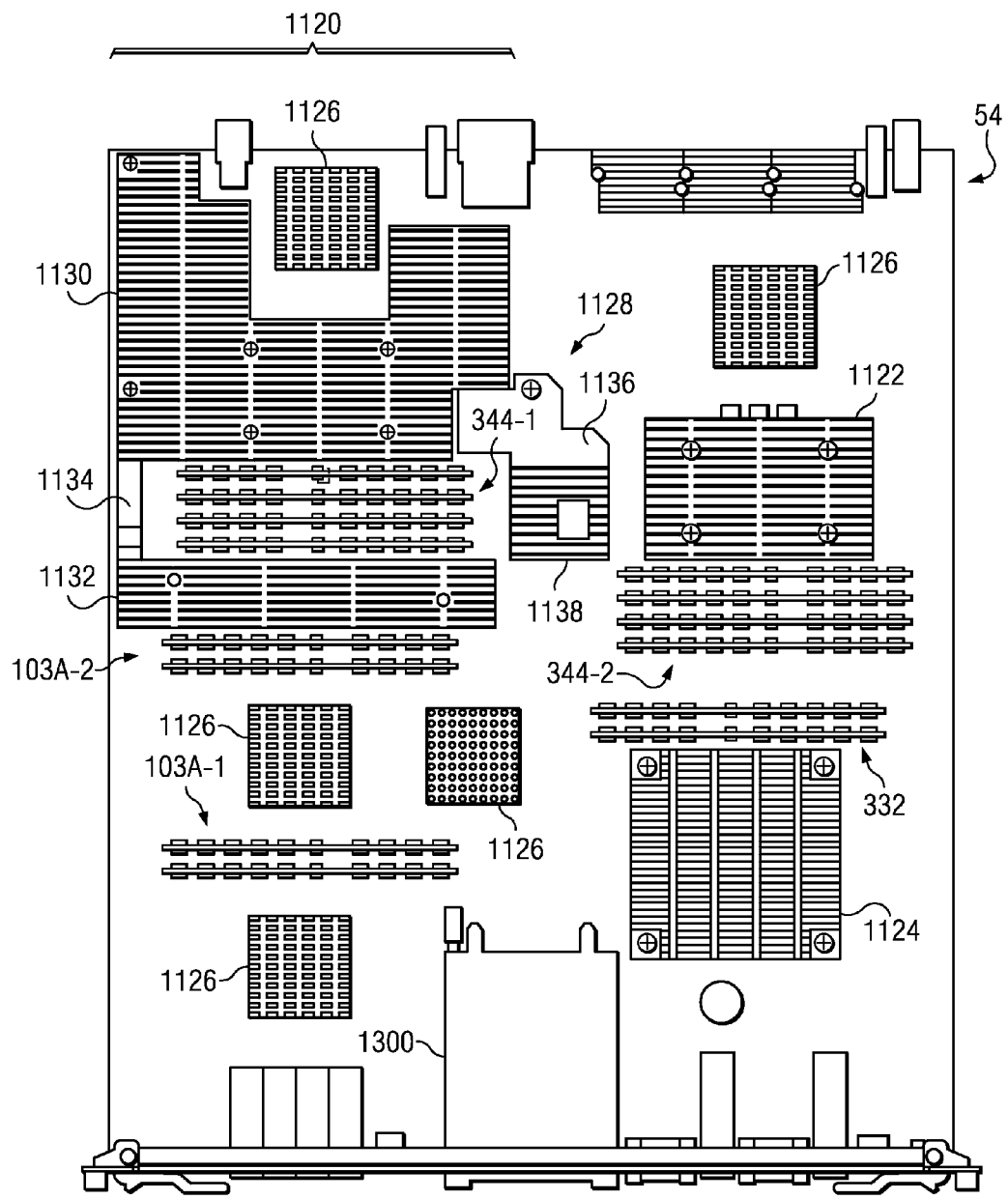

Turning next to FIGS. 56A and 56B, a number of heat sinks may be installed on or near significant heat-generating devices of card 54. As shown, card 54 includes a dual-body heat sink 1120 to remove heat from first network processor 105-1, a heat sink 1122 to remove heat from second network processor 105-2, a heat sink 1124 to remove heat from control processor 106, a number of heat sinks 1126 to remove heat from each CLD 102a-1, 102a-2, 102b-1, 102b-2, and 102c, and a heat sink 1128 to remove heat from management switch 110. Each heat sink may have any suitable shape and configuration suitable for removing heat from the corresponding heat-generating devices. As shown, each heat sink may include fins, pegs, or other members extending generally perpendicular to the plane of the card 54 for directing air flow from one or more fans across the card 54. Thus, the fins of the various heat sinks may be aligned in one general direction, the same alignment direction as DIMMS 103A-1, 103A-2, 344-1, 344-2, and 332, in order to facilitate air flow in a general direction across card 54 through the heat sinks and DIMMS. Some heat sinks may include an array of fins in which each individual fins extends in one direction (the direction of air flow), and with gaps between fins that run in a perpendicular direction, which gaps may create turbulence that increases convective heat transfer from the fins to the forced air flow.

As discussed below in greater detail, dual-body heat sink 1120 for removing heat from first network processor 105-1 includes a first heat sink portion 1130 arranged above the network processor 105 and a second heat sink portion 1132 physically removed from network processor 105 but connected to the first heat sink portion 1130 by a heat pipe 1134. Heat is transferred from the first heat sink portion 1130 to the second heat sink portion 1132 (i.e., away from network processor 105) via the heat pipe. As shown in FIGS. 56A and 56B, the second heat sink portion 1132 may be arranged laterally between two sets of DIMMs 103A-2 and 344-1, and longitudinally in line with another set of DIMMs 344-2 in the general direction of air flow. Details of dual-body heat sink 1120 are discussed in more detail below with reference to FIGS. 60-62.

Figure 57A:
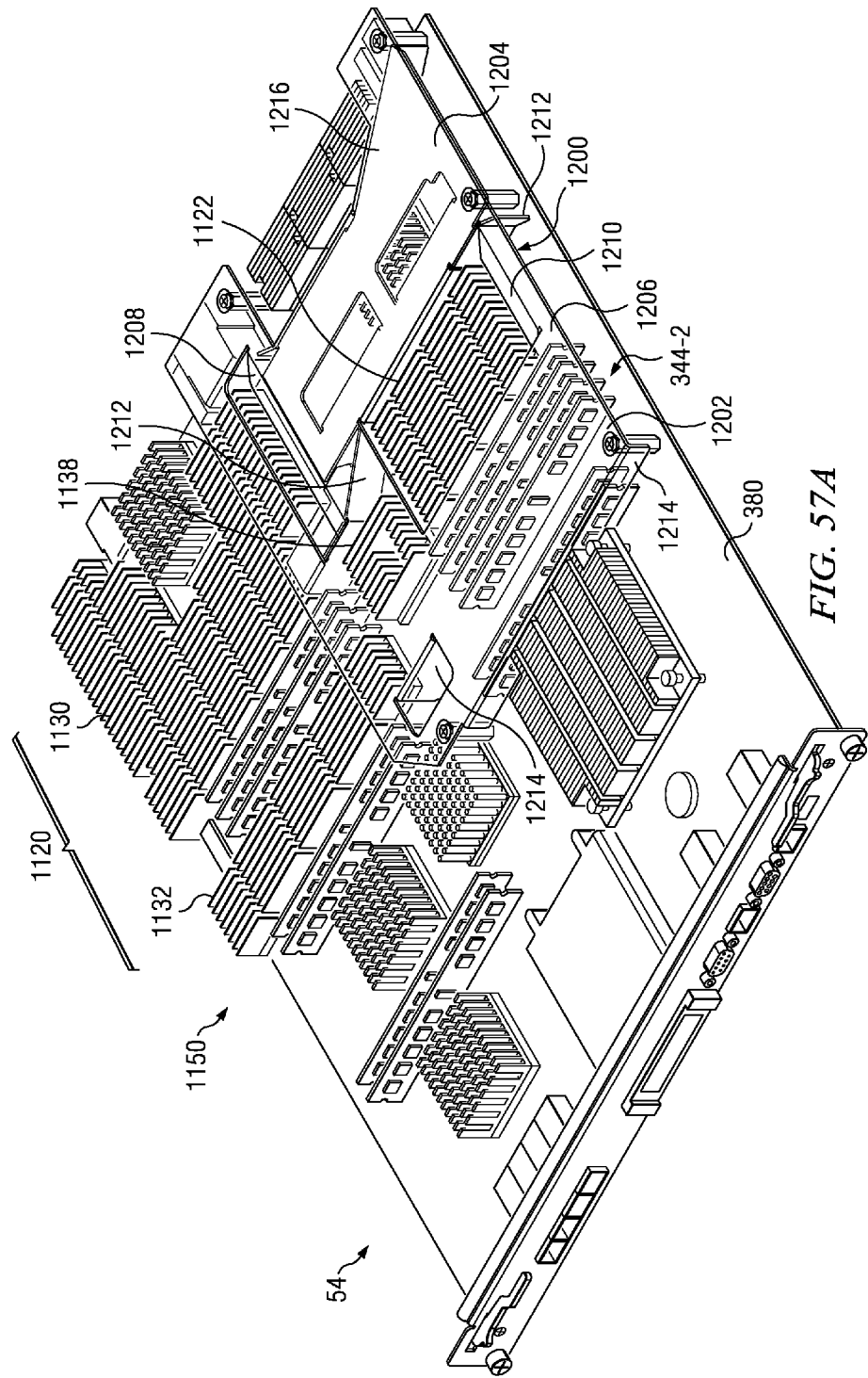
Figure 57B:
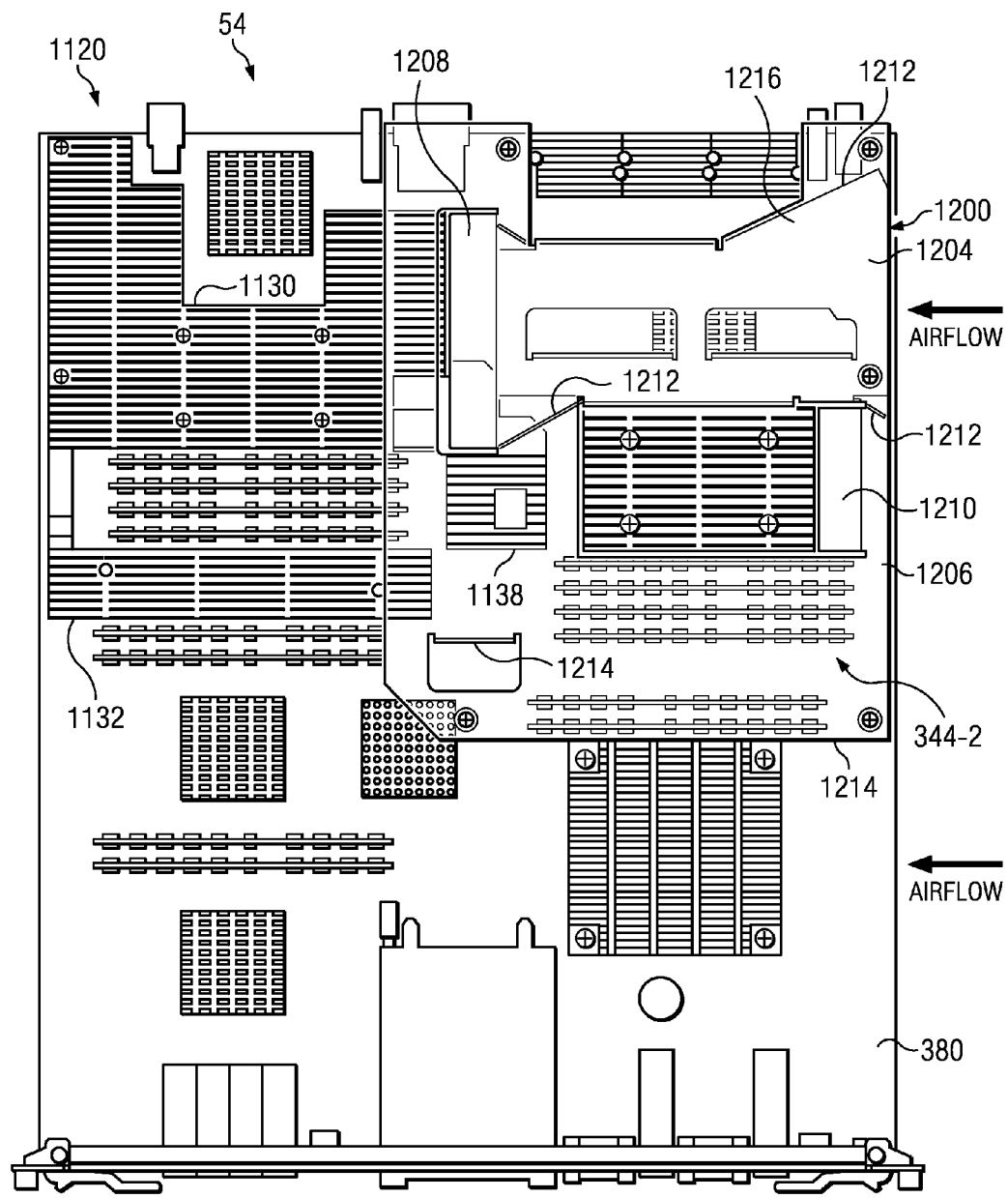
Figure 58A:
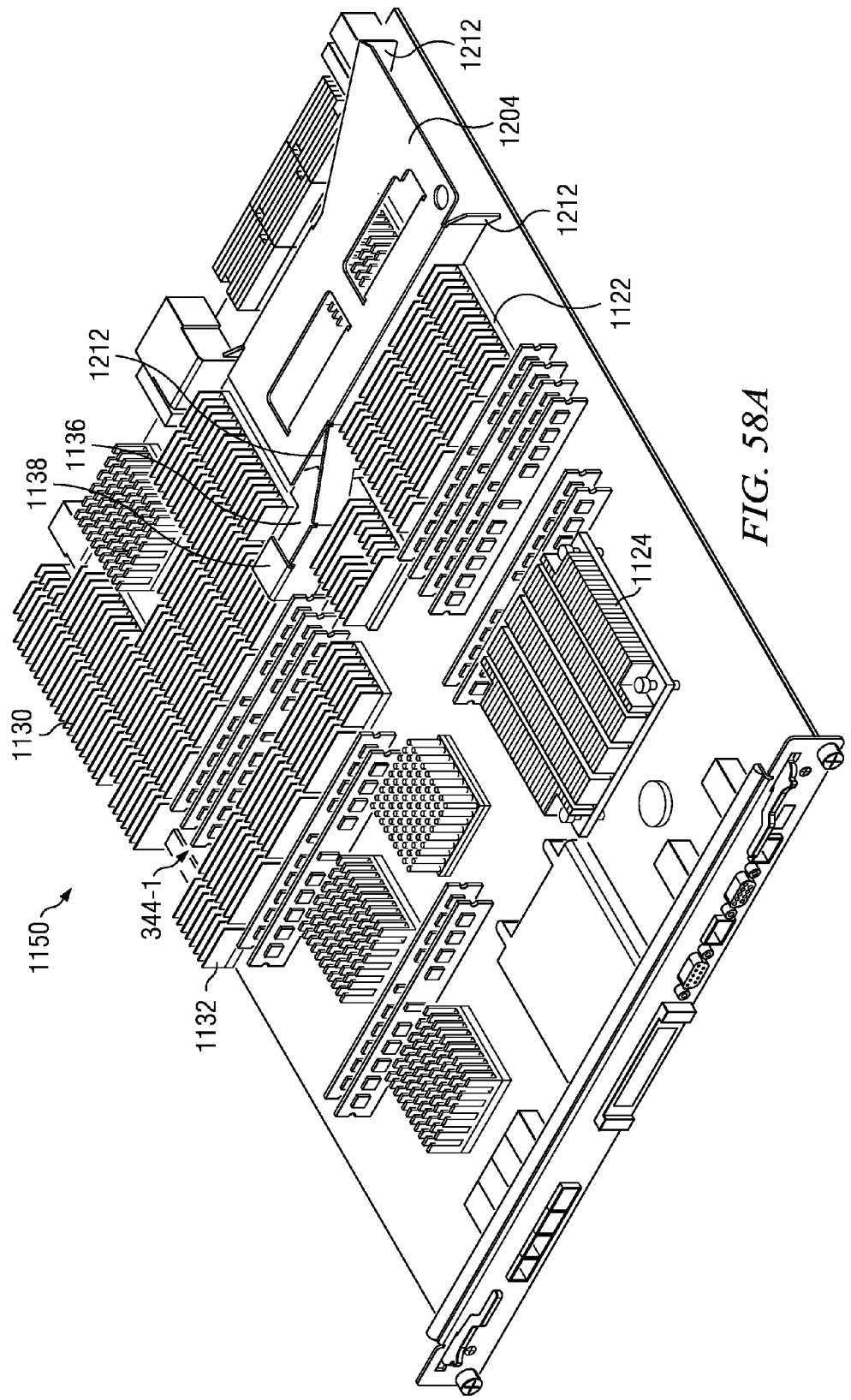
Figure 58B:
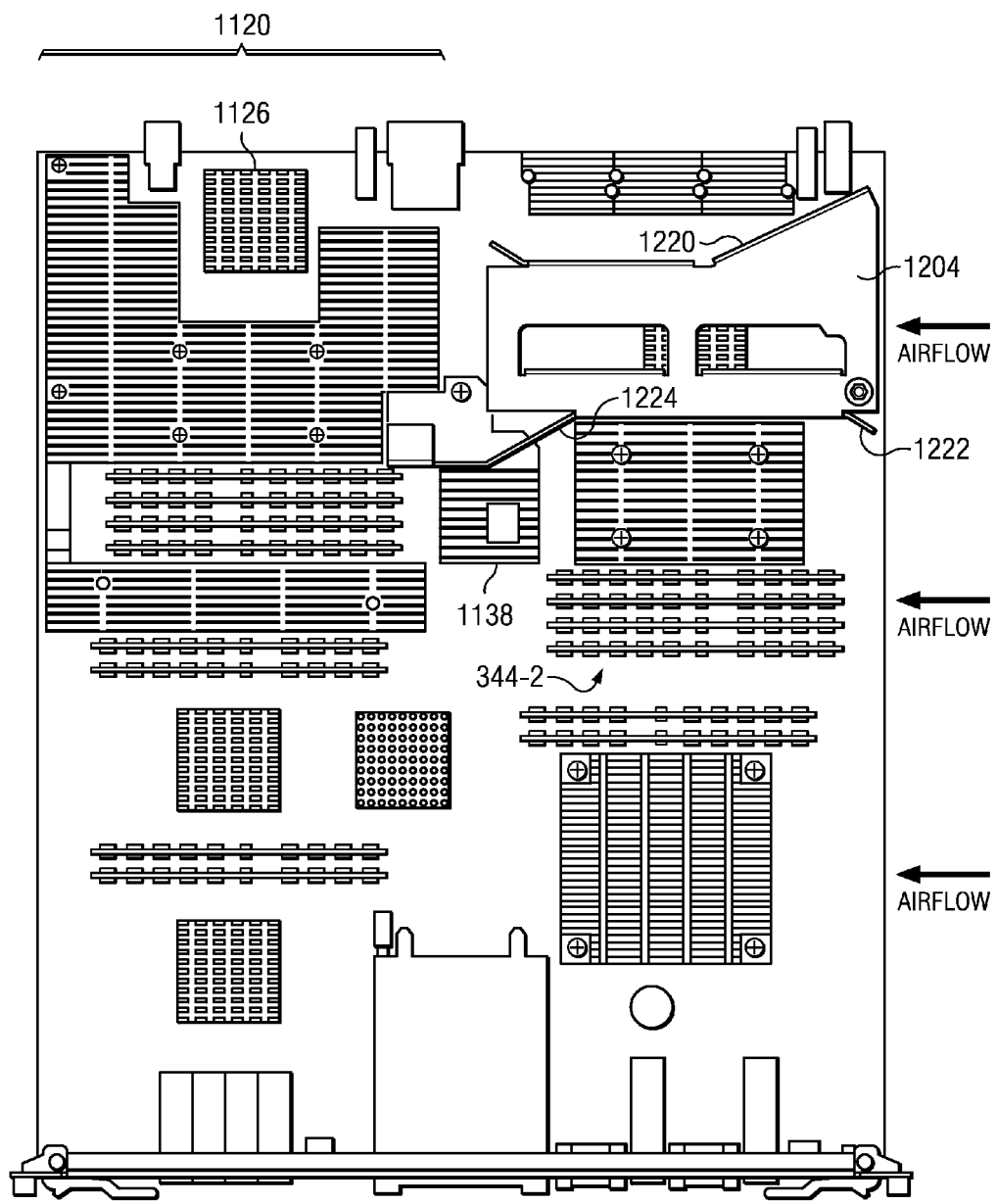

FIGS. 57A-59B show various views of a two-part air baffle 1200 installed over a portion of card 54 to manage air flow across card 54. Two-part air baffle 1200 includes a first part 1202 and an underlying second part 1204. In FIGS. 57A and 57B, first part 1202 of air baffle 1200 is shown as a transparent member in order to view the underlying second part 1204. In FIGS. 58A and 58B, first part 1202 of air baffle 1200 is removed for a better view of the underlying second part 1204. Finally, in FIGS. 59A and 59B, first part 1202 is shown as a solid member installed over the second part 1204.

As shown in FIGS. 57A-59B, air baffle 1200 may include various structures and surfaces for guiding or facilitating air flow across card 54 as desired. For example, first part 1202 of air baffle 1200 may include a thin, generally planar sheet portion 1206 arranged above components on card 54 and extending parallel to the plane of the printed circuit board, and a number of guide walls 1214 extending downwardly and perpendicular to the planar sheet portion 1206. Similarly, second part 1204 may include a thin, generally planar sheet portion 1216 arranged above components on card 54 and extending parallel to the plane of the printed circuit board, and a number of guide walls 1212 extending downwardly and perpendicular to the planar sheet portion 1206. Guide walls 1212 and 1214 are configured to influence the direction and volume of air flow across various areas and components of card 54, e.g., to promote and distribute air flow through the channels defined between heat sink fins and DIMMs on card 54.

In addition, first part 1202 of air baffle 1200 may include angled flaps or "wings" 1208 and 1210 configured to direct air flow above air baffle 1200 downwardly into and through the fins of heat sinks 1120 and 1122, respectively, to promote conductive heat transfer away from such heat sinks. As discussed below with reference to FIG. 65, wings 1208 and 1210 may create a low pressure area that influences air flow downwardly into the respective heat sinks.

Details of air baffle 1200 is discussed in more detail below with reference to FIGS. 63-65.

Dual-Body Heat Sink

As discussed above, heat dissipation system 1150 of card 54 may include a dual-body heat sink 1120 that functions in cooperation with air baffle 1200 to dissipate heat from a network processor 105 (e.g., a Netlogic XLR 732 1.4 GHz processor).

Figure 60:
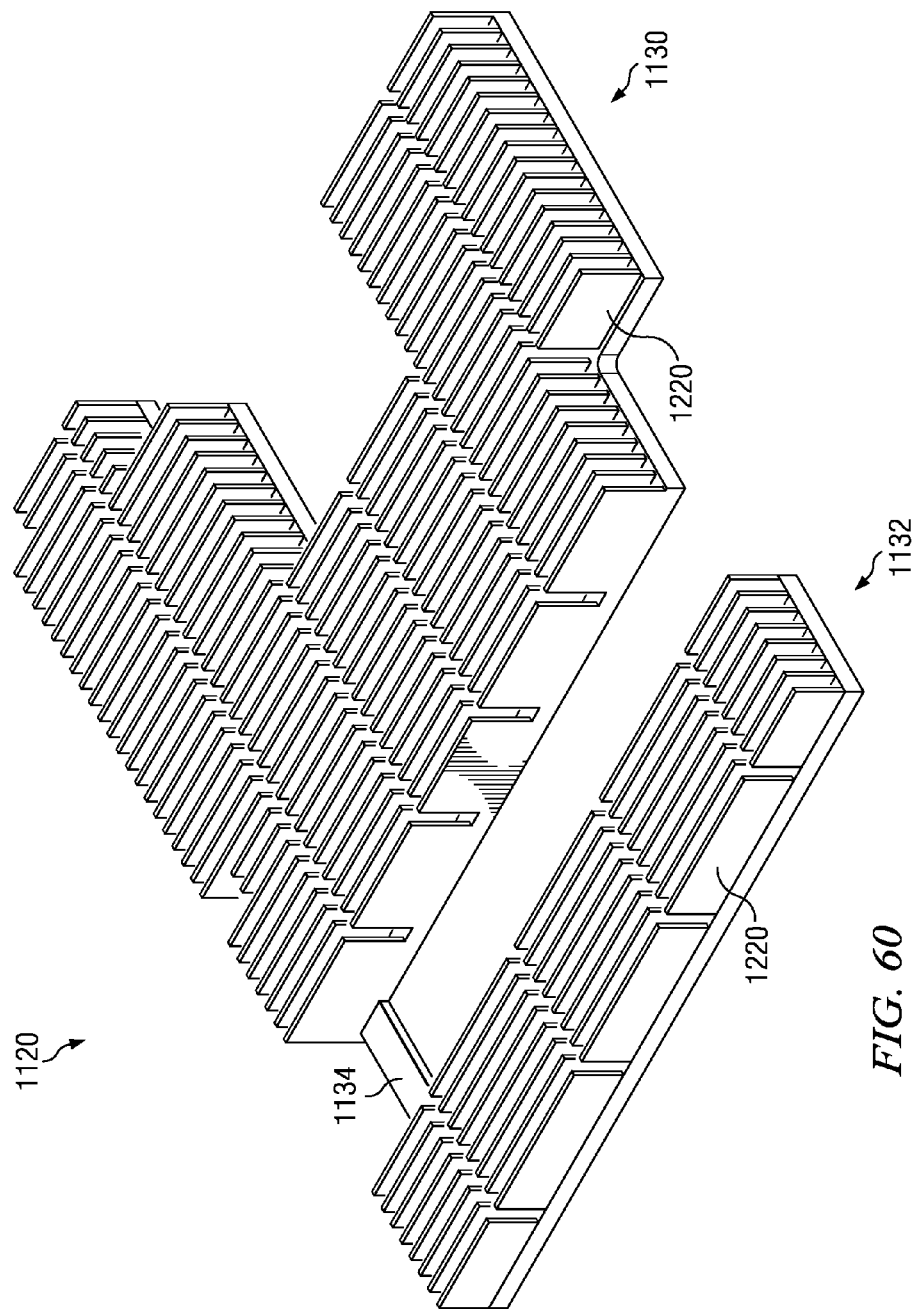
FIG. 60 shows a three-dimensional isometric view of an example dual-body heat sink for use in a network testing system, according to an example embodiment.
Figure 61:
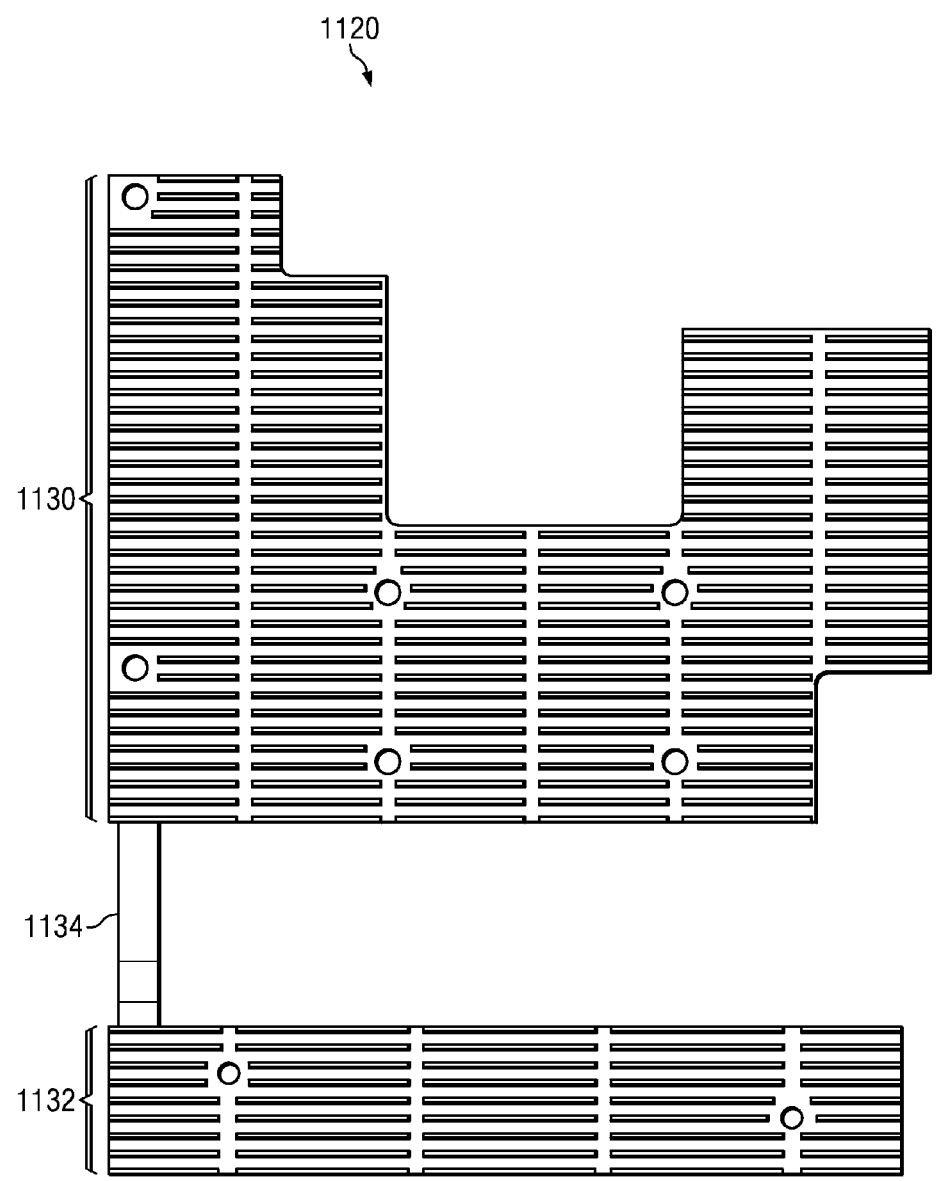
FIG. 61 shows a top view of the dual-body heat sink of FIG. 60, according to an example embodiment.
Figure 62:
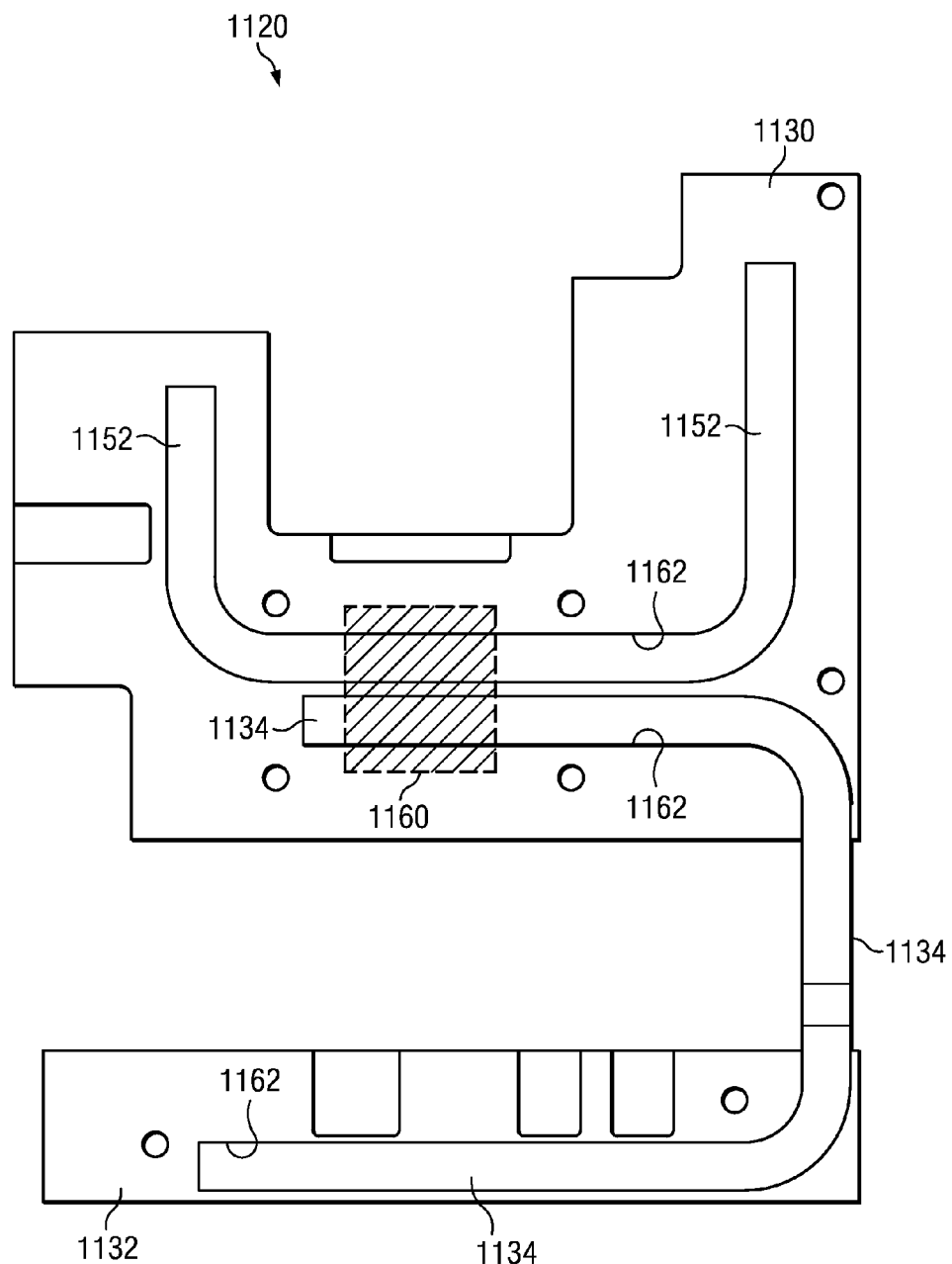
FIG. 62 shows a bottom view of the dual-body heat sink of FIG. 60, according to an example embodiment.

FIGS. 60-62 illustrate details of an example dual-body heat sink 1120, according to one embodiment. In particular, FIG. 60 shows a three-dimensional isometric view, FIG. 61 shows a top view, and FIG. 62 shows a bottom view of heat sink 1120. As shown, a first heat sink body 1130 and a second heat sink body 1132 may each include an array of fins 1220 or other members for encouraging convention from bodies 1130 and 1132 to an air flow.

First heat sink body 1130 is connected to the spaced-apart second heat sink body 1132 by a heat pipe 1134. As shown in FIG. 62, heat sink 1120 may include two heat pipes: a first heat pipe 1134 that connects first heat sink body 1130 with second heat sink body 1132, and a second heat pipe 1152 located within the perimeter of first heat sink body 1130. A thermal interface area 1160 in which network processor 105-1 physically interfaces with heat sink body 1130 is indicated in FIG. 62. Both heat pipes 1134 and 1152 extend through the thermal interface area 1160 to facilitate the movement of heat from processor 105-1 to heat sink bodies 1130 and 1132 via the thermal interface area 1160. Heat pipe 1134 moves heat to the remotely-located heat sink body 1132, which is cooled by an air flow across heat sink body 1132, which causing further heat flow from heat sink body 1130 to heat sink body 1132. Two heat sink bodies are used so that memory (DIMMs 344-1) for processor 105-1 can be placed close to processor 105-1. The cooling provided by the dual-body design may provide increased or maximized processing performance of processor 105-1, as compared with certain single-body heat sink designs.

As shown, both heat pipes 1134 and 1152 interface with processor 105-1 via thermal interface area 1160. The co-planarity of this interface may be critical to adequate contact. Thus, the interface may be milled to a very tight tolerance. Further, in some embodiments, a phase change thermal material or other thermally-conductive material may be provided at the interface to ensure that heat sink body 1130 is bonded at the molecular level with processor 105-1. This material may ensures extremely high thermal connectivity between processor 105-1 and heat sink body 1130.

In this embodiment, each heat pipe is generally U-shaped, and is received in rectangular cross-section channels 1162 milled in heat sink bodies 1130 and 1132, except for the portion of pipe 1134 extending between first and second heat sink bodies 1130 and 1132. Each channel 1162 may be sized such that a bottom surface of each heat pipe 1134 and 1152 is substantially flush with bottom surfaces of heat sink bodies 1130 and 1132. Thus, heat pipes 1134 and 1152 are essentially embedded in heat sink bodies 1130 and 1132. Heat pipes 1134 and 1152 may have rounded edges. Thus, when heat pipes 1134 and 1152 are installed in channels 1162, gaps are formed between the walls of channels 1162 and the outer surfaces of heat pipes 1134 and 1152. Left empty, such gaps would reduce the surface area contact between the heat pipes and the heat sink bodies, as well as the contact between the heat pipes/heat sink and processor 105-1 at thermal interface area 1160, which may reduce the performance of processor 105-1. Thus, such gaps between the walls of channels 1162 and the outer surfaces of heat pipes 1134 and 1152 may be filled with a thermally conductive solder or other thermally conductive material to promote heat transfer between heat pipes 1134 and 1152 and heat sink bodies 1130 and 1132, and all bottom surfaces may then be machined flat, to provide a planar surface with a tight tolerance.

Heat sink bodies 1130 and 1132 and heat pipes 1134 and 1152 may be formed from any suitable thermally-conductive materials. For example, heat sink bodies 1130 and 1132 may be formed from copper, and heat pipes 1134 and 1152 may comprise copper heat pipes embedded in copper heat sink bodies 1130 and 1132.

Fins 1220 on bodies 1130 and 1132 may be designed to provide a desired or maximum amount of cooling for the given air flow and air pressure for the worst case slot 52 of the chassis 50. The thickness and spacing of fins 1220 may be important to the performance of heat sink 1120. Mounting of heat sink 1120 to card 54 may also be important. For example, thermal performance may be degraded if the pressure exerted on heat sink 1120 is not maintained at a specified value or within a specified range. In one embodiment, an optimal pressure may be derived by testing, and a four post spring-based system may be designed and implemented to attach heat sink 1120 to the PCB 380.

In some embodiments, fans in chassis 50 create a generally diagonal air flow though the chassis 50. Due to this diagonal airflow, as well as the relatively small cross section of cards 54 and "pre-heating" of processors caused by heat from adjacent processors, a special air baffle 1200 may be provided to work in conjunction with heat sink 1120 (and other aspects of heat dissipation system 1150), as discussed above. Air baffle 1200 has unique features with respect to cooling of electronic, and assists the cooling of other components of card 54, as discussed above with reference to FIGS. 57A-59B and below with reference to FIGS. 63-65.

Air Baffle

In some embodiments, management switch 110 generates large amounts of heat. For example, management switch 110 may generate more heat than any other device on card 54.

Thus, aspects of heat dissipation system 1150, including the location of management switch 110 relative to other components of card 54, the design of heat sink 1128 coupled to management switch 110, and the design of air baffle 1200, may be designed to provide sufficient cooling of management switch 110 for reliable performance of switch 110 and other components of card 54.

As shown in FIGS. 55A and 55B, in the desired direction of air flow across card 54, management switch 110 is aligned with network processor 105-1. Due to the large amount of heat generated by switch 110, it may be disadvantageous to dissipate heat from management switch 110 into the air flow that subsequently flows across and through heat sink 1130 above network processor 105-1. That is, delivering a significant portion of the heat from switch 100 through the heat sink intended to cool network processor 105-1 may inhibit the cooling of network processor 105-1. Thus, heat sink 1128 may be configured to transfer heat from management switch 110 laterally, out of alignment with network processor 105-1 (in the desired direction of air flow). Thus, as shown in FIGS. 56A and 56B, heat sink 1128 may include a first conductive portion 1136 positioned over and thermally coupled to management switch 110, and a second finned portion 1138 laterally removed from management switch 110 in order to conductively transfer heat laterally away from management switch 110 and then from the fins of finned portion 1138 to the forced air flow by convection. In this example configuration, finned portion 1138 is aligned (in the air flow direction) with DIMMs 344-1 rather than with network processor 105-1. Because DIMMs typically generate substantially less heat than network processors, DIMMs 344-1 may be better suited than network processor 105-1 to receive the heated airflow from switch 110.

Further, as shown in FIGS. 57A-57B and 58A-58B, air baffle 1200 is configured to direct and increase the volume of air flow across heat sink 1128. For example, angled wing 1210 directs air flow downwardly through heat sink 1122, which then flows through heat sink 1128. Further, an angled guide wall 1212 of the second part 1204 of air baffle 1200 essentially funnels the air flow to heat sink 1128, thus providing an increased air flow mass and/or speed across heat sink 1128.

Figure 64A:
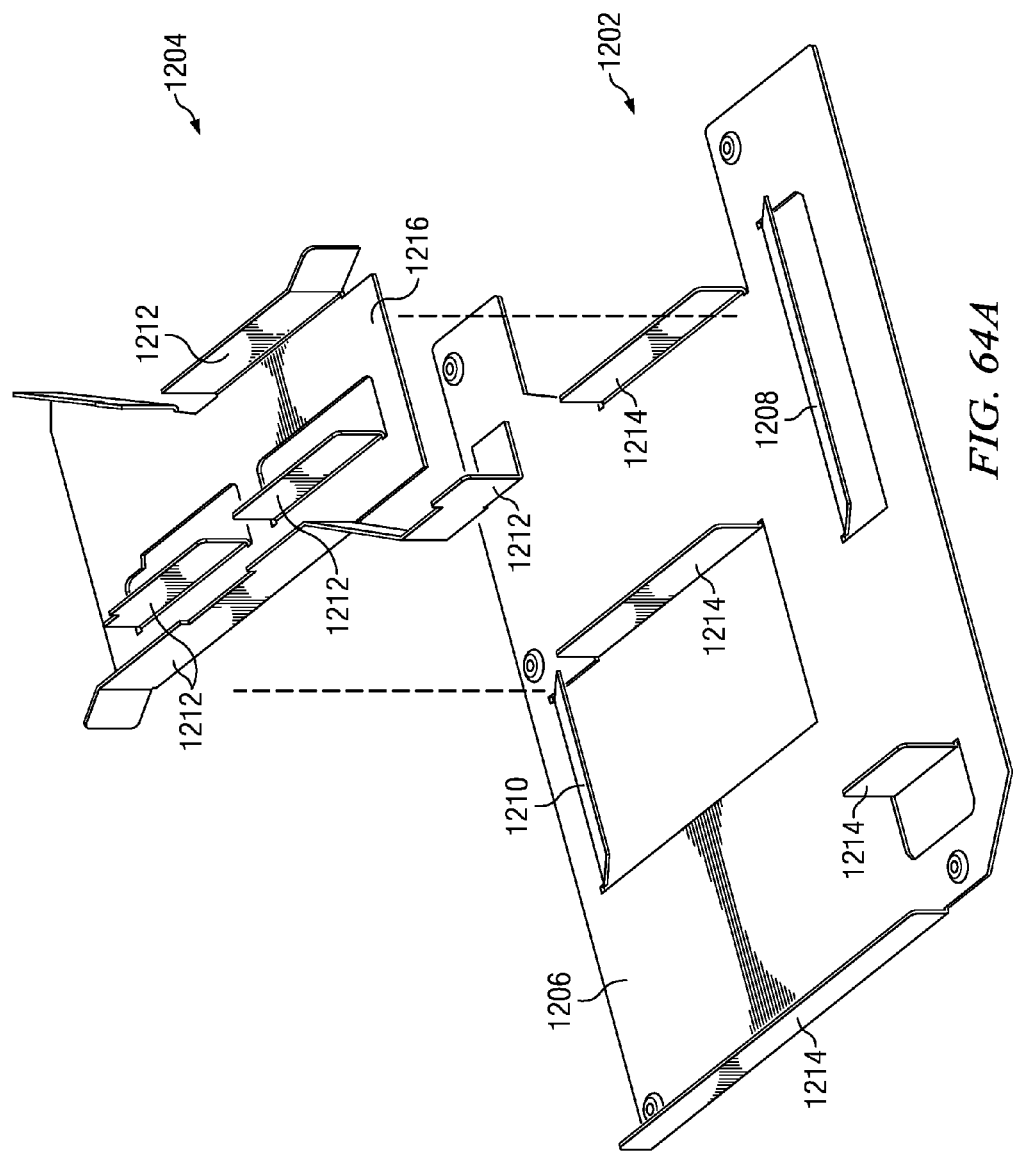
FIGS. 64A and 64B shows a three-dimensional exploded view from below, and a three-dimensional assembled view from below, of the air baffle of FIG. 63, according to an example embodiment.

FIGS. 63-65 provide views of example air baffle 1200 removed from card 54, to show various details of air baffle 1200, according to one embodiment. FIG. 63 shows a three-dimensional view from above air baffle 1200, in which first part 1202 of air baffle 1200, also referred to as "shell" 1202, is shown as a transparent rhember in order to view the underlying second part 1204, also referred to as "air deflector" 1204. FIG. 64A shows a three-dimensional exploded view from below of shell 1202 and air deflector 1204. FIG. 64A shows a three-dimensional assembled view from below of air deflector 1204 received within shell 1202. Finally, FIG. 64A shows a side view of assembled air baffle 1200, illustrating the directions of air flow promoted by air baffle 1200, in particular angled wings 1208 and 1210, according to one embodiment.

Figure 64B:
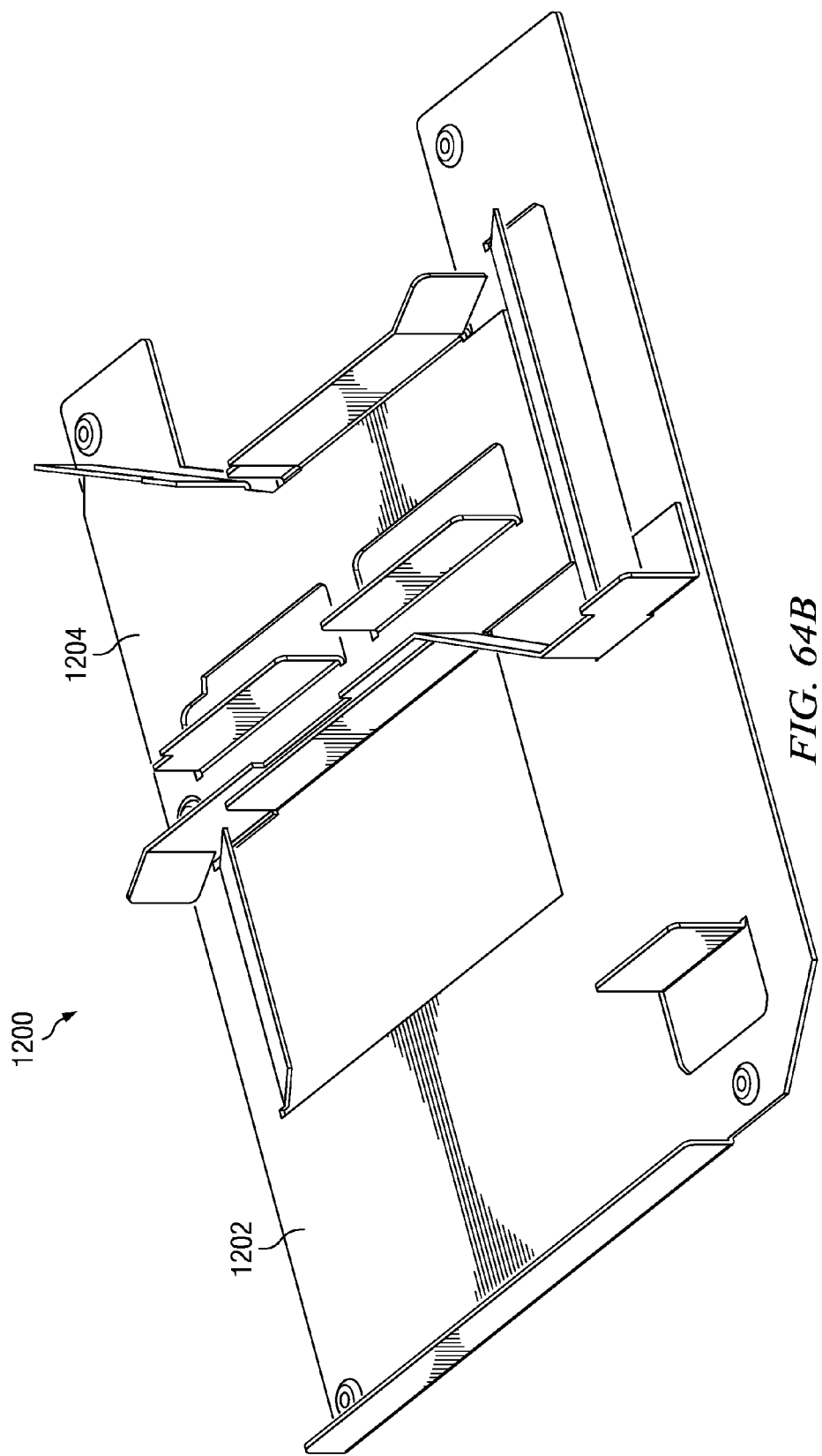

In one embodiment, shell 1202 is a sheet metal shell, and air deflector 1204 serves as a multi-vaned air deflector that creates specific channels for air to flow. The parts are assembled as shown in FIGS. 64A and 64B. As discussed above, the sheet metal shell 1202 may include slanted wing like structures 1210 and 1208, which act as low pressure generators to direct air flow downwardly as shown in FIG. 65. Similar to an aircraft wing, an angle of attack with respect to the plane of the sheet metal (1206 in FIG. 65) may be set for each wing 1210 and 1208, indicated as $\theta_1$ and $\theta_2$, respectively.

The angles $\theta_1$ and $\theta_2$ may be selected to provide desired air flow performance, and may be the same or different angles. In some embodiments, one or both of $\theta_1$ and $\theta_2$ are between 20 and 70 degrees. In particular embodiments, one or both of $\theta_1$ and $\theta_2$ are between 30 and 60 degrees. In certain embodiments, one or both of $\theta_1$ and $\theta_2$ are between 40 and 50 degrees. Each wing 1210 and 1208 creates a low pressure area, which deflects a portion of the air flow above the sheet metal plane 1206 downwardly into the air baffle 1200. This mechanism captures air flow that would normally move above the heat sink fins and redirects this air flow through the heat sink fins. The redirected airflow may be directed to lower parts of the heat sinks located within the air baffle (i.e., below the sheet metal plane 1206), thus providing improved cooling performance. An indication of air flow paths provided by air baffle 1200 is provided in FIG. 63.

Further, as discussed above, air baffle 1200 may include guide vanes 1214 and 1212 extending perpendicular from planar sheets 1206 and 1214 of shell 1202 and air deflector 1204 (i.e., downwardly toward PCB 380). As discussed above, fans may tend to generate a diagonal air flow across card 54. On a general level, guide vanes 1214 and 1212 may direct this air flow across card 54 in a perpendicular or orthogonal to the sides of card 54, rather than diagonally across card 54, which may promote increased heat dissipation. On a more focused level, as shown in FIGS. 63 and 64B, particular guide vanes 1212 of air deflector 1204 may be angled with respect to the perpendicular side-to-side direction of air flow, which may create areas of increased air flow volume and/or speed, e.g., for increased cooling of management switch 110, as discussed above. In one embodiments, vanes 1214 and 1212 are implemented as a Lexan structure. Thus, to summarize, in some embodiments, vanes 1214 and 1212 linearize the diagonal air flow supplied by high speed fans in chassis 50. The vanes cause the air to flow through/over the heat sinks within and downstream of air baffle 1200, which may provide the air speed and pressure necessary for proper operation of such heat sinks. Further, vanes 1214 and 1212 may be designed to substantially prevent pre-heated air from flowing through critical areas that may require or benefit from lower-temperature air for desired cooling of such areas, e.g., to substantially prevent air heated by management switch 110 by way of heat sink 1128 from subsequently flowing across downstream heat sink part 1130 arranged above network processor 105-1.

Drive Carrier

As discussed above, in some embodiments, disk drive 109 is a solid state drive that can be interchanged or completely removed from card 54, e.g., for interchangeability security and ease of managing multiple projects, for example. Disk drive 109 may be provided in a drive assembly 1300 shown in FIGS. 56A and 56B. Drive assembly 1300 includes a drive carrier support 1340 that is secured to card 54 and a drive carrier 1302 that is removeably received in the drive carrier support 1340. Drive carrier 1302 houses solid state disk drive 109, which is utilized by control processor 106 for various functions, as discussed above. With reference to FIGS. 55A-55B and 56A-56B, drive carrier support 1340 may be received in notch 388 formed in PCB 380 and secured to PCB 380. When drive carrier 1302 is fully inserted in drive carrier support 1340, connections on one end of disk drive 109 connect with drive connector 386 shown in FIGS. 55A and 55B, thus providing connection between drive 109 and control processor 106 (and/or other processors or devices of card 54).

FIGS. 66-68B illustrate various aspects of drive assembly 1300, according to one example embodiment. FIG. 66 shows an assembled drive carrier 1302, according to the example embodiment. Drive carrier 1302 comprises a disk housing 1304 for housing disk drive 109. In one embodiment, disk housing 1304 may substantially surround disk drive 109, but provide an opening at one end 1307 of the housing 1304 to allow external access to an electrical connector 1305 of disk drive, which is configured to connect with electrical connector 386 on PCB 380 in order to provide data communications between disk drive 109 and components of card 54.

Figure 68A:
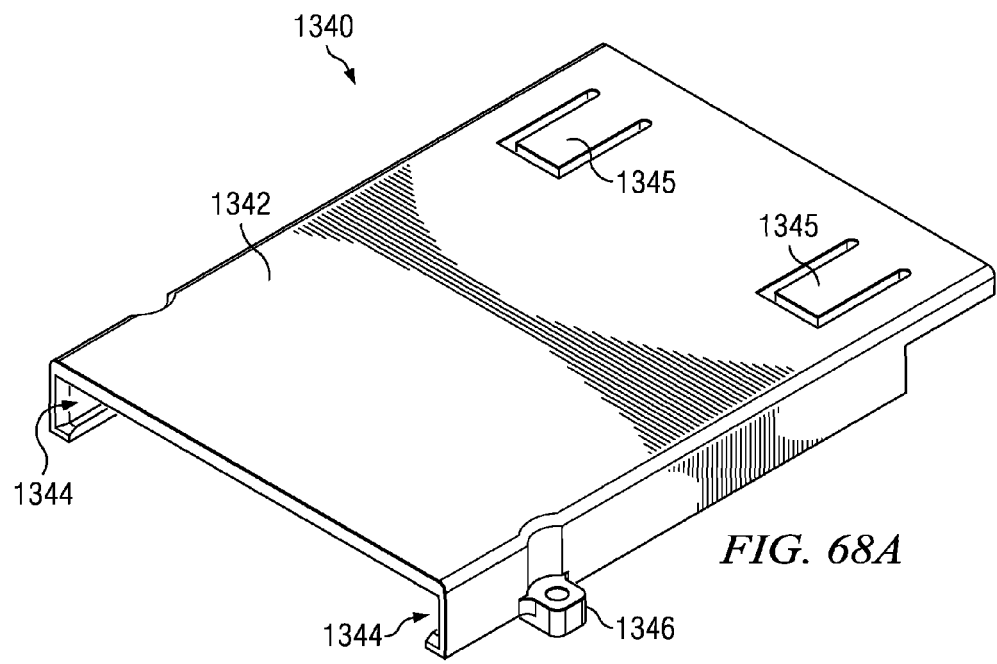
FIGS. 68A and 68B shows three-dimensional isometric views of a drive carrier support for receiving the drive carrier of FIG. 68, according to an example embodiment.
Figure 68B:
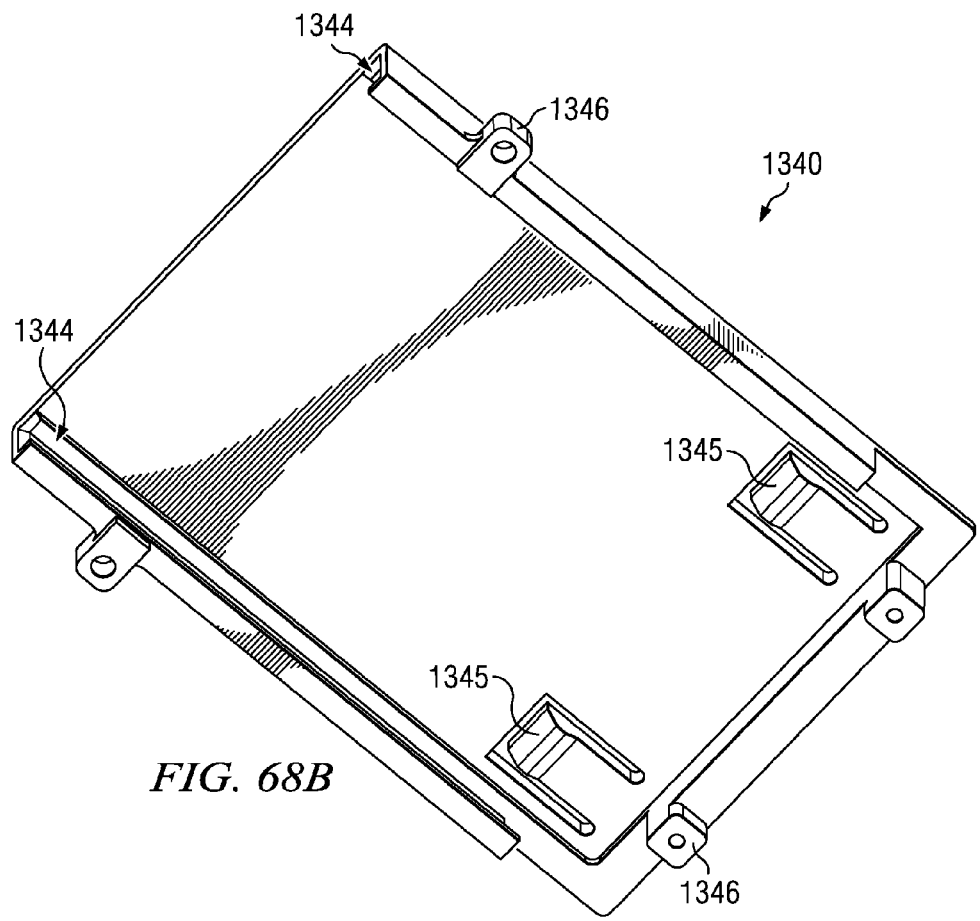

Lateral sides 1308 of disk housing 1304 are configured to be slidably received in guide channels of drive carrier support 1340, shown in FIGS. 68A and 68B. Disk housing 1304 may also include end flanges 1312 that include a groove 1310 or other protrusion or detent for engaging with spring tabs 1345 at the back portion of drive carrier support 1340, shown in FIGS. 68A and 68B. Disk housing 1304 may also include a lighted label 1314 and a handle 1306 for installing and removing drive carrier 1302. Handle 1306 may comprise a D-shaped finger pull or any other suitable handle.

Figure 67:
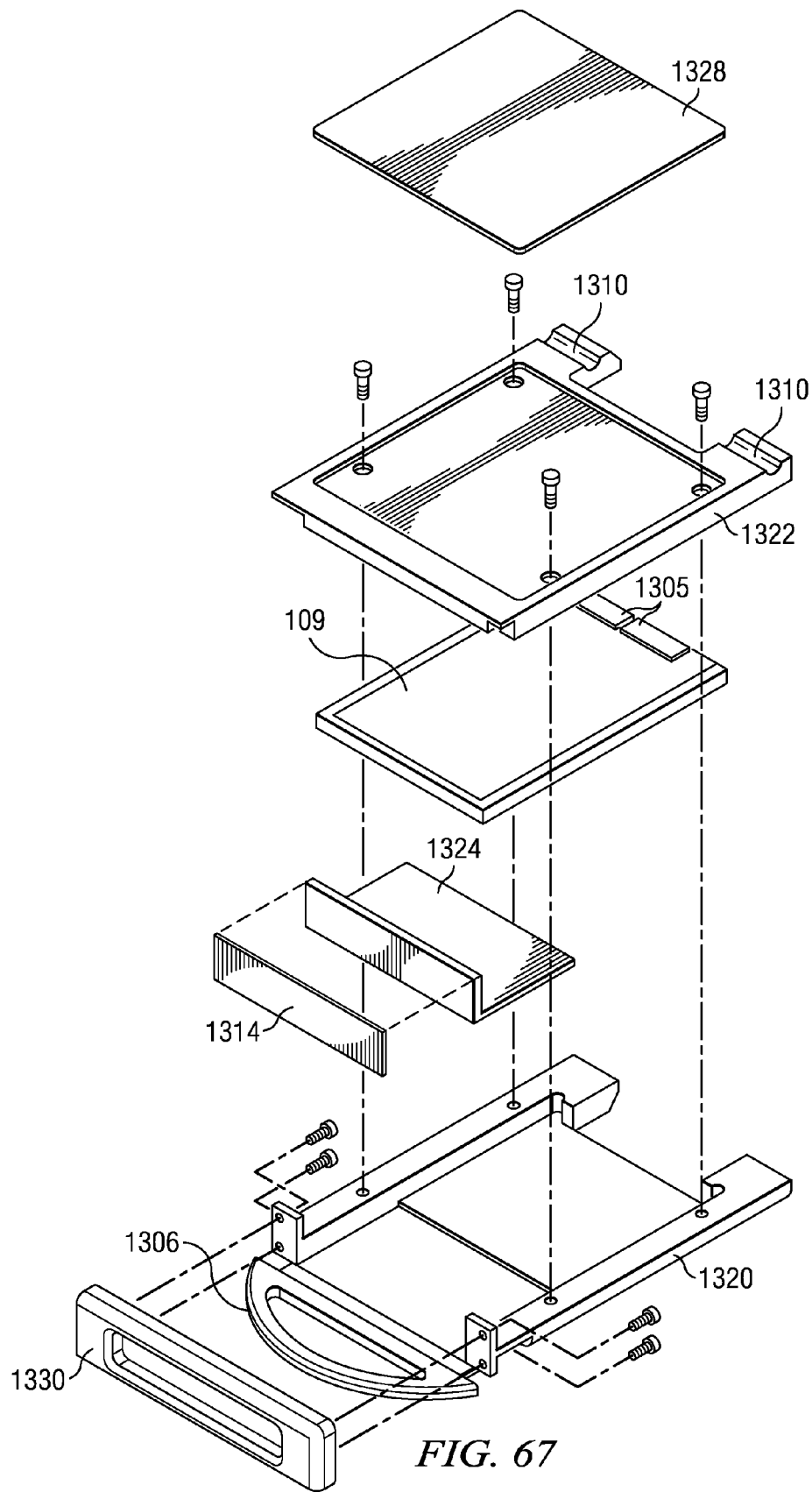
FIG. 67 shows an exploded view of the drive carrier of FIG. 68, according to an example embodiment.

FIG. 67 shows an exploded view of drive carrier 1302, according to the example embodiment. As shown, drive carrier 1302 includes disk drive 109 sandwiched between an upper housing 1322 and a lower housing 1320. A light pipe or light guide 1324 is also housed between upper housing 1322 and lower housing 1320, which delivers light to a front label 1314, and a faceplate 1330 having an opening is assembled over label carrier 1314. Any suitable light source may be used for lighting label 1314, e.g., a pair of multicolored LEDs positioned on each lateral side of the drive carrier 1302 on the PCB 380. A top label 1328 may be attached to the top of drive carrier 1302.

FIGS. 68A and 68B show details of drive carrier support 1340, according to an example embodiment. Drive carrier support 1340 may include a body 1342 having guide channels 1344 on opposing lateral sides for slidably receiving lateral sides 1308 of disk housing 1304. Drive carrier support 1340 may also include flanges 1346 for securing drive carrier support 1340 to PCB 380, and spring tabs 1345 having protrusions configured to engage with grooves 1310 formed in the end flanges 1312 of drive carrier 1302 (shown in FIG. 66). The location of spring tabs 1345 and grooves 1310 may provide precise positioning of drive carrier 1302 in the direction of insertion, which may ensure proper connection with drive connector 386. The interaction between spring tabs 1345 and grooves 1310 provides a latching mechanism that provides a spring-based latching force that secures drive carrier 1302 in drive carrier support 1340, but which can be overcome by a user pulling handle 1306 to remove drive carrier 1302 out of drive carrier support 1340. Drive carrier support 1340 may thus serve to align the drive carrier 1302, provide a smooth slide during insertion, provide depth control, and a latching mechanism to secure the drive carrier 1302.

The components of drive carrier 1302 and drive carrier support 1340 may be formed from any suitable materials. In some embodiments, drive carrier 1302 may be formed from materials that provide desired weight, conductivity, and/or EMI shielding, e.g., aluminum.

Drive carrier support 1340 may be formed from any suitable materials. In some embodiments, drive carrier support 1340 may be formed from materials that provide low insertion force (e.g., low friction force). For example, drive carrier support 1340 may be formed from polyoxymethylene, acetal, polyacetal, or polyformaldehyde to provide a self-lubricating surface, rigidity, stability, and machinability.

In some embodiments, drive assembly 1300 and/or card 54 includes a drive status detection system for automatic detection of the removal or insertion of drive carrier 1302 from drive carrier support 1340. For example, the drive status detection may include an electrical micro switch configured to detect the presence or absence of the drive carrier 1302 (or communicative connection/disconnection of drive 109 from card 54). Other embodiments include software for detecting the presence or absence of the drive carrier 1302 (or communicative connection/disconnection of drive 109 from card 54). Such software may periodically check an ID register on the drive 109 to verify that the drive carrier 1302 is still installed. If the drive is not found, the software may automatically issue a board reset. A special BIOS function may be provided that periodically or continuously checks for a drive 109 if a drive is not found. Once the drive carrier 1302 is installed and the BIOS detects the drive 109, the card 54 will boot normally.

For the purposes of this disclosure, the term exemplary means example only. Although the disclosed embodiments are described in detail in the present disclosure, it should be understood that various changes, substitutions and alterations can be made to the embodiments without departing from their spirit and scope.

What is claimed is:

1. A device for directing air flow for dissipating heat in an electronics system, comprising:
   a generally planar body extending in a first plane;
   at least one guide member extending from the generally planar body in a direction perpendicular to the first plane;
   an opening in the generally planar body; and
   a generally planar wing coupled to the generally planar body at a first side of the opening, the generally planar wing extending in a second plane that is angularly offset from the first plane of the generally planar body by an angle between 20 degrees and 70 degrees.

2. The device of claim 1, wherein the second plane of the generally planar wing is angularly offset from the first plane of the generally planar body by an angle between 30 degrees and 60 degrees.

3. The device of claim 1, wherein the second plane of the generally planar wing is angularly offset from the first plane of the generally planar body by an angle between 40 degrees and 50 degrees.

4. The device of claim 1, further comprising:
   an additional opening in the generally planar body;
   an additional generally planar wing coupled to the generally planar body at a first side of the additional opening, the additional generally planar wing extending in a third plane that is angularly offset from the first plane of the generally planar body by an angle between 20 degrees and 70 degrees.

5. The device of claim 4, wherein the third plane of the additional generally planar wing is parallel to and offset from the second plane of the generally planar wing.

6. The device of claim 1, wherein:
   a first guide member is generally planar and extends in a third plane; and
   the third plane of the first guide member is perpendicular to the second plane of the generally planar wing.

7. The device of claim 1, wherein the at least one guide member extending from the generally planar body in a direction perpendicular to the first plane comprises:
   a first guide member extending in a first guide member plane; and
   a second guide member extending in a second guide member plane that that is angularly offset from the first guide member plane of the first guide member by non-zero and non-90 degree angle.

8. A heat management system for an electronics system, comprising:
- a generally planar printed circuit board extending in a first plane;
- a plurality of heat-generating electrical components mounted on a first side of the printed circuit board; and
- an air baffle coupled to the printed circuit board and configured to direct air flow across at least some of the heat-generating electrical components, the air baffle comprising:
  - a generally planar air baffle body extending in a second plane parallel to and offset from the first plane of the printed circuit board such that at least one of the heat-generating electrical components is located in an area between the air baffle body and the printed circuit board;
  - an opening in the generally planar body; and
  - a generally planar wing coupled to the air baffle body at a first side of the opening and extending toward the printed circuit board at an askew angle relative to the first plane of the air baffle body, the wing being configured to facilitate air flow through the opening in the generally planar body.

9. The heat management system of claim 8, wherein the generally planar wing extends toward the printed circuit board at an angle of between 20 degrees and 70 degrees relative to the first plane of the air baffle body.

10. The heat management system of claim 8, wherein the generally planar wing extends toward the printed circuit board at an angle of between 30 degrees and 60 degrees relative to the first plane of the air baffle body.

11. The heat management system of claim 8, wherein the generally planar wing extends toward the printed circuit board at an angle of between 40 degrees and 50 degrees relative to the first plane of the air baffle body.

12. The heat management system of claim 8, wherein the air baffle further comprising:
- an additional opening in the air baffle body; and
- an additional generally planar wing coupled to the air baffle body at a first side of the additional opening and extending toward the printed circuit board at an angle of between 20 degrees and 70 degrees relative to the first plane of the air baffle body.

13. The heat management system of claim 8, further comprising at least one heat sink located at least partially in the area between the air baffle body and the printed circuit board.

14. The heat management system of claim 13, wherein the at least one heat sink located at least partially in the area between the air baffle body and the printed circuit board includes a particular heat sink positioned in substantially alignment with the opening in the generally planar body of the air baffle.

15. The heat management system of claim 13, further comprising:
- at least one heat sink located at least partially in the area between the air baffle body and the printed circuit board, each heat sink including a plurality of heat dissipation structures that extend in a first direction; and
- at least one elongated memory device located at least partially in the area between the air baffle body and the printed circuit board, the at least one elongated memory device extending in the first direction;
- such that the heat dissipation structures of the at least one heat sink and the at least one elongated memory device cooperate to guide an air flow the area between the air baffle body and the printed circuit board in the first direction.

16. The heat management system of claim 8, further comprising at least one guide member extending from the generally planar air baffle body in a direction perpendicular to the air baffle body.

17. A heat management system for an electronics system, comprising:
- a generally planar printed circuit board extending in a first plane;
- a heat-generating electrical component mounted on a first side of the printed circuit board;
- a heat sink comprising:
  - a first portion located over the heat-generating electrical component and substantially free of convection-based heat dissipation structures; and
  - a second portion located laterally with respect to the heat-generating electrical component and including an array of convection-based heat dissipation structures, such that heat generated by the heat-generating electrical component is received into the first portion of the heat sink, conductively transferred from the first portion to the second portion of the heat sink, and convectively dissipated from the second portion of the heat sink into an air flow; and
- an air baffle coupled to the printed circuit board and comprising a guidance structure at least partially positioned above the first portion of the heat sink, the guidance structure configured to increase a volume or a speed of an air flow across the second portion of the heat sink comprising the array of convection-based heat dissipation structures.

* * * * *